(12) United States Patent
Kimura et al.

(10) Patent No.: US 7,889,295 B2
(45) Date of Patent: Feb. 15, 2011

(54) LIQUID CRYSTAL DISPLAY DEVICE

(75) Inventors: Hajime Kimura, Kanagawa (JP); Hideki Uochi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 382 days.

(21) Appl. No.: 11/565,989

(22) Filed: Dec. 1, 2006

(65) Prior Publication Data

US 2007/0146591 A1 Jun. 28, 2007

(30) Foreign Application Priority Data

Dec. 5, 2005 (JP) ............................. 2005-350198

(51) Int. Cl.
*G02F 1/1335* (2006.01)
*G02F 1/1343* (2006.01)

(52) U.S. Cl. ....................................... 349/114; 349/141
(58) Field of Classification Search ........................ None
See application file for complete search history.

(56) References Cited

U.S. PATENT DOCUMENTS

| | | | |
|---|---|---|---|
| 5,870,160 A | 2/1999 | Yanagawa et al. | |
| 6,034,757 A | 3/2000 | Yanagawa et al. | |
| 6,108,066 A | 8/2000 | Yanagawa et al. | |
| 6,469,765 B1 | 10/2002 | Matsuyama et al. | |
| 6,914,656 B2 | 7/2005 | Sakamoto et al. | |
| 6,950,158 B2 | 9/2005 | Chang | |
| 7,088,409 B2 | 8/2006 | Itou et al. | |
| 7,420,635 B2 | 9/2008 | Ozawa | |
| 7,486,351 B2 | 2/2009 | Itou et al. | |
| 7,639,327 B2 | 12/2009 | Ozawa | |
| 2003/0103181 A1 | 6/2003 | Imayama et al. | |
| 2003/0218664 A1 | 11/2003 | Sakamoto et al. | |
| 2005/0001959 A1* | 1/2005 | Chang | 349/114 |
| 2005/0105033 A1 | 5/2005 | Itou et al. | |
| 2005/0128389 A1 | 6/2005 | Yang | |
| 2005/0128390 A1 | 6/2005 | Yang | |

(Continued)

FOREIGN PATENT DOCUMENTS

JP 09-105918 4/1997

(Continued)

OTHER PUBLICATIONS

PCT International Search Report (Application No. PCT/JP2006/324313), dated Jan. 23, 2007, 3 pages.

(Continued)

*Primary Examiner*—Tina M Wong
(74) *Attorney, Agent, or Firm*—Fish & Richardson P.C.

(57) ABSTRACT

It is an object of the present invention to provide a liquid crystal display device which has a wide viewing angle and less color-shift depending on an angle at which a display screen is seen and can display an image favorably recognized both outdoors in sunlight and dark indoors (or outdoors at night). The liquid crystal display device includes a first portion where display is performed by transmission of light and a second portion where display is performed by reflection of light. Further, a liquid crystal layer includes a liquid crystal molecule which rotates parallel to an electrode plane when a potential difference is generated between two electrodes of a liquid crystal element provided below the liquid crystal layer.

10 Claims, 97 Drawing Sheets

U.S. PATENT DOCUMENTS

| | | |
|---|---|---|
| 2005/0140867 A1 | 6/2005 | Choi |
| 2005/0264731 A1 | 12/2005 | Itou et al. |
| 2006/0092356 A1 | 5/2006 | Morimoto et al. |
| 2006/0092363 A1 | 5/2006 | Hasegawa et al. |
| 2006/0146250 A1 | 7/2006 | Wu et al. |
| 2006/0164575 A1* | 7/2006 | Su et al. ............ 349/114 |
| 2006/0192912 A1 | 8/2006 | Itou et al. |
| 2006/0215086 A1 | 9/2006 | Kurasawa |
| 2006/0215087 A1 | 9/2006 | Matsushima et al. |
| 2006/0267891 A1 | 11/2006 | Nishimura et al. |
| 2007/0040978 A1 | 2/2007 | Nakayoshi et al. |
| 2007/0126969 A1 | 6/2007 | Kimura et al. |

FOREIGN PATENT DOCUMENTS

| | | |
|---|---|---|
| JP | 2003-149664 A | 5/2003 |
| JP | 2003-344837 | 12/2003 |
| JP | 2005-106967 | 4/2005 |
| JP | 2003-338264 A | 12/2005 |
| JP | 2005-338256 | 12/2005 |
| JP | 2006-126551 | 5/2006 |
| JP | 2006-126602 | 5/2006 |
| JP | 2006-184325 | 7/2006 |
| JP | 2006-215287 A | 8/2006 |
| JP | 2006-243144 | 9/2006 |
| JP | 2006-276110 | 10/2006 |
| JP | 2006-276112 | 10/2006 |
| JP | 2007-004126 | 1/2007 |
| WO | 2005/006068 A1 | 1/2005 |

OTHER PUBLICATIONS

PCT Written Opinion (Application No. PCT/JP2006/324313), dated Jan. 23, 2007, 4 pages.

Jeong et al., "P-111: Voltage and Rubbing Angle Dependent Behavior of the Single Cell Gap Transflective Fringe Field Switching (FFS) Mode,", SID Digest '05 : SID International Symposium Digest of Technical Papers, 2005, pp. 723-725.

S. H. Lee, et al., "Ultra-FFS TFT-LCD with Super Image Quality and Fast Response Time," *SID Digest 01: SID International Symposium Digest Of Technical Papers*, 29.2-18.1, pp. 484-487 (2001).

Song et al., "Electro-Optic Characteristics of Fringe-Field Driven Transflective LCD with Dual Cell Gap," IDW/AD '05, vol. 1, pp. 103-106 (2005).

Choi et al., "A Single Gap Transflective Display Using A Fringe-Field Driven Homogeneously Aligned Nematic Liquid Crystal Display," *SID 05 Digest*, p. 110; pp. 719-721 (2005).

Ruibo Lu, "4.4: Transflective Liquid Crystal Display Using In-Plane Switching Effect," *IDRC 06*, Sep. 2006, pp. 39-42.

Gak Seok Lee et al., "6.3: Design of Wide-Viewing-Angle Transflective IPS LCD," Sep. 2006, pp. 75-77.

Norio Aoki, "16.3: Invited Paper: Advanced IPS Technology for Mobile Applications," *SID 06 Digest*, Jun. 2006, pp. 1087-1090.

Sakamoto et al., "L-6: Late-News Paper: Development of the Novel Transflective LCD Module Using Super-Fine-TFT Technology," *SID 06 Digest*, Jun. 2006, pp. 1669-1672.

Gak Seok Lee et al. "Optical Configurations of Horizontal-Switching Transflective LCDs in Double Cellgap Structure," *IDW/AD'05*, pp. 111-114 (2005).

O. Itou et al., "P231L: Late-News Poster: A Wide Viewing Angle Transflective IPS LCD Applying New Optical Design," *SID 06 Digest*, Jun. 2006, pp. 832-835.

Search Report (PCT Application No. 06834068.6) dated Jan. 29, 2010, in English.

* cited by examiner

FIG. 17A IC connected by FPC
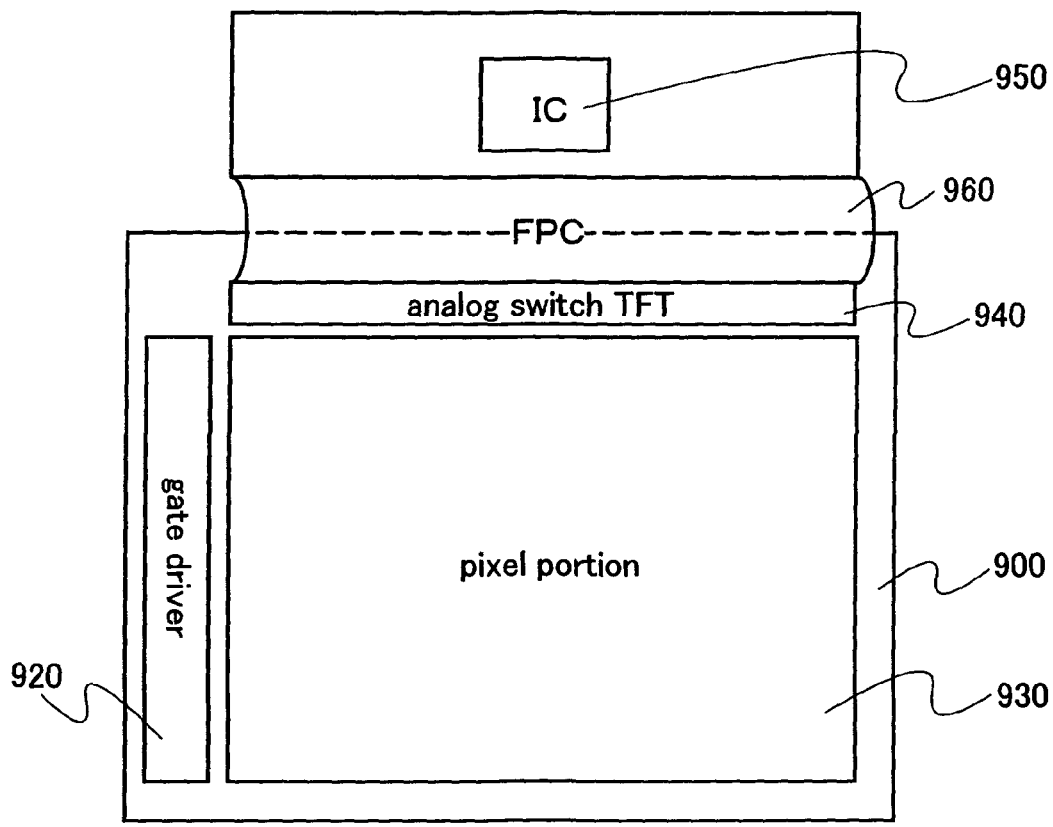
FIG. 17B IC formed by FPC, COG, and the like (switch portion)
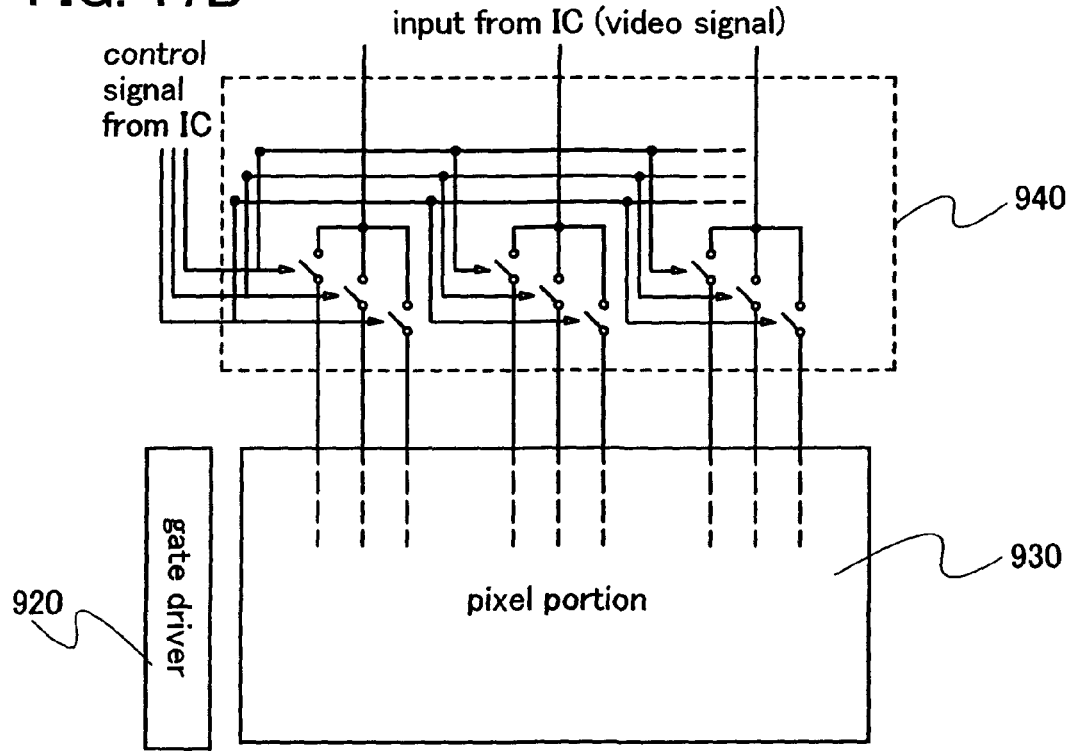

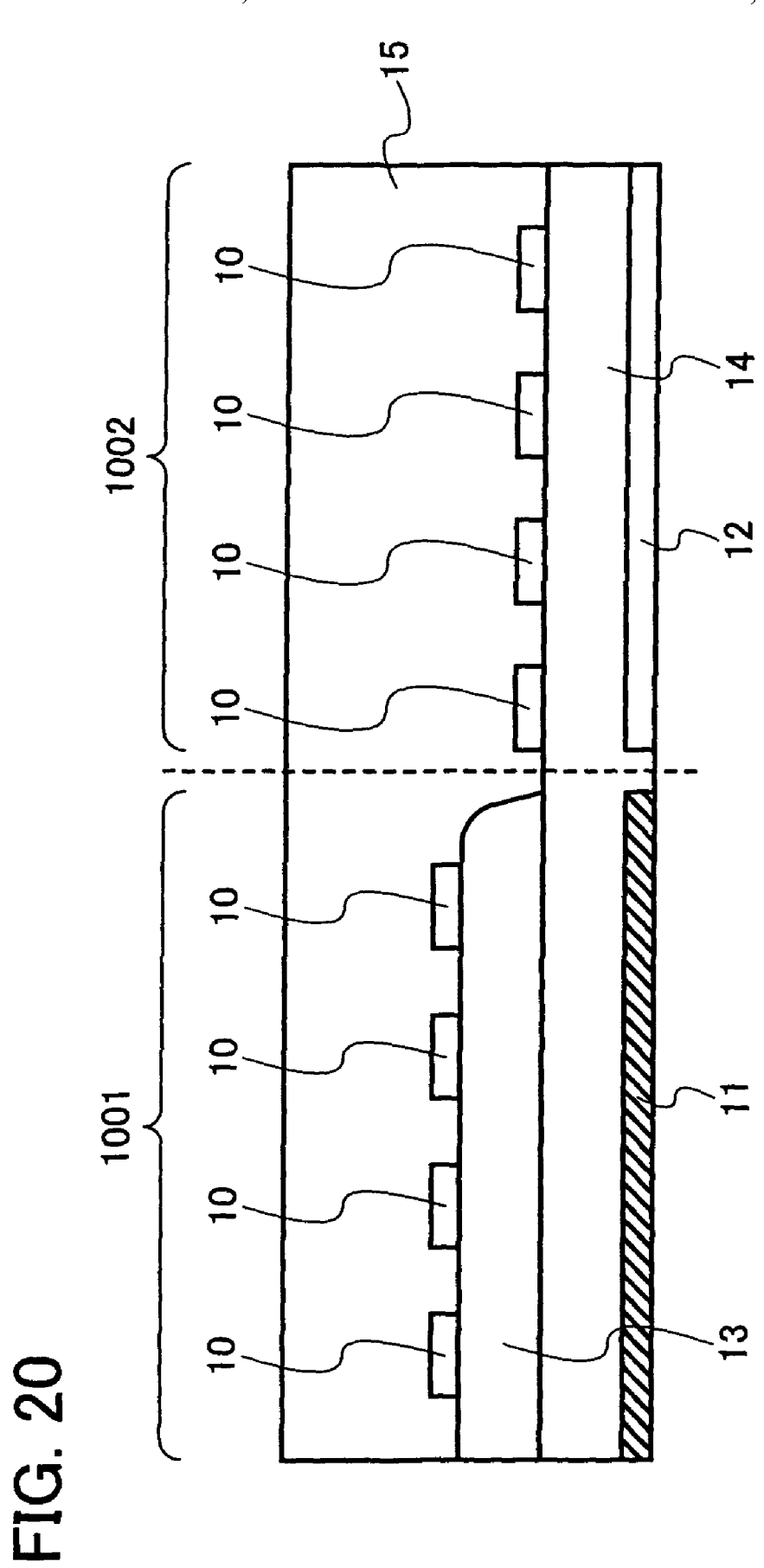

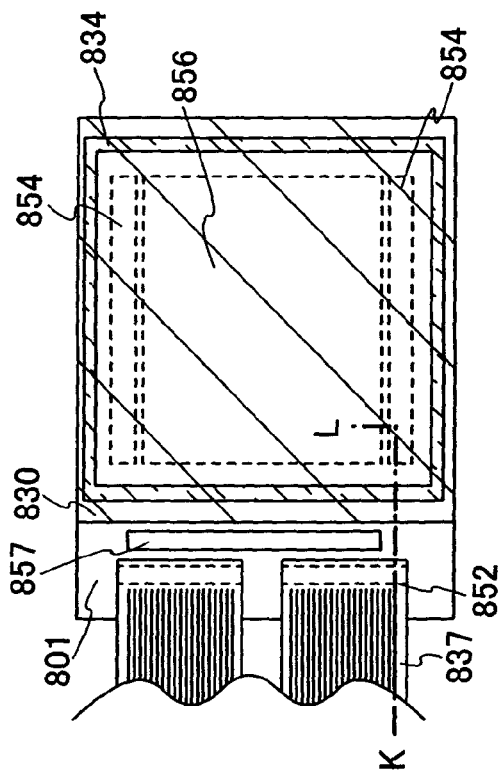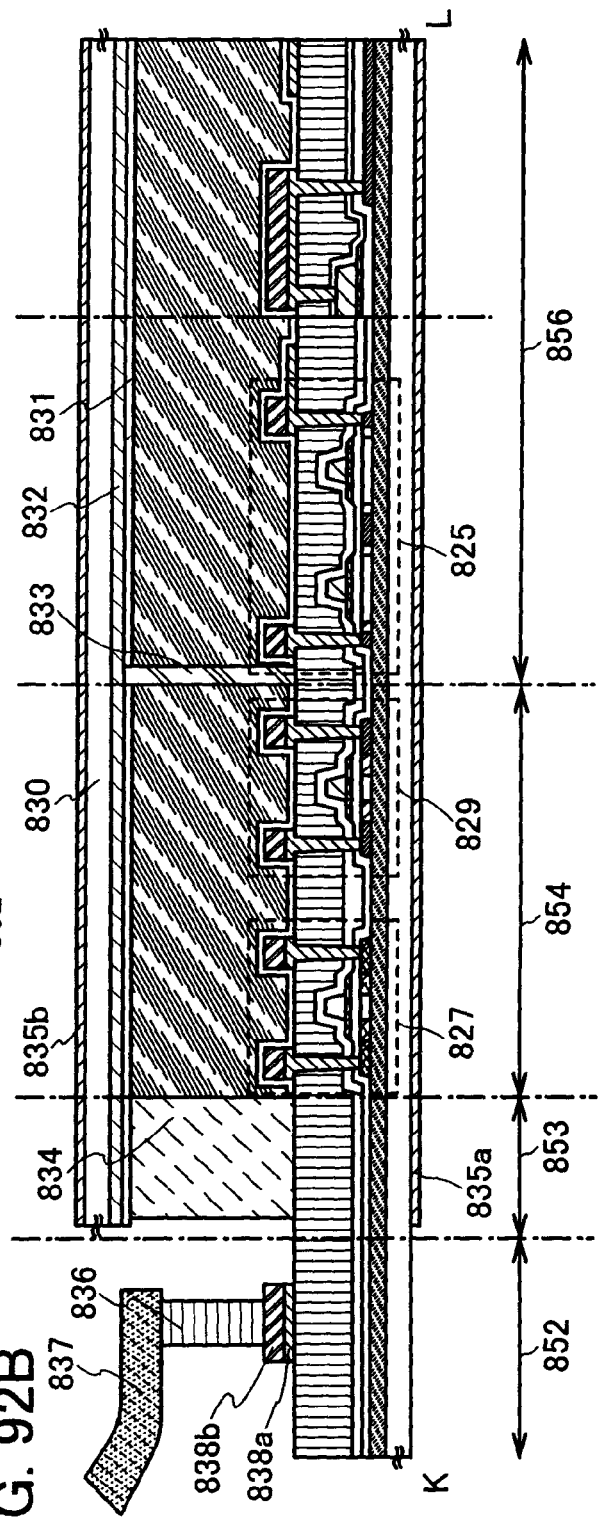
FIG. 92A
FIG. 92B

LIQUID CRYSTAL DISPLAY DEVICE

TECHNICAL FIELD

The present invention relates to a liquid crystal display device. In particular, the present invention relates to a liquid crystal display device which is driven by changing alignment of a liquid crystal molecule by an electric field that is almost horizontal to a substrate.

BACKGROUND ART

A display device includes a self-light emitting display device and a non-light emitting display device. A liquid crystal display device is the most representative non-light emitting display device. A driving method of liquid crystal in a liquid crystal display device includes a vertical electric field type in which voltage is applied vertically to a substrate and a horizontal electrical field type in which voltage is applied almost parallel to the substrate.

In recent years, a liquid crystal display device has attracted attention, in which voltage is applied to generate an electric field in a horizontal direction (a direction parallel to a substrate), and a liquid crystal molecule rotates parallel to a substrate plane to make light from a backlight transmit or not transmit, thereby displaying an image (for example, see Patent Document 1: Japanese Published Patent Application No. H9-105918 and Non Patent Document 1: Ultra-FFS TFT-LCD with Super Image Quality and Fast Response Time 2001 SID pp. 484-487).

Each of the vertical electric field type and the horizontal electric field type has an advantage and a disadvantage. For example, the horizontal electrical field type has characteristics such as a wide viewing angle, high contrast, high gradation display, and the like compared to the vertical electric field type typified by a TN type, and is used as a monitor or television. These kinds of liquid crystal display devices coexist in a field of liquid crystal, and products have been developed. In addition, each of a liquid crystal material for a horizontal electric field type and a liquid crystal material for a vertical electric field type has been developed and has different material characteristics in accordance with a direction of applied voltage.

Further, a horizontal electric field liquid crystal display device includes an IPS (In-Plane Switching) type and an FFS (Fringe Field Switching) type. In an IPS type, a pixel electrode having a comb-shape or a slit and a common electrode having a comb-shape or a slit are alternately arranged, and an electric field almost parallel to a substrate is generated between the pixel electrode and the common electrode, thereby driving a liquid crystal display device. On the other hand, in an FFS type, a pixel electrode having a comb-shape or a slit is arranged over a common electrode which has a planar shape and is entirely formed in a pixel portion. An electric field almost parallel to a substrate is generated between the pixel electrode and the common electrode, thereby driving a liquid crystal display device.

In such a kind of liquid crystal display device, there are advantages such as a wide viewing angle and less color-shift depending on an angle at which a display screen is seen, and the liquid crystal display device is effectively used in a display portion of a TV set.

A transmission type liquid crystal display device which utilizes light from a backlight has a problem in that, although a display image is easily seen in a dark room, a display image is not easily seen in sunlight. In particular, this problem greatly influences an electronic appliance which is often used outdoors, such as a camera, a mobile information terminal, or a mobile phone.

Therefore, a liquid crystal display device which can display a favorable image both indoors and outdoors and has a wide viewing angle is expected to be developed.

DISCLOSURE OF INVENTION

It is an object of the present invention to provide a liquid crystal display device which has a wide viewing angle and less color-shift depending on an angle at which a display screen is seen and can display an image favorably recognized both indoors and outdoors.

A liquid crystal display device according to the present invention includes a first portion where display is performed by transmission of light and a second portion where display is performed by reflection of light. In addition, a liquid crystal layer includes a liquid crystal molecule which rotates parallel to an electrode plane, that is, in a plane parallel to a substrate, when a potential difference is generated between two electrodes of a liquid crystal element, which are provided below the liquid crystal layer.

It is to be noted that, in the present invention, "rotation parallel to an electrode plane" includes parallel rotation which includes discrepancy unrecognizable by human eyes. In other words, "rotation parallel to an electrode plane" also includes rotation which mainly includes vector components in a plane direction but also includes a few vector components in a normal direction in addition to the vector components in a plane direction.

FIGS. 18A to 18C show a liquid crystal molecule which rotates parallel to an electrode plane in a liquid crystal layer. When a potential difference is generated between an electrode 803 and an electrode 804 provided below a liquid crystal layer, a liquid crystal molecule 802 contained in the liquid crystal layer 801 rotates by an effect of a horizontal electric field. A state shown in FIG. 18A changes into that shown in FIG. 18B, or the state shown in FIG. 18B changes into that shown in FIG. 18A, as the liquid crystal molecule 802 rotates. FIGS. 18A and 18B are cross-sectional views. The rotation seen from above is shown by an arrow in FIG. 18C.

Similarly, FIGS. 93A to 93C show a liquid crystal molecule which rotates parallel to an electrode plane in a liquid crystal layer. When a potential difference is generated between an electrode 9803 and an electrode 9805 and between an electrode 9804 and the electrode 9805 provided below a liquid crystal layer, a liquid crystal molecule 9802 contained in the liquid crystal layer 9801 rotates by an effect of a horizontal electric field. A state shown in FIG. 93A changes into that shown in FIG. 93B, or the state shown in FIG. 93B changes into that shown in FIG. 93A as the liquid crystal molecule 9802 rotates. FIGS. 93A and 93B are cross-sectional views. The rotation seen from above is shown by an arrow in FIG. 93C.

It is to be noted that positions and the like of the electrode 803 and the electrode 804 are not limited to those shown in FIGS. 18A to 18C.

Similarly, positions and the like of the electrode 9803, the electrode 9804, and the electrode 9805 are not limited to those shown in FIGS. 93A to 93C.

In the first portion where display is performed by transmission of light, a pair of electrodes are provided below a liquid crystal layer in the same layer. Alternatively, in the first portion, two electrodes of a liquid crystal element are provided below a liquid crystal layer, and the electrodes are respectively formed in different layers. One of the electrodes serves as a reflector, or a reflector is provided so as to overlap with the electrodes, thereby reflecting light. In the second portion, two electrodes of the liquid crystal element are provided below a liquid crystal layer. Both the electrodes are light-transmitting and provided over the same layer or over different layers with an insulating layer interposed therebetween.

One mode of the present invention is a liquid crystal display device which includes a liquid crystal element including a first electrode having a light-transmitting property, a second electrode having a light-transmitting property, and a liquid crystal layer provided over the first electrode and the second electrode; a first portion in which the first electrode and the second electrode are provided in different layers with an insulating layer interposed therebetween; and a second portion in which the first electrode and the second electrode are provided over the insulating layer, where, in the first portion, the liquid crystal layer overlaps with a reflector.

In a structure of the present invention, the reflector can be electrically connected to the second electrode.

Another mode of the present invention is a liquid crystal display device which includes a liquid crystal element including a first electrode having a light-transmitting property, a second electrode including a first conductive layer reflecting light and a second conductive layer having a light-transmitting property, and a liquid crystal layer which is provided over the first electrode and the second electrode and includes a liquid crystal molecule rotating parallel to the first electrode plane; a first portion in which the first electrode and the first conductive layer are provided in different layers with an insulating layer interposed therebetween; and a second portion in which the first electrode and the second electrode are provided over the insulating layer.

Another mode of the present invention is a liquid crystal display device which includes a liquid crystal element and a reflector between a first substrate and a second substrate, where the liquid crystal element includes a liquid crystal layer, and a first electrode and a second electrode provided between the liquid crystal layer and the first substrate; and where part of the liquid crystal layer overlaps with the reflector provided between at least one of the first electrode and the second electrode, and the first substrate.

In the structure of the present invention, the liquid crystal layer can include a liquid crystal molecule which rotates parallel to the substrate plane when a potential difference is generated between the first electrode and the second electrode.

By carrying out the present invention, an image with a wide viewing angle and less color-shift depending on an angle at which a display screen is seen, which is favorably recognized both outdoors in sunlight and dark indoors (or outdoors at night) can be obtained.

BRIEF DESCRIPTION OF DRAWINGS

In the accompanying drawings:

FIGS. 17A and 17B are views each explaining a module to which a liquid crystal display device according to the present invention is applied;

FIG. 20 is a view explaining one mode of a liquid crystal display device according to the present invention;

FIGS. 92A and 92B are views each explaining one mode of a liquid crystal display device according to the present invention;

BEST MODE FOR CARRYING OUT THE INVENTION

Figure 1:
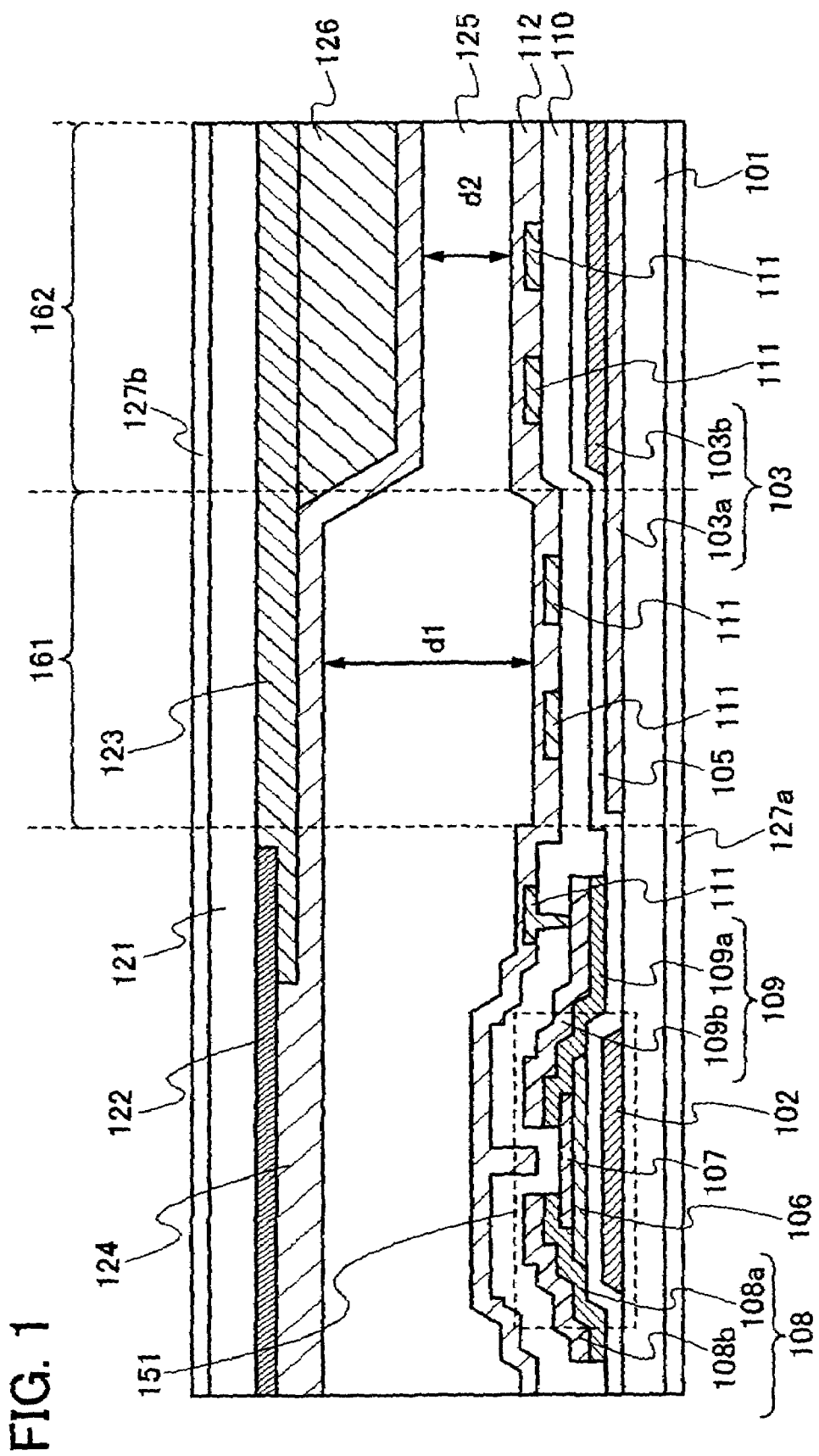
FIG. 1 is a view explaining a mode of a cross-sectional structure of a pixel portion included in a liquid crystal display device according to the present invention.

Hereinafter, one mode of the present invention will be described. It is to be noted that the present invention can be implemented in many different modes, and it is easily understood by those skilled in the art that modes and details thereof can be modified in various ways without departing from the purpose and the scope of the invention. Therefore, the present invention should not be interpreted as being limited to the description of the embodiment modes.

In the present invention, a type of an applicable transistor is not limited. It is thus possible to apply a thin film transistor (TFT) using a non-single crystal semiconductor film typified by amorphous silicon and polycrystalline silicon, a transistor using a semiconductor substrate or an SOI substrate, a MOS transistor, a junction type transistor, or a bipolar transistor, a transistor using an organic semiconductor or a carbon nanotube; or other transistor. Further, a type of a substrate over which a transistor is arranged is not limited, and a transistor can be arranged over a single crystal substrate, an SOI substrate, a glass substrate, or the like.

In the present invention, "to be connected" also indicates "to be electrically connected". Accordingly, in a structure disclosed in the present invention, other elements capable of electrical connection (such as a switch, a transistor, a capacitor, a resistor, a diode, and other element) may be arranged, in addition, between predetermined connected elements.

It is to be noted that a switch shown in the present invention may be an electrical switch or a mechanical switch. That is, any switch may be used as far as it can control a current flow, and the switch may be a transistor, a diode, or a logic circuit combining a transistor and a diode. Therefore, in the case of applying a transistor as a switch, polarity (conductivity type) thereof is not particularly limited because the transistor operates just as a switch. However, when an off-state current is desired to be low, a transistor of polarity with a lower off-state current is desirably used. For example, a transistor which is provided with an LDD region, a transistor which has a multi-gate structure, or the like has a low off-state current. Further, it is desirable that an n-channel transistor be employed when potential of a source terminal of a transistor serving as a switch is close to potential of a low potential side power source (Vss, Vgnd, 0 V or the like), and a p-channel transistor be employed when the potential of the source terminal is close to potential of a high potential side power source (Vdd or the like). This helps the switch operate efficiently since an absolute value of gate-source voltage can be increased. It is to be noted that a CMOS type switch using both an n-channel transistor and a p-channel transistor may also be used.

As described above, various types of transistors can be used as a transistor of the present invention, and the transistor may be formed over various substrates. Therefore, all the circuits which drive a pixel may be formed over a glass substrate, a plastic substrate, a single crystal substrate, an SOI substrate, or other substrate. Alternatively, part of a circuit which drives a pixel may be formed over a certain substrate while another part of the circuit which drives a pixel may be formed over another substrate. That is to say, all the circuits which drive a pixel are not required to be formed over the same substrate. For example, a pixel arrangement and a gate line driver circuit are formed using a TFT over a glass substrate, and a signal line driver circuit (or part thereof) may be formed over a single crystal substrate, and then, IC chips formed in this manner may be connected by COG (Chip On Glass) and arranged over a glass substrate. Alternatively, the IC chip may be connected to a glass substrate by using TAB (Tape Automated Bonding) or a printed substrate.

Embodiment Mode 1

One mode of a liquid crystal display device according to the present invention will be described with reference to FIG. 20. A liquid crystal display device is provided with a plurality of pixels arranged in a matrix, and FIG. 20 shows one mode of a cross-sectional structure of one pixel.

As shown in FIG. 20, the liquid crystal display device includes a reflection portion 1001 where display is performed by reflection of light and a transmission portion 1002 where display is performed by transmission of light. In each portion, an electrode serving as a pixel electrode and an electrode serving as a common electrode are provided.

The electrode serving as a pixel electrode is formed into a comb-shape or a slit shape. On the other hand, the electrode serving as a common electrode is formed into a flat shape or formed entirely in a pixel portion. However, the present invention is not limited thereto.

A space between the electrodes, each of which is formed into a comb-shape or a slit shape and serves as a pixel electrode, is preferably 2 to 8 μm, more preferably 3 to 4 μm.

Voltage is supplied between the electrode serving as a pixel electrode and the electrode serving as a common electrode, thereby generating an electric field. The electric field contains a lot of components which are parallel to a substrate. Then, a liquid crystal molecule rotates in a plane parallel to the substrate in accordance with the electric field. Accordingly, it is possible to control transmissivity and reflectiveness of light and to display a gradation.

When a plurality of electrodes each serving as a common electrode are provided, preferably, a contact hole is opened in an insulating layer or the electrodes are made to overlap with each other so as to electrically connect the common electrodes.

In addition, when the electrode serving as a pixel electrode and the electrode serving as a common electrode are arranged with an insulating layer interposed therebetween, a portion where the electrodes are arranged with an insulating layer interposed therebetween serves as a capacitor. Therefore, the portion can also serve as a storage capacitor for storing an image signal.

The reflection portion 1001 where display is performed by reflection of light has a reflecting electrode, by which light is reflected to perform display. The reflecting electrode may also serve as a common electrode, or alternatively, the reflecting electrode and the common electrode may be separately provided. Therefore, the reflecting electrode may be connected to the common electrode to be supplied with voltage. However, when the reflecting electrode and the common electrode are separately provided, there is also the case where no voltage is supplied, or another voltage is supplied.

The transmission portion 1002 where display is performed by transmission of light has a transmitting electrode, by which light is transmitted to perform display. The transmitting electrode may also serve as a common electrode, or alternatively, the transmitting electrode and the common electrode may be separately provided. Therefore, the transmitting electrode may be connected to the common electrode to be supplied with voltage. However, when the transmitting electrode and the common electrode are separately provided, there is also the case where no voltage is supplied, or another voltage is supplied. In addition, the transmitting electrode may also serve as a pixel electrode.

Subsequently, a structure of FIG. 20 will be described. In the reflection portion 1001, an electrode 10 of a liquid crystal element and an electrode 11 of the liquid crystal element overlap with each other with an insulating layer 13 and an insulating layer 14 interposed therebetween. In addition, in the transmission portion 1002, the electrode 10 of the liquid crystal element and an electrode 12 of the liquid crystal element overlap with each other with the insulating layer 14 interposed therebetween.

The electrode 10 of the liquid crystal element is formed into a comb-shape, and the electrode 11 of the liquid crystal element and the electrode 12 of the liquid crystal element are entirely formed in the pixel portion. However, the present invention is not limited thereto. The electrode 11 of the liquid crystal element and the electrode 12 of the liquid crystal element may have a gap like a slit or a hole, or may be formed into a comb-shape.

The electrode 10 of the liquid crystal element serves as a pixel electrode, and the electrode 11 of the liquid crystal element and the electrode 12 of the liquid crystal element each serve as a common electrode. However, the present invention is not limited thereto. The electrode 10 of the liquid crystal element may serve as a common electrode, and the electrode 11 of the liquid crystal element and the electrode 12 of the liquid crystal element may each serve as a pixel electrode.

As for the electrodes each serving as a common electrode, preferably, a contact hole is opened in an insulating layer so as to electrically connect the electrodes. Alternatively, the electrodes are made to overlap with each other so as to electrically connect the electrodes.

The electrode 11 of the liquid crystal element is formed using a conductive material which reflects light. Therefore, this electrode serves as a reflecting electrode. In addition, the electrode 12 of the liquid crystal element is formed using a conductive material which transmits light. Therefore, this electrode serves as a transmitting electrode.

It is preferable to form the electrode 10 of the liquid crystal element using a conductive material which transmits light. This is because the electrode 10 can transmit light and can thus contribute to a portion which displays an image. It is to be noted that the electrode 10 of the liquid crystal element may also be formed using a material which reflects light. In such a case, since the electrode 10 reflects light, even the transmission portion 1002 can serve as a reflection portion.

In addition, when the electrode serving as a pixel electrode (the electrode 10 of the liquid crystal element) and the electrode serving as a common electrode (the electrode 11 of the liquid crystal element and the electrode 12 of the liquid crystal element) are arranged with an insulating layer interposed therebetween, a portion where the electrodes are arranged with an insulating layer interposed therebetween serves as a capacitor. Therefore, the portion can also serve as a storage capacitor for storing an image signal.

Figure 18A:
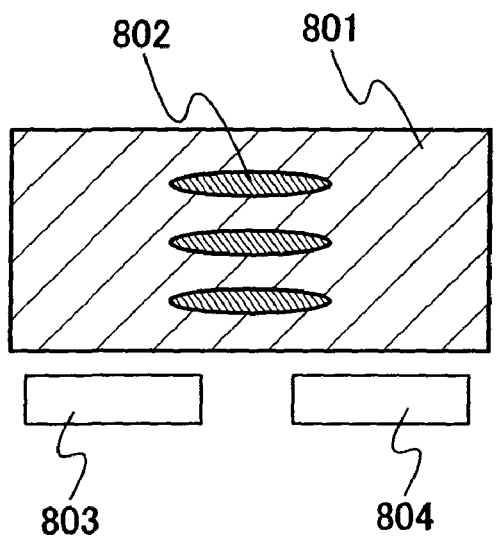
FIGS. 18A to 18C are views each explaining one mode of a liquid crystal display device according to the present invention.
Figure 18B:
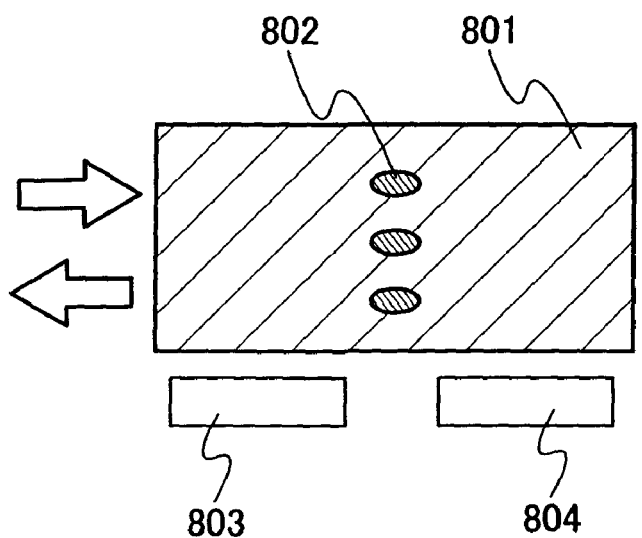
Figure 18C:
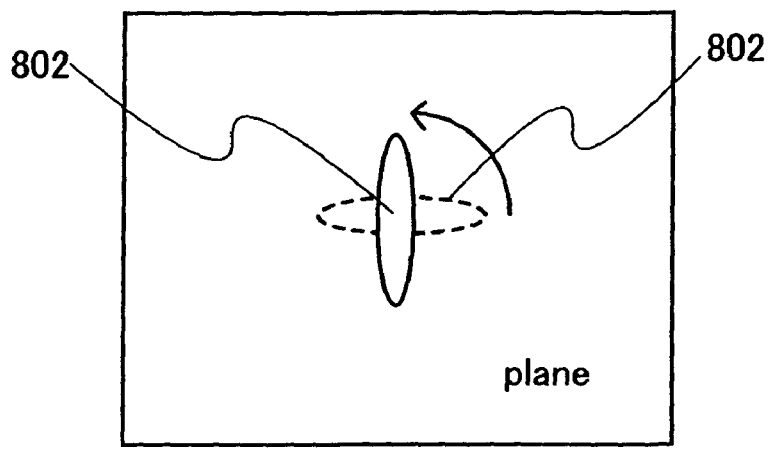
Figure 83:
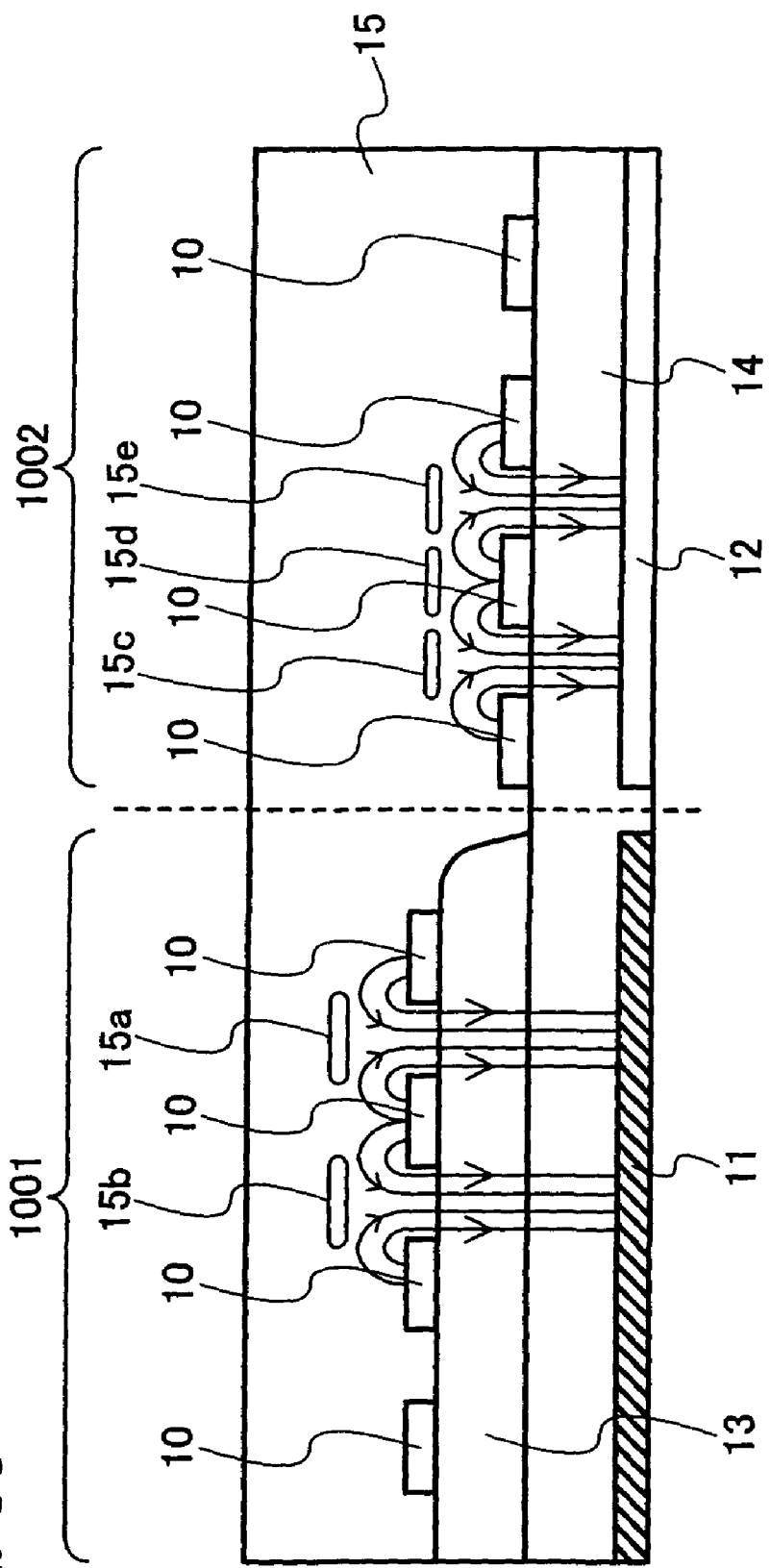
FIG. 83 is a view explaining one mode of a liquid crystal display device according to the present invention.
Figure 93A:
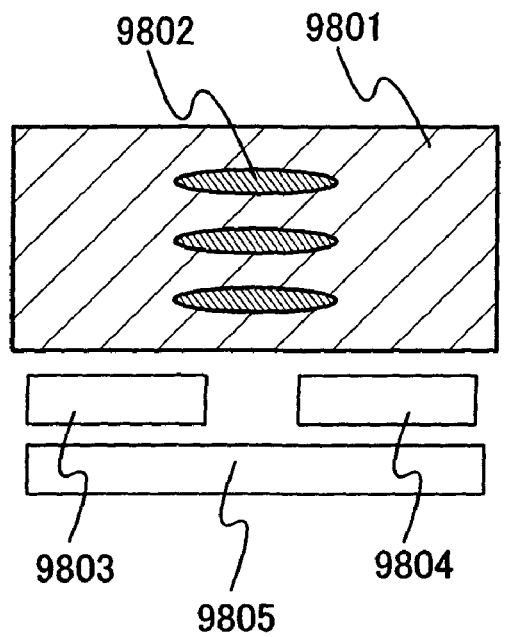
FIGS. 93A to 93C are views each explaining one mode of a liquid crystal display device according to the present invention.
Figure 93B:
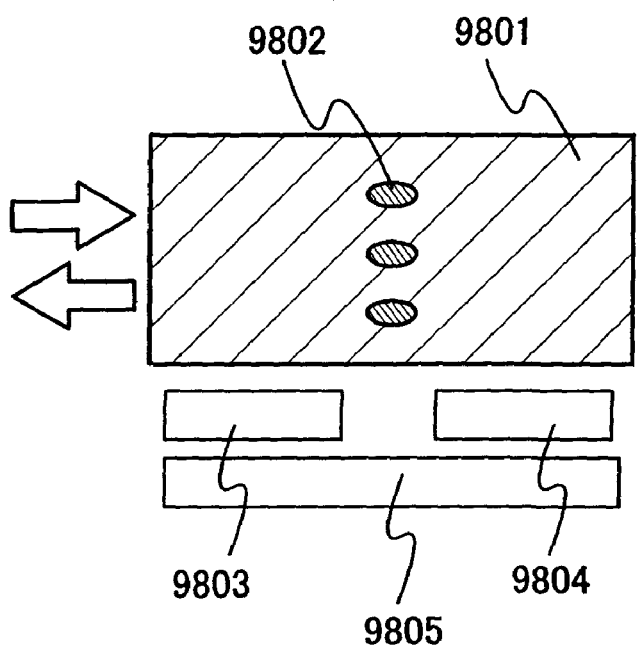
Figure 93C:
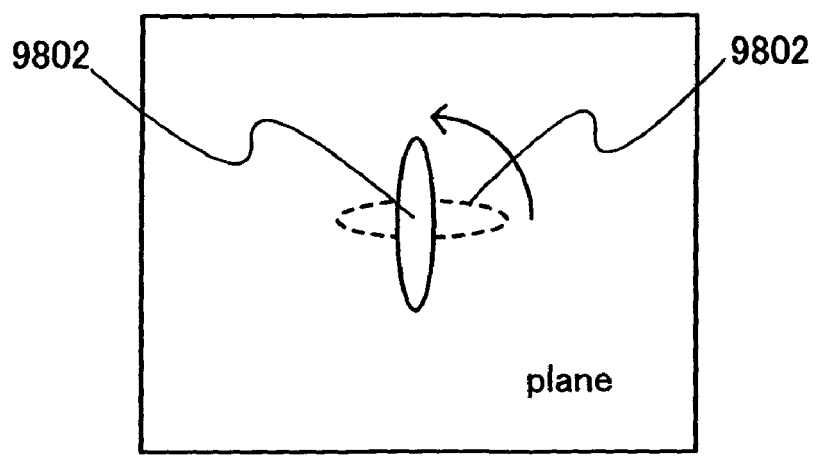

FIG. 83 shows a state where an electric field is applied between the electrodes of the liquid crystal element of FIG. 20. In the reflection portion 1001 where display is performed by reflection of light, when a potential difference is generated between the electrode 10 of the liquid crystal element and the electrode 11 of the liquid crystal element, liquid crystal molecules (15a and 15b) contained in the liquid crystal layer 15 rotate parallel to the plane of the electrode 10 of the liquid crystal element and the electrode 11 of the liquid crystal element (i.e. in a plane parallel to a substrate), and it becomes possible to control the amount of light which passes through the liquid crystal layer 15. More precisely, it becomes possible to control a polarized state of light, and the liquid crystal molecules (15a and 15b) can control the amount of light which passes through a polarizing plate provided on the outer side of the substrate. FIG. 83 corresponds to FIG. 18A and FIG. 93A. The liquid crystal molecules (15a and 15b) shown in FIG. 83 rotate in the manner similar to those shown in FIGS. 18A to 18B and 93A to 93B. Light that has entered the liquid crystal display device from outside passes through the liquid crystal layer 15, transmits through the electrode 10 of the liquid crystal element, the insulating layer 13, and the insulating layer 14, reflects at the electrode 11 of the liquid crystal element, passes through the insulating layer 13, the insulating layer 14, the electrode 10 of the liquid crystal element, and the liquid crystal layer 15 again, and is emitted from the liquid crystal display device.

Since the insulating layer 13 and the insulating layer 14 scarcely have refractive index anisotropy, a polarized state is not changed even when light passes through the insulating layer.

In addition, in the transmission portion 1002 where display is performed by transmission of light, when a potential difference is generated between the electrode 10 of the liquid crystal element and the electrode 12 of the liquid crystal element, liquid crystal molecules (15c, 15d, and 15e) contained in the liquid crystal layer 15 rotate parallel to the plane of the electrode 10 of the liquid crystal element and the electrode 12 of the liquid crystal element (i.e. in a plane parallel to the substrate), and it becomes possible to control the amount of light which passes through the liquid crystal layer 15. More precisely, it becomes possible to control a polarized state of light, and the liquid crystal molecules (15c, 15d, and 15e) can control the amount of light which passes through a polarizing plate provided on the outer side of the substrate. FIG. 83 corresponds to FIG. 18A and FIG. 93A. The liquid crystal molecules (15c, 15d, and 15e) shown in FIG. 83 rotate in the manner similar to those shown in FIGS. 18A to 18B and 93A to 93B. Light that has entered the liquid crystal display device from a backlight passes through the liquid crystal layer 15 and is emitted from the liquid crystal display device.

It is to be noted that, in the reflection portion 1001 where display is performed by reflection of light and in the transmission portion 1002 where display is performed by transmission of light, a color filter is provided in a light path, and light is changed into light of a desired color. By combining light emitted from each pixel in such a manner, an image can be displayed.

The color filter may be provided over a counter electrode arranged over the liquid crystal layer 15, over the electrode 10 of the liquid crystal element, or in the insulating layer 14 or in part thereof.

It is to be noted that a black matrix may also be provided in the manner similar to the color filter.

In the reflection portion 1001 where display is performed by reflection of light, light passes through the liquid crystal layer 15 twice. In other words, external light enters the liquid crystal layer 15 from the counter substrate side, reflects at the electrode 11 of the liquid crystal element, enters the liquid crystal layer 15 again, and is emitted outside the counter substrate; thus, light passes through the liquid crystal layer 15 twice.

On the other hand, in the transmission portion 1002 where display is performed by transmission of light, light enters the liquid crystal layer 15 through the electrode 12 of the liquid crystal element and is emitted from the counter substrate. In other words, light passes through the liquid crystal layer 15 once.

Here, since the liquid crystal layer 15 has refractive index anisotropy, a polarized state of light is changed depending on a traveling distance of light in the liquid crystal layer 15. Accordingly, an image cannot be displayed correctly in some cases. Therefore, it is necessary to adjust a polarized state of light. As a method for adjusting a polarized state, a thickness of the liquid crystal layer 15 (a so-called cell gap) in the reflection portion 1001 where display is performed by reflection of light may be thinned so that the distance becomes not too long when light passes twice.

Since the insulating layer 13 and the insulating layer 14 scarcely have refractive index anisotropy, a polarized state is not changed even when light passes through the insulating layers. Therefore, presence or a thickness of the insulating layer 13 and the insulating layer 14 does not greatly influence a polarized state.

In order to thin a thickness of the liquid crystal layer 15 (a so-called cell gap), a film for adjusting a thickness may be arranged. In FIG. 20, the insulating layer 13 corresponds to this layer. In other words, in the reflection portion 1001 where display is performed by reflection of light, the insulating layer 13 is a layer that is provided to adjust a thickness of the liquid crystal layer. By providing the insulating layer 13, a thickness of the liquid crystal layer in the reflection portion 1001 can be thinner than a thickness of the liquid crystal layer in the transmission portion 1002.

It is preferable that a thickness of the liquid crystal layer 15 in the reflection portion 1001 is half of a thickness of the liquid crystal layer 15 in the transmission portion 1002. Here, "to be half" also includes the amount of discrepancy that cannot be recognized by human eyes.

It is to be noted that light does not enter only from a direction vertical to the substrate, i.e. a normal direction, and light also enters obliquely in many cases. Therefore, with all cases considered, traveling distances of light may be almost the same in both the reflection portion 1001 and the transmission portion 1002. Therefore, a thickness of the liquid crystal layer 15 in the reflection portion 1001 is preferably about greater than or equal to one-third and less than or equal to two-thirds of a thickness of the liquid crystal layer 15 in the transmission portion 1002.

As described above, a thickness of the liquid crystal layer can be easily adjusted when the insulating layer 13 is arranged as a film for adjusting a thickness of the liquid crystal layer on the substrate side provided with the electrode 10 of the liquid crystal element. In other words, various wirings, electrodes, and films are formed on the substrate side provided with the electrode 10 of the liquid crystal element. Therefore, as part of a flow of forming various wirings, electrodes, and films, a film for adjusting a thickness of the liquid crystal layer may be formed; thus, there are few difficulties when a thickness of the liquid crystal layer is adjusted. In addition, it becomes also possible to form the film for adjusting a thickness of the liquid crystal layer concurrently with a film having another function. Therefore, a process can be simplified, and the cost can be reduced.

In a liquid crystal display device having the above structure according to the present invention, a viewing angle is wide, a color is not often changed depending on an angle at which a display screen is seen, and an image that is favorably recognized both outdoors in sunlight and dark indoors (or outdoors at night) can be provided.

In FIG. 20, the electrode 11 of the liquid crystal element and the electrode 12 of the liquid crystal element are formed in the same plane; however, the present invention is not limited thereto. Both the electrodes may also be formed in different planes.

In FIG. 20, the electrode 11 of the liquid crystal element and the electrode 12 of the liquid crystal element are arranged apart from each other; however, the present invention is not limited thereto. Both the electrodes may be arranged so as to be in contact or formed using the same electrode. Alternatively, the electrode 11 of the liquid crystal element and the electrode 12 of the liquid crystal element may be electrically connected to each other.

In FIG. 20, the insulating layer 13 is arranged as a film for adjusting a thickness of the liquid crystal layer 15; however, the present invention is not limited thereto. The film for adjusting a thickness of the liquid crystal layer 15 may also be arranged on the counter substrate side.

It is to be noted that the insulating layer 13 is arranged as a film for adjusting a thickness of the liquid crystal layer 15 in order to thin a thickness of the liquid crystal layer 15. However, on the other hand, the film may be removed in a predetermined region in order to thicken a thickness of the liquid crystal layer 15.

It is to be noted that the surface of the reflecting electrode may be flat but is preferably uneven. By the uneven surface, light can be diffused to be reflected. Consequently, light can be scattered, and luminance can be improved.

Embodiment Mode 2

A mode of a liquid crystal display device according to the present invention, which has a different structure from that of Embodiment Mode 1, will be described with reference to FIGS. 21 to 42. It is to be noted that portions having the same function as those of Embodiment Mode 1 are denoted by the same reference numerals.

Figure 21:
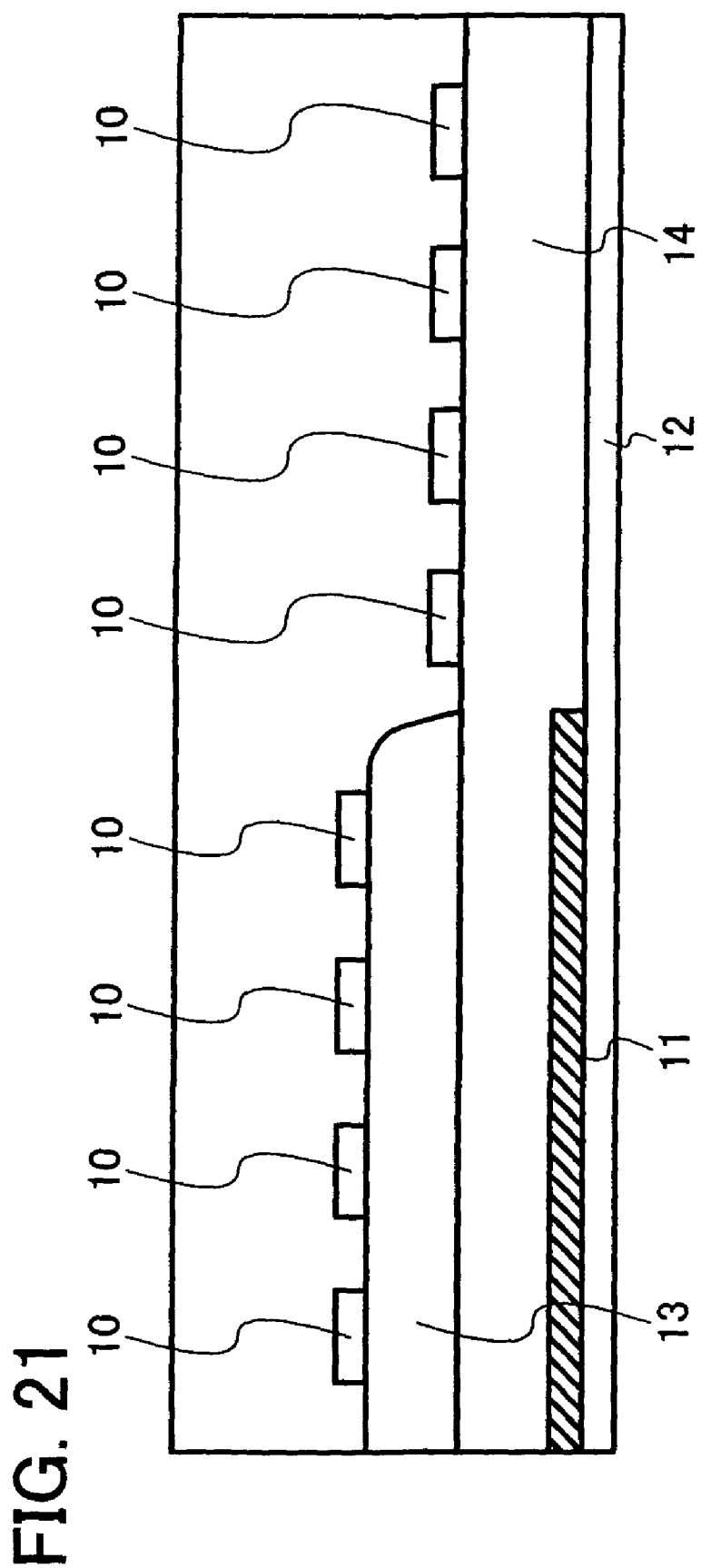
FIG. 21 is a view explaining one mode of a liquid crystal display device according to the present invention.

FIG. 21 shows a mode of a liquid crystal display device, which is different from the liquid crystal display device of FIG. 20, in that an electrode 11 of a liquid crystal element and an electrode 12 of the liquid crystal element are stacked. When the electrode 11 of the liquid crystal element and the electrode 12 of the liquid crystal element are desired to have the same potential, the electrodes may be electrically connected by being stacked in such a manner.

It is to be noted that the electrode 12 of the liquid crystal element is arranged below the electrode 11 of the liquid crystal element; however, the present invention is not limited thereto. The electrode 12 of the liquid crystal element may be arranged over the electrode 11 of the liquid crystal element.

It is to be noted that the electrode 12 of the liquid crystal element is arranged entirely below the electrode 11 of the liquid crystal element; however, the present invention is not limited thereto.

When the electrode 12 of the liquid crystal element is arranged entirely below the electrode 11 of the liquid crystal element, the electrode 11 of the liquid crystal element and the electrode 12 of the liquid crystal element can be formed using one mask. In general, the electrode 11 of the liquid crystal element and the electrode 12 of the liquid crystal element are formed using different masks. But in this case, the electrode 11 of the liquid crystal element and the electrode 12 of the liquid crystal element can be formed using one mask by forming a mask such as a half tone mask or a gray tone mask and changing a thickness of a resist depending on a region. Consequently, the manufacturing process can be simplified, the number of steps can be reduced, and the number of masks (the number of reticles) can be reduced. Accordingly, the cost can be reduced.

Figure 22:
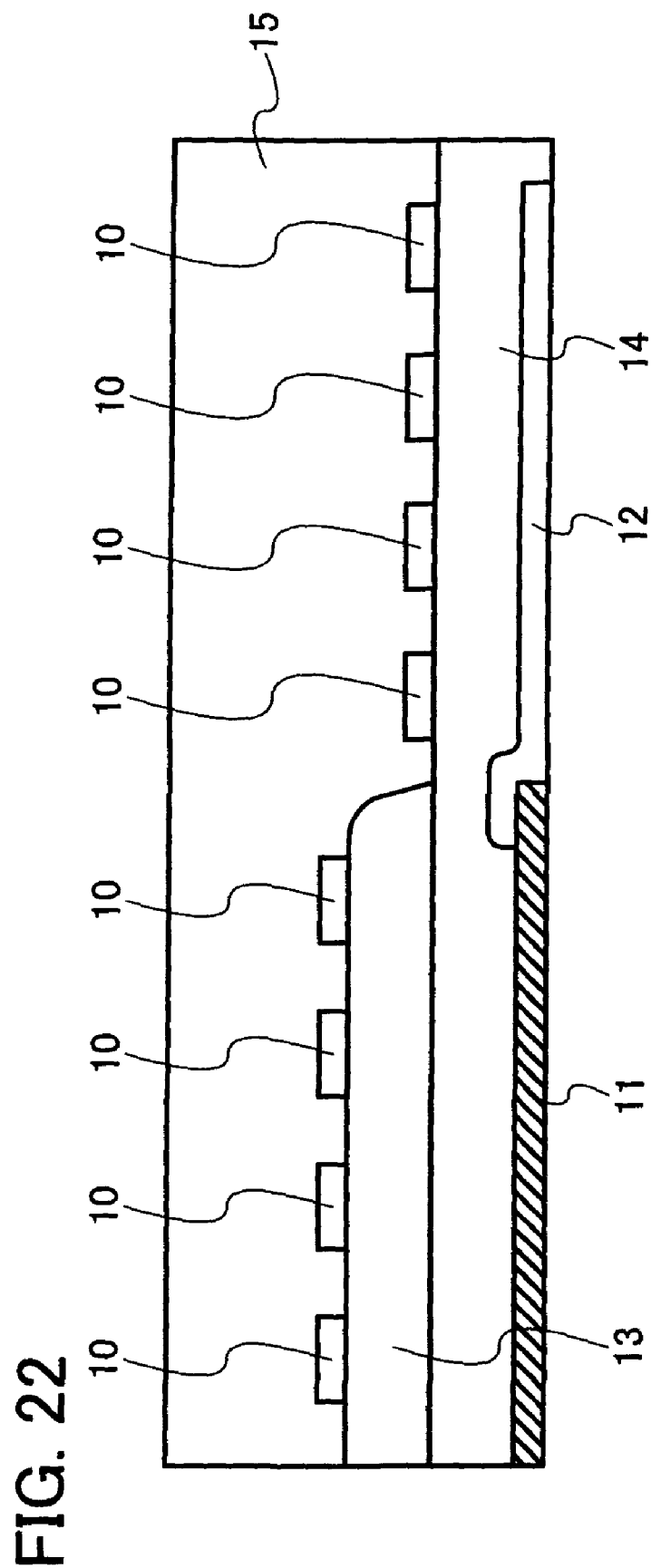
FIG. 22 is a view explaining one mode of a liquid crystal display device according to the present invention.

FIG. 22 shows a mode of a liquid crystal display device in which part of an electrode 11 of a liquid crystal element and part of an electrode 12 of the liquid crystal element are stacked so as to be electrically connected to each other. By such a structure, both the electrodes may be electrically connected to each other.

It is to be noted that the electrode 12 of the liquid crystal element is arranged over and to be in contact with the electrode 11 of the liquid crystal element; however, the present invention is not limited thereto. The electrode 11 of the liquid crystal element may also be arranged over and to be in contact with the electrode 12 of the liquid crystal element.

In such a manner, when the electrode 12 of the liquid crystal element is not arranged over the electrode 11 of the liquid crystal element, loss of light there can be reduced.

Figure 23:
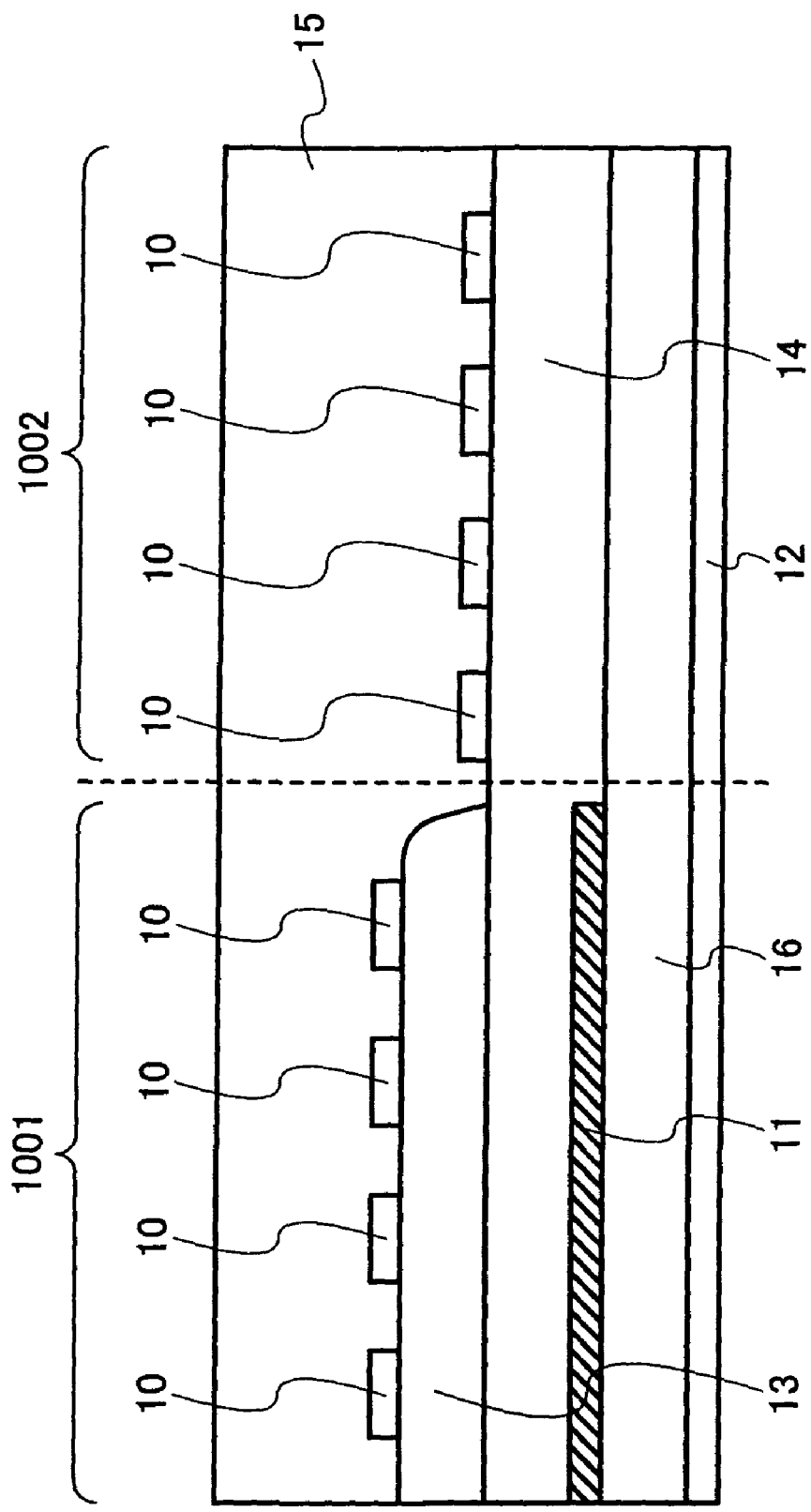
FIG. 23 is a view explaining one mode of a liquid crystal display device according to the present invention.

In FIG. 23, an electrode 11 of a liquid crystal element and an electrode 12 of the liquid crystal element are provided in different layers so as to interpose an insulating layer 16. In such a manner, the electrode 11 of the liquid crystal element and the electrode 12 of the liquid crystal element may be provided in different layers.

As described above, when the electrode 11 of the liquid crystal element and the electrode 12 of the liquid crystal element are provided in different layers, a distance between the electrode 11 of the liquid crystal element and an electrode 10 of the liquid crystal element in a reflection portion 1001 may be almost the same as a distance between the electrode 12 of the liquid crystal element and the electrode 10 of the liquid crystal element in a transmission portion 1002. Accordingly, in the reflection portion 1001 and the transmission portion 1002, the distances between the electrodes can be almost the same. A direction, a distribution, intensity, and the like of an electric field are changed depending on a distance between electrodes. Therefore, when the distances between the electrodes are almost the same, electric fields applied to the liquid crystal layer 15 can be almost the same in the reflection portion 1001 and the transmission portion 1002; thus, it is possible to precisely control the liquid crystal molecule. In addition, since degrees of the liquid crystal molecule rotation are almost the same in the reflection portion 1001 and the transmission portion 1002, an image can be displayed with almost the same gradation in the case of display as a transmission type and in the case of display as a reflection type.

It is to be noted that the electrode 12 of the liquid crystal element is arranged entirely below the electrode 11 of the liquid crystal element; however, the present invention is not limited thereto. The electrode 12 of the liquid crystal element may be arranged at least in the transmission portion 1002.

It is to be noted that a contact hole may be formed in the insulating layer 16 to connect the electrode 12 of the liquid crystal element and the electrode 11 of the liquid crystal element.

Figure 24:
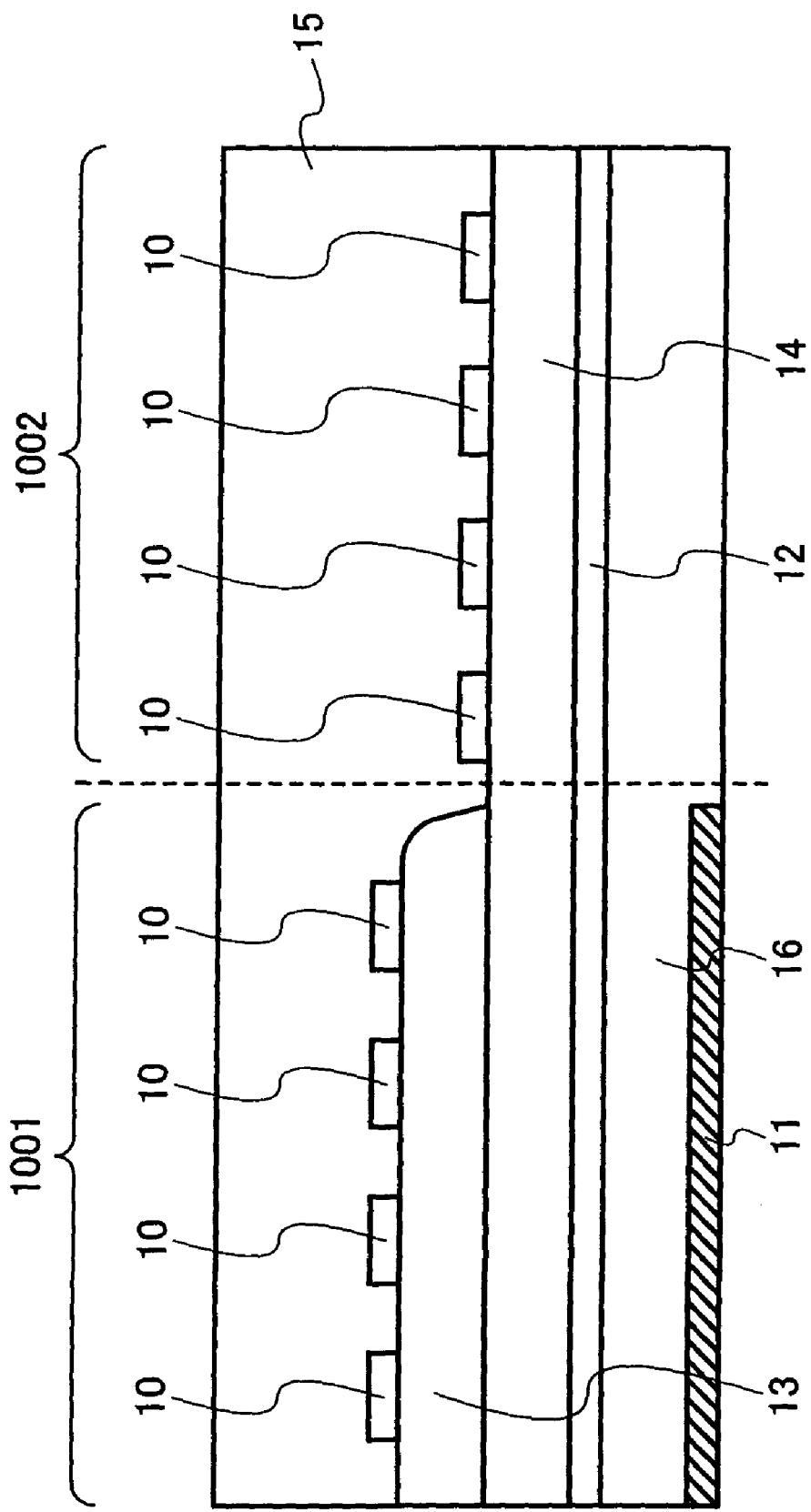
FIG. 24 is a view explaining one mode of a liquid crystal display device according to the present invention.

FIG. 24 shows a mode of a liquid crystal display device, which is different from the liquid crystal display device of FIG. 23, in that an electrode 11 of a liquid crystal element is provided in a lower layer of an electrode 12 of the liquid crystal element (in a layer provided apart from a liquid crystal layer 15).

It is to be noted that the electrode 12 of the liquid crystal element is also formed in a reflection portion 1001; however, the present invention is not limited thereto. The electrode 12 of the liquid crystal element may be arranged at least in a transmission portion 1002.

When the electrode 12 of the liquid crystal element is formed also in the reflection portion 1001, the liquid crystal layer 15 is controlled by voltage between the electrode 12 of the liquid crystal element and the electrode 11 of the liquid crystal element also in the reflection portion 1001. In such a case, the electrode 11 of the liquid crystal element serves only as a reflecting electrode, and the electrode 12 of the liquid crystal element serves as a common electrode in the reflection portion 1001.

Therefore, in such a case, arbitrary voltage is supplied to the electrode 11 of the liquid crystal element. The same voltage as that supplied to the electrode 12 of the liquid crystal element may be supplied, or the same voltage as that supplied to the electrode 10 of the liquid crystal element may be supplied. In that case, a capacitor is to be formed between the electrode 11 of the liquid crystal element and the electrode 12 of the liquid crystal element, and the capacitor can serve as a storage capacitor for storing an image signal.

It is to be noted that a contact hole may be formed in an insulating layer 16 to connect the electrode 12 of the liquid crystal element and the electrode 11 of the liquid crystal element.

Figure 89:
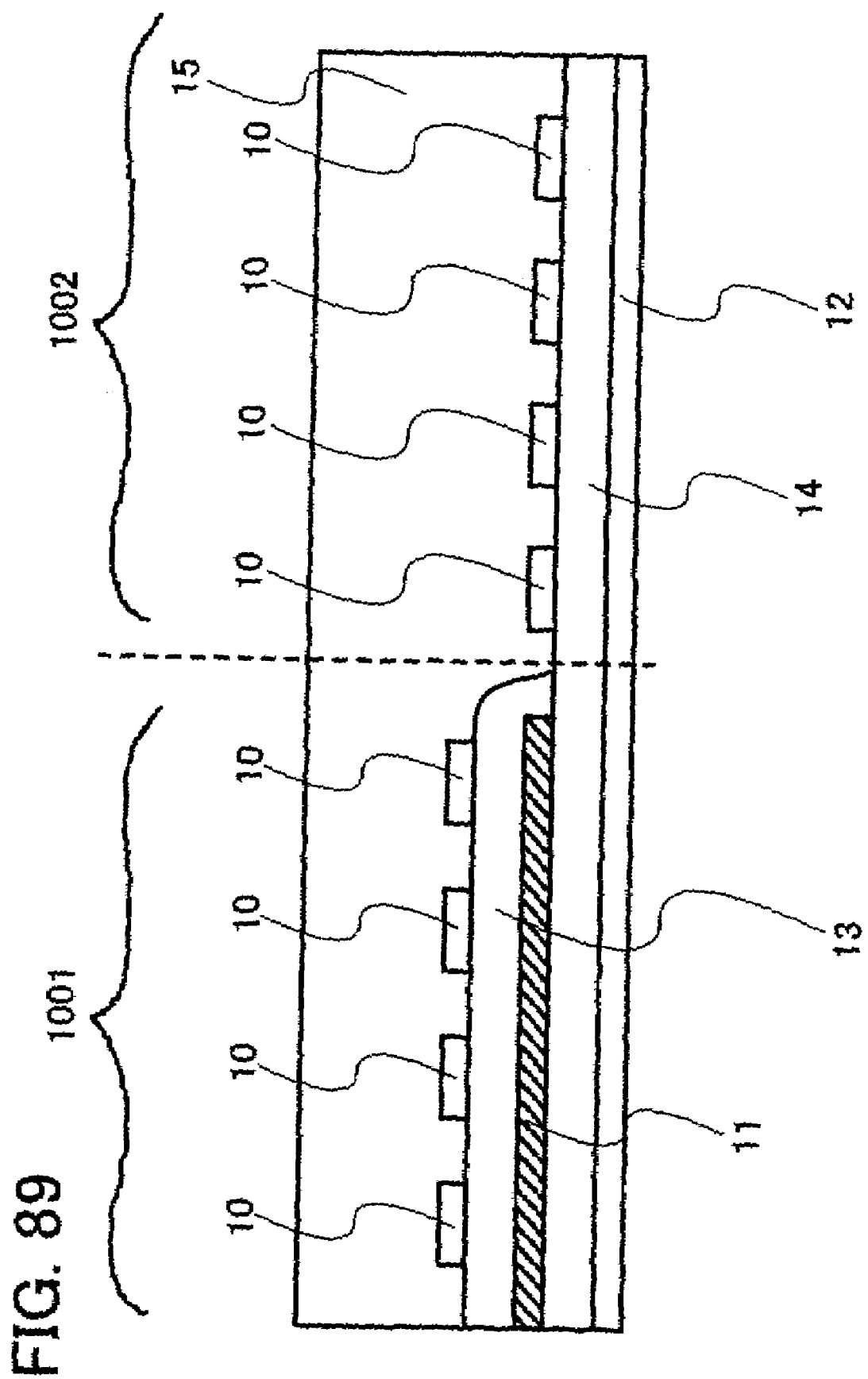
FIG. 89 is a view explaining one mode of a liquid crystal display device according to the present invention.

In FIG. 89, over an insulating layer 14, an electrode 11 of a liquid crystal element in a reflection portion 1001 and an electrode 10 of the liquid crystal element in a transmission portion 1002 are formed. Then, an insulating layer 13 is formed over the electrode 11 of the liquid crystal element, and an electrode 10 of the liquid crystal element in a reflection portion is formed thereover. An electrode 12 of the liquid crystal element is formed below the insulating layer 14.

It is to be noted that the electrode 12 of the liquid crystal element is also formed in the reflection portion 1001; however, the present invention is not limited thereto. The electrode 12 of the liquid crystal element may be arranged at least in the transmission portion 1002.

It is to be noted that a contact hole may be formed in the insulating layer 14 so as to connect the electrode 12 of the liquid crystal element and the electrode 11 of the liquid crystal element.

In FIGS. 20 to 24 and 89, the surface of the electrode is not shown as being uneven. However, as for the electrode 10 of the liquid crystal element, the electrode 11 of the liquid crystal element, and the electrode 12 of the liquid crystal element, the surface is not limited to be flat and may be uneven.

In addition, in FIGS. 20 to 24 and 89, the surfaces of the insulating layer 13, the insulating layer 14, and the insulating layer 16 are not shown as being uneven. However, as for the insulating layer 13, the insulating layer 14, and the insulating layer 16, the surfaces are not limited to be flat and may be uneven.

It is to be noted that, by forming plural pieces of large unevenness on the surface of the reflecting electrode, light can be diffused. Consequently, luminance of the display device can be improved. Therefore, the surfaces of the reflecting electrode and the transmitting electrode (the electrode 11 of the liquid crystal element and the electrode 12 of the liquid crystal element) shown in FIGS. 20 to 24 and 89 may be uneven.

It is to be noted that an uneven shape on the surface of the reflecting electrode may be a shape which can diffuse light as much as possible.

In the transmission portion 1002, the transmitting electrode is preferably not uneven so as not to disturb a direction, a distribution, and the like of an electric field. However, even when the transmitting electrode is uneven, there is no problem when display is not adversely affected.

Figure 25:
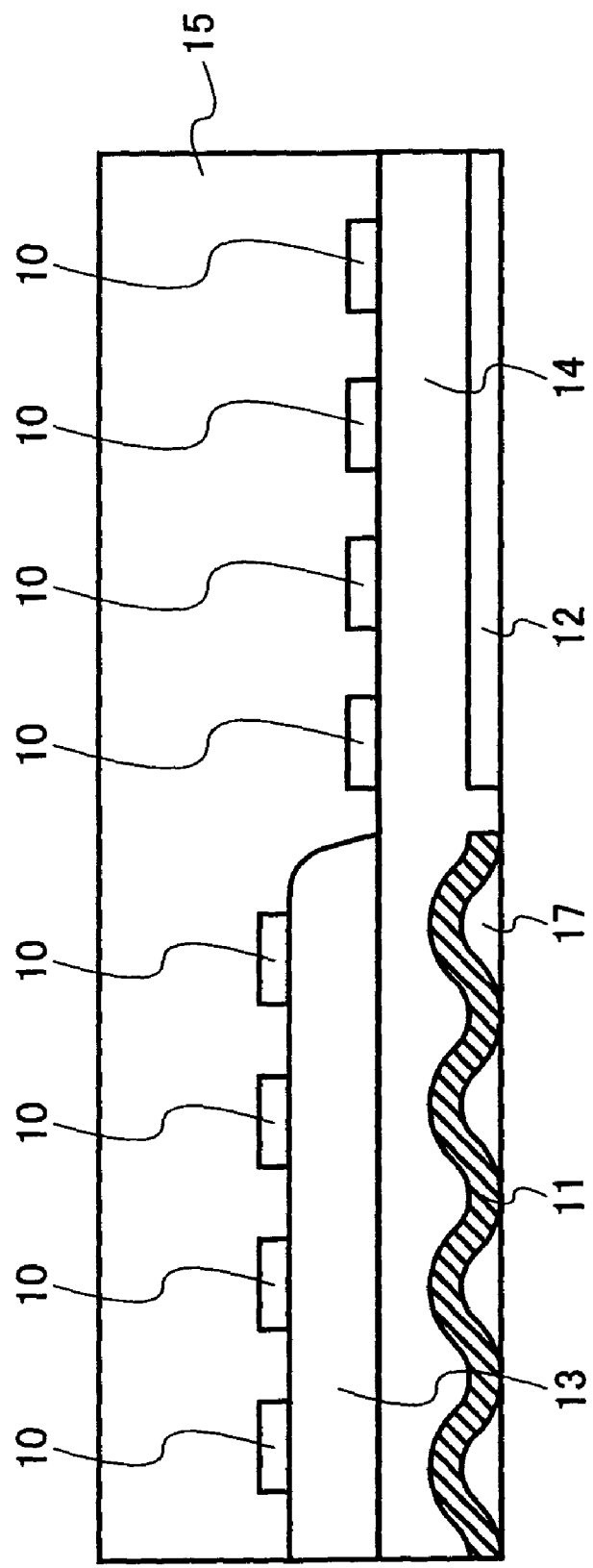
FIG. 25 is a view explaining one mode of a liquid crystal display device according to the present invention.
Figure 26:
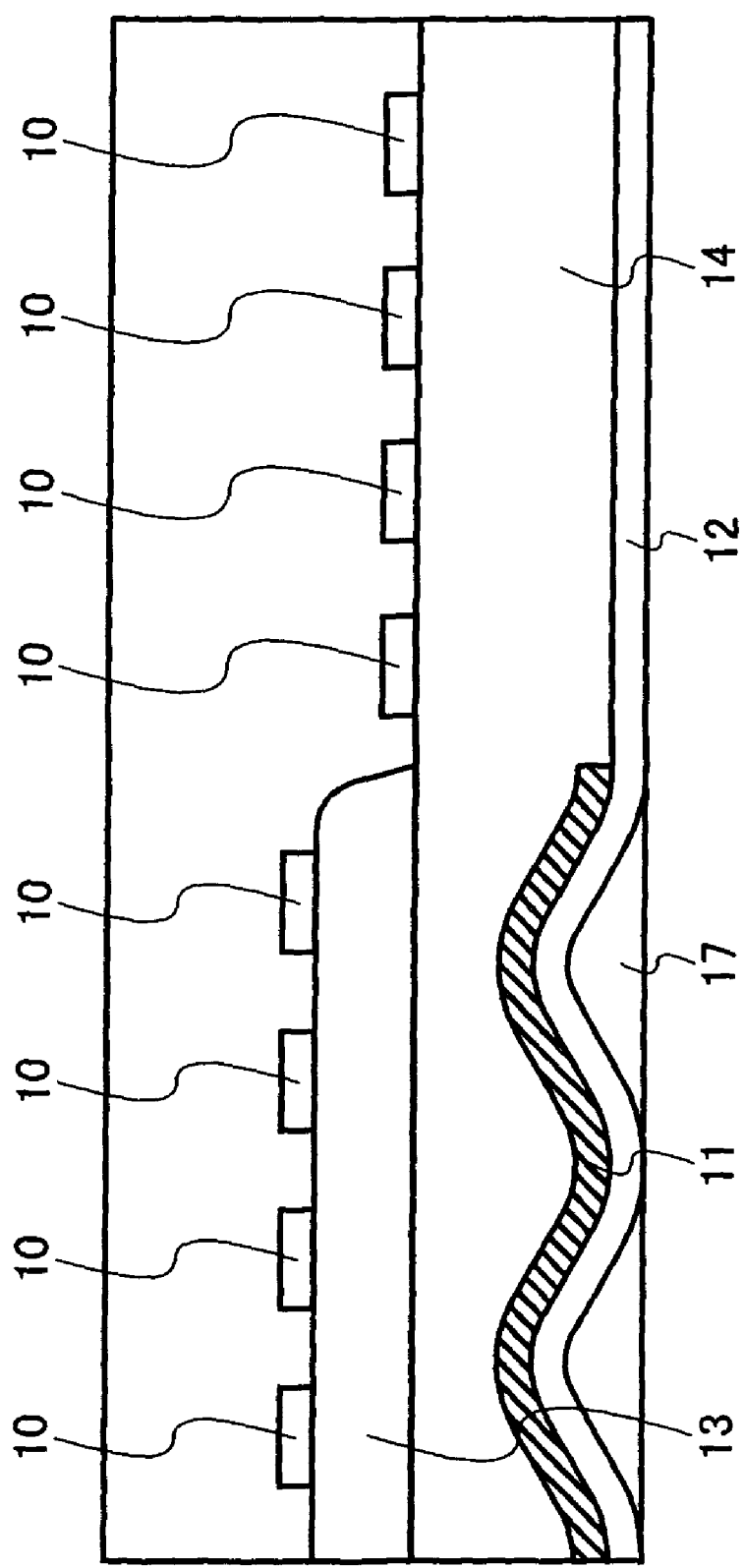
FIG. 26 is a view explaining one mode of a liquid crystal display device according to the present invention.
Figure 27:
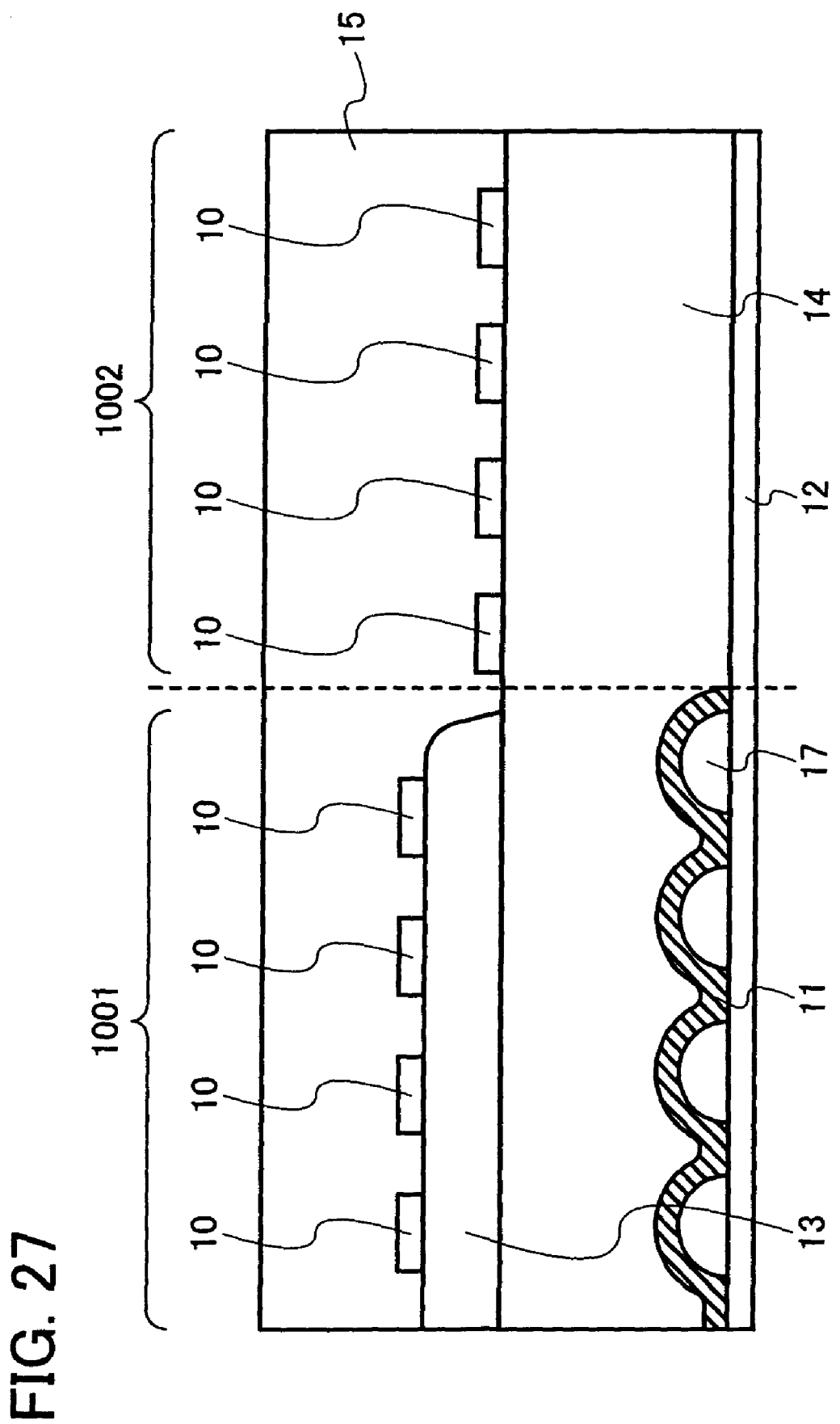
FIG. 27 is a view explaining one mode of a liquid crystal display device according to the present invention.
Figure 28:
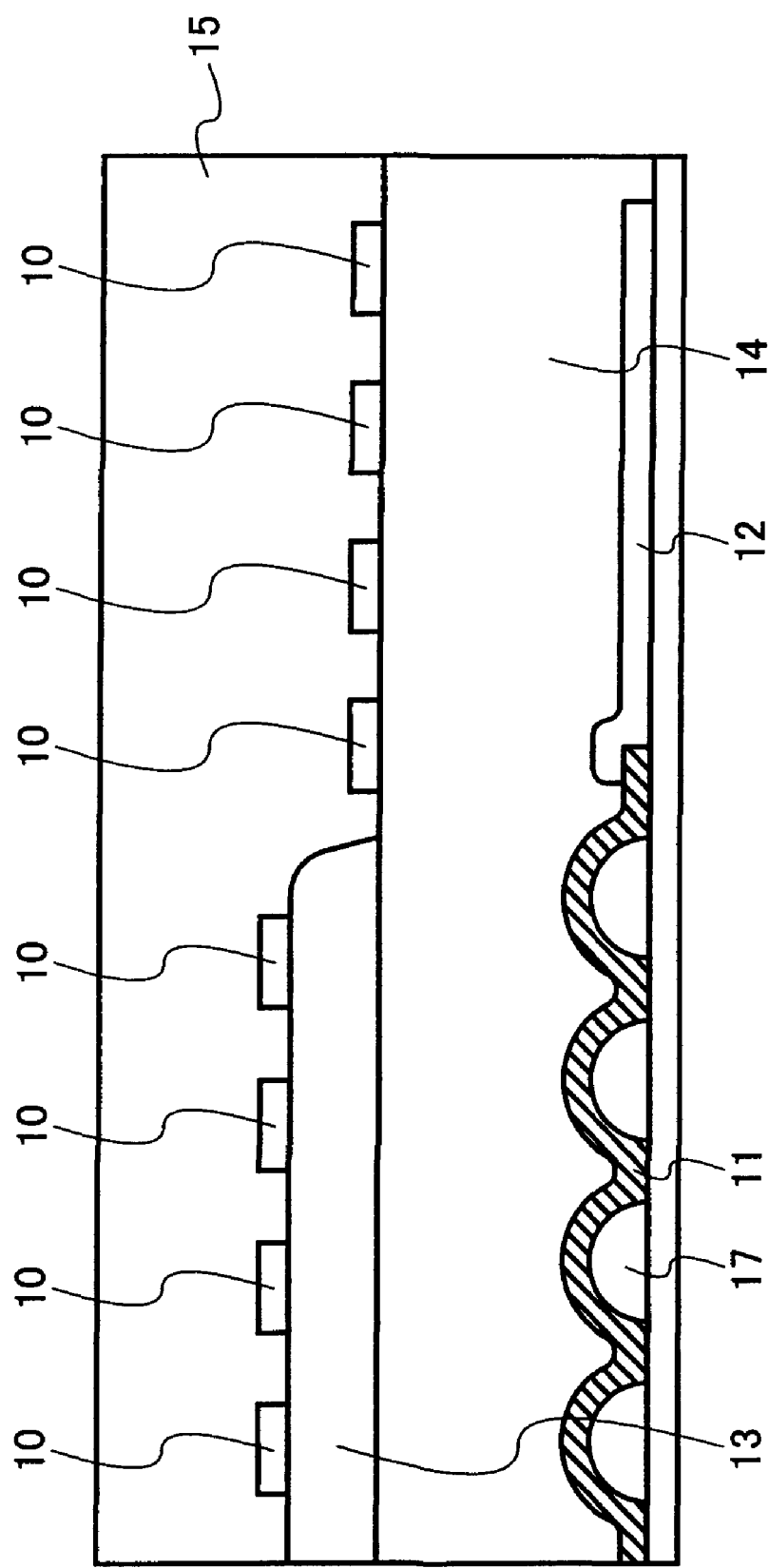
FIG. 28 is a view explaining one mode of a liquid crystal display device according to the present invention.
Figure 29:
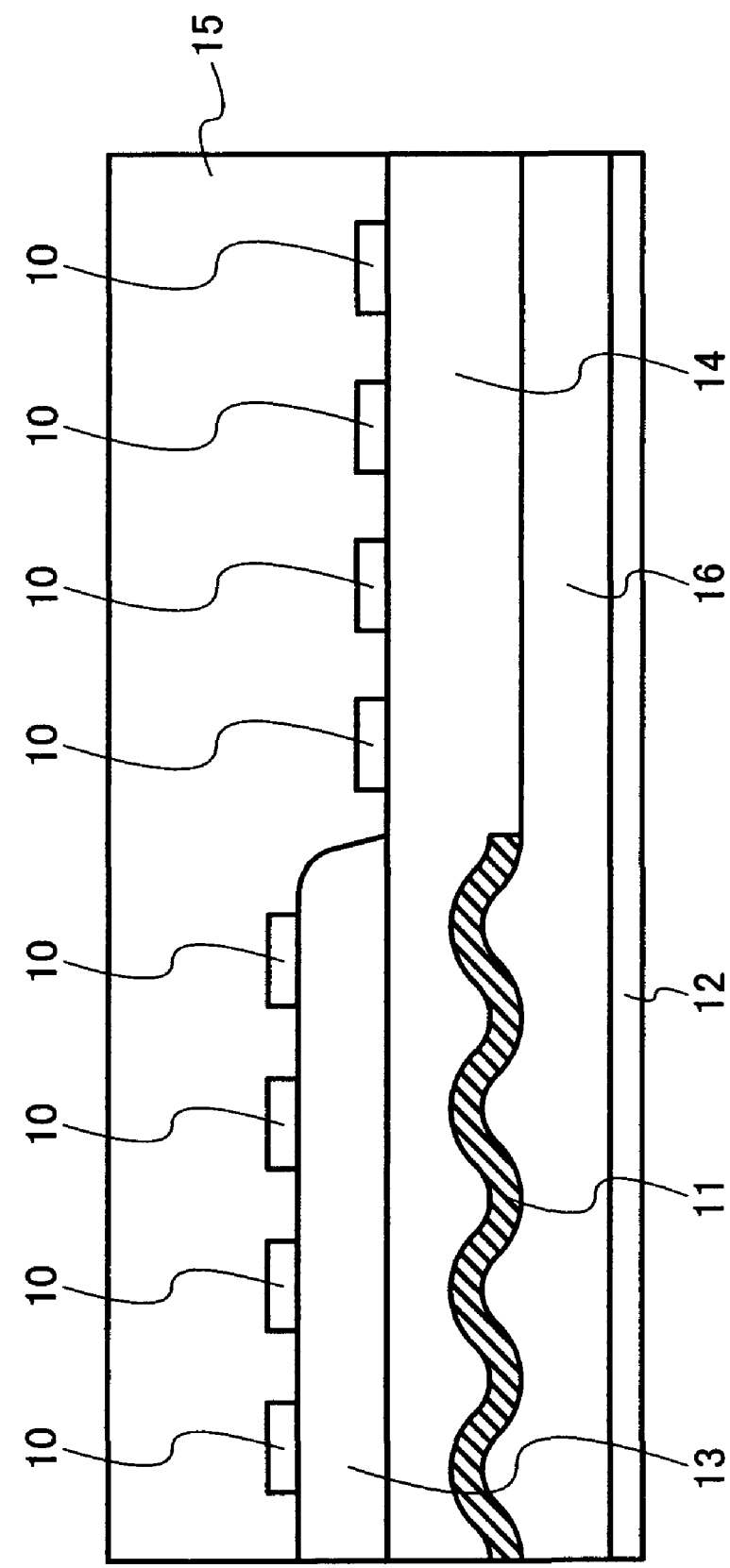
FIG. 29 is a view explaining one mode of a liquid crystal display device according to the present invention.
Figure 30:
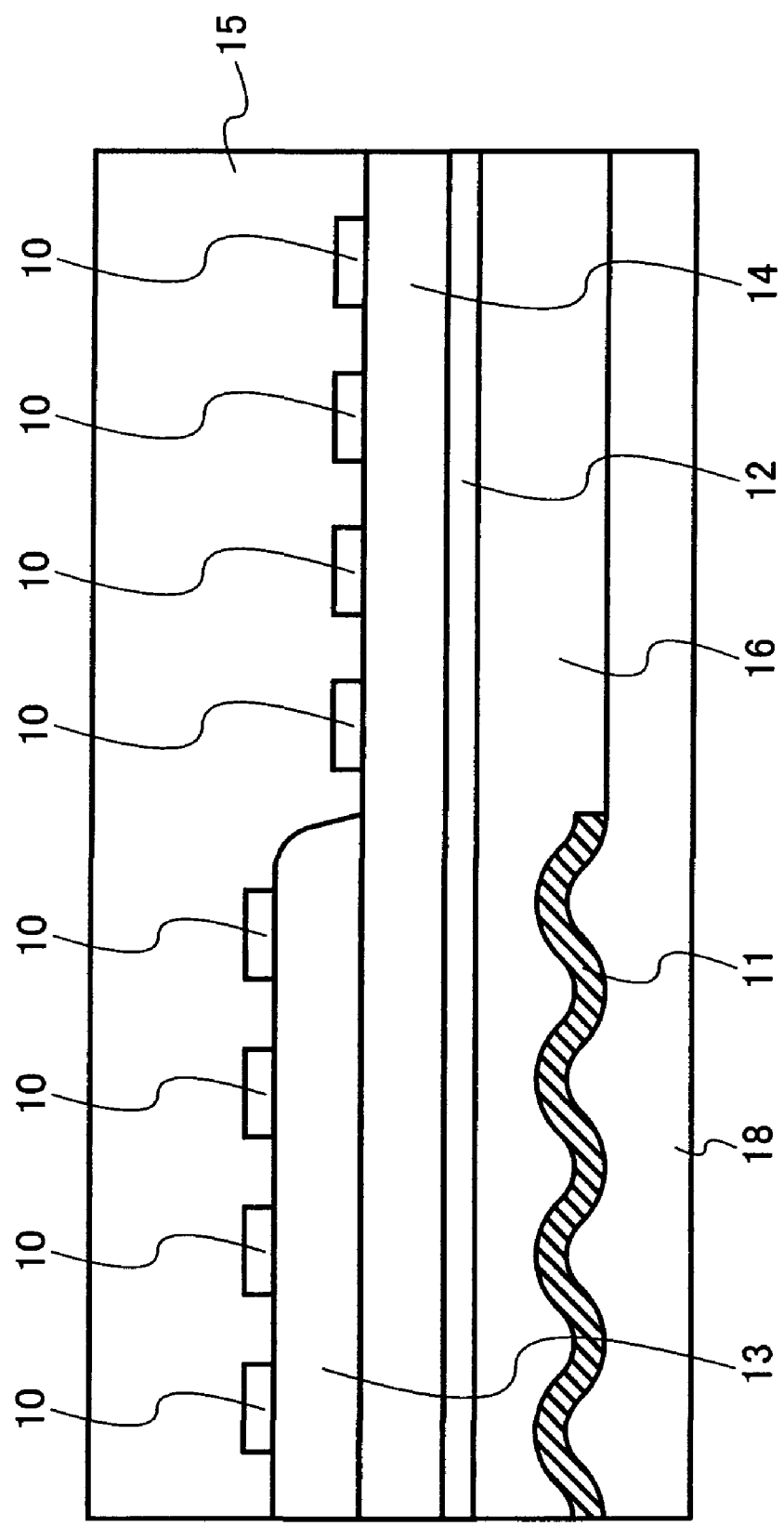
FIG. 30 is a view explaining one mode of a liquid crystal display device according to the present invention.

FIG. 25 shows the case where the surface of the reflecting electrode of FIG. 20 is uneven, FIGS. 26 and 27 each show the case where the surface of the reflecting electrode of FIG. 21 is uneven, FIG. 28 shows the case where the surface of the reflecting electrode of FIG. 22 is uneven, FIG. 29 shows the case where the surface of the reflecting electrode of FIG. 23 is uneven, and FIG. 30 shows the case where the surface of the reflecting electrode of FIG. 24 is uneven.

Accordingly, the description on the cases where the surface of the reflecting electrode is not uneven in FIGS. 20 to 24 and 89 can also be applied to the cases of FIGS. 25 to 30.

FIG. 25 shows a mode of a liquid crystal display device, which is different from the liquid crystal display device of FIG. 20, in that a scatterer 17 having a convex shape is provided below an electrode 11 of a liquid crystal element. When the scatterer 17 having a convex shape is provided and the surface of the electrode 11 of the liquid crystal element is made uneven, light can be scattered, and reduction in contrast due to reflection of light or reflecting can be prevented, thereby improving luminance.

It is preferable that the scatterer 17 has a shape which can diffuse light as much as possible. However, since an electrode or a wiring is arranged over the scatterer 17 in some cases, a smooth shape which does not disconnect the electrode or the wiring is desirable.

FIG. 26 shows a mode of a liquid crystal display device, which is different from the liquid crystal display device of FIG. 25, in that an electrode 11 of a liquid crystal element and an electrode 12 of the liquid crystal element are stacked.

Since an area where the electrode 12 of the liquid crystal element and the electrode 11 of the liquid crystal element are in close contact is large, contact resistance can be reduced.

FIG. 27 shows a mode of a liquid crystal display device, which is different from the liquid crystal display device of FIG. 26, in that a scatterer 17 is provided between an electrode 11 of a liquid crystal element and an electrode 12 of the liquid crystal element.

Since the scatterer 17 is formed after the electrode 12 of the liquid crystal element is formed, the electrode 12 of the liquid crystal element can be flat in a transmission portion 1002.

FIG. 28 shows a mode of a liquid crystal display device, which is different from the liquid crystal display device of FIG. 22, in that a scatterer 17 having a convex shape is provided below an electrode 11 of a liquid crystal element.

FIG. 29 shows a mode of a liquid crystal display device, which is different from the liquid crystal display device of FIG. 23, in that part of a surface of an insulating layer 16 is uneven. A surface of an electrode 11 of a liquid crystal element is made uneven in accordance with such a shape of the insulating layer 16.

FIG. 30 shows a mode of a liquid crystal display device, which is different from the liquid crystal display device of FIG. 24, in that an insulating layer 18 of which part of the surface is uneven is provided below an electrode 11 of a liquid crystal element, and thus, the surface of the electrode 11 of the liquid crystal element is made uneven.

Figure 84:
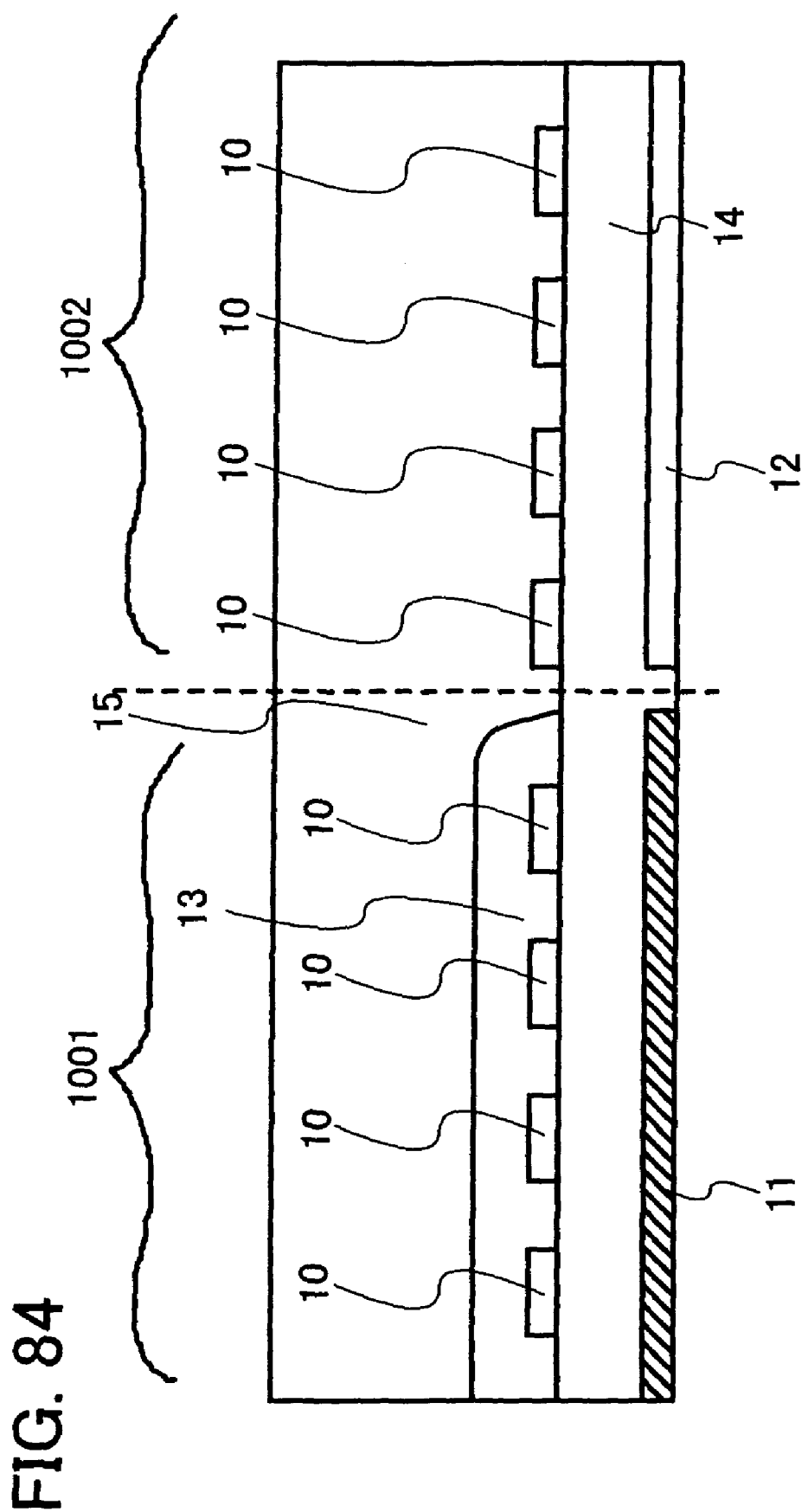
FIG. 84 is a view explaining one mode of a liquid crystal display device according to the present invention.

In FIGS. 20 to 30 and 89, the insulating layer 13 for adjusting a thickness of the liquid crystal layer 15 is formed below the electrode 10 of the liquid crystal element; however, the present invention is not limited thereto. As shown in FIG. 84, the insulating layer 13 for adjusting a thickness of the liquid crystal layer 15 may be arranged over the electrode 10 of the liquid crystal element. FIG. 84 corresponds to FIG. 20. Also in FIGS. 21 to 30 and 89, the insulating layer 13 for adjusting a thickness of the liquid crystal layer 15 can be arranged over the electrode 10 of the liquid crystal element, similarly to FIG. 84.

In FIGS. 20 to 30, 89, and 84, the insulating layer 13 for adjusting a thickness of the liquid crystal layer 15 is arranged on the substrate side provided with the electrode 10 of the liquid crystal element; however, the present invention is not limited thereto. The insulating layer 13 for adjusting a thickness may also be arranged on the counter substrate side.

When the insulating layer 13 for adjusting a thickness of the liquid crystal layer 15 is arranged on the counter substrate side, the electrodes 10 of the liquid crystal element can be arranged in the same plane in both the reflection portion 1001 and the transmission portion 1002. Therefore, distances between the pixel electrode and the common electrode can be almost the same in the transmission portion 1002 and in the reflection portion 1001. A direction, a distribution, intensity, and the like of an electric field are changed depending on a distance between electrodes. Therefore, when the distances between the electrodes are almost the same, electric fields applied to the liquid crystal layer 15 can be almost the same in the reflection portion 1001 and the transmission portion 1002; thus, it is possible to precisely control the liquid crystal molecule. In addition, since degrees of liquid crystal molecule rotation are almost the same in the reflection portion 1001 and the transmission portion 1002, an image can be displayed with almost the same gradation in the case of display as a transmission type and in the case of display as a reflection type.

In addition, the insulating layer 13 for adjusting a thickness of the liquid crystal layer 15 can cause a disordered alignment mode of the liquid crystal molecule in the neighborhood thereof, and a defect such as disclination is possibly generated. However, when the insulating layer 13 for adjusting a thickness of the liquid crystal layer 15 is arranged over the counter substrate, the insulating layer 13 for adjusting a thickness can be apart from the electrode 10 of the liquid crystal element. Accordingly, a low electric field is applied, thereby preventing a disordered alignment mode of the liquid crystal molecule and a hard-to-see screen.

Further, over the counter electrode, only a color filter, a black matrix, and the like are formed; thus, the number of steps is small. Accordingly, even when the insulating layer 13 for adjusting a thickness of the liquid crystal layer 15 is formed over the counter substrate, the yield is not easily reduced. Even if a defect is generated, not so much manufacturing cost is wasted because of the small number of steps and inexpensive cost.

Figure 31:
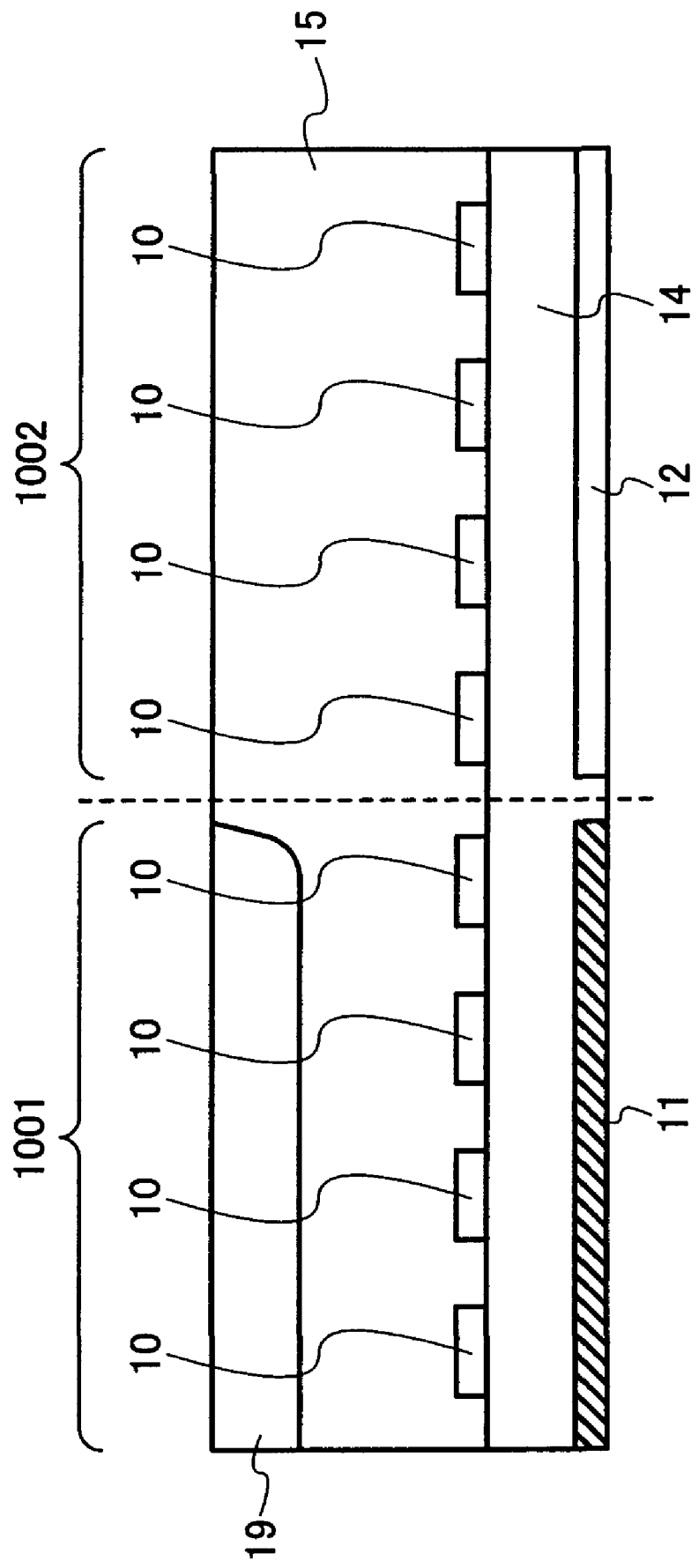
FIG. 31 is a view explaining one mode of a liquid crystal display device according to the present invention.
Figure 32:
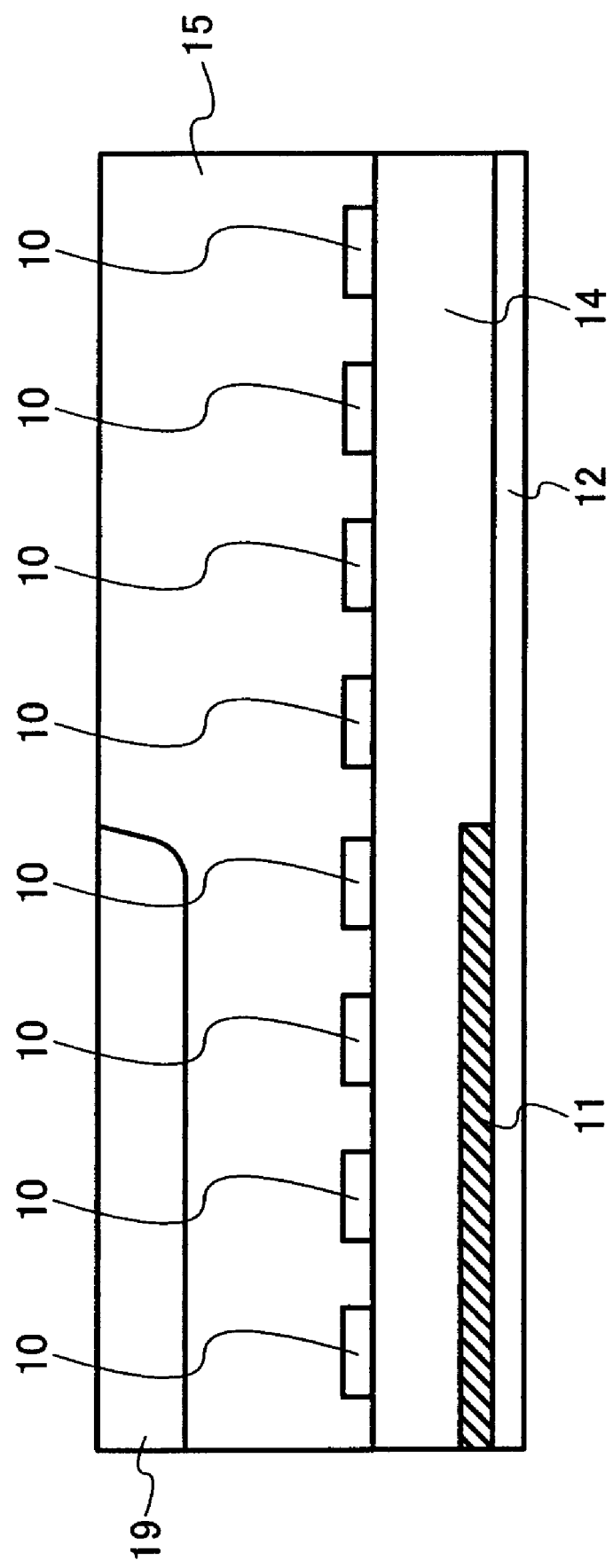
FIG. 32 is a view explaining one mode of a liquid crystal display device according to the present invention.
Figure 33:
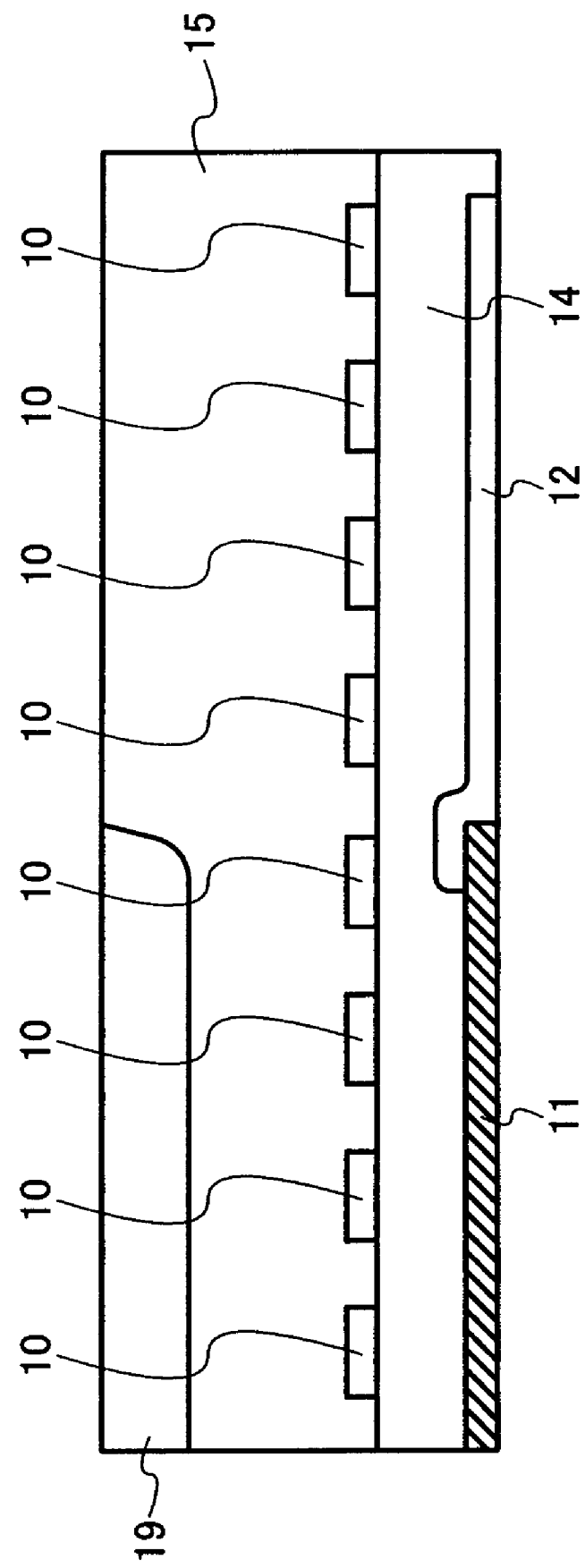
FIG. 33 is a view explaining one mode of a liquid crystal display device according to the present invention.
Figure 34:
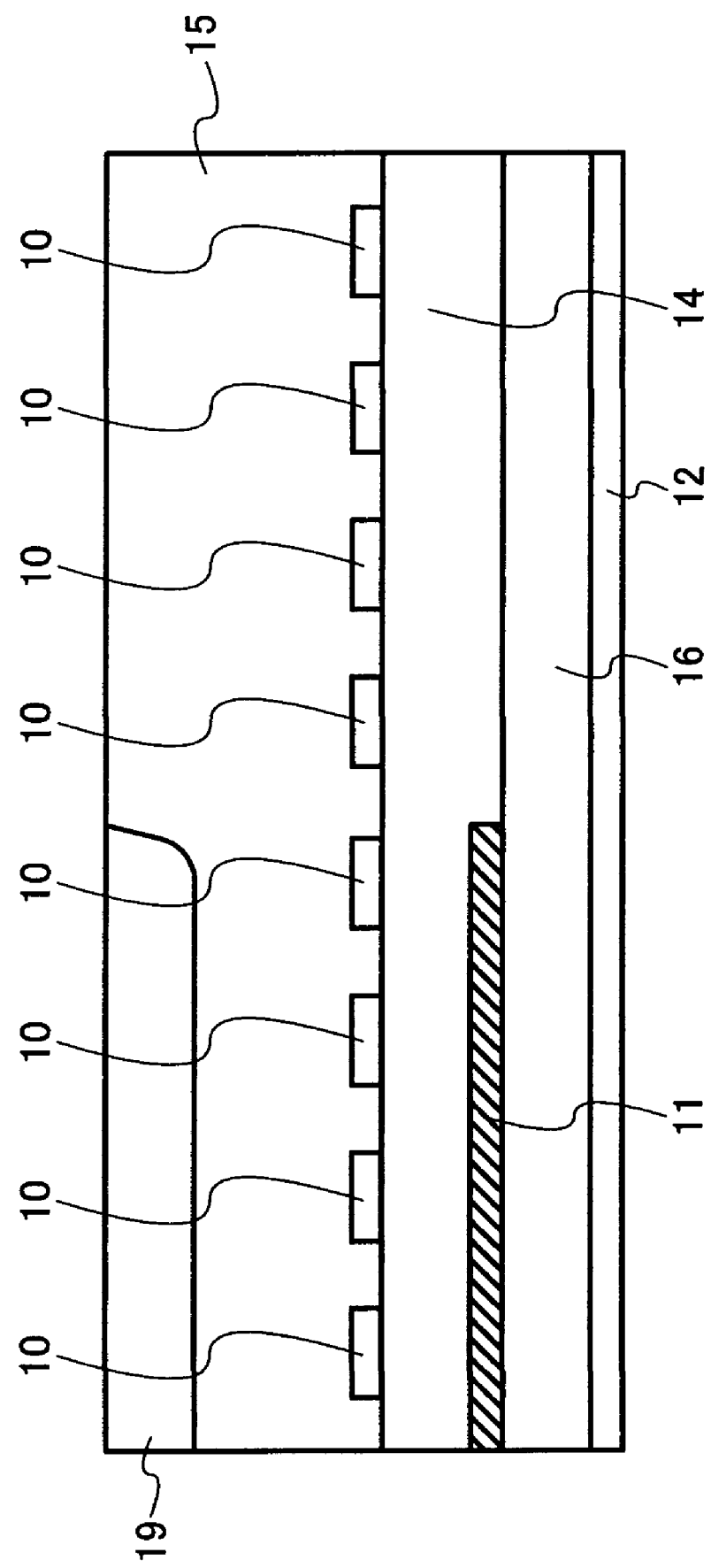
FIG. 34 is a view explaining one mode of a liquid crystal display device according to the present invention.
Figure 35:
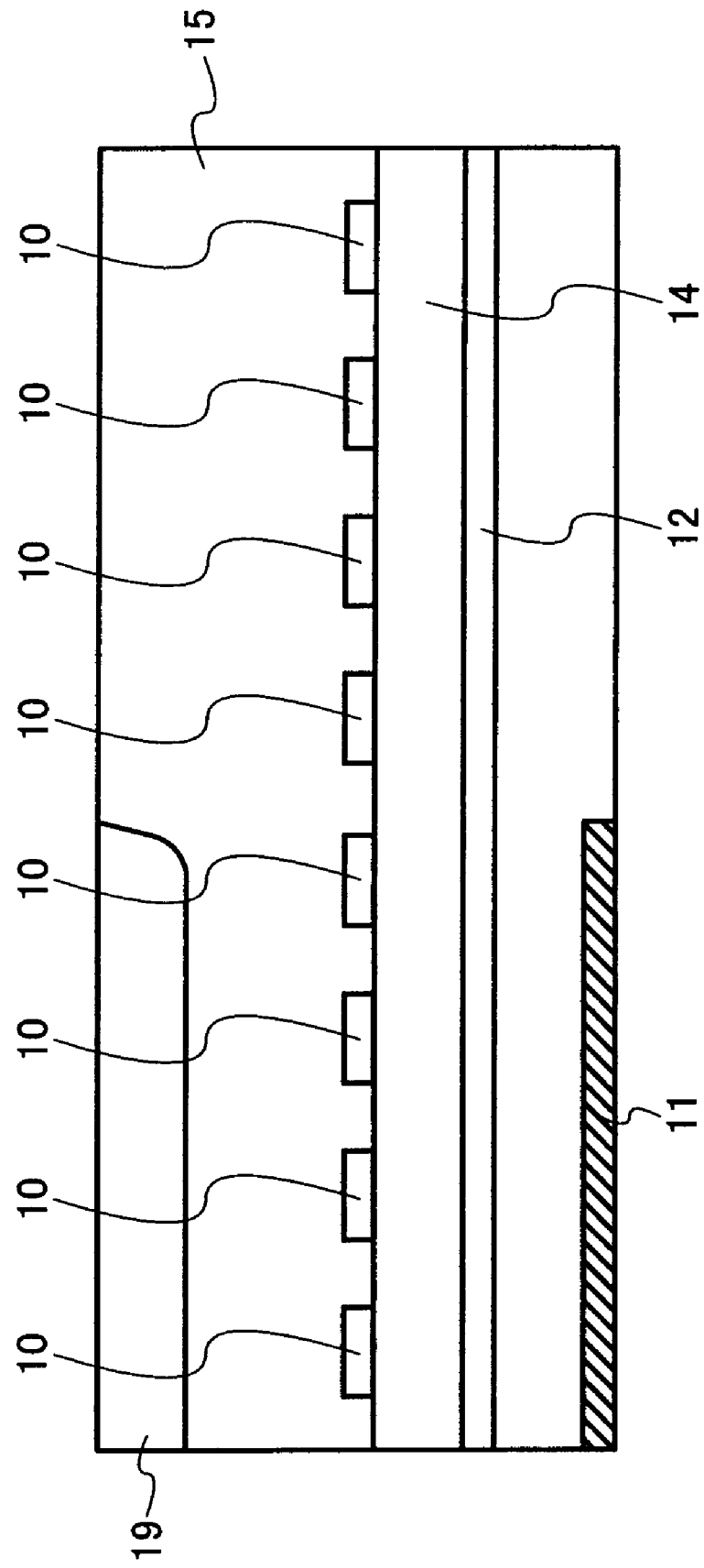
FIG. 35 is a view explaining one mode of a liquid crystal display device according to the present invention.

FIG. 31 shows the case where the counter substrate of FIG. 20 is provided with a film for adjusting a thickness, FIG. 32 shows the case where the counter substrate of FIG. 21 is provided with a film for adjusting a thickness, FIG. 33 shows the case where the counter substrate of FIG. 22 is provided with a film for adjusting a thickness, FIG. 34 shows the case where the counter substrate of FIG. 23 is provided with a film for adjusting a thickness, and FIG. 35 shows the case where the counter substrate of FIG. 24 is provided with a film for adjusting a thickness.

Therefore, the description on FIGS. 20 to 24, 89, and 84 can also be applied to the cases of FIGS. 31 to 35.

FIG. 31 shows a mode of a liquid crystal display device, which is different from the liquid crystal display device of FIG. 20, in that an insulating layer 19 for adjusting a thickness of a liquid crystal layer 15 is provided on a side opposite to an electrode 10 of a liquid crystal element with the liquid crystal layer 15 interposed therebetween in a reflection portion 1001, and further, the electrode 10 of the liquid crystal element is provided over an insulating layer 14.

FIG. 32 shows a mode of a liquid crystal display device, which is different from the liquid crystal display device of FIG. 21, in that an insulating layer 19 for adjusting a thickness of a liquid crystal layer 15 is provided on a side opposite to an electrode 10 of a liquid crystal element with the liquid crystal layer 15 interposed therebetween in a reflection portion 1001, and further, the electrode 10 of the liquid crystal element is provided over an insulating layer 14.

FIG. 33 shows a mode of a liquid crystal display device, which is different from the liquid crystal display device of FIG. 22, in that an insulating layer 19 for adjusting a thickness of a liquid crystal layer 15 is provided on a side opposite to an electrode 10 of a liquid crystal element with the liquid crystal layer 15 interposed therebetween in a reflection portion 1001, and further, the electrode 10 of the liquid crystal element is provided over an insulating layer 14.

FIG. 34 shows a mode of a liquid crystal display device, which is different from the liquid crystal display device of FIG. 23, in that an insulating layer 19 for adjusting a thickness of a liquid crystal layer 15 is provided on a side opposite to an electrode 10 of a liquid crystal element with the liquid crystal layer 15 interposed therebetween in a reflection portion 1001, and further, the electrode 10 of the liquid crystal element is provided over an insulating layer 14.

FIG. 35 shows a mode of a liquid crystal display device, which is different from the liquid crystal display device of FIG. 25, in that an insulating layer 19 for adjusting a thickness of a liquid crystal layer 15 is provided on a side opposite to an electrode 10 of a liquid crystal element with the liquid crystal layer 15 interposed therebetween in a reflection portion 1001, and further, the electrode 10 of the liquid crystal element is provided over an insulating layer 14.

In FIGS. 31 to 35, the surface of the electrode is not shown as being uneven. However, as for the electrode 10 of the liquid crystal element, the electrode 11 of the liquid crystal element, and the electrode 12 of the liquid crystal element, the surface is not limited to be flat and may be uneven.

In addition, in FIGS. 31 to 35, the surfaces of the insulating layer 14 and the insulating layer 16 are not shown as being uneven. However, as for the insulating layer 14, the insulating layer 16, and the like, the surfaces are not limited to be flat and may be uneven.

It is to be noted that, by forming plural pieces of large unevenness on the surface of the reflecting electrode, light can be diffused. Consequently, luminance of the display device can be improved. Therefore, the surfaces of the reflecting electrode and the transmitting electrode (the electrode 11 of the liquid crystal element and the electrode 12 of the liquid crystal element) shown in FIGS. 31 to 35 may be uneven.

It is to be noted that an uneven shape on the surface of the reflecting electrode may be a shape which can diffuse light as much as possible.

In the transmission portion 1002, the transmitting electrode is preferably not uneven so as not to disturb a direction, a distribution, and the like of an electric field. However, even when the transmitting electrode is uneven, there is no problem when display is not adversely affected.

Figure 36:
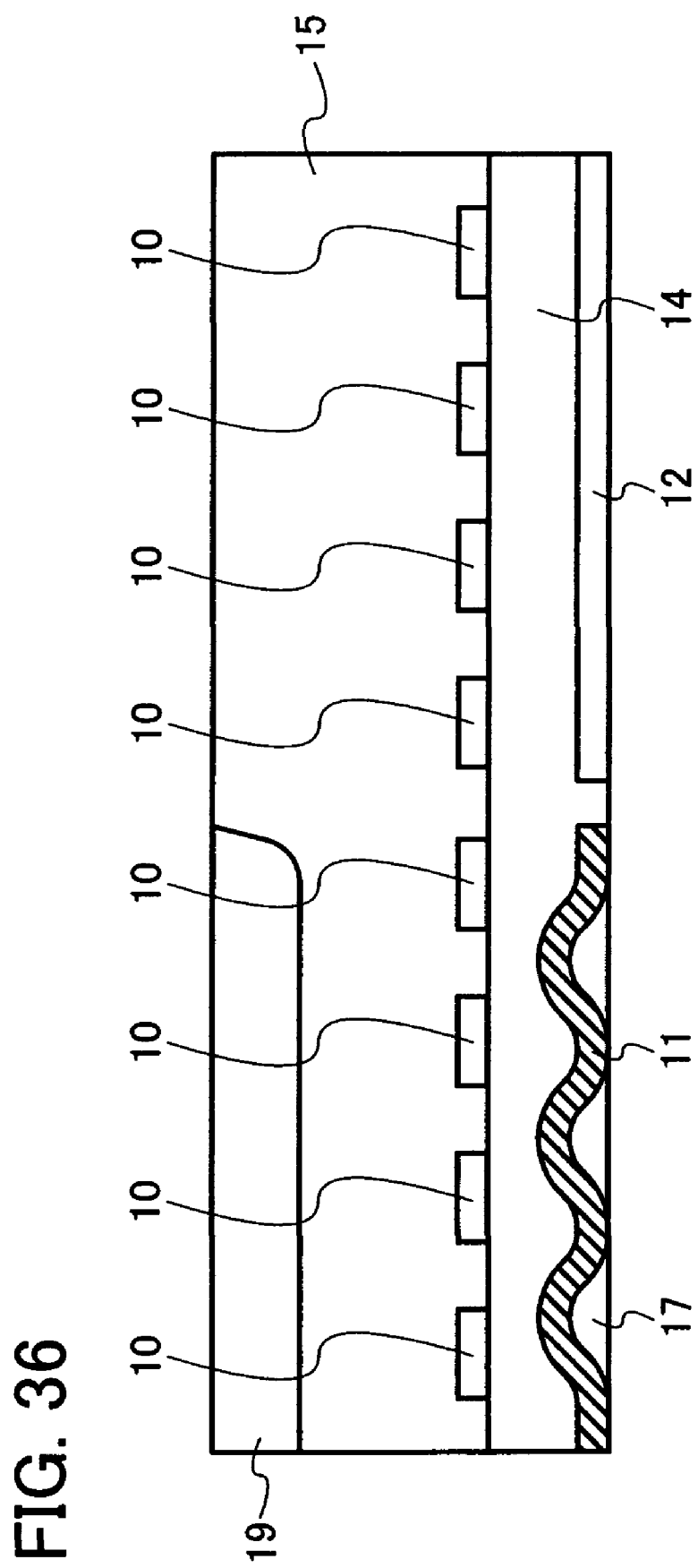
FIG. 36 is a view explaining one mode of a liquid crystal display device according to the present invention.

This is the same as in the case where FIGS. 25 to 30 respectively correspond to FIGS. 20 to 24, 89, and 84 by providing the electrode with an uneven surface. That is, the surface of the reflecting electrode may be uneven in FIGS. 31 to 35. FIG. 36 shows an example in which the surface of the reflecting electrode of FIG. 31 is uneven. The same also applies to FIGS. 32 to 35.

It is to be noted that the description in FIG. 31 on the case where the surface of the reflecting electrode is not uneven can also be applied to the case of FIG. 36.

FIG. 36 shows a mode of a liquid crystal display device, which is different from the liquid crystal display device of FIG. 31, in that an insulating layer 19 for adjusting a thickness of a liquid crystal layer 15 is provided on a side opposite to an electrode 10 of a liquid crystal element with the liquid crystal layer 15 interposed therebetween, and further, the electrode 10 of the liquid crystal element is provided over an insulating layer 14.

Figure 85:
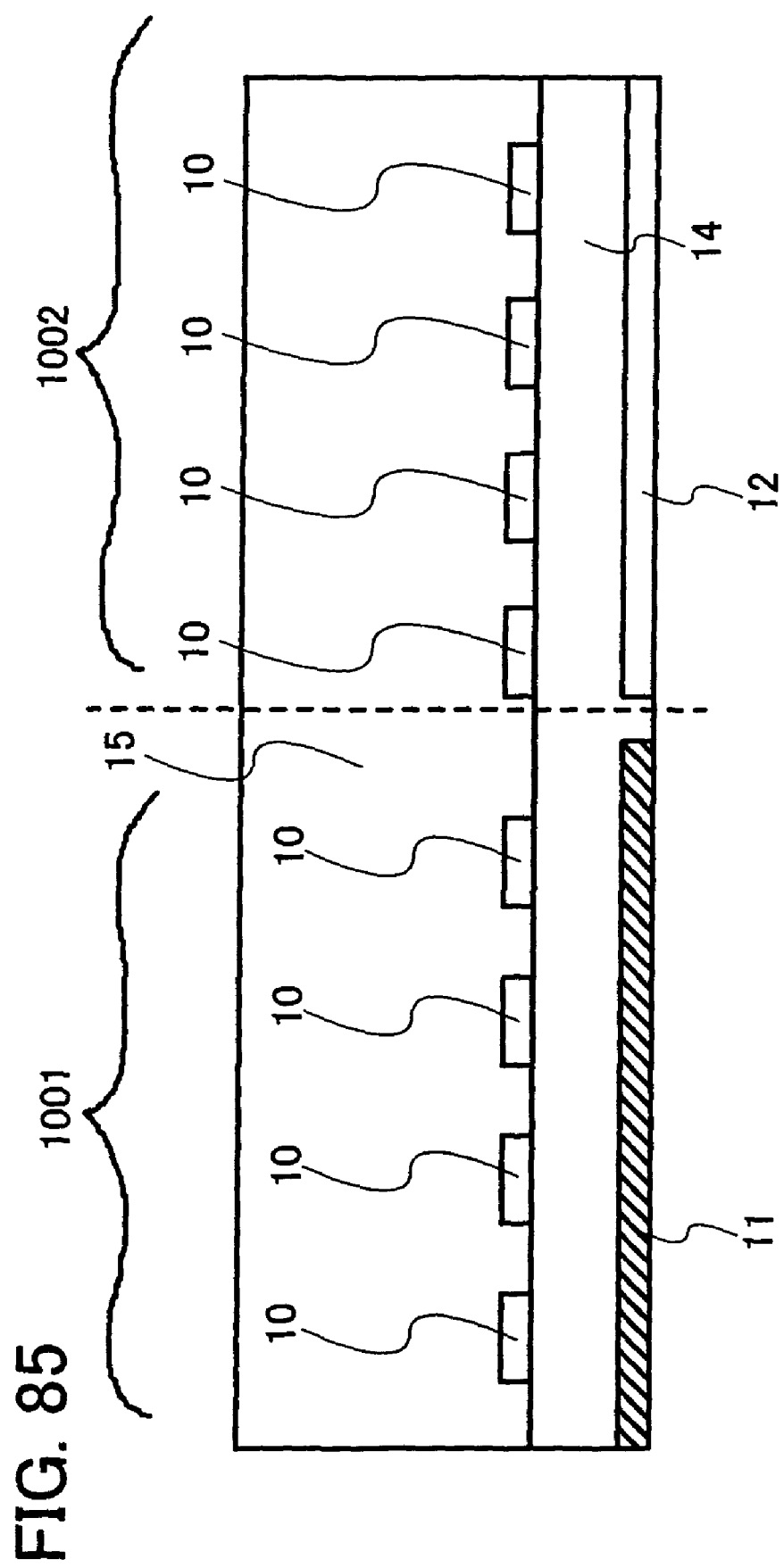
FIG. 85 is a view explaining one mode of a liquid crystal display device according to the present invention.

In FIGS. 20 to 36, 84, and 89, the insulating layer 13 for adjusting a thickness of the liquid crystal layer 15 is arranged on the substrate side provided with the electrode 10 of the liquid crystal element or on the counter substrate side; however, the present invention is not limited thereto. The insulating layer 13 for adjusting a thickness of the liquid crystal layer 15 is not required to be arranged. FIG. 85 shows such a case. FIG. 85 corresponds to FIGS. 20 and 31. Also in FIGS. 20 to 36, 84, and 89, which are the cases other than FIGS. 20 and 31, the insulating layer 13 for adjusting a thickness of the liquid crystal layer 15 is not required to be arranged, similarly to FIG. 85.

When the insulating layer 13 for adjusting a thickness of the liquid crystal layer 15 is not arranged, a traveling distance of light which passes through the liquid crystal layer is different in the reflection portion and the transmission portion. Therefore, an object which changes a polarized state of light, such as a wave plate (such as a λ/4 plate) or a material which has refractive index anisotropy (such as liquid crystal) is preferably arranged in a path through which light passes. For example, when the wave plate is arranged between the polarizing plate and the counter substrate on a side of the counter substrate, which is not in contact with the liquid crystal layer, the same transmission state of light can be made in the reflection portion and the transmission portion.

In FIGS. 20 to 36, 84, 85, and 89 or in the description up to here, in the transmission portion 1002, the electrodes 10 of the liquid crystal element are formed in the same plane in some cases; however, the present invention is not limited thereto. The electrodes 10 of the liquid crystal element may also be formed in different planes.

Similarly, in FIGS. 20 to 36, 84, 85, and 89 or in the description up to here, in the reflection portion 1001, the electrodes 10 of the liquid crystal element are formed in the same plane in some cases; however, the present invention is not limited thereto. The electrodes 10 of the liquid crystal element may also be formed in different planes.

In FIGS. 20 to 36, 84, 85, and 89 or in the description up to here, in the reflection portion 1001, the electrode 11 of the liquid crystal element and the electrode 12 of the liquid crystal element have a planar shape and are formed entirely in the pixel portion in some cases; however, the present invention is not limited thereto. The electrode 11 of the liquid crystal element and the electrode 12 of the liquid crystal element may also have a comb-shape having a slit or a gap.

In FIGS. 20 to 36, 84, 85, and 89 or in the description up to here, in the transmission portion 1002, the electrode 12 of the liquid crystal element has a planar shape and is formed entirely in the pixel portion in some cases; however, the present invention is not limited thereto. The electrode 12 of the liquid crystal element may also have a comb-shape having a slit or a gap.

In FIGS. 20 to 36, 84, 85, and 89 or in the description up to here, in the reflection portion 1001, the electrode 11 of the liquid crystal element and the electrode 12 of the liquid crystal element are arranged below the electrode 10 of the liquid crystal element in some cases; however, the present invention is not limited thereto. As far as the electrode 11 of the liquid crystal element and the electrode 12 of the liquid crystal element have a comb-shape having a slit or a gap, they may be formed in the same plane as that of the electrode 10 of the liquid crystal element or over the electrode 10 of the liquid crystal element.

The case where the electrode 12 of the liquid crystal element has a comb-shape having a slit or a gap in the transmission portion is described. In this case, the electrode 12 of the liquid crystal element can be formed concurrently with the electrode 10 of the liquid crystal element in some cases. Consequently, the manufacturing process can be simplified, the number of steps can be reduced, and the number of masks (the number of reticles) can be reduced. Accordingly, the cost can be reduced.

Figure 37:
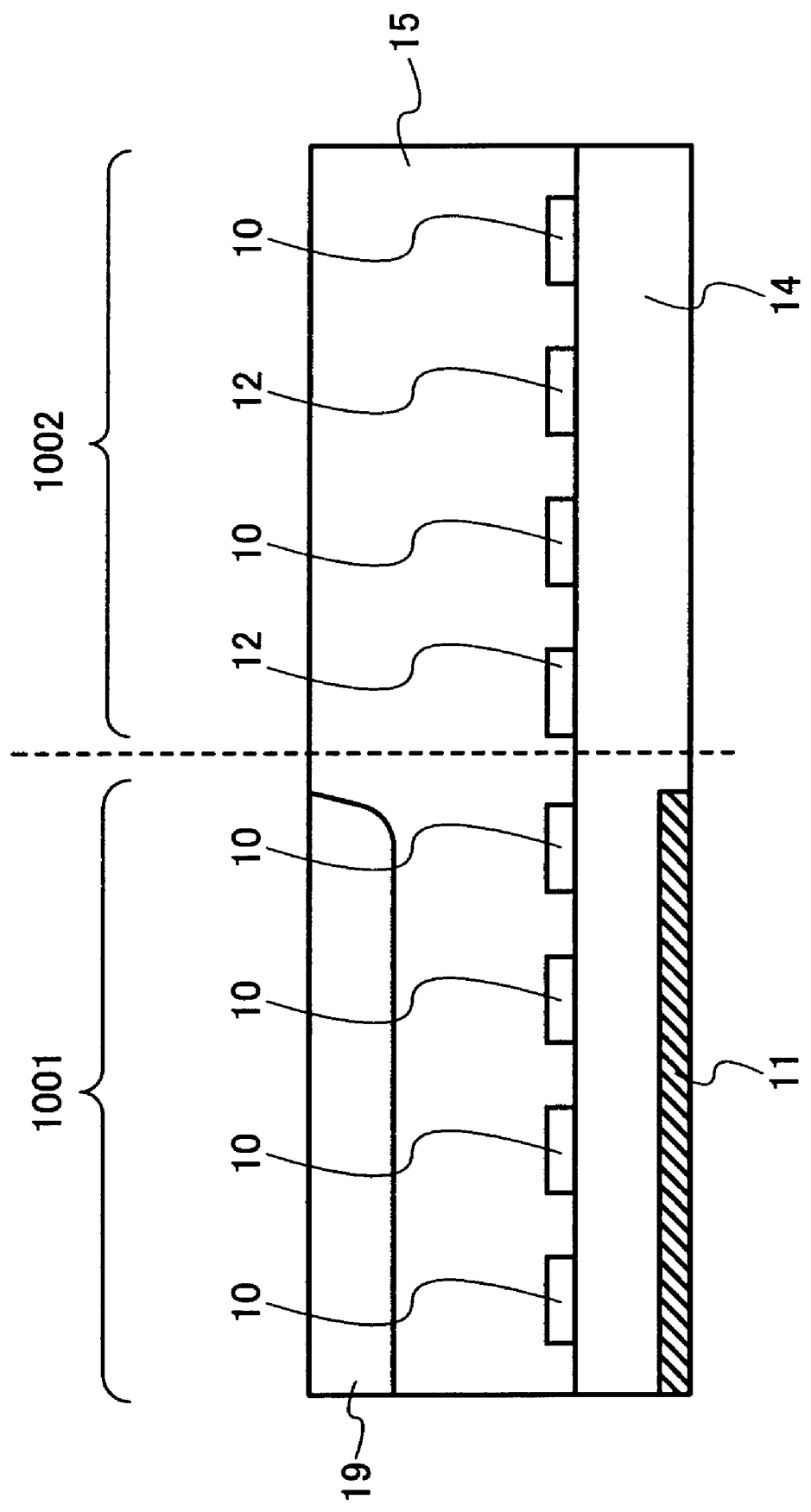
FIG. 37 is a view explaining one mode of a liquid crystal display device according to the present invention.
Figure 38:
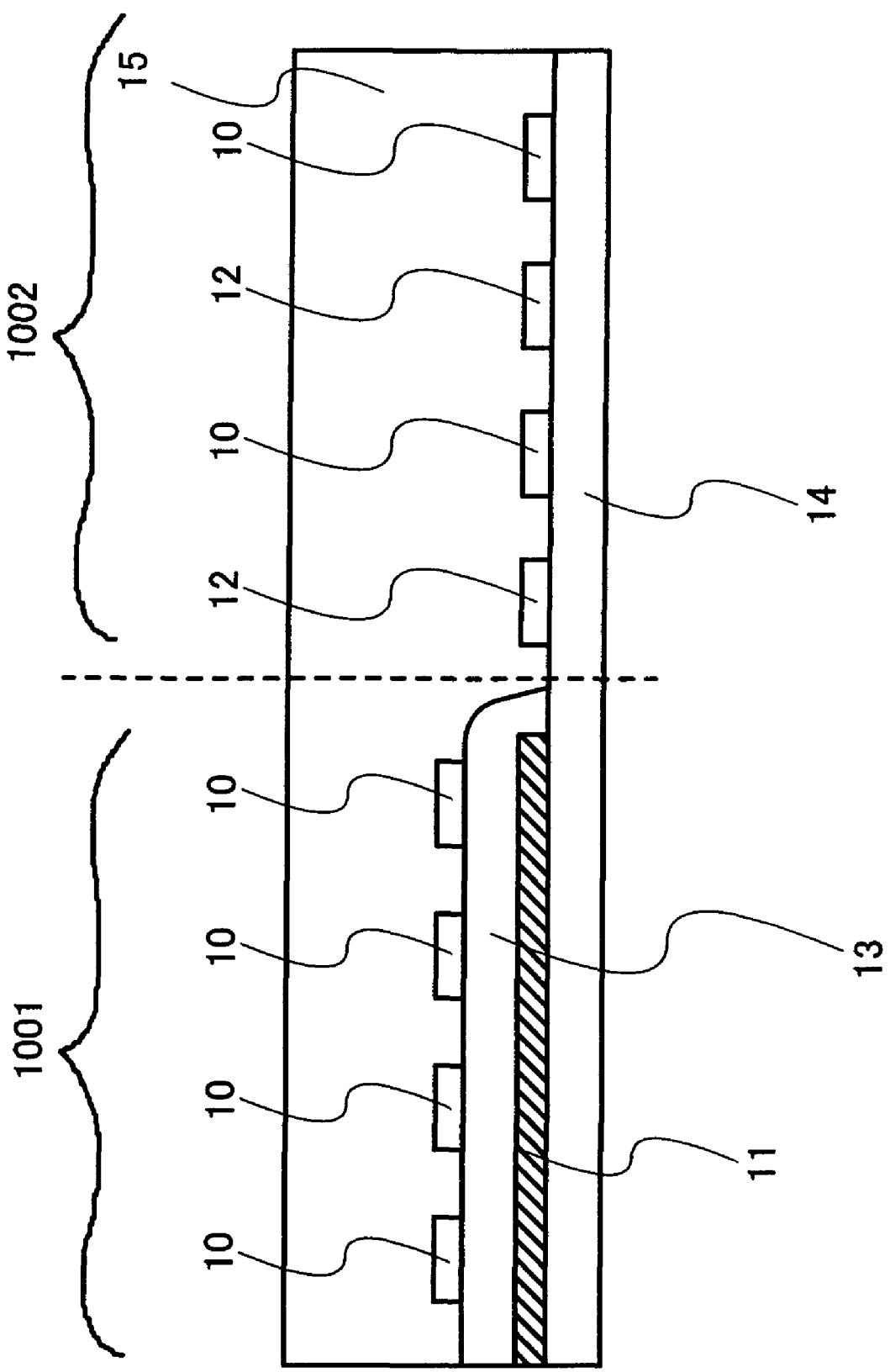
FIG. 38 is a view explaining one mode of a liquid crystal display device according to the present invention.
Figure 87:
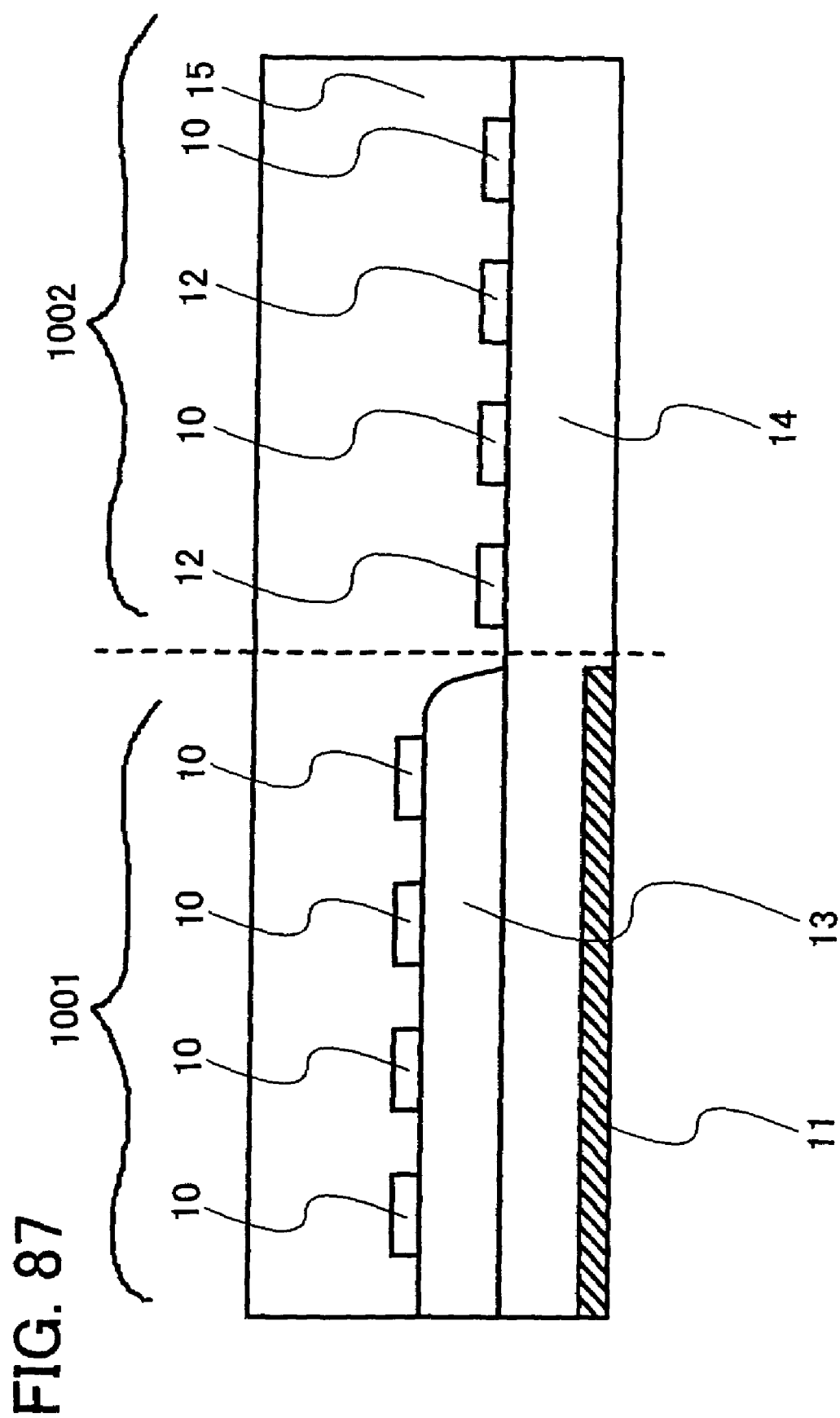
FIG. 87 is a view explaining one mode of a liquid crystal display device according to the present invention.
Figure 88:
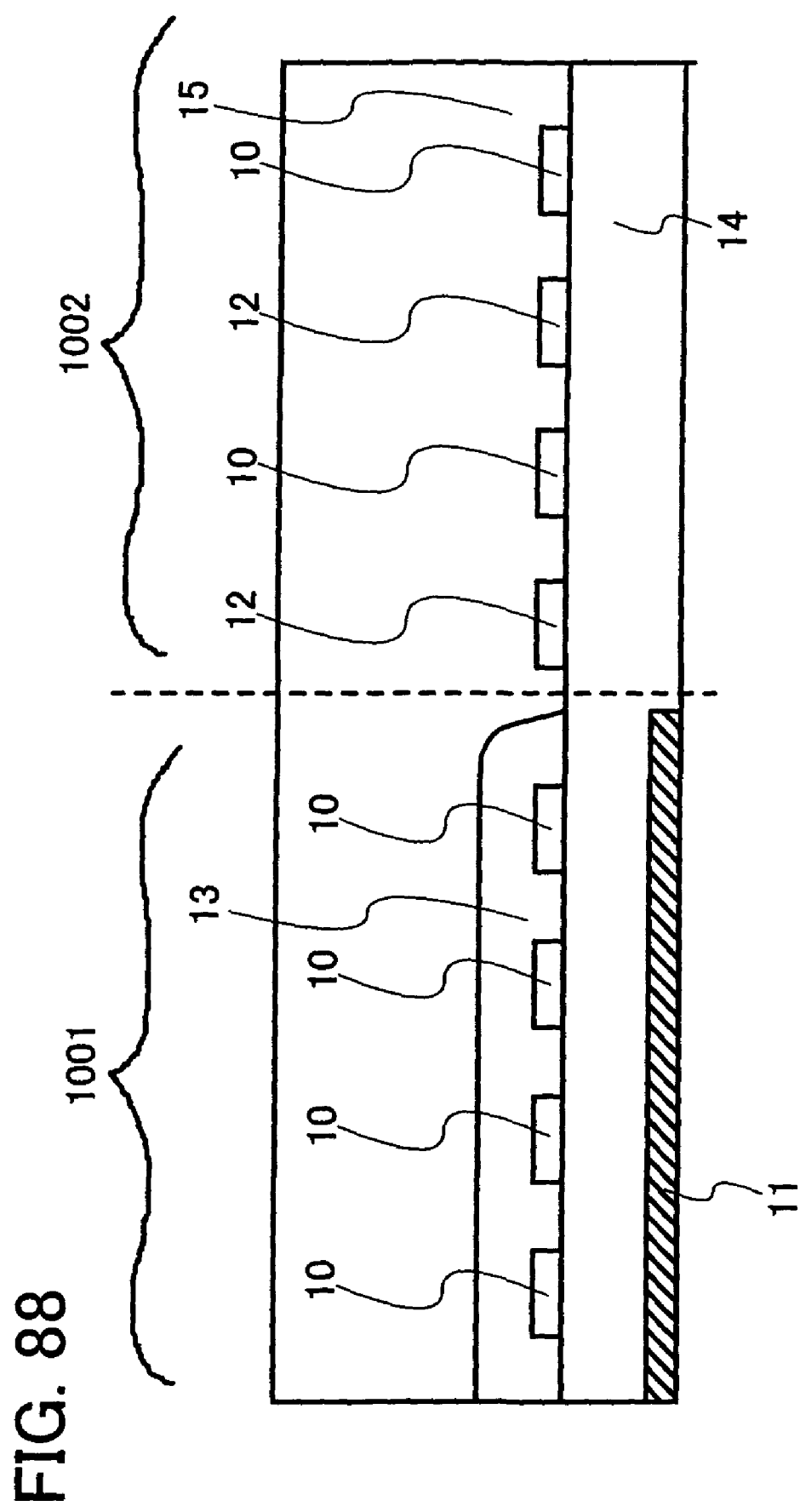
FIG. 88 is a view explaining one mode of a liquid crystal display device according to the present invention.
Figure 90:
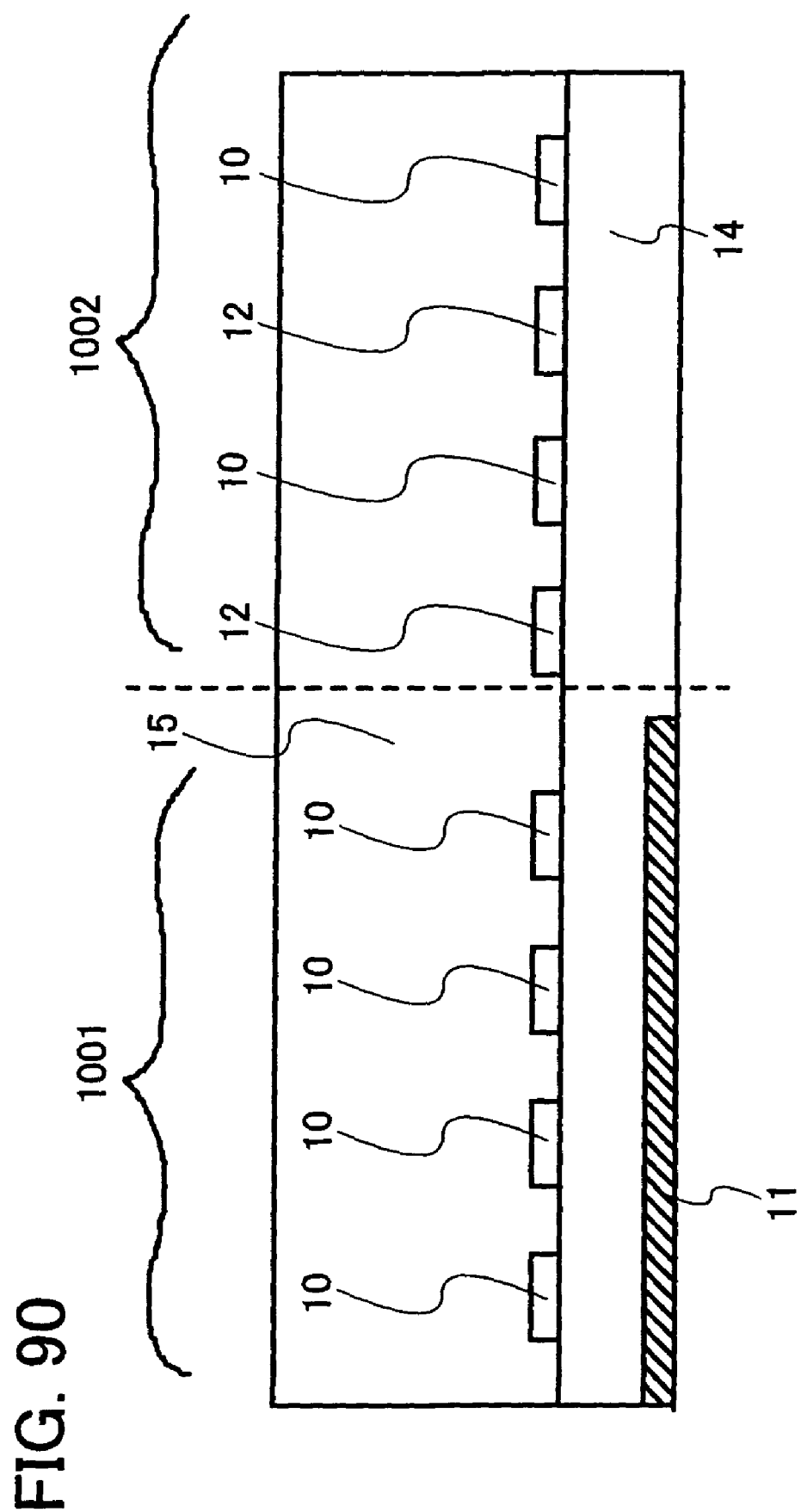
FIG. 90 is a view explaining one mode of a liquid crystal display device according to the present invention.
Figure 91A:
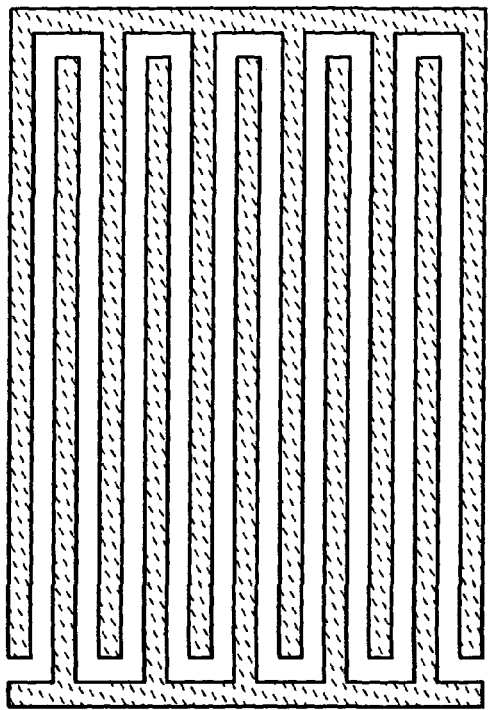
FIGS. 91A to 91D are views each explaining one mode of a liquid crystal display device according to the present invention.
Figure 91B:
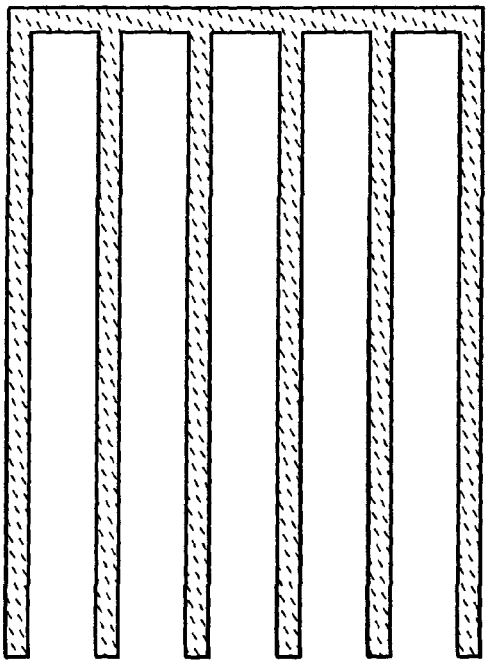
Figure 91C:
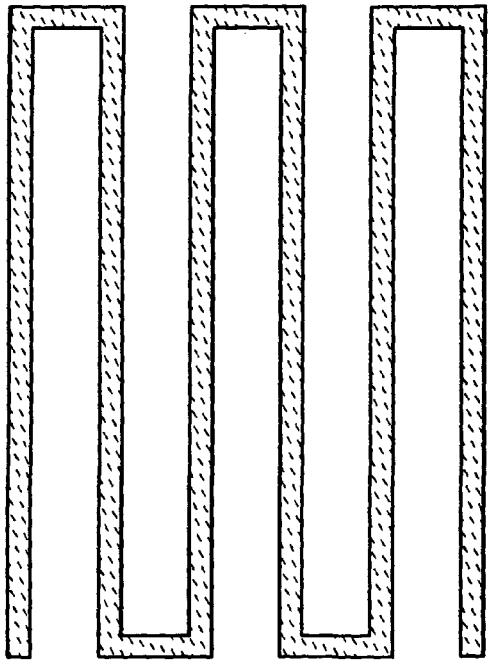
Figure 91D:
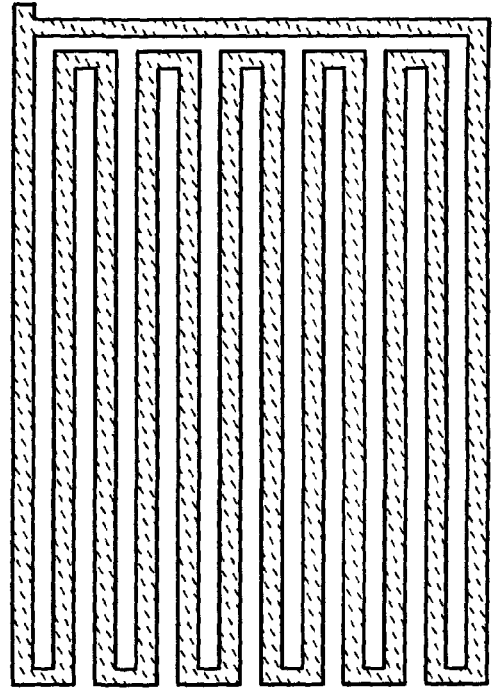

FIG. 37 shows the case where, in the transmission portion 1002 of FIG. 31, the electrode 12 of the liquid crystal element has a comb-shape having a slit or a gap, FIG. 38 shows the case where, in the transmission portion 1002 of FIG. 89, the electrode 12 of the liquid crystal element has a comb-shape having a slit or a gap, FIG. 87 shows the case where, in the transmission portion 1002 of FIG. 20, the electrode 12 of the liquid crystal element has a comb-shape having a slit or a gap, FIG. 88 shows the case where, in the transmission portion 1002 of FIG. 84, the electrode 12 of the liquid crystal element has a comb-shape having a slit or a gap, and FIG. 90 shows the case where, in the transmission portion 1002 of FIG. 85, the electrode 12 of the liquid crystal element has a comb-shape having a slit or a gap.

Similarly to FIGS. 37, 38, 87, 88, and 90 corresponding to FIGS. 31, 89, 20, 84, and 85 respectively, the electrode 12 of the liquid crystal element can have a comb-shape having a slit or a gap in the transmission portion 1002 in FIGS. 20 to 36, 84, 85, and 89 or in the description up to here.

FIG. 37 shows a mode of a liquid crystal display device, which is different from the liquid crystal display device of FIG. 31, in that both an electrode 10 of a liquid crystal element and an electrode 12 of the liquid crystal element are formed over an insulating layer 14 in a transmission portion 1002.

Figure 86:
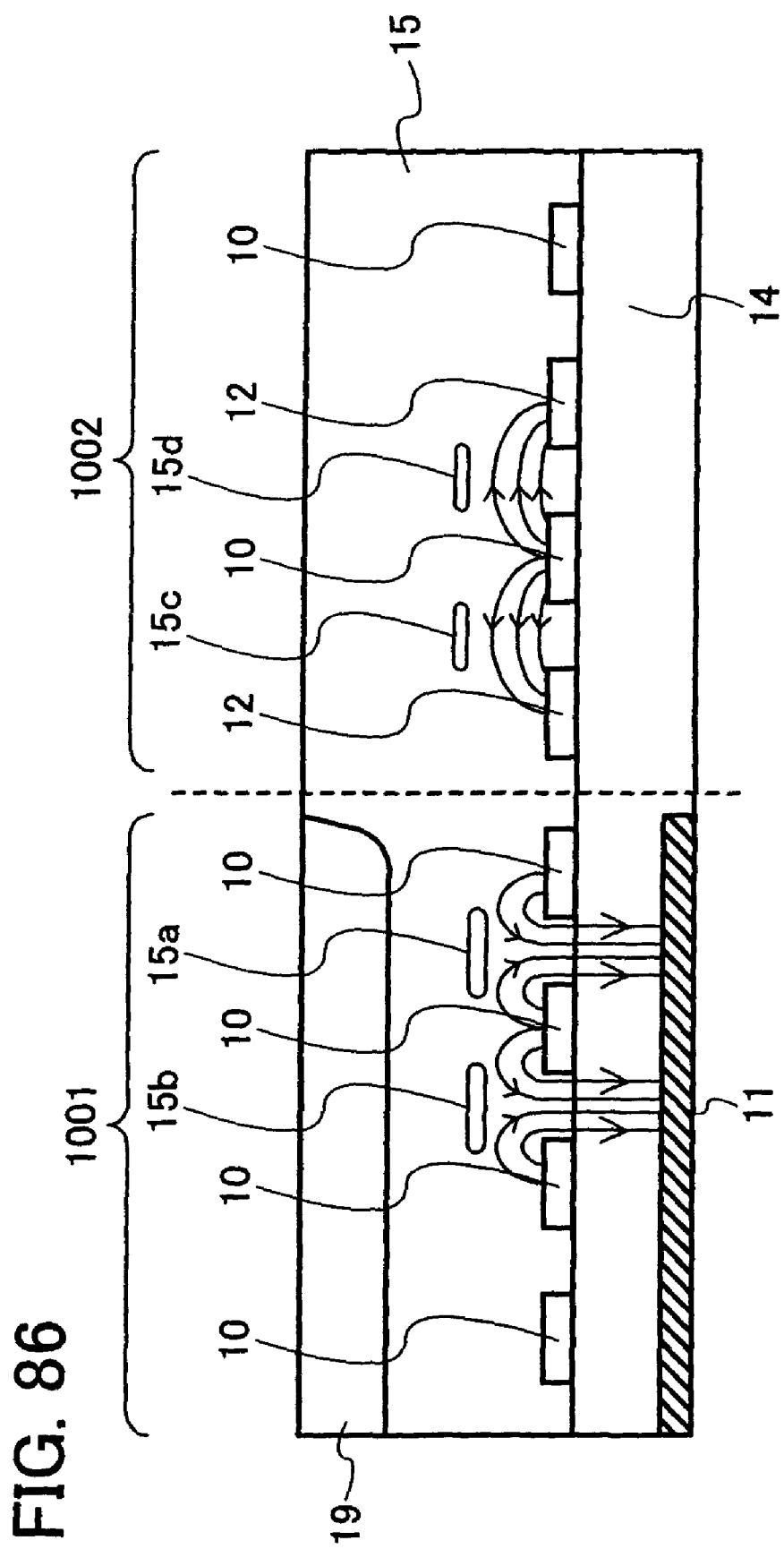
FIG. 86 is a view explaining one mode of a liquid crystal display device according to the present invention.

FIG. 86 shows a state where an electric field is applied between the electrodes of the liquid crystal element of FIG. 87. In a reflection portion 1001 where display is performed by reflection of light, when a potential difference is generated between an electrode 10 of a liquid crystal element and an electrode 11 of the liquid crystal element, liquid crystal molecules (15a and 15b) contained in a liquid crystal layer 15 rotate parallel to the plane of the electrodes 10 and 11 of the liquid crystal element (i.e. in a plane parallel to the substrate), and it becomes possible to control the amount of light which passes through the liquid crystal layer 15. More precisely, it becomes possible to control a polarized state of light, and the liquid crystal molecules (15a and 15b) can control the amount of light which passes through a polarizing plate provided on an outer side of the substrate. FIG. 86 corresponds to FIG. 18A and FIG. 93A. The liquid crystal molecules (15a and 15b) shown in FIG. 86 rotate in the manner similar to those shown in FIGS. 18A to 18B and 93A to 93B. Light that has entered the liquid crystal display device from outside passes through the liquid crystal layer 15, reflects at the electrode 11 of the liquid crystal element, passes through the liquid crystal layer 15 again, and is emitted from the liquid crystal display device.

In addition, in a transmission portion 1002 where display is performed by transmission of light, when a potential difference is generated between the electrode 10 of the liquid crystal element and an electrode 12 of the liquid crystal element, liquid crystal molecules (15c and 15d) contained in the liquid crystal layer 15 rotate parallel to the plane of the electrodes 10 and 12 of the liquid crystal element (i.e. in a plane parallel to the substrate), and it becomes possible to control the amount of light which passes through the liquid crystal layer 15. More precisely, it becomes possible to control a polarized state of light, and the liquid crystal molecules (15c and 15d) can control the amount of light which passes through a polarizing plate provided on an outer side of the substrate. FIG. 86 corresponds to FIG. 18A and FIG. 93A. The liquid crystal molecules (15c and 15d) shown in FIG. 86 rotate in the manner similar to those shown in FIGS. 18A to 18B and 93A to 93B. Light that has entered the liquid crystal display device from a backlight passes through the liquid crystal layer 15 and is emitted from the liquid crystal display device.

In FIG. 37, the electrode 12 of the liquid crystal element and the electrode 10 of the liquid crystal element are formed in the same plane. Therefore, the electrode 12 of the liquid crystal element can be formed concurrently with the electrode 10 of the liquid crystal element. Consequently, the manufacturing process can be simplified, the number of steps can be reduced, and the number of masks (the number of reticles) can be reduced. Accordingly, the cost can be reduced.

FIG. 38 shows a mode of a liquid crystal display device having a structure in which an insulating layer 13 is provided over an electrode 11 of a liquid crystal element, and an electrode 10 of the liquid crystal element and an electrode 12 of the liquid crystal element are formed in the same layer in a transmission portion 1002. A mode of a liquid crystal display device is shown, which is different from the liquid crystal display device of FIG. 89, in that both the electrode 10 of the liquid crystal element and the electrode 12 of the liquid crystal element are formed over an insulating layer 14 in the transmission portion 1002. In such a manner, the insulating layer 13 may be formed between a pair of electrodes of the liquid crystal element in a reflection portion 1001, and a pair of electrodes of the liquid crystal element may be formed in the same layer in the transmission portion 1002.

In FIG. 38, the electrode 12 of the liquid crystal element and the electrode 10 of the liquid crystal element are formed after the insulating layer 13 is formed. Accordingly, the electrode 12 of the liquid crystal element can be formed concurrently with the electrode 10 of the liquid crystal element. Consequently, the manufacturing process can be simplified, the number of steps can be reduced, and the number of masks (the number of reticles) can be reduced. Accordingly, the cost can be reduced.

FIG. 87 shows a mode of a liquid crystal display device having a structure in which an insulating layer 14 is provided over an electrode 11 of a liquid crystal element, and an electrode 10 of the liquid crystal element and an electrode 12 of the liquid crystal element are formed in the same layer. A mode of a liquid crystal display device is shown, which is different from the liquid crystal display device of FIG. 20, in that both the electrode 10 of the liquid crystal element and the electrode 12 of the liquid crystal element are formed over the insulating layer 14 in the transmission portion 1002. In such a manner, the insulating layer may be formed between a pair of electrodes of the liquid crystal element in a reflection portion 1001, and a pair of electrodes of the liquid crystal element may be formed in the same layer in the transmission portion 1002.

In FIG. 87, the electrode 12 of the liquid crystal element and the electrode 10 of the liquid crystal element are formed after the insulating layer 13 is formed. Accordingly, the electrode 12 of the liquid crystal element can be formed concurrently with the electrode 10 of the liquid crystal element. Consequently, the manufacturing process can be simplified, the number of steps can be reduced, and the number of masks (the number of reticles) can be reduced. Accordingly, the cost can be reduced.

FIG. 88 shows a mode of a liquid crystal display device having a structure in which an insulating layer 14 is provided over an electrode 11 of a liquid crystal element, and an electrode 10 of the liquid crystal element and an electrode 12 of the liquid crystal element are formed in the same layer. A mode of a liquid crystal display device is shown, which is different from the liquid crystal display device of FIG. 84, in that both the electrode 10 of the liquid crystal element and the electrode 12 of the liquid crystal element are formed over the insulating layer 14 in the transmission portion 1002. In such a manner, the insulating layer 14 may be formed between a pair of electrodes of the liquid crystal element in a reflection portion 1001, and a pair of electrodes of the liquid crystal element may be formed in the same layer in the transmission portion 1002.

In FIG. 88, the electrode 12 of the liquid crystal element and the electrode 10 of the liquid crystal element can be formed after the insulating layer 14 is formed. Accordingly, the electrode 12 of the liquid crystal element can be formed concurrently with the electrode 10 of the liquid crystal element. Consequently, the manufacturing process can be simplified, the number of steps can be reduced, and the number of masks (the number of reticles) can be reduced. Accordingly, the cost can be reduced.

FIG. 90 shows a mode of a liquid crystal display device having a structure in which an insulating layer 14 is provided over an electrode 11 of a liquid crystal element, and an electrode 10 of the liquid crystal element and an electrode 12 of the liquid crystal element are formed in the same layer. A mode of a liquid crystal display device is shown, which is different from the liquid crystal display device of FIG. 85, in that both the electrode 10 of the liquid crystal element and the electrode 12 of the liquid crystal element are formed over the insulating layer 14 in a transmission portion 1002. In such a manner, the insulating layer 14 may be formed between a pair of electrodes of the liquid crystal element in a reflection portion 1001, and a pair of electrodes of the liquid crystal element may be formed in the same layer in the transmission portion 1002.

In FIG. 90, the electrode 12 of the liquid crystal element and the electrode 10 of the liquid crystal element can be formed after the insulating layer 14 is formed. Accordingly, the electrode 12 of the liquid crystal element can be formed concurrently with the electrode 10 of the liquid crystal element. Consequently, the manufacturing process can be simplified, the number of steps can be reduced, and the number of masks (the number of reticles) can be reduced. Accordingly, the cost can be reduced.

Figure 39:
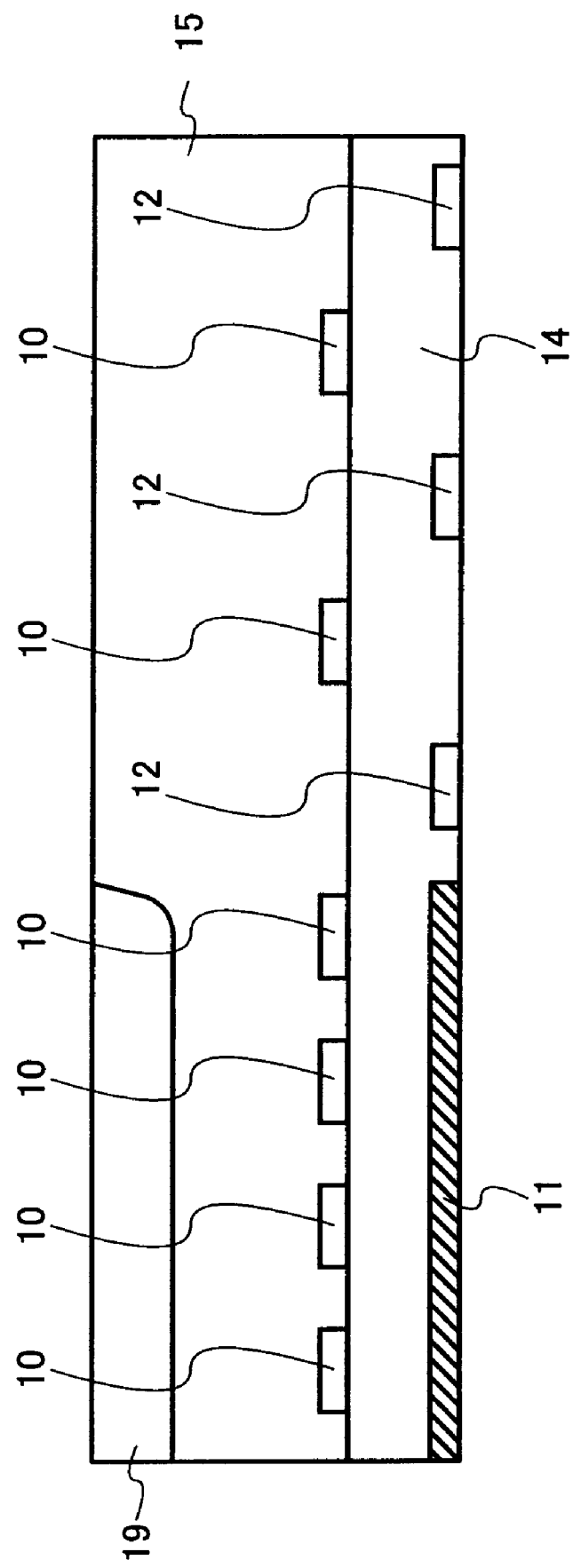
FIG. 39 is a view explaining one mode of a liquid crystal display device according to the present invention.

FIG. 39 shows a mode of a liquid crystal display device, which is different from the liquid crystal display device of FIG. 31, in that an electrode 10 of a liquid crystal element and an electrode 12 of the liquid crystal element are formed in different layers with an insulating layer 14 interposed therebetween, and the electrode 10 of the liquid crystal element and the electrode 12 of the liquid crystal element do not overlap with each other.

It is to be noted that the electrode 11 of the liquid crystal element and the electrode 12 of the liquid crystal element may be formed concurrently.

It is to be noted that, in a transmission portion 1002, the electrode 10 of the liquid crystal element and the electrode 12 of the liquid crystal element may be reversed. In other words, the electrode in one position is moved to the other position, and the electrode in the other position is moved to the one position.

Similarly to FIGS. 25 to 30 corresponding to FIGS. 20 to 24, the reflecting electrode can be uneven also in FIGS. 37, 38, 87, 88, 90, and the similar drawings.

Figure 40:
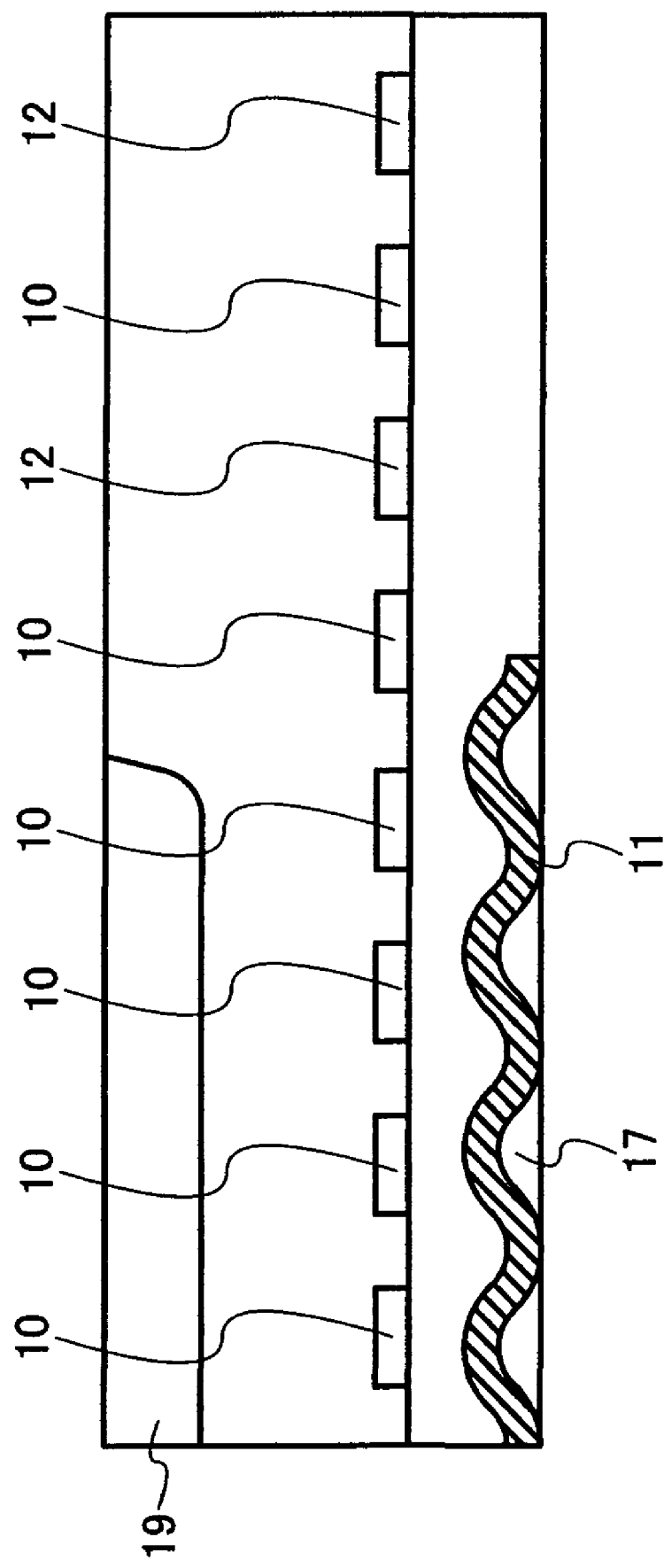
FIG. 40 is a view explaining one mode of a liquid crystal display device according to the present invention.

FIG. 40 shows a mode of a liquid crystal display device, which is different from the liquid crystal display device of FIG. 37, in that a scatterer 17 having a convex shape is provided below an electrode 11 of a liquid crystal element.

Figure 41:
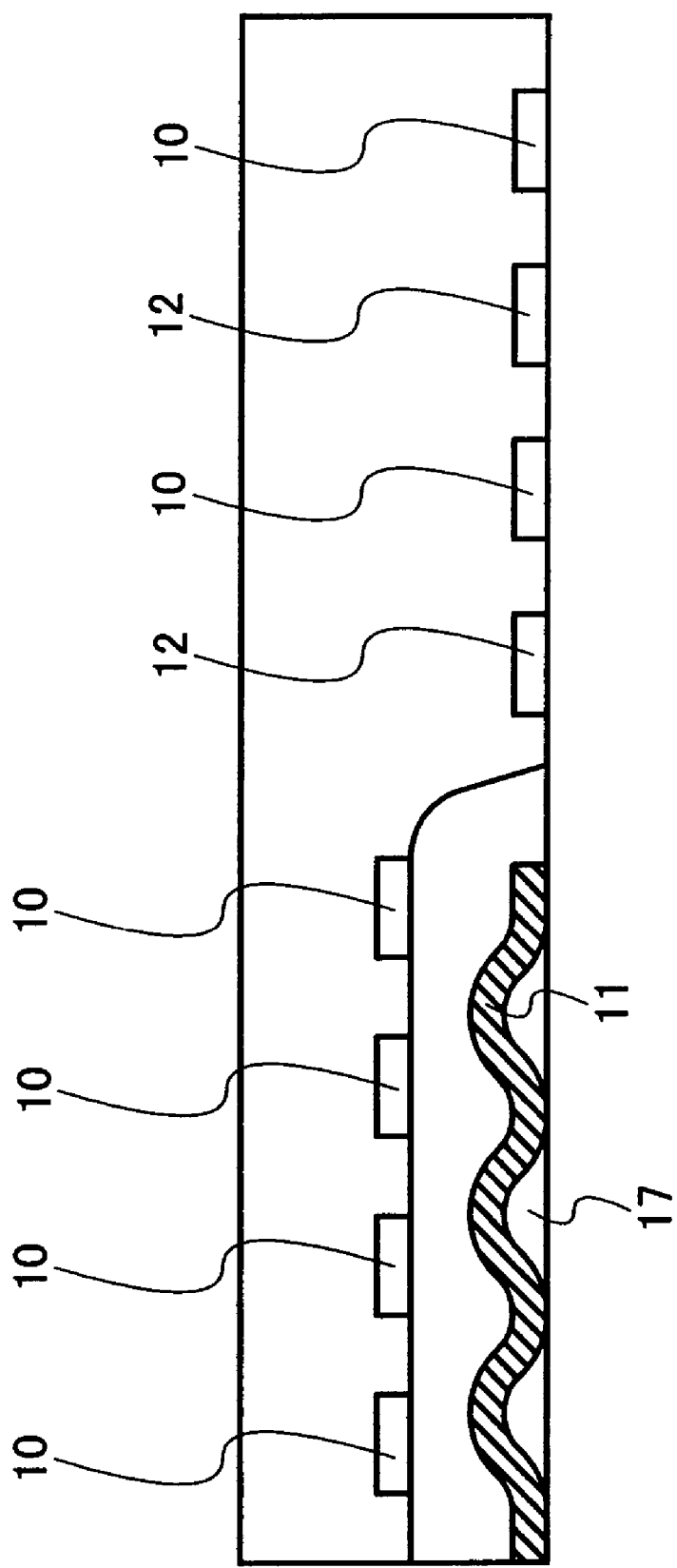
FIG. 41 is a view explaining one mode of a liquid crystal display device according to the present invention.

FIG. 41 shows a mode of a liquid crystal display device, which is different from the liquid crystal display device of FIG. 38, in that a scatterer 17 having a convex shape is provided below an electrode 11 of a liquid crystal element.

Figure 42:
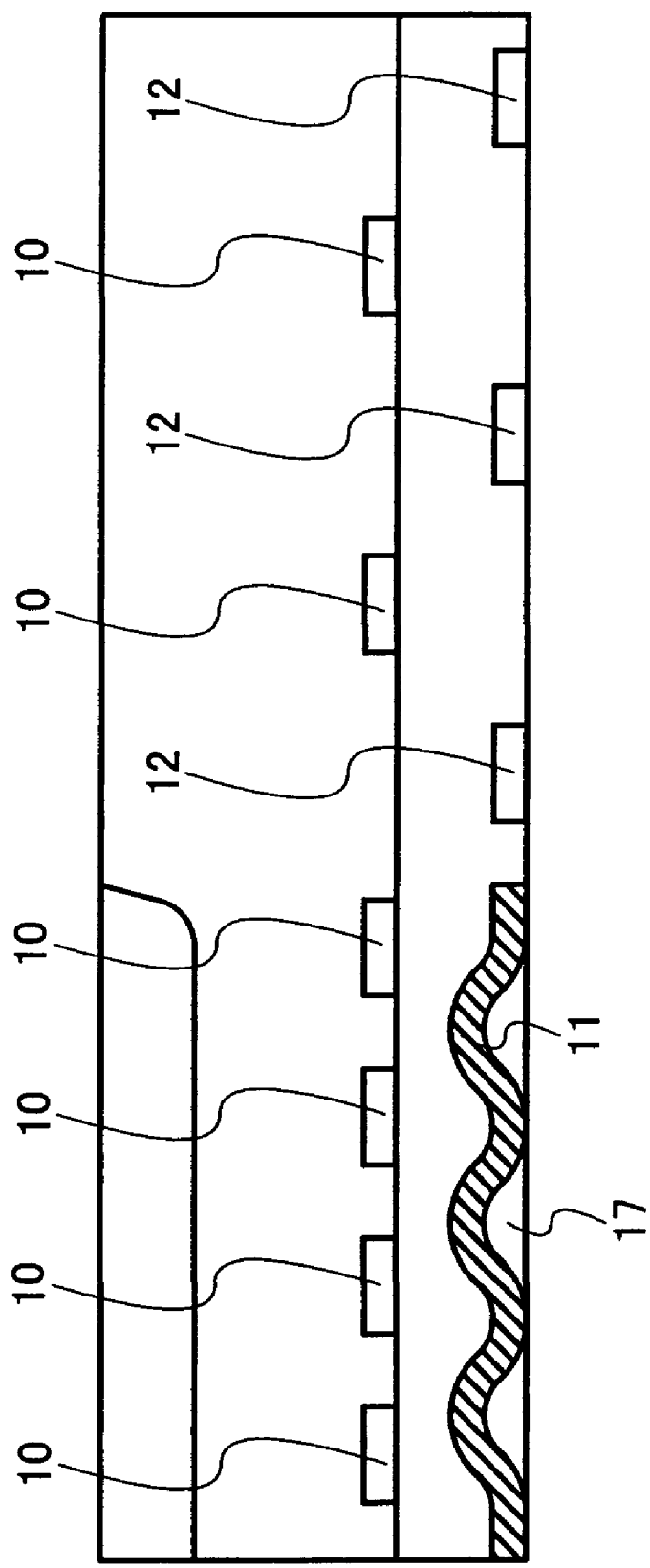
FIG. 42 is a view explaining one mode of a liquid crystal display device according to the present invention.

FIG. 42 shows a mode of a liquid crystal display device, which is different from the liquid crystal display device of FIG. 39, in that a scatterer 17 having a convex shape is provided below an electrode 11 of a liquid crystal element.

In the structures described above such as FIGS. 20 to 42, 83 to 90, and in the combination thereof, a color filter may be provided over the counter substrate arranged over the liquid crystal layer 15, or over the substrate provided with the electrode 10 of the liquid crystal element.

For example, a color filter may be provided in the insulating layer 13, the insulating layer 14, the insulating layer 16, the insulating layer 18, the insulating layer 19, or the like, or in part thereof.

It is to be noted that a black matrix may be provided in the manner similar to the color filter. Both the color filter and the black matrix may also be provided as a matter of course.

In such a manner, when the insulating layer is made to be the color filter or the black matrix, material cost can be saved.

In addition, when the color filter, the black matrix, or the like is arranged over the substrate provided with the electrode 10 of the liquid crystal element, a margin of alignment with the counter substrate can be improved.

It is to be noted that the position, the type, and the shape of the electrode of the liquid crystal element, and the position and the shape of the insulating layer can have various modes. In other words, various modes can be provided by combining the position of the electrode of the liquid crystal element in a certain drawing with the position of the insulating layer in another drawing. For example, FIG. 25 shows the electrode 11 of the liquid crystal element in FIG. 20, of which the shape is changed into an uneven shape, and FIG. 87 shows the electrode 12 of the liquid crystal element in FIG. 20, of which the position and the shape are changed. In the drawings as shown above, by combining various components, a great number of modes can be provided.

Embodiment Mode 3

One mode of an active matrix liquid crystal display device according to the present invention will be described with reference to FIGS. 1 and 2.

It is to be noted that, in the present invention, a transistor is not always essential. Therefore, the present invention can also be applied to a so-called passive matrix display device which is not provided with a transistor.

This embodiment mode will describe an example, where the structure described in Embodiment Mode 1 or Embodiment Mode 2 or a structure realized by combination of the components shown in the drawings is provided with a transistor.

As shown in FIG. 1, a transistor 151 and an electrode 103 of a liquid crystal element are each formed over a substrate 101.

The transistor 151 includes an insulating layer 105 between a gate electrode 102 and a semiconductor layer 106 and is a bottom gate transistor in which the gate electrode 102 is provided below the semiconductor layer 106. The gate electrode 102 is formed by using, for example, metal such as molybdenum, aluminum, tungsten, titanium, copper, silver, or chromium; alloy combining metal such as a material containing aluminum and neodymium; a material containing metal and nitrogen; or a conductive material such as metal nitride, e.g. titanium nitride, tantalum nitride, molybdenum nitride, or the like. It is to be noted that the gate electrode 102 may be a single layer or a multilayer. In addition, the insulating layer 105 is formed by using, for example, an insulating material such as silicon oxide or silicon nitride. It is to be noted that the insulating layer 105 may be a single layer or a multilayer. Further, the semiconductor layer 106 is formed by using a semiconductor such as silicon or silicon germanium. A crystal characteristic of these semiconductors is not particularly limited and may be amorphous or polycrystalline.

Over the semiconductor layer 106, a protective film 107 is provided so as to cover part of the semiconductor layer 106. Further, over the semiconductor layer 106, a wiring 108 (108a, 108b) and a wiring 109 (109a and 109b) are each provided so as to be electrically connected to the semiconductor layer 106. The protective film 107 is provided to prevent the semiconductor layer 106 from being etched by etching to form the wirings 108 and 109 and is formed by using, for example, an insulating material such as silicon nitride. It is to be noted that the protective film 107 is also referred to as a channel-protecting film, a channel stop film, or the like. Furthermore, a transistor including such a protective film 107 is referred to as a channel-protecting transistor. In the wiring 108, a semiconductor layer containing an impurity which imparts n-type conductivity (hereinafter referred to as an n-type semiconductor layer 108a) and a conductive layer 108b are stacked. The n-type semiconductor layer 108a is formed by using a semiconductor such as silicon containing phosphorus, arsenic, or the like as an impurity. In addition, the conductive layer 108b is formed by using, for example, metal such as molybdenum, aluminum, tungsten, titanium, silver, copper, or chromium; alloy containing aluminum and neodymium; or a conductive material such as metal nitride, e.g. titanium nitride, tantalum nitride, molybdenum nitride, or the like. It is to be noted that the conductive layer 108b may be a single layer or a multilayer.

The electrode 103 of the liquid crystal element has a structure in which a conductive layer 103a and a conductive layer 103b are stacked. In order to transmit light from a backlight, the conductive layer 103a is formed by using a light-transmitting and conductive material such as indium tin oxide (ITO), indium zinc oxide, or zinc oxide. It is to be noted that each of these materials is generally referred to as a transmitting electrode material. In addition to the transmitting electrode material, a silicon film, which is formed to be thin enough to transmit light and has conductivity by containing an impurity, can also be used as the conductive layer 103a. The conductive layer 103b is provided to reflect light that enters a liquid crystal display device. In the liquid crystal display device of this embodiment mode, the conductive layer 103b is formed by using the same material as that of the gate electrode 102 and concurrently with the gate electrode 102. However, the gate electrode 102 and the conductive layer 103b are not always required to be formed by using the same material and may be formed by using different materials in different steps.

An insulating layer 110 is provided over and to cover the transistor 151, the wiring 108, the wiring 109, and the electrode 103 of the liquid crystal element. A contact hole is provided in the insulating layer 110. The insulating layer 110 is formed by using, for example, an insulating material such as silicon oxide, silicon nitride, acrylic, or polyimide. It is to be noted that the insulating layer 110 may be a single layer or a multilayer. For example, when a layer formed by using acrylic, polyimide, or the like is provided over a layer formed by using silicon oxide and/or silicon nitride, flatness of the insulating layer 110 can be enhanced, and disordered alignment of a liquid crystal molecule can be prevented. An electrode 111 of the liquid crystal element provided over the insulating layer 110 is electrically connected to the wiring 109 through the contact hole provided in the insulating layer 110. Further, an alignment film 112 is provided over the insulating layer 110.

As the insulating layer 110, an inorganic material or an organic material can be used. As an inorganic material, silicon oxide or silicon nitride can be used. As an organic material, polyimide, acrylic, polyamide, polyimide amide, resist, benzocyclobutene, siloxane, or polysilazane can be used. Siloxane includes a skeleton structure formed by a bond of silicon (Si) and oxygen (O). An organic group containing at least hydrogen (such as an alkyl group or aromatic hydrocarbon) is used as a substituent. Alternatively, a fluoro group may be used as the substituent. Further alternatively, a fluoro group and an organic group containing at least hydrogen may be used as the substituent. It is to be noted that polysilazane is formed by using a polymer material having a bond of silicon (Si) and nitrogen (N) as a starting material.

It is preferable to use an organic material for the insulating layer since flatness of the surface thereof can be enhanced. When an inorganic material is used for the insulating layer, the surface thereof follows the surface shape of the semiconductor layer or the gate electrode. Also in this case, the insulating layer can be flat by being thickened.

As described above, a circuit for driving the liquid crystal display device is provided over the substrate 101. A substrate 121 provided so as to face the substrate 101 has a light-shielding layer 122 which overlaps with the transistor 151. The light-shielding layer 122 is formed by using, for example, a conductive material such as tungsten, chromium, or molybdenum; silicide such as tungsten silicide; or a resin material containing black pigment or carbon black. In addition, a color filter 123 is provided so as to overlap with the electrode 103 of the liquid crystal element and the electrode 111 of the liquid crystal element. An alignment film 124 is further provided over the color filter 123. A gap-adjusting film 126 is provided between the alignment film 124 and the color filter 123.

Figure 13:
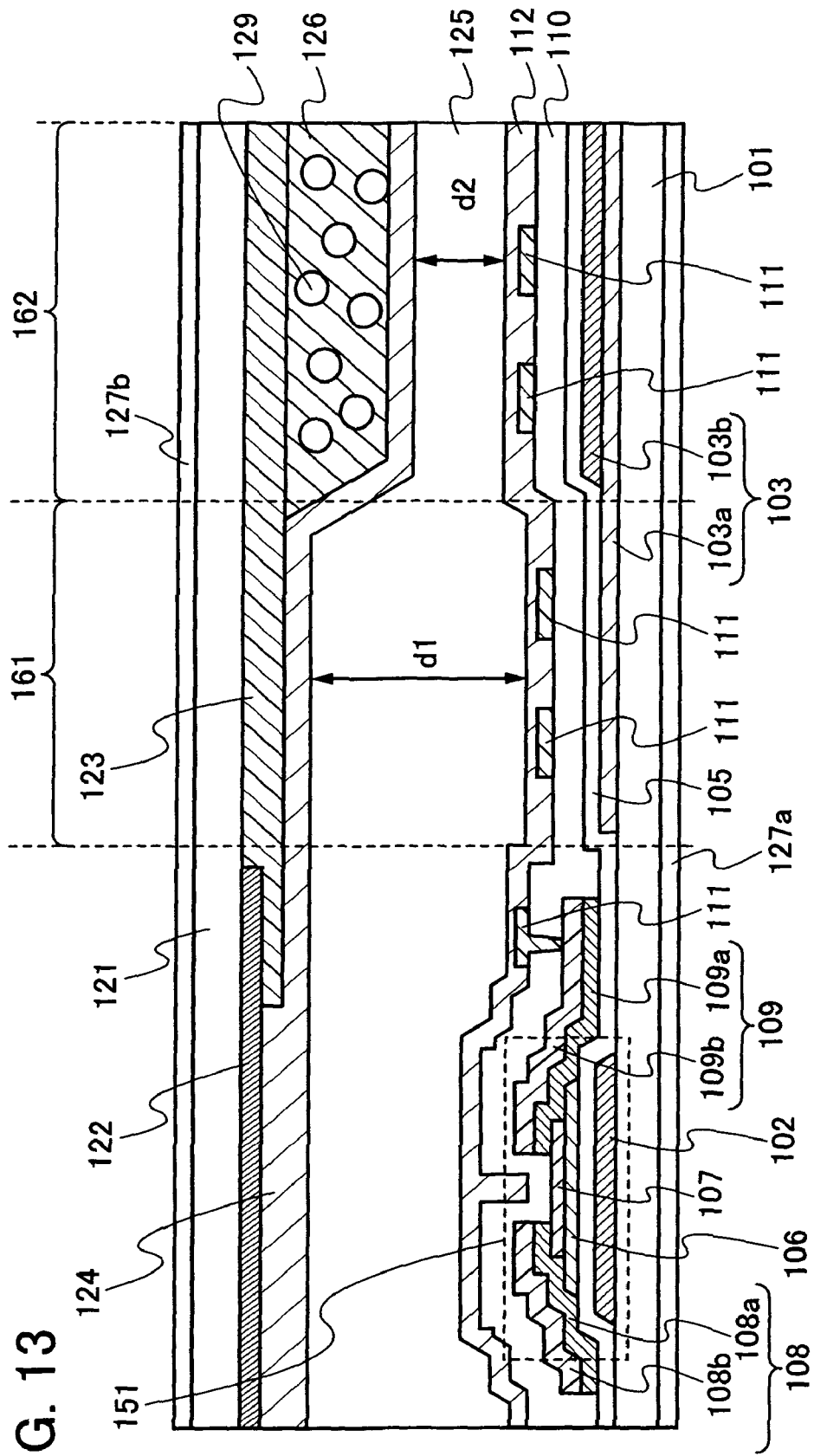
FIG. 13 is a view explaining one mode of a liquid crystal display device according to the present invention.

A liquid crystal layer 125 is provided between the substrate 101 and the substrate 121. The liquid crystal layer 125 includes a liquid crystal molecule rotating almost parallel to the substrate plane when voltage is applied so that a potential difference is generated between the electrode 103 of the liquid crystal element and the electrode 111 of the liquid crystal element. In addition, a thickness $d_1$ of the liquid crystal layer 125 in a transmission portion 161 where display is performed by transmission of light from a backlight is adjusted by the gap-adjusting film 126 so as to be approximately the double of a thickness $d_2$ of the liquid crystal layer 125 in a reflection portion 162 where display is performed by reflection of external light such as sunlight or light from a front light. By adjusting a thickness of the liquid crystal layer 125 as described above, an image with high contrast can be displayed. The gap-adjusting film 126 is formed by using a light-transmitting resin so as to transmit visible light. It is to be noted that the gap-adjusting film 126 preferably contains a particle 129 which serves as a scattering material so as to prevent reflecting due to reflection or to improve luminance by diffusing light (FIG. 13). The particle 129 is formed by using a light-transmitting resin material which has a different refractive index from a base material (such as an acrylic resin) forming the gap-adjusting film 126. When the gap-adjusting film 126 contains the particle 129 as described above, light can be scattered, and contrast and luminance of the display image can be improved. In addition, polarizing plates 127a and 127b are provided over the substrate 101 and the substrate 121, respectively. The polarizing plates 127a and 127b are respectively provided on sides of the substrate 101 and the substrate 121, which are opposite to sides provided with the liquid crystal layer 125.

Figure 2:
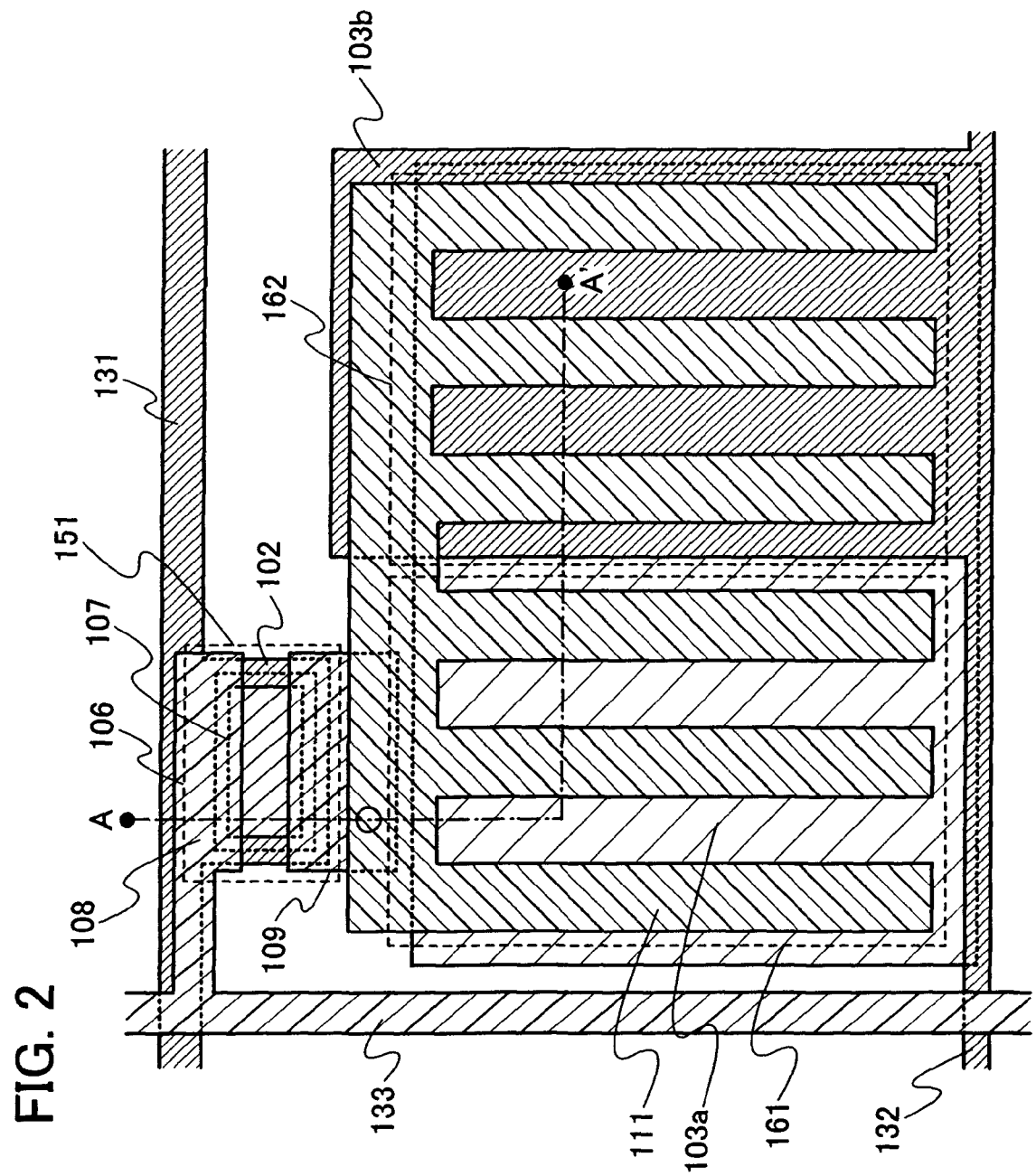
FIG. 2 is a top view explaining a mode of a structure of a pixel portion included in a liquid crystal display device according to the present invention.

FIG. 2 shows a top view of the liquid crystal display device according to the present invention as described above. In FIG. 2, a cross-sectional structure of a portion denoted by a broken line A-A' corresponds to a cross-sectional structure described with reference to FIG. 1. It is to be noted that, in FIG. 2, the same reference numerals are used for the same portions as those in FIG. 1.

As is clear from FIG. 2, the gate electrode 102 is part of a gate line 131. In the gate line 131, particularly, a portion which serves as an electrode for switching the transistor 151 is the gate electrode 102. In addition, the wiring 108 is part of a source line 133. A portion which extends from the source line 133 provided so as to intersect with the gate line and is electrically connected to the semiconductor layer 106 of the transistor 151 is the wiring 109. A common wiring 132 is a wiring which is electrically connected to the electrode 103 of the liquid crystal element and led so that the electrodes 103 of the liquid crystal elements in a plurality of pixels in the liquid crystal display device have the same potential. The electrode 103 of the liquid crystal element electrically connected to the common wiring is also referred to as a common electrode in general. On the other hand, the electrode 111 of the liquid crystal element of which potential changes at any time in accordance with potential from the source line is referred to as a pixel electrode in general. In this embodiment mode, the conductive layer 103a and the conductive layer 103b are formed together with the gate line 131 and the common wiring 132. It is to be noted that a portion where the conductive layer 103a and the electrode 111 of the liquid crystal element are stacked; and a portion where the conductive layer 103b and the electrode 111 of the liquid crystal element are stacked can each serve as a capacitor.

In the liquid crystal display device, a plurality of pixels having the structure described with reference to FIGS. 1 and 2 are arranged in a matrix. Each pixel receives a signal from the gate line 131 and the source line 133. By the signal, the transistor is turned on, and further, when a potential difference is generated between the electrode 103 of the liquid crystal element and the electrode 111 of the liquid crystal element (that is, when a horizontal electric field is generated), the liquid crystal molecule contained in the liquid crystal layer 125 rotates almost parallel to the substrate plane. The rotation of the liquid crystal molecule makes light transmit through the liquid crystal layer 125. Then, light which has transmitted through the liquid crystal layer 125 in each pixel is combined, thereby displaying an image.

In FIGS. 1 and 2, an example of a channel-protecting transistor is shown; however, the present invention is not limited thereto. A channel-etched transistor without the channel protective film 107 may also be employed.

In FIGS. 1 and 2, an example of a bottom gate transistor is shown; however, the present invention is not limited thereto. A top gate transistor (including a planar transistor) may also be employed.

It is to be noted that the description of Embodiment Mode 1 and Embodiment mode 2 can be freely applied to this embodiment mode.

Embodiment Mode 4

Embodiment Mode 3 shows a mode in which the electrode 103 of the liquid crystal element (a so-called pixel electrode), to which a signal is inputted from the source line 133 through the transistor 151, and the electrode 111 of the liquid crystal element (a so-called common electrode), which is electrically connected to the common wiring 132, are formed in different layers. On the other hand, this embodiment mode will describe a mode including a structure in which a pair of electrodes of a liquid crystal element are provided in the same layer and a structure in which a pair of electrodes of a liquid crystal element are provided in different layers, with reference to FIGS. 3 and 4. It is to be noted that FIG. 3 is a cross-sectional view corresponding to a cross-sectional structure of FIG. 4, taken along a broken line B-B'.

Figure 4:
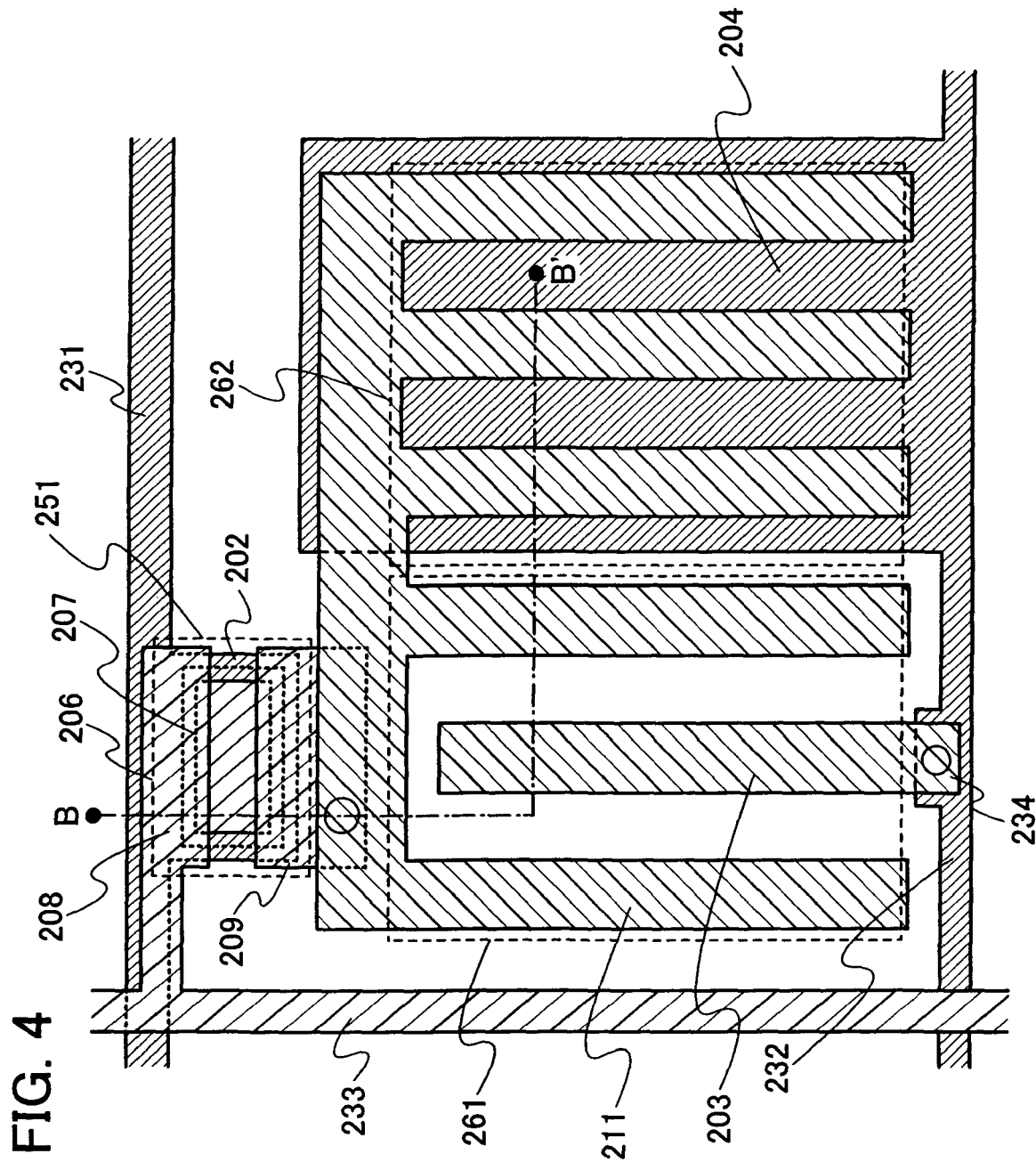
FIG. 4 is a top view explaining a mode of a structure of a pixel portion included in a liquid crystal display device according to the present invention.

As is clear from FIG. 4, in this embodiment mode, a common wiring 232 is formed in the same layer as that of a gate line 231. It is to be noted that the common wiring 232 is provided in each pixel, and the common wiring 232 provided in each pixel is electrically connected to an electrode 203 of a liquid crystal element and an electrode 204 of the liquid crystal element.

As is clear from FIG. 4, the electrode 203 of the liquid crystal element and an electrode 211 of the liquid crystal element are alternately arranged. As can be seen from a cross-sectional view of FIG. 3, the electrode 211 of the liquid crystal element is electrically connected to a transistor 251 through a wiring 209. On the other hand, the electrode 203 of the liquid crystal element is electrically connected to the common wiring 232 through a wiring 234.

Figure 3:
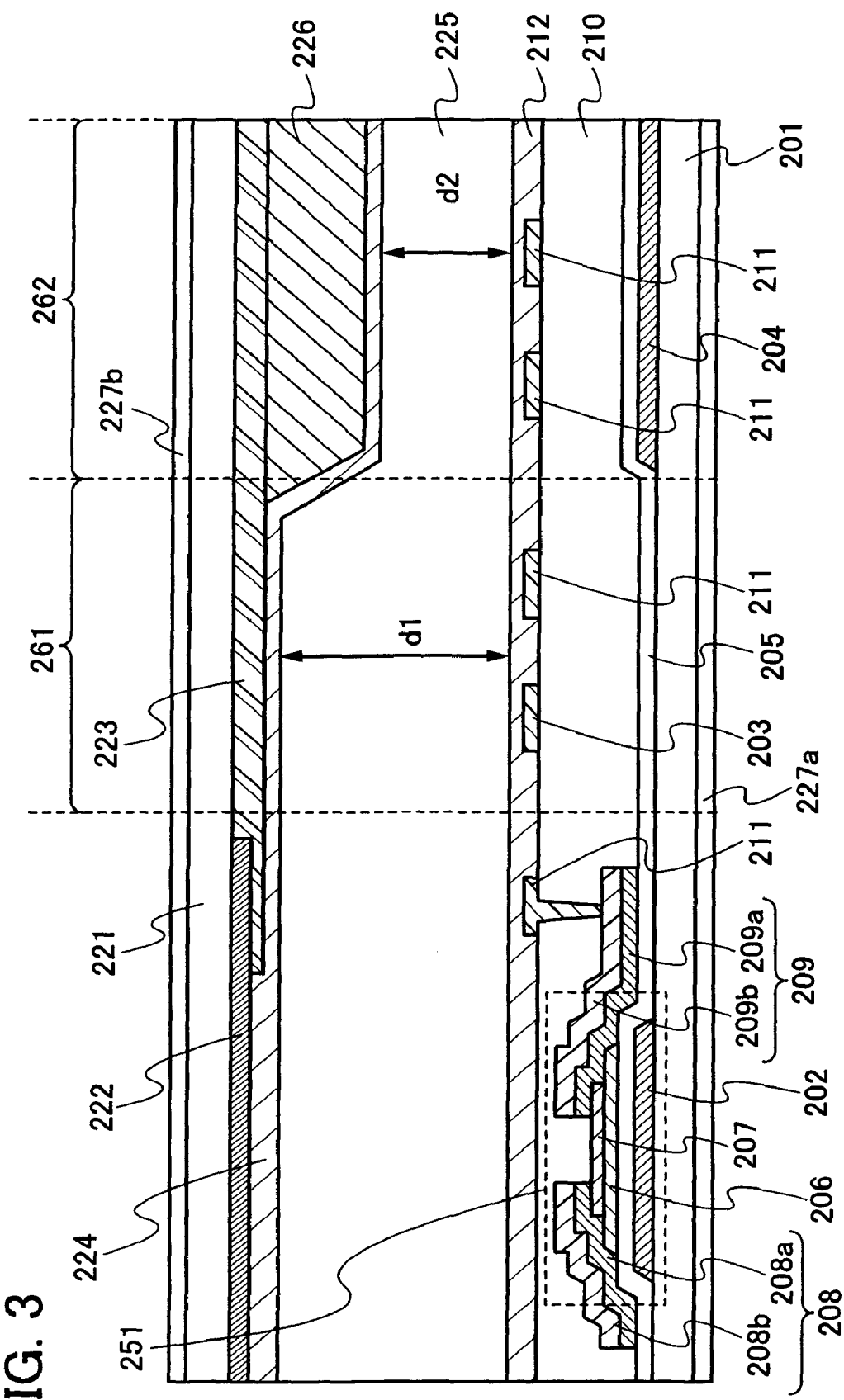
FIG. 3 is a view explaining a mode of a cross-sectional structure of a pixel portion included in a liquid crystal display device according to the present invention.

Similarly to the transistor 151 described in Embodiment Mode 3, the transistor 251 is a bottom gate transistor in which an insulating layer 205 is provided over a gate electrode 202, and a semiconductor layer 206 is further provided over the insulating layer 205 (FIG. 3). Materials for the semiconductor layer 206, the insulating layer 205, and the gate electrode 202 included in the transistor 251 are similar to the materials for the semiconductor layer 106, the insulating layer 105, and the gate electrode 102 described in Embodiment Mode 3, respectively; therefore, the description is omitted.

In this embodiment mode, an electrode 204 of the liquid crystal element, which also serves as a reflecting film, is formed concurrently with the gate electrode 202 of the transistor 251. Therefore, in this embodiment mode, the electrode 204 of the liquid crystal element and the gate electrode 202 are formed by using the same material. It is to be noted that the electrode 204 of the liquid crystal element is not always required to be formed concurrently with the gate electrode 202 and the gate line 231. For example, the electrode 204 of the liquid crystal element is formed concurrently with a wiring 208, a wiring 209, and a source line 233. The transistor 251 and the electrode 204 of the liquid crystal element are covered with an insulating layer 210 provided with a contact hole. Over the insulating layer 210, the electrode 203 of the liquid crystal element and the electrode 211 of the liquid crystal element, which are formed using a light-transmitting and conductive material, are formed. In particular, the electrode 211 of the liquid crystal element is electrically connected to the semiconductor layer 206 through the contact hole and the wiring 209. The semiconductor layer 206 is electrically connected to the source line 233 through the wiring 208 on a side opposite to the side electrically connected to the electrode 211 of the liquid crystal element, with the gate electrode 202 interposed. It is to be noted that the surface of the insulating layer 210 covering the transistor 251 and the like may be flattened as shown in FIG. 3. A method for flattening the surface of the insulating layer 210 is not particularly limited, and the surface may be flattened by being polished by a chemical mechanical polishing method (CMP) or may be flattened by a method utilizing fluidity of liquid in which a liquid resin material or the like is applied by a spin coating method or the like. In the case where an impurity which lowers performance of the transistor is contained in the resin material or the liquid crystal layer, in order to prevent diffusion of the impurity, an insulating layer containing silicon nitride is preferably provided between the transistor 251 and the insulating layer formed using a resin material, thereby preventing the impurity from diffusing into the transistor 251.

As is clear from FIGS. 3 and 4, the electrode 204 of the liquid crystal element is provided so as to overlap with part of the electrode 211 of the liquid crystal element. Therefore, a capacitor is formed using these two electrodes. The capacitor corresponds to a storage capacitor and can store an image signal. In a transmission portion 261 where the electrode 204 of the liquid crystal element is not provided, display is performed by transmission of light from a backlight. On the other hand, in a reflection portion 262 where the electrode 204 of the liquid crystal element is provided, display is performed by reflection of external light such as sunlight at the electrode 204 of the liquid crystal element.

Over the electrodes 203 and 211 of the liquid crystal element, an alignment film 212 is provided. In addition, a substrate 221 is provided so as to face the substrate 201 provided with the transistor 251, the electrode 203 of the liquid crystal element, the electrode 211 of the liquid crystal element, and the like, with the liquid crystal layer 225 interposed therebetween. Similarly to the substrate 121 described in Embodiment Mode 3, the substrate 221 may have a light-shielding layer 222 which overlaps with the transistor 251, a color filter 223 provided in a region where light is transmitted, a gap-adjusting film 226 provided so as to overlap with the reflection portion 262, and an alignment film 224 provided to align the liquid crystal molecule. Also in this embodiment mode, a thickness $d_1$ of the liquid crystal layer 225 in the transmission portion 261 is adjusted by the gap-adjusting film 226 so as to be almost the double of a thickness $d_2$ of the liquid crystal layer 225 in the reflection portion 262 where display is performed by reflection of external light such as sunlight. Similarly to Embodiment Mode 1, the gap-adjusting film 226 may contain a particle to scatter light. In addition, polarizing plates 227a and 227b are provided over the substrate 201 and the substrate 221, respectively. The polarizing plates 227a and 227b are respectively provided on sides of the substrate 201 and the substrate 221, which are opposite to sides provided with the liquid crystal layer 225.

In the liquid crystal display device having the structure as described above, when the transistor 251 is turned on by input of a signal from the gate line 231, potential of the source line 233 is transmitted to the electrode 211 of the liquid crystal element. Consequently, a potential difference is generated between the electrode 211 of the liquid crystal element and the electrode 203 of the liquid crystal element in the transmission portion 261, and the liquid crystal molecule contained in the liquid crystal layer 225 rotates almost parallel to the substrate plane. In addition, a potential difference is generated between the electrode 211 of the liquid crystal element and the electrode 204 of the liquid crystal element in the reflection portion 262, and the liquid crystal molecule contained in the liquid crystal layer 225 rotates almost parallel to the substrate plane. The rotation of the liquid crystal molecule makes light transmit through the liquid crystal layer 225. Then, light which has transmitted through the liquid crystal layer 225 in each pixel is combined, thereby displaying an image.

In the case of this structure, in the transmission portion 261, it is not necessary to form a common electrode entirely in the pixel portion. A common electrode in the transmission portion 261 is the electrode 203 of the liquid crystal element and can be formed concurrently with the electrode 211 of the liquid crystal element. Therefore, compared to the case where a common electrode is formed entirely in the pixel portion, the number of steps can be reduced, and the number of masks (the number of reticles) can be reduced. Accordingly, the cost can be reduced.

Since this embodiment mode is slightly different from Embodiment Mode 3 only regarding the electrode of the liquid crystal element, the description of Embodiment Mode 1 to Embodiment mode 3 can also be applied to and combined with this embodiment mode.

Embodiment Mode 5

Embodiment Mode 3 and Embodiment Mode 4 describe the liquid crystal display device in which the gap-adjusting film is provided over the substrate which face the substrate provided with the transistor, the wiring, the electrode of the liquid crystal element, and the like, with the liquid crystal layer interposed therebetween. This embodiment mode will describe a mode in which a gap-adjusting film is provided on a substrate side provided with a transistor, a wiring, an electrode of a liquid crystal element, and the like with reference to FIGS. 5 and 6. It is to be noted that FIG. 5 is a cross-sectional view corresponding to a cross-sectional structure of FIG. 6, taken along a broken line C-C'.

In addition, FIGS. 1 to 4 show the case of the bottom gate transistor; however, this embodiment mode will describe the case of a top gate transistor.

Figure 5:
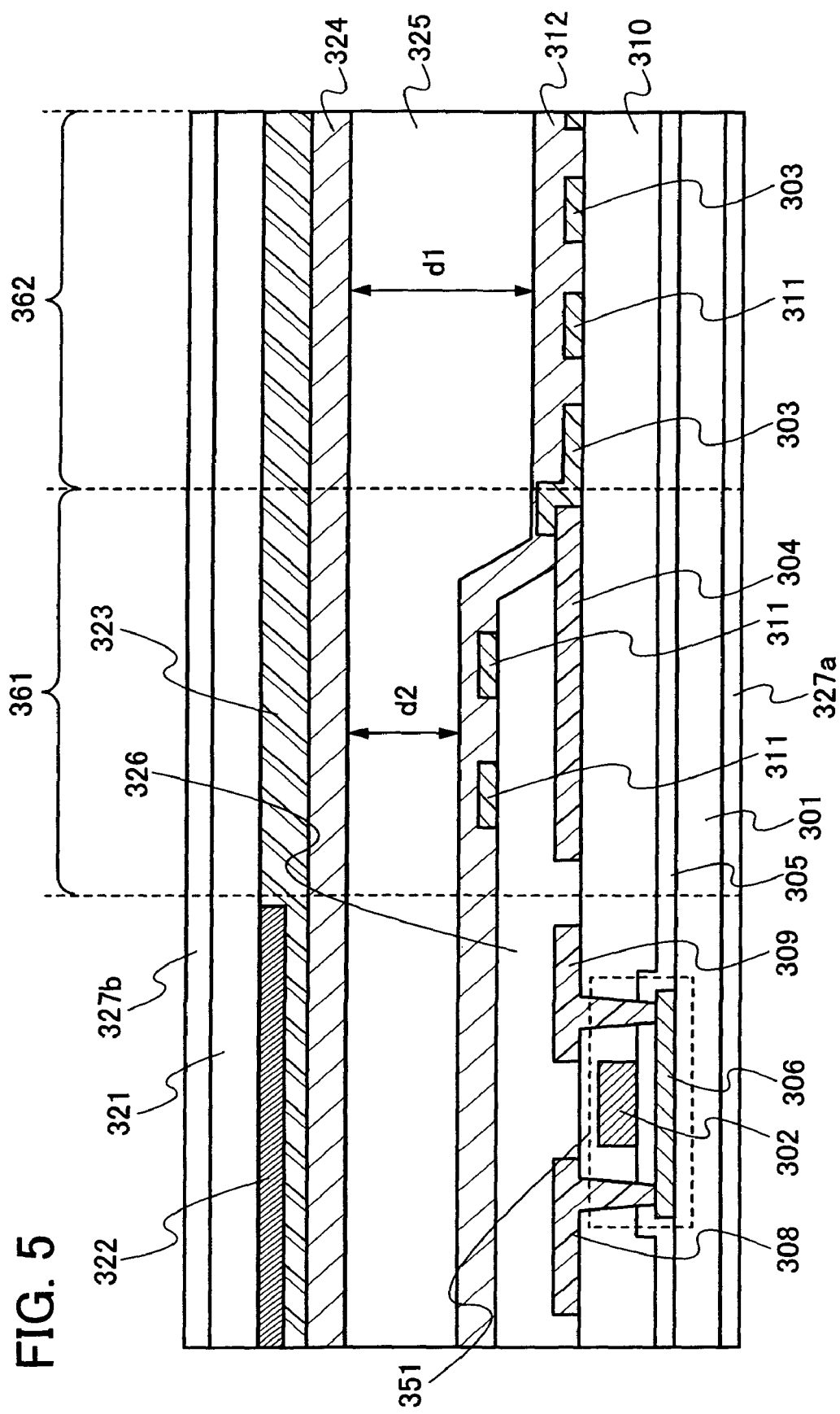
FIG. 5 is a view explaining a mode of a cross-sectional structure of a pixel portion included in a liquid crystal display device according to the present invention.
Figure 6:
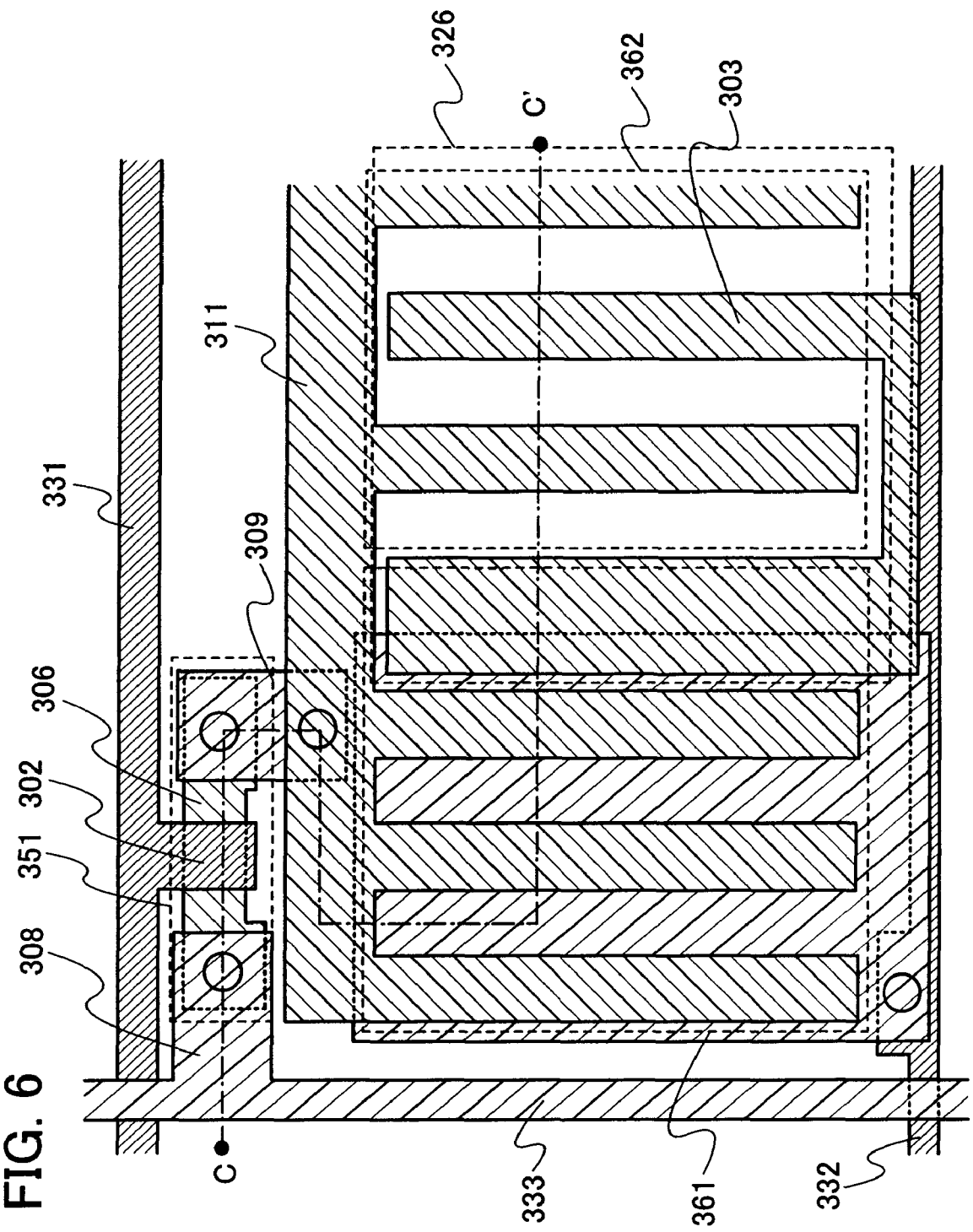
FIG. 6 is a top view explaining a mode of a structure of a pixel portion included in a liquid crystal display device according to the present invention.

In FIG. 5, a transistor 351 is provided over a substrate 301. The transistor 351 includes a semiconductor layer 306, a gate electrode 302, and an insulating layer 305 provided between the semiconductor layer 306 and the gate electrode 302. In this embodiment mode, the transistor 351 is a top gate transistor in which the gate electrode 302 is provided over the semiconductor layer 306. The transistor used in the present invention may be such a top gate transistor or a bottom gate transistor as shown in FIGS. 1 and 3. It is to be noted that the gate electrode 302 is a portion which extends from a gate line 331 as is clear from FIG. 6 and is electrically connected to the gate line 331.

The transistor 351 is covered with an insulating layer 310 provided with a contact hole. Over the insulating layer 310, a wiring 308, a wiring 309, and a conductive layer 304 are provided. In this embodiment mode, the wiring 308, the wiring 309, and the conductive layer 304 are formed in the same step. The wiring 308 is a portion which extends from a source line 333 as is clear from FIG. 6 and is electrically connected to the source line 333.

As a gap-adjusting film, an insulating layer 326 is provided so as to cover the transistor 351 and expose the edge of the conductive layer 304. Over the insulating layer 326, an electrode 311 of a liquid crystal element is formed by using a light-transmitting and conductive material. As is clear from FIG. 6, the electrode 311 of the liquid crystal element also extends to a portion over the insulating layer 310 (not shown in the drawing), where the conductive layer 304 and the insulating layer 326 are not provided. In addition to the electrode 311 of the liquid crystal element, an electrode 303 of the liquid crystal element is also provided over the insulating layer 310. The electrode 311 of the liquid crystal element and the electrode 303 of the liquid crystal element are alternately arranged. As is clear from FIG. 6, part of the electrode 303 of the liquid crystal element is stacked over and electrically connected to the conductive layer 304. Furthermore, the conductive layer 304 is electrically connected to a common wiring 332 which is provided in the same layer as that of the gate line 331 through the contact hole provided in the insulating layer 310. In other words, the electrode 303 of the liquid crystal element is electrically connected to the common wiring 332. In such a manner, the conductive layer 304 serves as a reflecting film for performing display by reflection of light that enters the liquid crystal display device as well as a wiring for electrically connecting the electrode 303 of the liquid crystal element and the common wiring 332.

Over the electrode 303 of the liquid crystal element and the electrode 311 of the liquid crystal element, an alignment film 312 is provided. Further, a substrate 321 is provided so as to face the substrate 301 provided with the transistor 351, the electrode 303 of the liquid crystal element, the electrode 311 of the liquid crystal element, and the like, with a liquid crystal layer 325 interposed therebetween. The substrate 321 has a light-shielding layer 322 which overlaps with the transistor 351, a color filter 323 provided in a region where light is transmitted, and an alignment film 324 provided to align the liquid crystal molecule.

A thickness $d_1$ of the liquid crystal layer 325 in a transmission portion 362 where display is performed by transmission of light from a backlight is adjusted by the insulating layer 326 so as to be approximately the double of a thickness $d_2$ of the liquid crystal layer 325 in a reflection portion 361 where display is performed by reflection of external light such as sunlight. In addition, polarizing plates 327a and 327b are provided over the substrate 301 and the substrate 321, respectively. The polarizing plates 327a and 327b are respectively provided on sides of the substrate 301 and the substrate 321, which are opposite to sides provided with the liquid crystal layer 325.

In the liquid crystal display device having the structure as described above, when the transistor 351 is turned on by input of a signal from the gate line 331, a signal from the source line 333 is transmitted to the electrode 311 of the liquid crystal element. Consequently, a potential difference is generated between the electrode 311 of the liquid crystal element and the electrode 303 of the liquid crystal element in the transmission portion 362, and the liquid crystal molecule contained in the liquid crystal layer 325 rotates parallel to the substrate plane. In addition, a potential difference is generated between the electrode 311 of the liquid crystal element and the conductive layer 304 in the reflection portion 361, and the liquid crystal molecule contained in the liquid crystal layer 325 rotates parallel to the substrate plane. The rotation of the liquid crystal molecule makes light transmit through the liquid crystal layer 325. Then, light which has transmitted through the liquid crystal layer 325 in each pixel is combined, thereby displaying an image.

In the case of this structure, in the transmission portion 362, it is not necessary to form a common electrode entirely in the pixel portion. A common electrode in the transmission portion 362 is the electrode 303 of the liquid crystal element and can be formed concurrently with the electrode 311 of the liquid crystal element. Therefore, the number of steps can be reduced, and the number of masks (the number of reticles) can be reduced. Accordingly, the cost can be reduced.

Since this embodiment mode is slightly different from Embodiment Mode 4 only regarding the transistor, the description of Embodiment Mode 1 to Embodiment mode 4 can be applied to and combined with this embodiment mode.

Embodiment Mode 6

An electrode of a liquid crystal element (a first electrode), to which potential from a source line is transmitted, and an electrode of the liquid crystal element (a second electrode), to which potential from a common wiring is transmitted, may be respectively provided in different layers with an insulating layer interposed therebetween as in the liquid crystal display device described in Embodiment Mode 3. Alternatively, the first electrode and the second electrode may be provided over the same insulating layer as in the liquid crystal display device described in Embodiment Mode 4. Furthermore, as in a liquid crystal display device in this embodiment mode, the first electrode and the second electrode may be respectively provided in different layers with an insulating layer interposed therebetween in a portion where display is performed by reflection of light, whereas the first electrode and the second electrode may be provided over the same insulating layer in a portion where display is performed by transmission of light.

Figure 7:
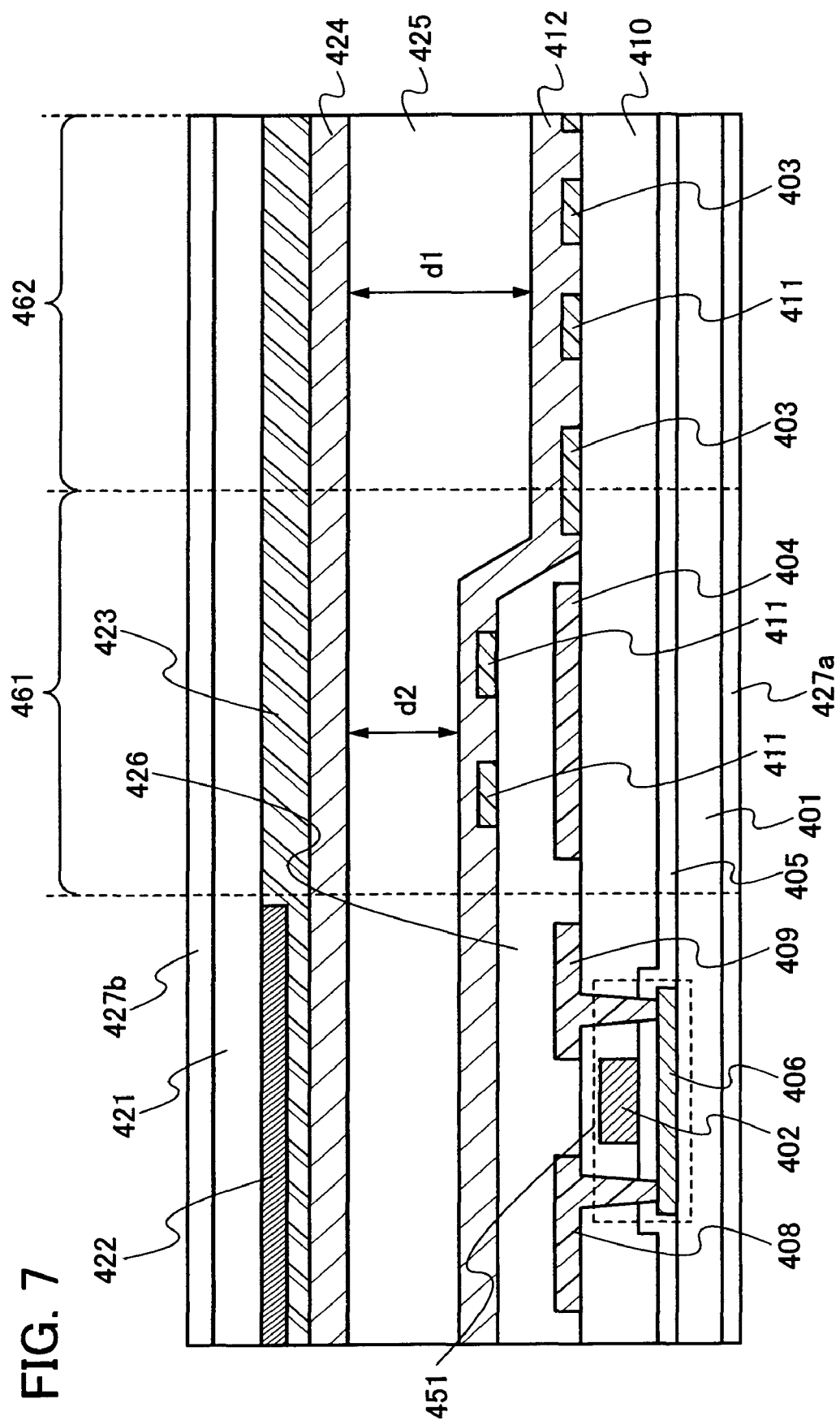
FIG. 7 is a view explaining a mode of a cross-sectional structure of a pixel portion included in a liquid crystal display device according to the present invention.
Figure 8:
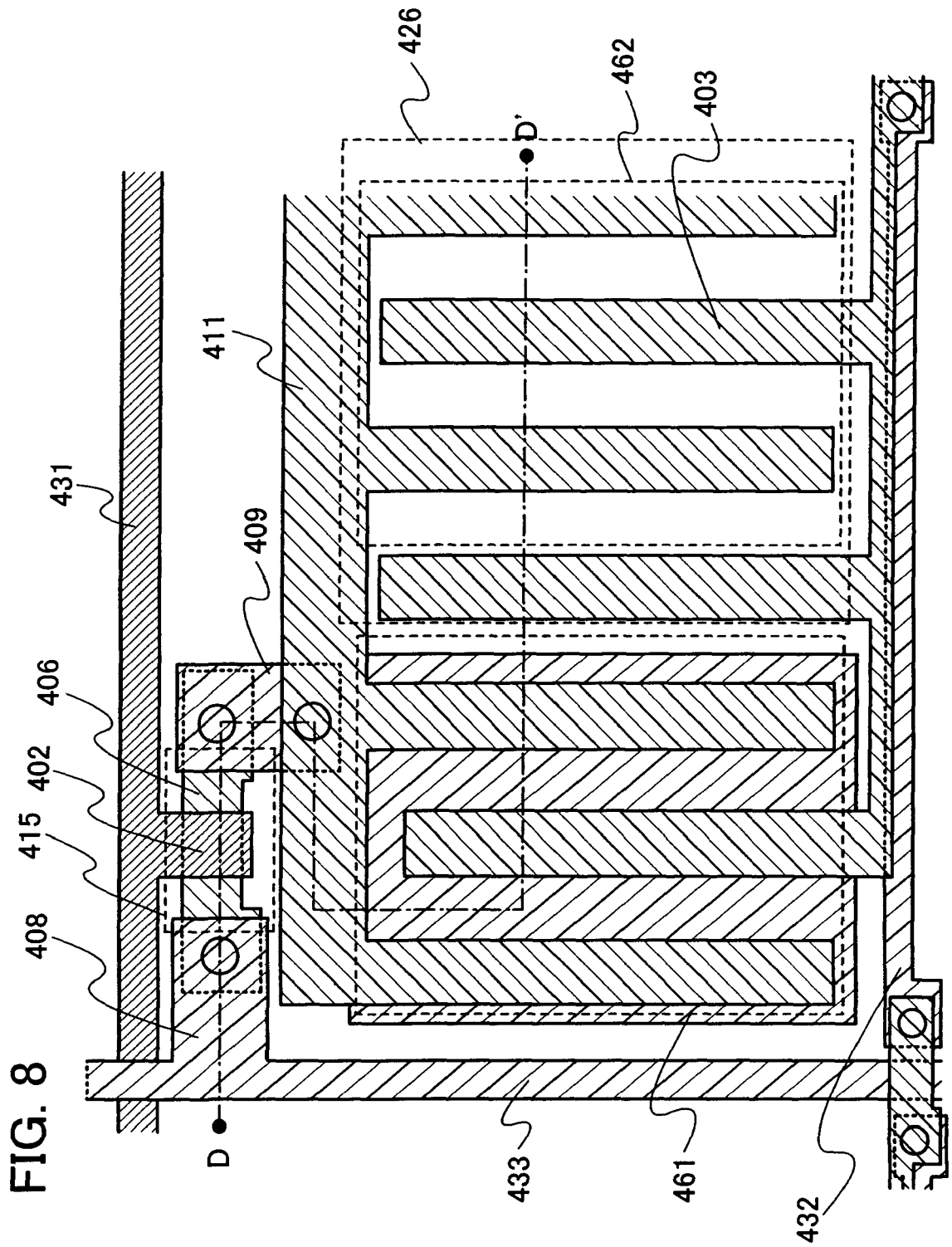
FIG. 8 is a top view explaining a mode of a structure of a pixel portion included in a liquid crystal display device according to the present invention.

With reference to FIGS. 7 and 8, this embodiment mode will describe a mode of a liquid crystal display device in which a gap-adjusting film is provided on a liquid crystal layer side, and an electrode of a liquid crystal element, to which potential from a source line is transmitted, and an electrode of the liquid crystal element, to which potential from a common wiring is transmitted, are formed in the same layer both in a portion where display is performed by reflection of light and in a portion where display is performed by transmission of light. It is to be noted that FIG. 7 is a cross-sectional view corresponding to a cross-sectional structure of FIG. 8, taken along a broken line D-D'.

In FIG. 7, a transistor 451 is provided over a substrate 401. The transistor 451 includes a semiconductor layer 406, a gate electrode 402, and an insulating layer 405 provided between the semiconductor layer 406 and the gate electrode 402. Also in this embodiment mode, similarly to Embodiment Mode 5, the transistor 451 is a top gate transistor in which the gate electrode 402 is provided over the semiconductor layer 406. As is clear from FIG. 8, the gate electrode 402 is a portion which extends from a gate line 431 and is electrically connected to the gate line 431.

The transistor 451 is covered with an insulating layer 410 provided with a contact hole. Over the insulating layer 410, a wiring 408, a wiring 409, and a conductive layer 404 are provided. In this embodiment mode, the wiring 408, the wiring 409, and the conductive layer 404 are formed in the same step. The wiring 408 is a portion which extends from a source line 433 as is clear from FIG. 8 and is electrically connected to the source line 433. It is to be noted that the conductive layer 404 is used as a reflecting film for reflecting external light such as sunlight.

As a gap-adjusting film, an insulating layer 426 is provided so as to cover the transistor 451 and the conductive layer 404. Over the insulating layer 426, an electrode 411 of a liquid crystal element is provided. As is clear from FIG. 8, the electrode 411 of the liquid crystal element also extends to a portion over the insulating layer 410, where the conductive layer 404 and the insulating layer 426 are not provided. In addition to the electrode 411 of the liquid crystal element, an electrode 403 of the liquid crystal element is also provided over the insulating layer 410. The electrode 411 of the liquid crystal element and the electrode 403 of the liquid crystal element are alternately arranged. Furthermore, the electrode 403 of the liquid crystal element is electrically connected to a common wiring 432 which is provided in the same layer as the source line through the contact hole provided in the insulating layer 426. In addition, the common wiring 432 is provided in each pixel, and the common wirings 432 provided in the pixels are electrically connected to each other through a wiring which extends from the electrode 403 of the liquid crystal element and crosses over the source line 433.

Over the electrodes 403 and 411 of the liquid crystal element, an alignment film 412 is provided. Further, a substrate 421 is provided so as to face the substrate 401 provided with the transistor 451, the electrode 403 of the liquid crystal element, the electrode 411 of the liquid crystal element, and the like, with a liquid crystal layer 425 interposed therebetween. Similarly to the substrate 121 described in Embodiment Mode 3, the substrate 421 has a light-shielding layer 422 which overlaps with the transistor 451, a color filter 423 provided in a region where light is transmitted, and an alignment film 424 provided to align the liquid crystal molecule.

A thickness $d_1$ of the liquid crystal layer 425 in a transmission portion 462 where display is performed by transmission of light from a backlight is adjusted by the insulating layer 426 so as to be the double of a thickness $d_2$ of the liquid crystal layer 425 in a reflection portion 461 where display is performed by reflection of external light such as sunlight. In addition, polarizing plates 427a and 427b are provided over the substrate 401 and the substrate 421, respectively. The polarizing plates 427a and 427b are respectively provided on sides of the substrate 401 and the substrate 421, which are opposite to sides provided with the liquid crystal layer 425.

In the liquid crystal display device having the structure as described above, when the transistor 451 is turned on by input of a signal from the gate line 431, a signal from the source line 433 is transmitted to the electrode 411 of the liquid crystal element. Consequently, a potential difference is generated between the electrode 411 of the liquid crystal element and the electrode 403 of the liquid crystal element in the transmission portion 462, and the liquid crystal molecule contained in the liquid crystal layer 425 rotates parallel to the substrate plane. In addition, a potential difference is generated between the electrode 411 of the liquid crystal element and the conductive layer 404 in the reflection portion 461, and the liquid crystal molecule contained in the liquid crystal layer 425 rotates parallel to the substrate plane. The rotation of the liquid crystal molecule makes light transmit through the liquid crystal layer 425. Then, light which has transmitted through the liquid crystal layer 425 in each pixel is combined, thereby displaying an image.

Embodiment Mode 7

When display is performed by reflection of light as in the liquid crystal display device according to the present invention, a gap-adjusting film may contain a particle for scattering light as described above. Alternatively, by providing a retarder having a function of retarding a phase of a wavelength of passing light by a quarter wavelength, reflecting due to reflection of light can be prevented. This embodiment mode will describe a mode of a liquid crystal display device provided with a retarder with reference to FIG. 9.

Figure 9:
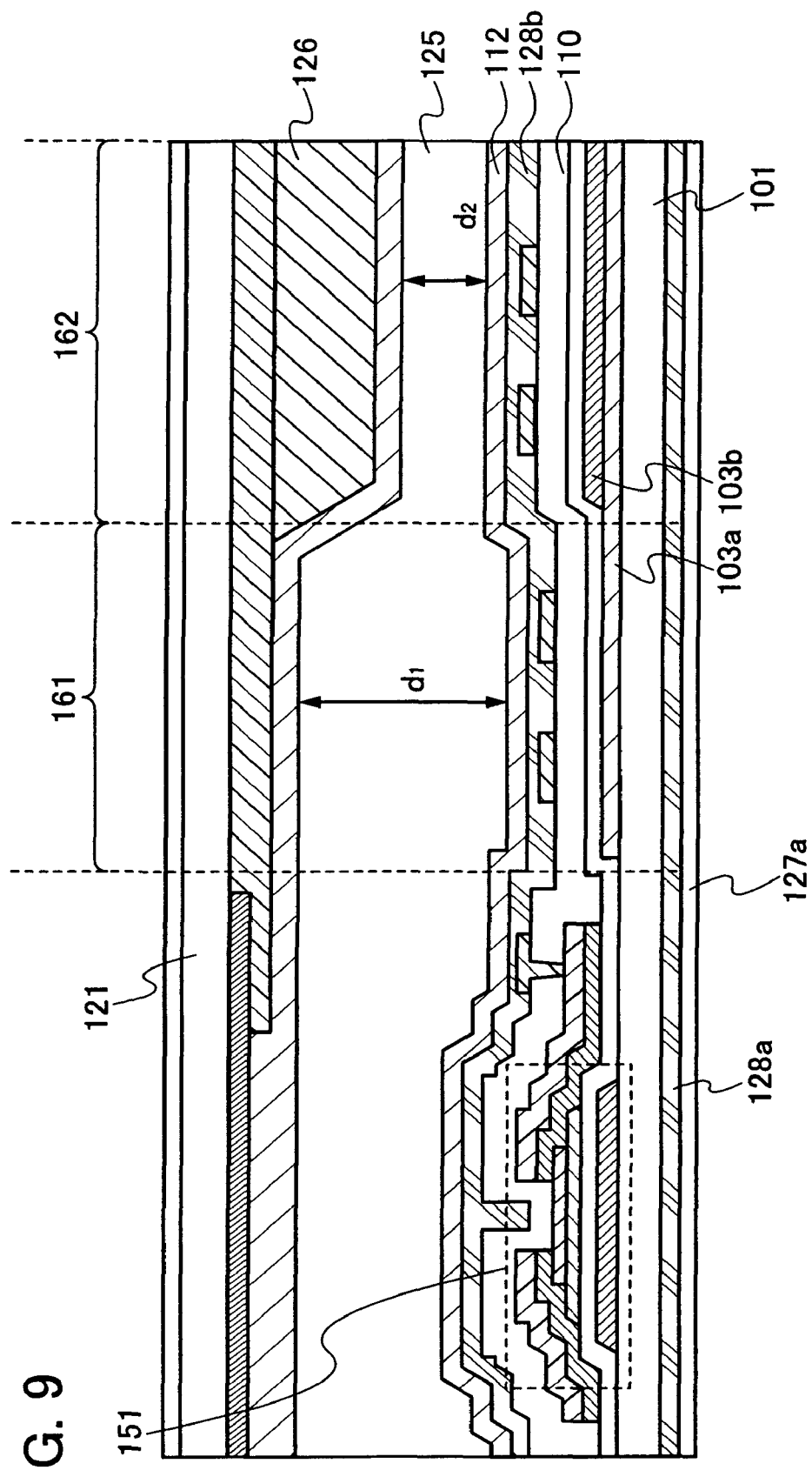
FIG. 9 is a view explaining one mode of a liquid crystal display device according to the present invention.

FIG. 9 shows a mode of a liquid crystal display device, where the liquid crystal display device of FIG. 1 is further provided with a retarder 128a and a retarder 128b. The retarder 128a is provided between a substrate 101 and a polarizing plate 127a. In addition, the retarder 128b is provided between an insulating layer 110 and an alignment film 112, above a conductive layer 103b serving as a reflecting film.

In a transmission portion 161, light enters from the substrate 101 side, transmits through a liquid crystal layer 125, and is emitted to a substrate 121 side, where light passes through both the retarders 128a and 128b to become light in which a phase is retarded by a half wavelength. In addition, in a reflection portion 162 where display is performed by reflection of light, light enters from the substrate 121 side and reflects at the conductive layer 103b, where light passes through the retarder 128b twice (in entering and in reflecting). Therefore, light, in which a phase is retarded by a half wavelength with respect to incident light, is emitted in the reflection portion 162.

By the structure as described above, reflecting due to reflection and reduction in contrast can be prevented. It is to be noted that the retarder is not limited to be provided in the liquid crystal display device shown in FIG. 1 and may be provided in other liquid crystal display device according to the present invention.

Embodiment Mode 8

Embodiment Modes 3 to 7 each describe the mode of the liquid crystal display device in which reflecting due to reflection of light is prevented by the gap-adjusting film containing a particle or by the retarder. This embodiment mode will describe a mode of a liquid crystal display device with reference to FIG. 10, in which a surface of a reflecting film or an electrode of a liquid crystal element also serving as a reflecting film is made uneven to prevent reflecting due to reflection of light or to increase luminance in the case of using the liquid crystal display device as a reflection type display device.

Figure 10:
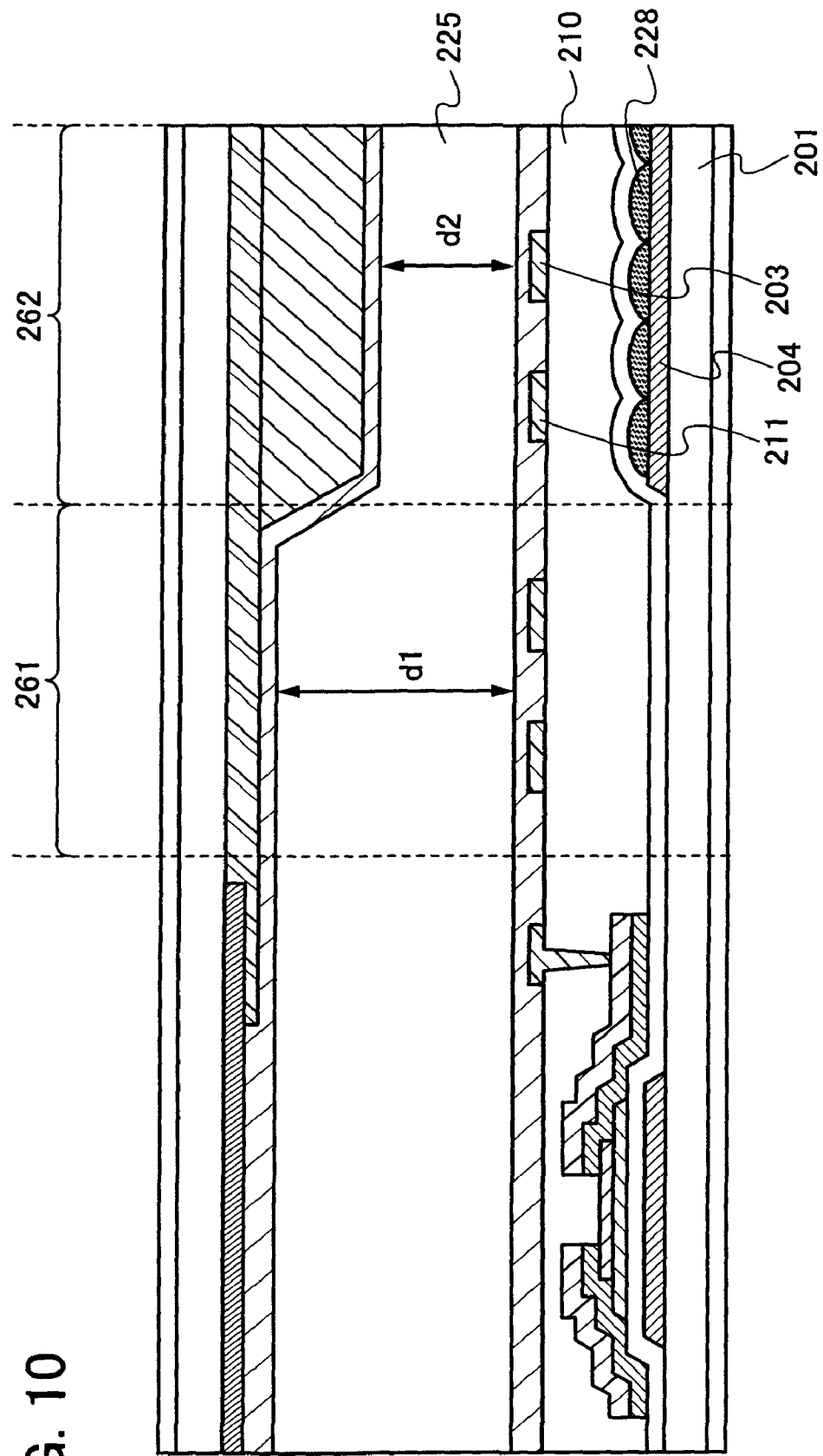
FIG. 10 is a view explaining one mode of a liquid crystal display device according to the present invention.

FIG. 10 shows a mode of a liquid crystal display device, where the liquid crystal display device of FIG. 3 is further provided with a scatterer 228. The scatterer 228 has a shape with a curved surface which increases its thickness toward the center so as to scatter light. In such a manner, by providing the scatterer 228, reflecting due to reflection of light can be prevented, an image with high contrast can be displayed, and luminance can be enhanced.

Embodiment Mode 9

Embodiment Modes 3 to 8 each describe the liquid crystal display device in which the color filter is provided over the substrate which is not provided with the transistor and the like, with the liquid crystal layer interposed. However, a color filter or a black matrix may also be provided over an insulating layer covering a transistor. This embodiment mode will describe a mode of a liquid crystal display device with reference to FIG. 11, in which a color filter is provided over an insulating layer covering a transistor.

Figure 11:
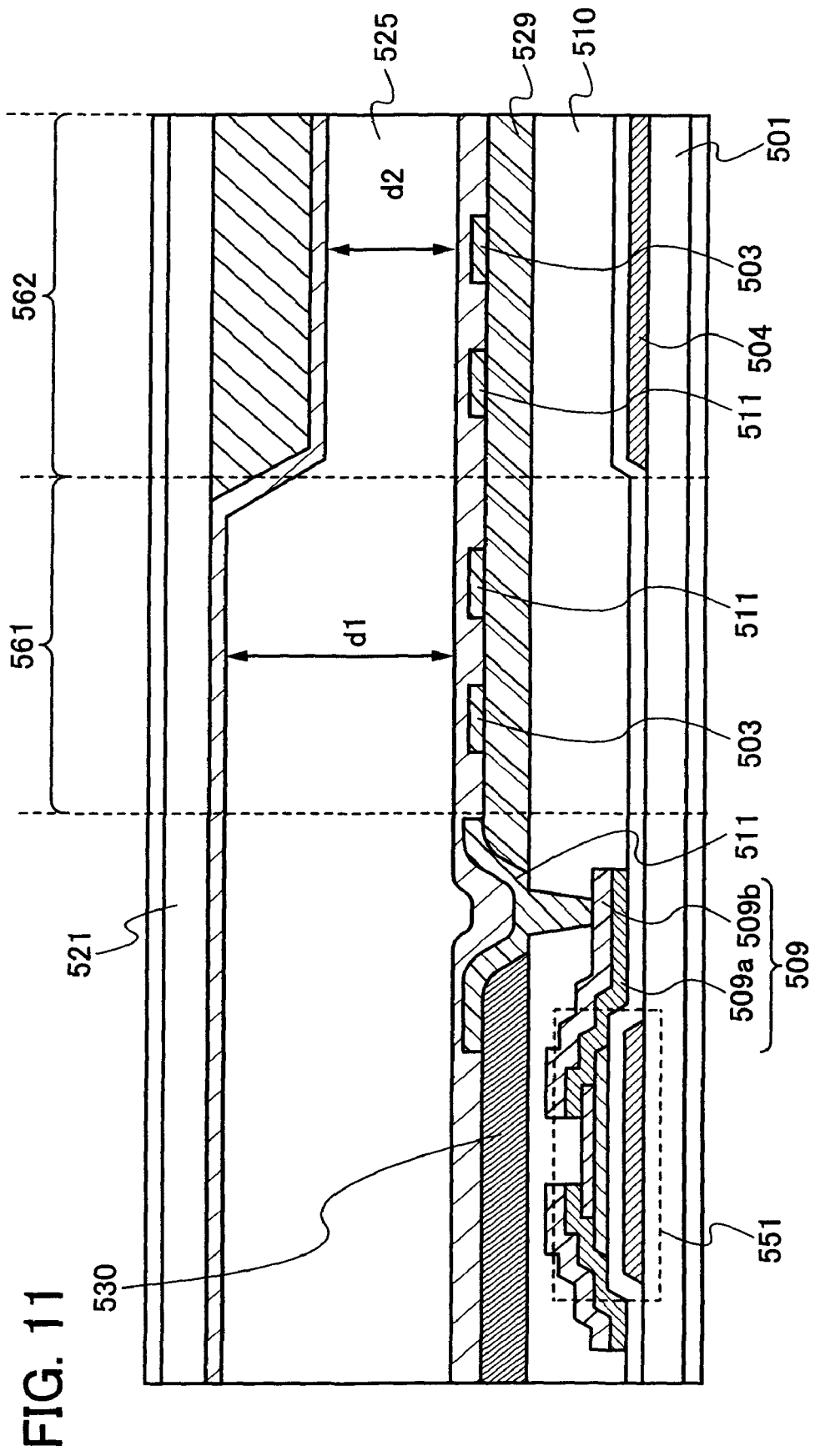
FIG. 11 is a view explaining one mode of a liquid crystal display device according to the present invention.

FIG. 11 shows a mode of a liquid crystal display device in which a color filter 529 is provided between an electrode 503 of a liquid crystal element and an electrode 511 of the liquid crystal element, and an insulating layer 510 covering a transistor 551. In FIG. 11, over the insulating layer 510, a light-shielding layer 530 which overlaps with the transistor 551 is also provided in addition to the color filter 529.

It is to be noted that only one of the color filter and the light-shielding layer may also be provided.

The color filter 529 and the light-shielding layer 530 are each formed in a different step over the insulating layer 510 at a certain interval. In a portion provided with neither the color filter 529 nor the light-shielding layer 530, a contact hole is provided in the insulating layer 510 to reach the transistor. The electrode 511 of the liquid crystal element covers the edges of the color filter 529 and the light-shielding layer 530, and is electrically connected to a wiring 509 through the contact hole provided in the insulating layer 510. It is to be noted that, in the case where the light-shielding layer 530 is in contact with the electrode 511 of the liquid crystal element as in this embodiment mode, the light-shielding layer 530 is preferably formed using an insulating material such as a resin material containing black pigment. In addition, in the case where the light-shielding layer 530 is formed using a metal material, an insulating layer for insulating the light-shielding layer 530 and the electrode 511 of the liquid crystal element is preferably provided therebetween.

Figure 12:
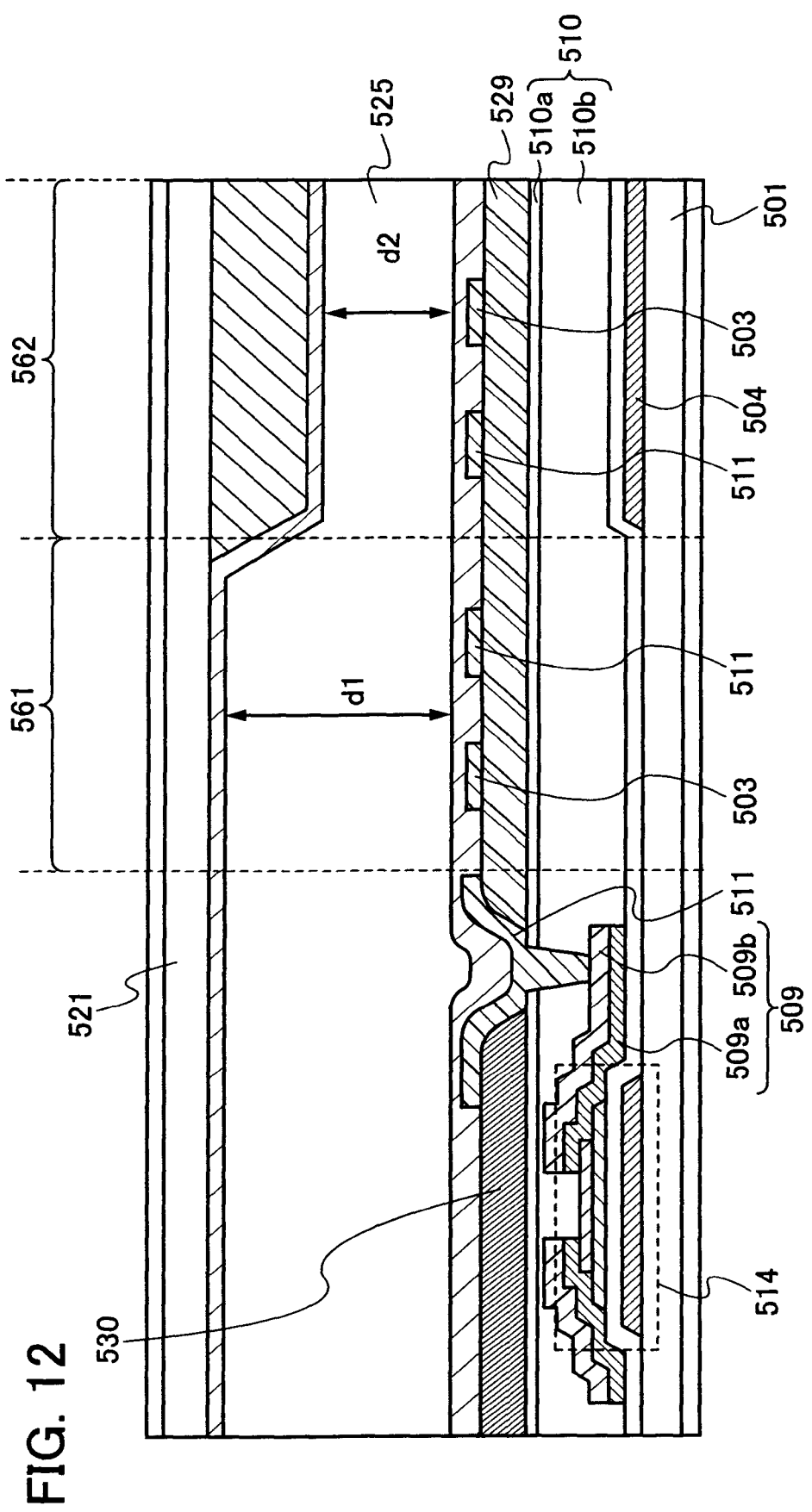
FIG. 12 is a view explaining one mode of a liquid crystal display device according to the present invention.

In addition, in the case where the transistor 551 and the color filter 529 are provided to be in close contact as in this embodiment mode, the insulating layer 510 is formed using silicon nitride so as to prevent an impurity contained in the color filter from diffusing to the transistor 551 side. Alternatively, for example, as shown in FIG. 12, it is preferable that the insulating layer 510 be a multilayer including an insulating layer 510a and an insulating layer 510b, and at least one of them be formed using silicon nitride.

As described above, the liquid crystal display device may also have a structure in which the color filter 529 is provided between a reflecting film 504 or a conductive layer serving as a reflecting film and a liquid crystal layer 525. In a reflection portion 562 where display is performed by reflection of light, light that has entered from a substrate 521 side reflects at the reflecting film 504, passes through the color filter 529 and the liquid crystal layer 525, and is emitted outside from the liquid crystal display device. In addition, in a transmission portion 561 where display is performed by transmission of light, light that has entered from a substrate 501 side passes through the color filter 529 and the liquid crystal layer 525, and is emitted outside from the liquid crystal display device.

It is to be noted that the liquid crystal display device of FIG. 11 is different from the liquid crystal display device of FIG. 3 only regarding a portion provided with the color filter and the light-shielding layer, and other structure is similar to that of the liquid crystal display device of FIG. 3.

Therefore, in various cases such as FIGS. 1, 3, 5, and 7, a color filter or a light-shielding layer (black matrix) can be arranged.

It is to be noted that the color filter or the light-shielding layer (black matrix) can be provided as various insulating layers or part thereof.

Therefore, the description of Embodiment Mode 1 to Embodiment mode 8 can also be applied to and combined with this embodiment mode.

Embodiment Mode 10

The top views shown in FIGS. 2, 4, 6, and 8 each show a mode where at least one of the electrode of the liquid crystal element (the first electrode), to which potential from the source line is transmitted, and the electrode of the liquid crystal element (the second electrode), to which potential from the common wiring is transmitted, is comb-shaped. However, the shapes of the first electrode and the second electrode are not limited to those shown in FIGS. 2, 4, 6, and 8. For example, they may be zigzag shaped or wavy shaped. This embodiment mode will show a mode of a liquid crystal display device having a shape of an electrode, which is different from those shown in FIGS. 2, 4, 6, and 8, with reference to FIGS. 14, 15, and 91A to 91D.

Figure 14:
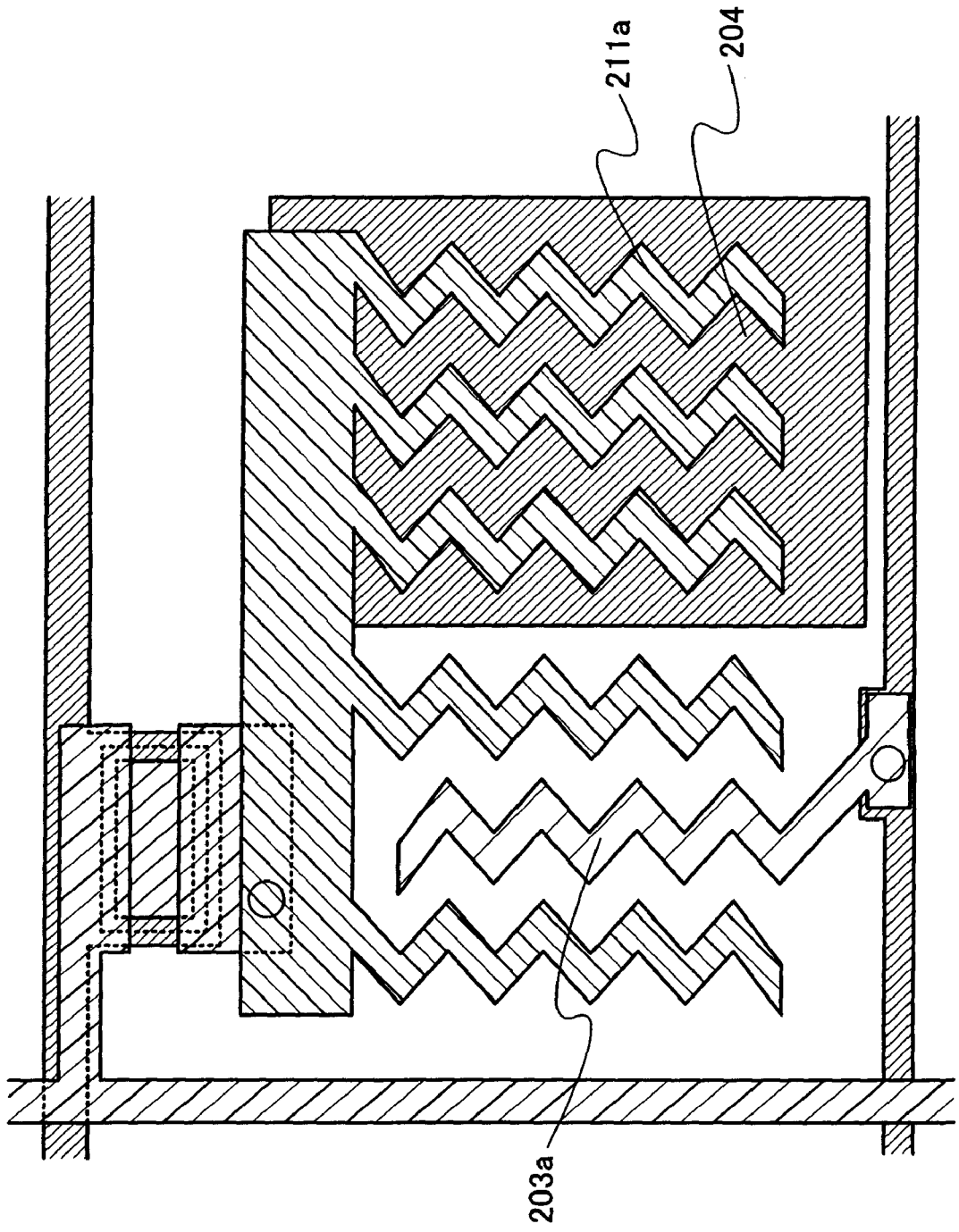
FIG. 14 is a view explaining one mode of a liquid crystal display device according to the present invention.

FIG. 14 shows a mode of a liquid crystal display device in which both an electrode 211a of a liquid crystal element, to which potential from a source line is transmitted, and an electrode 203a of the liquid crystal element, to which potential from a common wiring is transmitted, are zigzag shaped. It is to be noted that, although the shape of the electrode of the liquid crystal element in the liquid crystal display device of FIG. 14 is different from that in the liquid crystal display device shown in FIG. 4, other structures are similar thereto.

Figure 15:
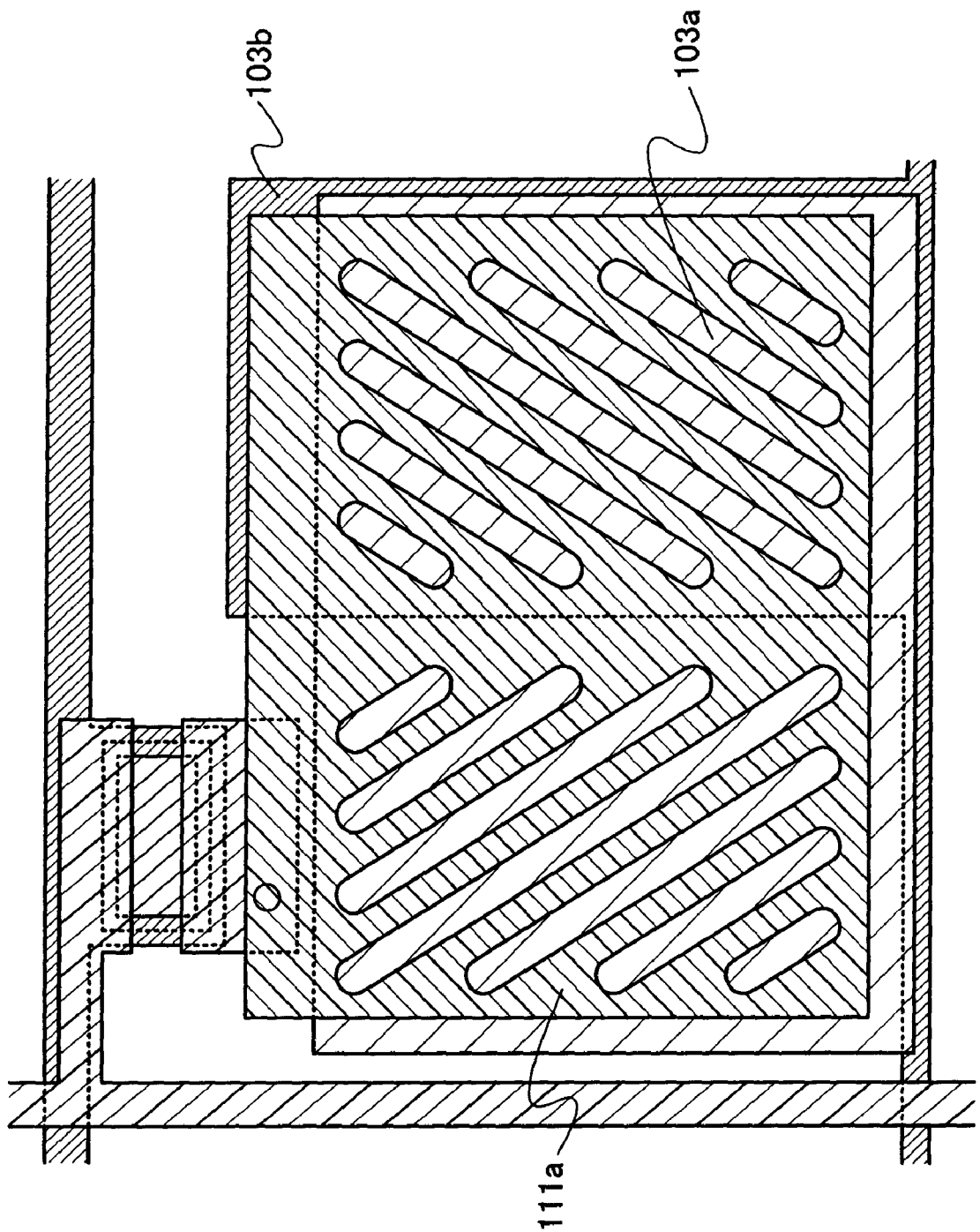
FIG. 15 is a view explaining one mode of a liquid crystal display device according to the present invention.

In addition, FIG. 15 shows a mode of a liquid crystal display device including an electrode 111a of a liquid crystal element, which is slit-shaped and is provided with a plurality of openings having a long and narrow shape. Although the shape of the electrode of the liquid crystal element in this liquid crystal display device is different from that in the liquid crystal display device shown in FIG. 2, other structures are similar thereto. Therefore, a conductive layer 103a and a conductive layer 103b are exposed from the opening of the electrode 111a of the liquid crystal element.

In addition, it is also possible to employ such shapes as shown in FIGS. 91A to 91D.

With such an arrangement, a rotation direction of the liquid crystal molecule can be varied by region in one pixel. That is, a multi-domain liquid crystal display device can be formed. The multi-domain liquid crystal display device can reduce the possibility that an image cannot be recognized accurately when being seen at a certain angle.

It is to be noted that the description of Embodiment Mode 1 to Embodiment mode 9 can also be applied to and combined with this embodiment mode.

Embodiment Mode 11

The present invention can be implemented in various modes in addition to the modes described in Embodiment Modes 1 to 10. Various modes of the liquid crystal display device according to the present invention will be shown in FIGS. 43 to 82.

Each of FIGS. 43 to 82 is an example specifically showing the description of Embodiment Modes 1 and 10. This embodiment mode will describe an example, where the structure described in Embodiment Mode 1 to 10 or a structure realized by combination of the components shown in the drawings is provided with a transistor.

It is to be noted that, in FIGS. 43 to 82, an electrode of a liquid crystal element, to which potential from a source line is transmitted, is referred to as a pixel electrode 4008, and an electrode of the liquid crystal element, which is electrically connected to a common wiring, is referred to as a common electrode 4019. In addition, a reflecting common electrode 4005 which is formed by using the same material as that of a gate electrode 4001 and a wiring 4014 which is formed by using the same material as that of the gate electrode are shown. In addition, a scatterer for providing unevenness is referred to as a projection 4007 for unevenness. A semiconductor layer of a transistor is referred to as a-Si (hereinafter referred to as an amorphous semiconductor layer) 4002 or p-Si (hereinafter referred to as a polycrystalline semiconductor layer) 4013. Further, a wiring provided in a step after the step of forming the gate electrode is referred to as a second wiring 4010.

Figure 43:
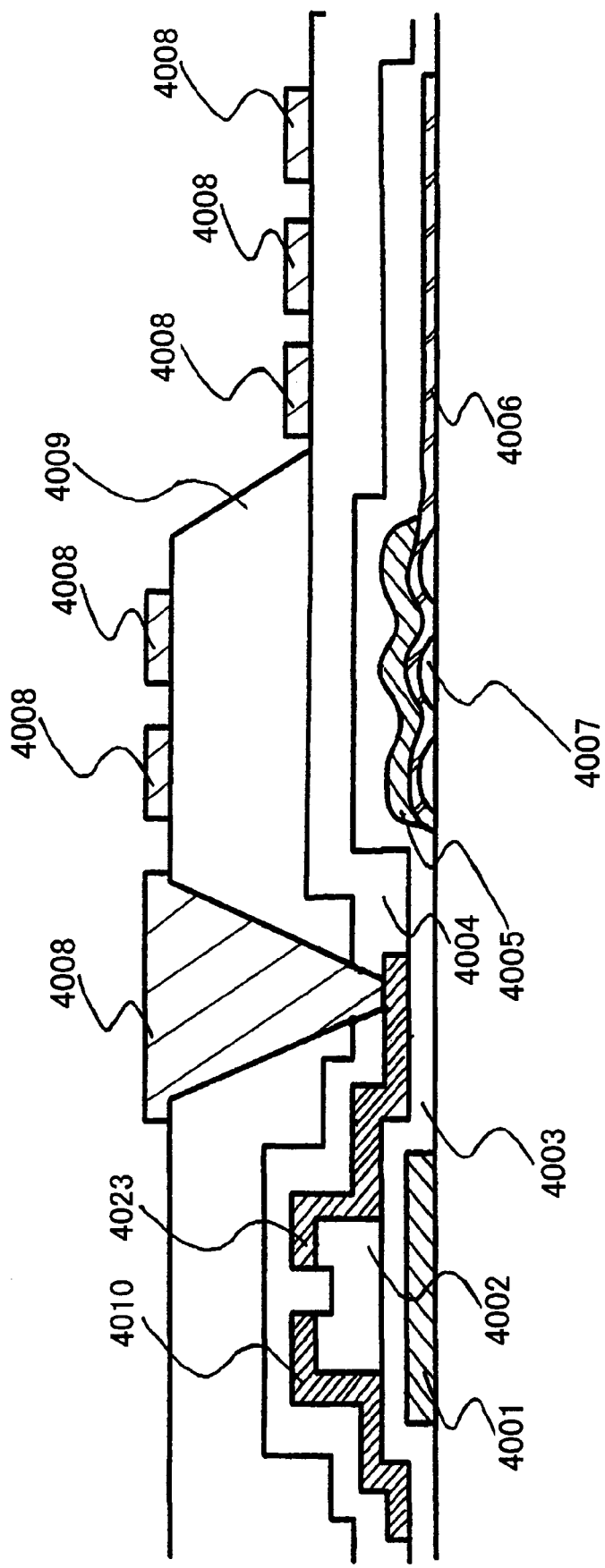
FIG. 43 is a view explaining one mode of a liquid crystal display device according to the present invention.

FIG. 43 shows a structure in which a transistor and a common electrode are provided in the same plane. The transistor includes a gate insulating layer 4003 between a gate electrode 4001 and an amorphous semiconductor layer 4002 and is a bottom gate transistor in which the gate electrode 4001 is provided below the amorphous semiconductor layer 4002. Second wirings 4010 and 4023 are formed over the amorphous semiconductor layer 4002. In addition, a projection 4007 for unevenness is provided in the same plane as that of the gate electrode 4001, and a transmitting common electrode 4006 is formed along the projection 4007 for unevenness. Over the transmitting common electrode 4006, a reflecting common electrode 4005 is formed. In other words, the transmitting common electrode 4006 and the reflecting common electrode 4005 are stacked. The transmitting common electrode 4006 is formed using a material such as indium tin oxide (ITO). The reflecting common electrode 4005 is formed using the same material as that of the gate electrode 4001. A first insulating layer 4004 is formed using a nitride film or the like over and to cover the second wirings 4010 and 4023, the reflecting common electrode 4005, and the transmitting common electrode 4006. Over the first insulating layer 4004, a second insulating layer 4009 is formed using an organic material or the like. The second insulating layer 4009 has an opening, and a pixel electrode 4008 is formed using a material such as ITO over the first insulating layer 4004 in the opening. In a region other than the opening, the pixel electrode 4008 is formed over the second insulating layer 4009. A contact hole is formed in the second insulating layer 4009 and the gate insulating layer 4003 so as to expose the second wiring 4023, and connect the pixel electrode 4008 and the second wiring 4023. The reflecting common electrode 4005 or the transmitting common electrode 4006 is arranged below the pixel electrode 4008 with the second insulating layer 4009, the first insulating layer 4004, or the gate insulating layer 4003 interposed therebetween.

Figure 44:
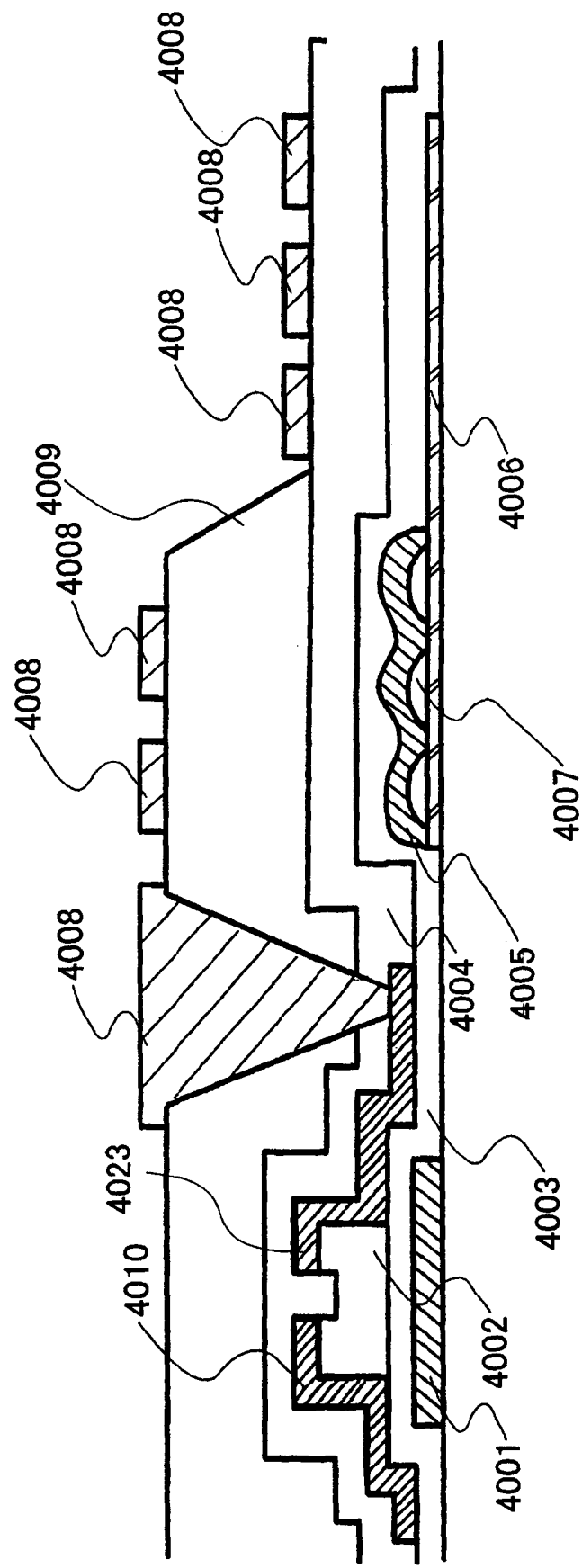
FIG. 44 is a view explaining one mode of a liquid crystal display device according to the present invention.

FIG. 44 shows a structure in which a projection 4007 for unevenness is provided over a transmitting common electrode 4006, and a reflecting common electrode 4005 is formed along the projection 4007 for unevenness. Other structure is similar to that of FIG. 43 or the like, and the description is thus omitted.

Figure 45:
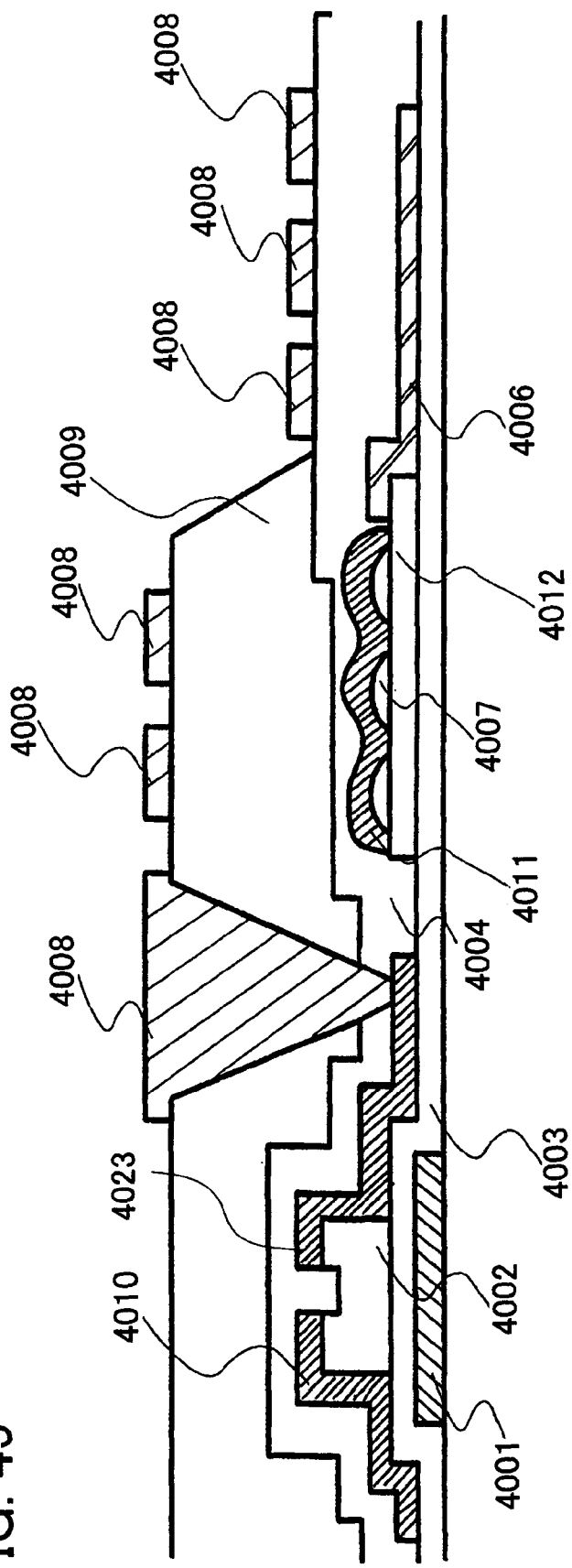
FIG. 45 is a view explaining one mode of a liquid crystal display device according to the present invention.

As shown in FIG. 45, a second wiring 4012 is formed over a gate insulating layer 4003. Over the second wiring 4012, a projection 4007 for unevenness is provided, a reflecting electrode 4011 is formed along the projection 4007 for unevenness, and a transmitting common electrode 4006 is formed so as to overlap with part of the second wiring 4012. Other structure is similar to that of FIG. 43 or the like, and the description is thus omitted.

Figure 46:
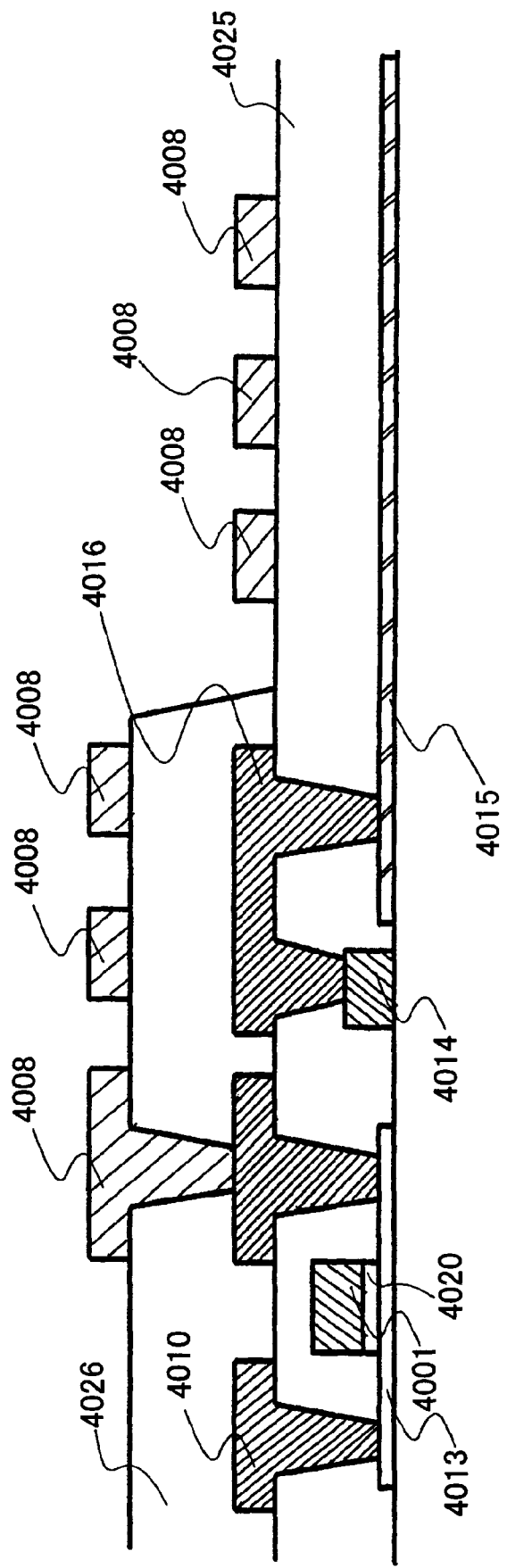
FIG. 46 is a view explaining one mode of a liquid crystal display device according to the present invention.

FIG. 46 shows a top gate transistor in which a gate electrode 4001 is provided above a polycrystalline semiconductor layer 4013. The transistor includes the polycrystalline semiconductor layer 4013, the gate electrode 4001, and a gate insulating layer 4020 provided between the polycrystalline semiconductor layer 4013 and the gate electrode 4001. The transistor is covered with a first insulating layer 4025. Over the first insulating layer 4025, a second wiring 4010 used for a signal line, a reflecting common electrode 4016 formed using the second wiring, and the like are provided. A second insulating layer 4026 formed so as to cover the transistor has an opening, and part of a pixel electrode 4008 is formed over the first insulating layer 4025. Over the second insulating layer 4026, the pixel electrode 4008 is formed using a material such as indium tin oxide (ITO). In addition, a wiring 4014 formed using the same material as that of the gate electrode 4001 and a transmitting common electrode 4015 are formed in the same plane as that of the gate electrode 4001. It is to be noted that the transmitting common electrode 4015 is formed using a polycrystalline semiconductor or ITO. A contact hole is formed in the first insulating layer 4025 so as to expose the wiring 4014 and the transmitting common electrode 4015. The reflecting common electrode 4016 is formed using the same material as that of the second wiring in the contact hole, thereby connecting the reflecting common electrode 4016, the wiring 4014, and the transmitting common electrode 4015. The pixel electrode 4008 is connected to the transistor (the polycrystalline semiconductor layer 4013) through the contact hole formed in the second insulating layer 4026 and the first insulating layer 4025. The reflecting common electrode 4016 or the transmitting common electrode 4015 is arranged below the pixel electrode 4008 with the second insulating layer 4026 and/or the insulating layer 4025 interposed therebetween.

Figure 47:
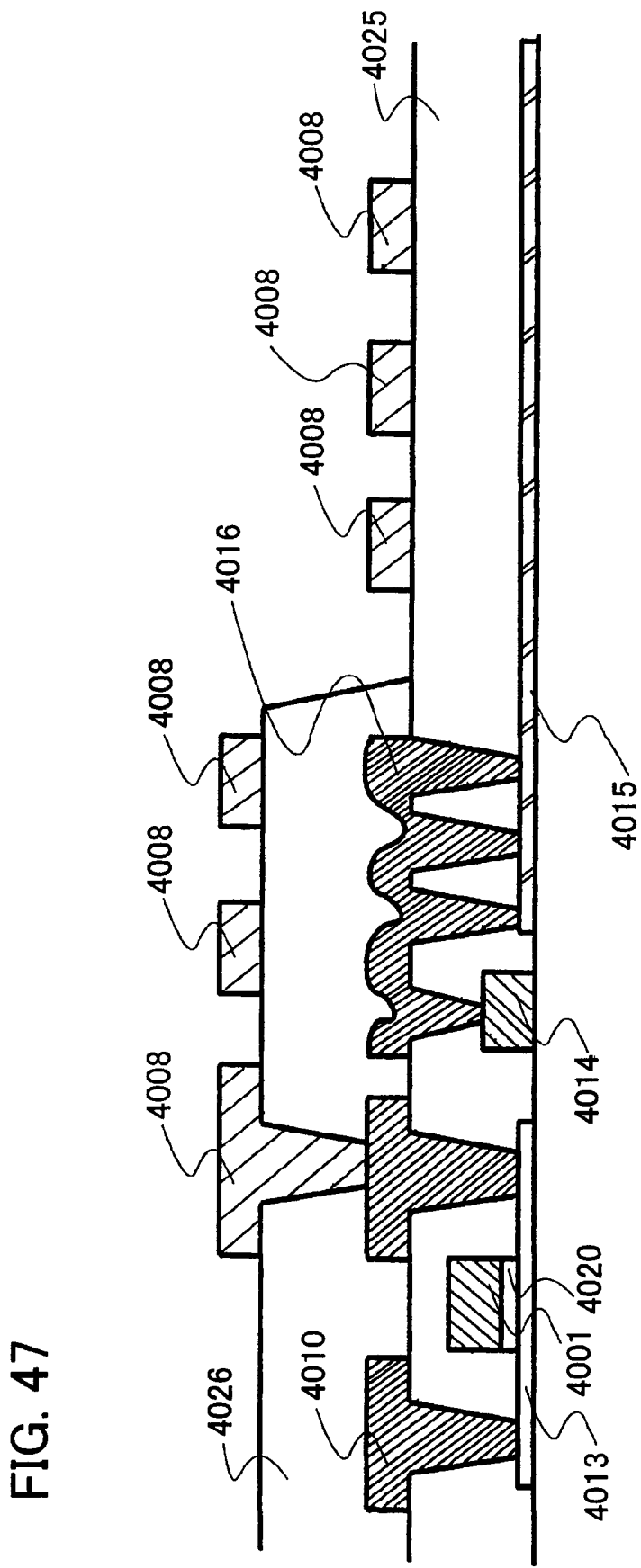
FIG. 47 is a view explaining one mode of a liquid crystal display device according to the present invention.

FIG. 47 shows a structure in which a plurality of contact holes are formed in a first insulating layer 4025 so as to expose a wiring 4014 and a transmitting common electrode 4015 on the transmitting common electrode 4015 side. A reflecting common electrode 4016 formed using the same material as that of a second wiring is formed in the contact hole, thereby connecting the wiring 4014 and the transmitting common electrode 4015. The surface of the reflecting common electrode 4016 is uneven. It is to be noted that an opening can be formed by selective etching utilizing a difference between materials for the first insulating layer 4025 and a second insulating layer 4026. Alternatively, a nitride film may be formed over the first insulating layer 4025. Other structure is similar to that of FIG. 46 or the like, and the description is thus omitted.

Figure 48:
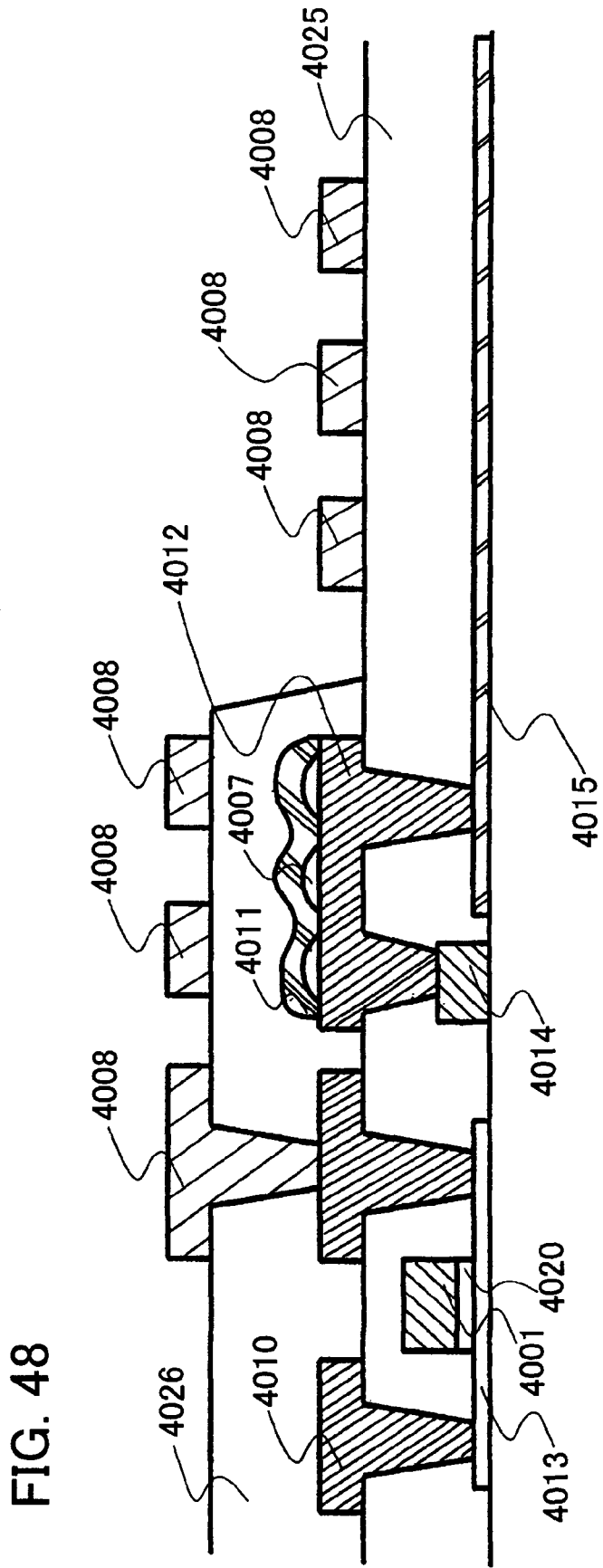
FIG. 48 is a view explaining one mode of a liquid crystal display device according to the present invention.

FIG. 48 shows a structure in which a projection 4007 for unevenness is formed over a second wiring 4012, and a reflecting electrode 4011 is formed along the projection 4007 for unevenness. Other structure is similar to that of FIG. 46 or the like, and the description is thus omitted.

Figure 49:
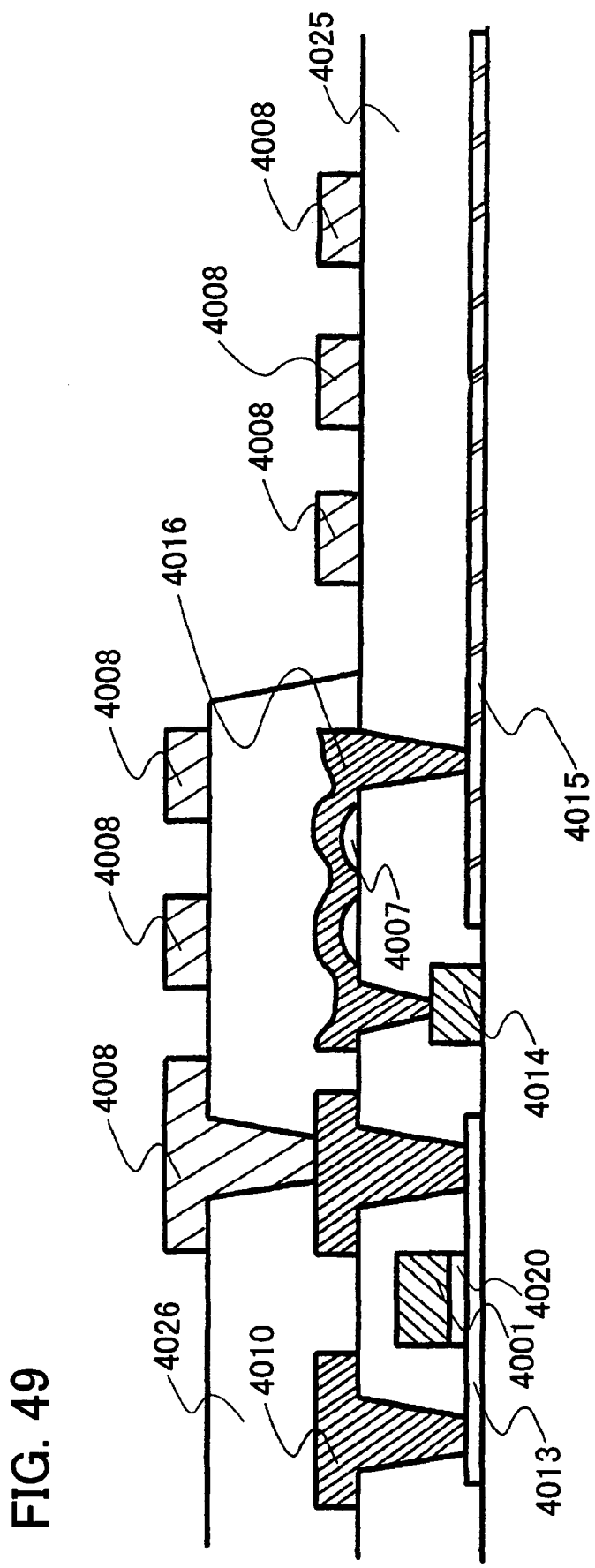
FIG. 49 is a view explaining one mode of a liquid crystal display device according to the present invention.

FIG. 49 shows a structure in which a projection 4007 for unevenness is provided over a first insulating layer 4025, and a reflecting common electrode 4016 is formed using the same material as that of a second wiring along the projection 4007 for unevenness. Other structure is similar to that of FIG. 46 or the like, and the description is thus omitted.

Figure 50:
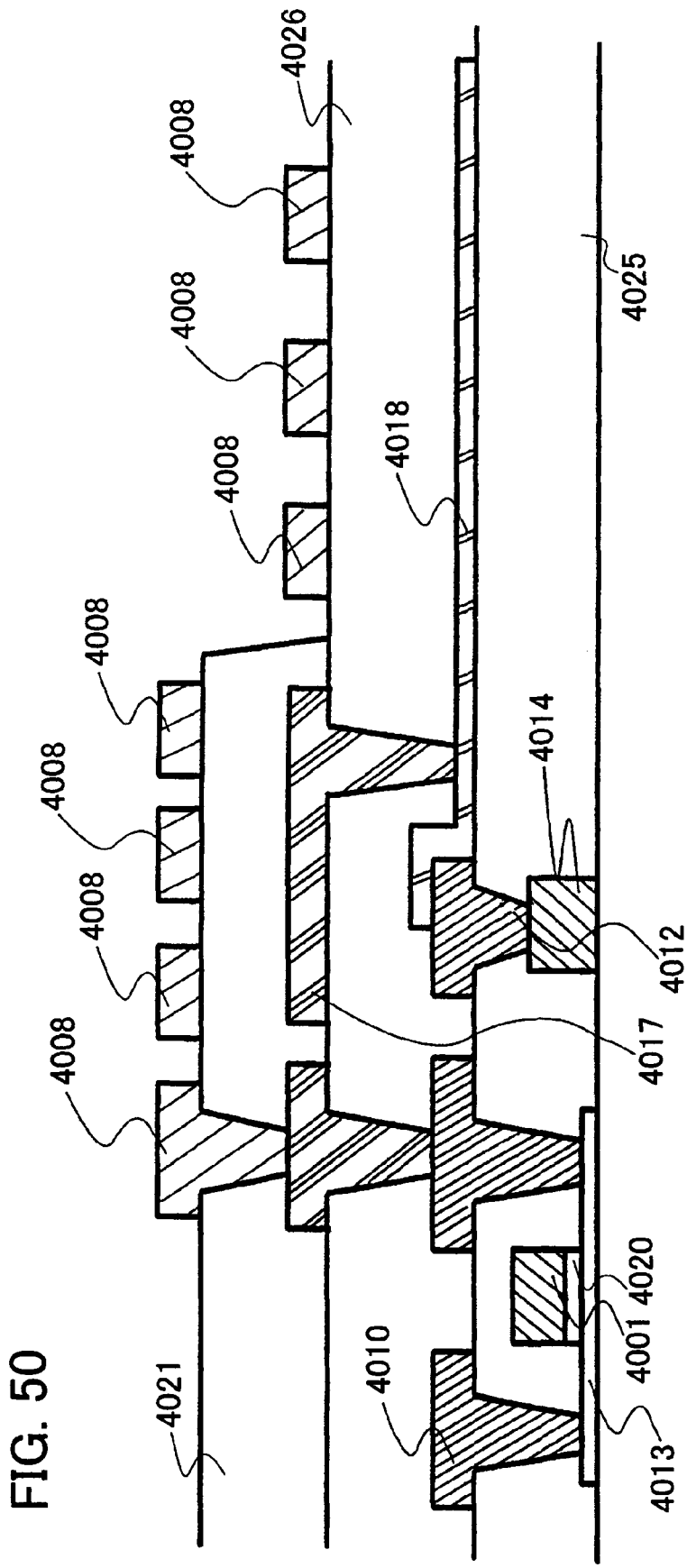
FIG. 50 is a view explaining one mode of a liquid crystal display device according to the present invention.

FIG. 50 shows a structure in which a third insulating layer 4021 is provided. A wiring 4014 is formed using the same material as that of a gate electrode 4001 in the same plane as that of a polycrystalline semiconductor layer 4013. A first insulating layer 4025 is formed over a transistor and the wiring 4014, and a contact hole is formed so as to expose the wiring 4014. A second wiring 4012 is connected to the wiring 4014 in the contact hole. Over the first insulating layer 4025, a transmitting common electrode 4018 is formed so as to overlap with part of the second wiring 4012. Over the transistor and the transmitting common electrode 4018, a second insulating layer 4026 is formed. In the second insulating layer 4026, a contact hole is formed, thereby connecting a reflecting common electrode 4017 formed using the same material as that of the second wiring and the transmitting common electrode 4018. Over the reflecting common electrode 4017, a third insulating layer 4021 is formed. The third insulating layer 4021 has an opening, and part of a pixel electrode 4008 is formed over the second insulating layer 4026. The pixel electrode 4008 is formed also over the third insulating layer 4021. The pixel electrode 4008 is connected the transistor (the polycrystalline semiconductor layer 4013) through the contact hole formed in the third insulating layer 4021, the second insulating layer 4026, and the first insulating layer 4025. The reflecting common electrode 4017 or the transmitting common electrode 4018 is arranged below the pixel electrode 4008 with the third insulating layer 4021 and/or the second insulating layer 4026 interposed therebetween.

Figure 51:
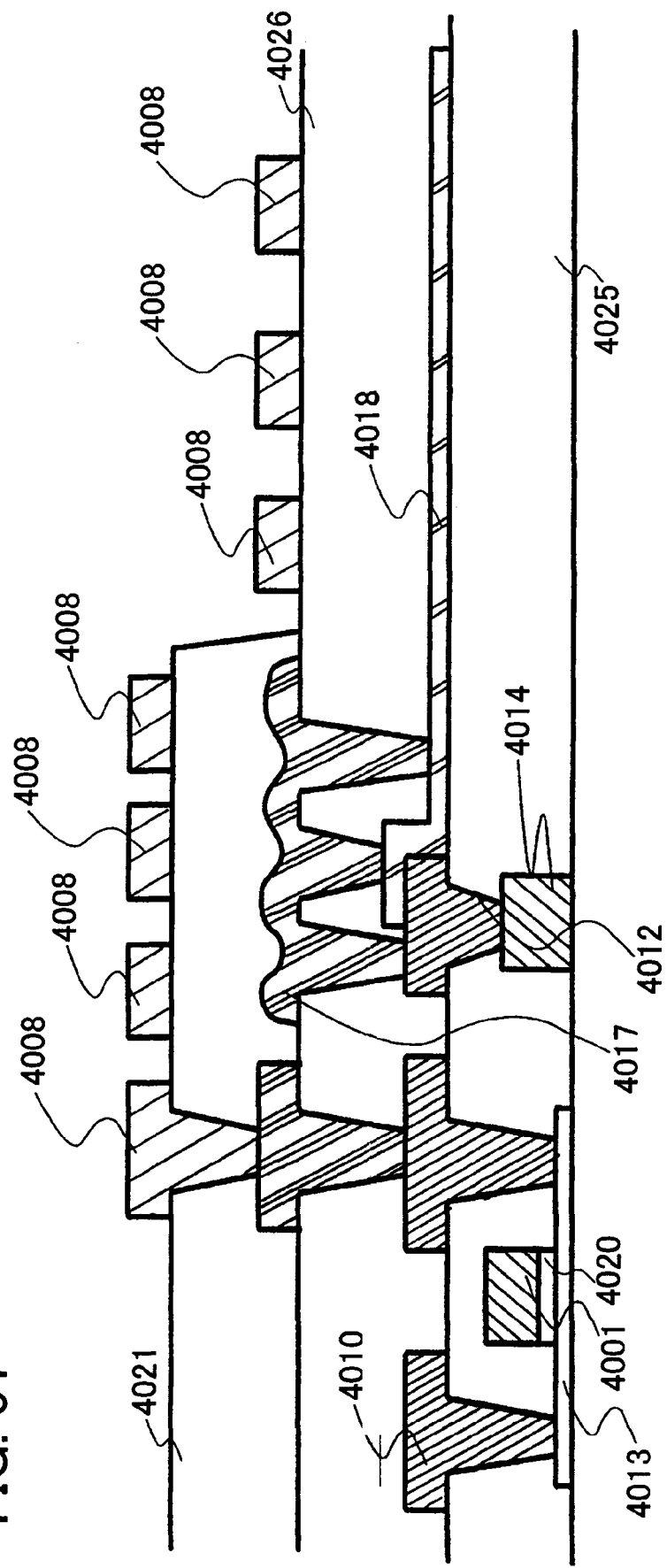
FIG. 51 is a view explaining one mode of a liquid crystal display device according to the present invention.

FIG. 51 shows a structure in which a plurality of contact holes are formed in a second insulating layer 4026 so as to expose a second wiring 4012 and a transmitting common electrode 4018 on the transmitting common electrode 4018 side. A reflecting common electrode 4017 is formed in the contact hole, thereby connecting the second wiring 4012 and the transmitting common electrode 4018. It is to be noted that the surface of the reflecting common electrode 4017 is uneven. Other structure is similar to that of FIG. 50 or the like, and the description is thus omitted.

Figure 52:
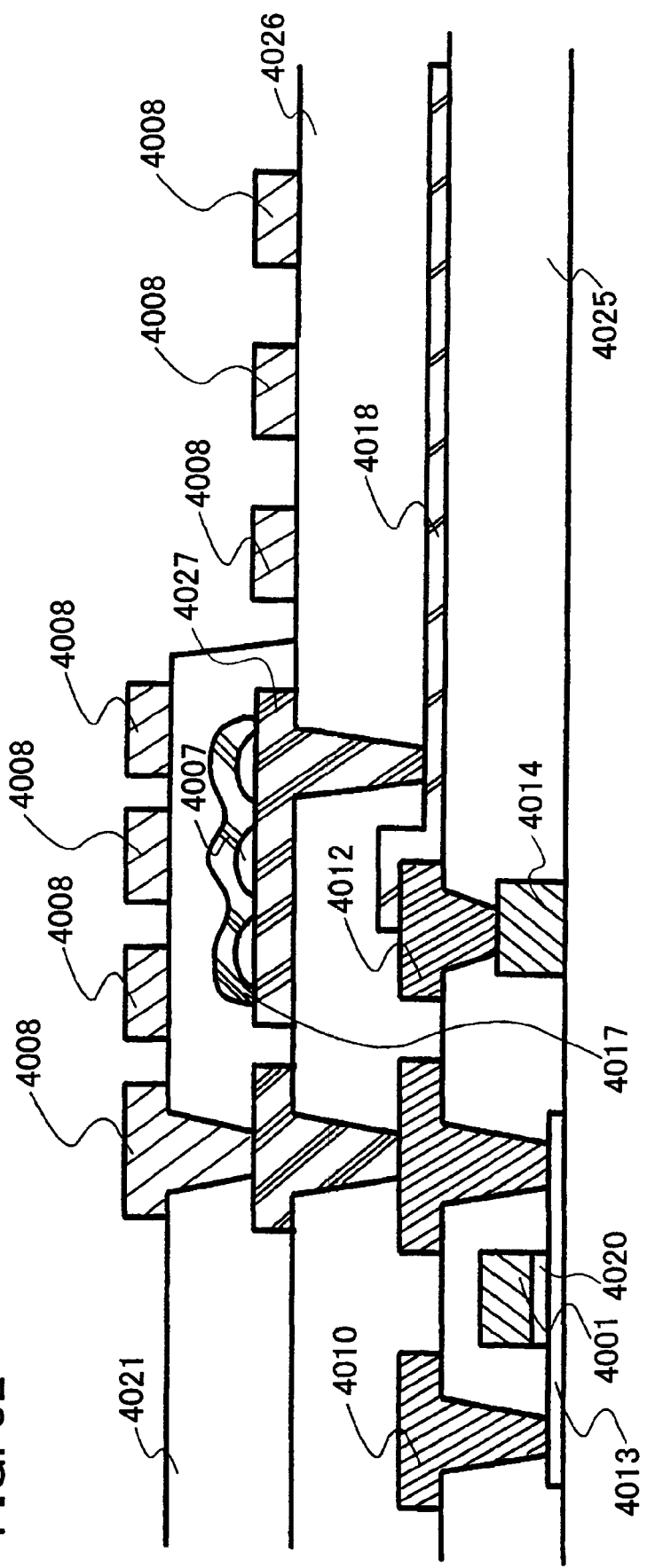
FIG. 52 is a view explaining one mode of a liquid crystal display device according to the present invention.

FIG. 52 shows a structure in which a projection 4007 for unevenness is provided over a conductive layer 4027, and a reflecting common electrode 4017 is formed along the projection 4007 for unevenness. A contact hole is formed in a second insulating layer 4026 so as to expose a transmitting common electrode 4018, thereby connecting the conductive layer 4027 and the transmitting common electrode 4018. Other structure is similar to that of FIG. 50 or the like, and the description is thus omitted.

Figure 53:
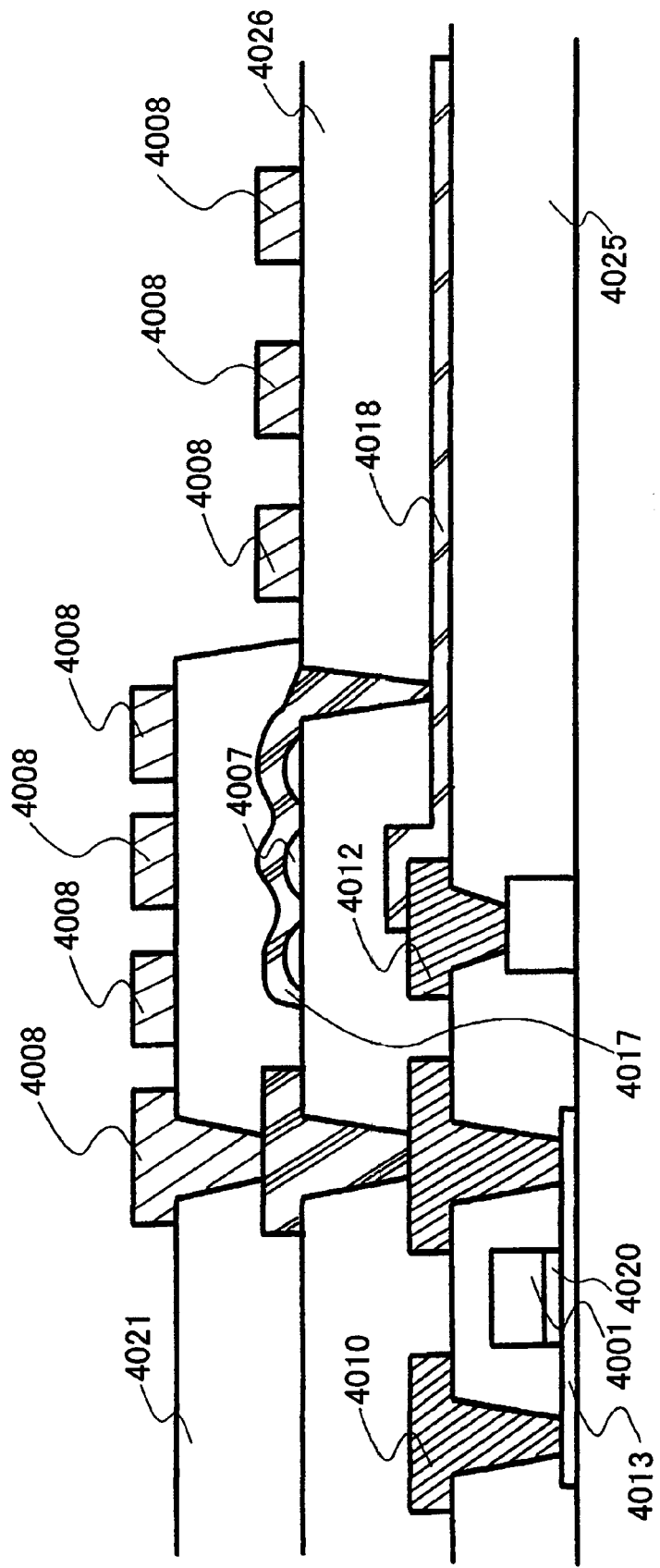
FIG. 53 is a view explaining one mode of a liquid crystal display device according to the present invention.

FIG. 53 shows a structure, in which a projection 4007 for unevenness is provided over a second insulating layer 4026, and a reflecting common electrode 4017 is formed along the projection 4007 for unevenness. Other structure is similar to that of FIG. 50 or the like, and the description is thus omitted.

Figure 54:
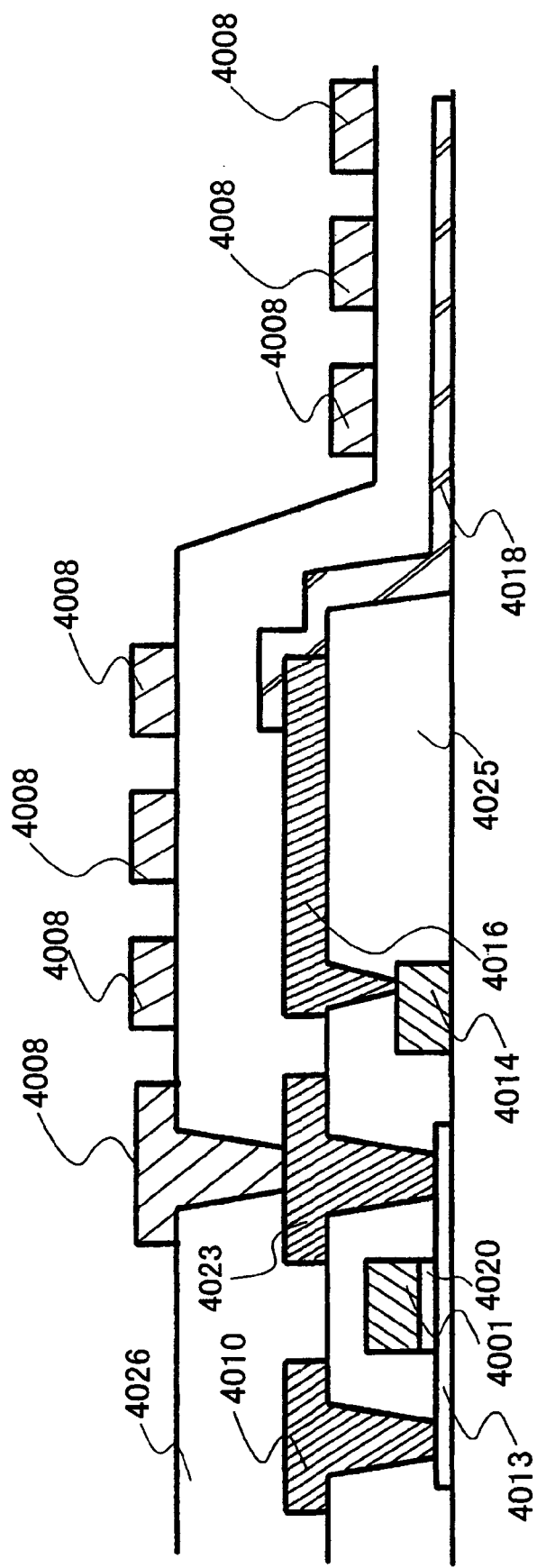
FIG. 54 is a view explaining one mode of a liquid crystal display device according to the present invention.

FIG. 54 shows a structure in which an opening is provided in a first insulating layer 4025. A contact hole is formed in the first insulating layer 4025 so as to expose a wiring 4014 formed using the same material as that of a gate electrode, thereby connecting a reflecting common electrode 4016 formed using the same material as that of a second wiring and the wiring 4014. A transmitting common electrode 4018 is formed so as to overlap with part of the reflecting common electrode 4016 in the same plane as that of a polycrystalline semiconductor layer 4013 (in the opening in the first insulating layer 4025) and over the first insulating layer 4025. Over the first insulating layer 4025 and the transmitting common electrode 4018, a second insulating layer 4026 is formed. A pixel electrode 4008 is formed over the second insulating layer 4026. A contact hole is formed in the second insulating layer 4026 so as to expose a second wiring 4023 of a transistor, thereby connecting the pixel electrode 4008 and the second wiring 4023. In other words, the pixel electrode 4008 is connected to the transistor (the polycrystalline semiconductor layer 4013) through the contact hole formed in the second insulating layer 4026 and the first insulating layer 4025. The reflecting common electrode 4016 or the transmitting common electrode 4018 is arranged below the pixel electrode 4008 with the second insulating layer 4026 interposed therebetween. Other structure is similar to that of FIG. 46 or the like, and the description is thus omitted.

Figure 55:
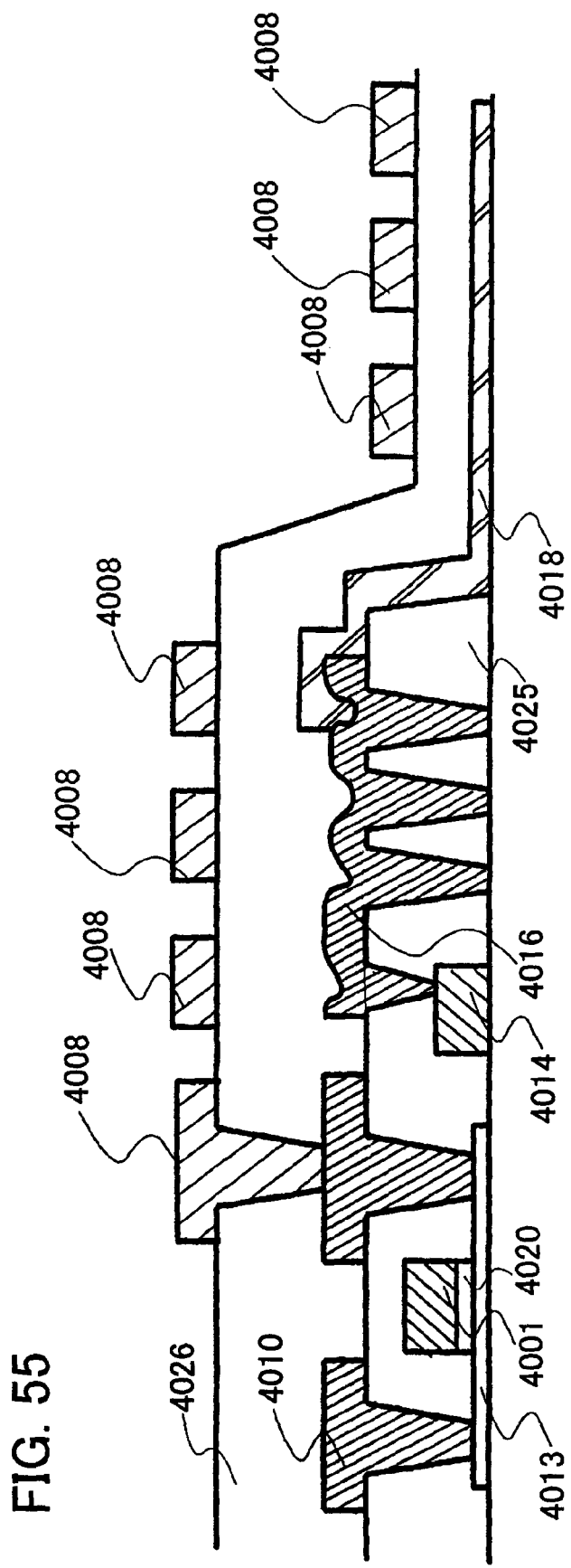
FIG. 55 is a view explaining one mode of a liquid crystal display device according to the present invention.

FIG. 55 shows a structure in which a plurality of contact holes are formed in a first insulating layer 4025. A reflecting common electrode 4016 is formed in the opening. It is to be noted that the surface of the reflecting common electrode 4026 is uneven. Other structure is similar to that of FIG. 54 or the like, and the description is thus omitted.

Figure 56:
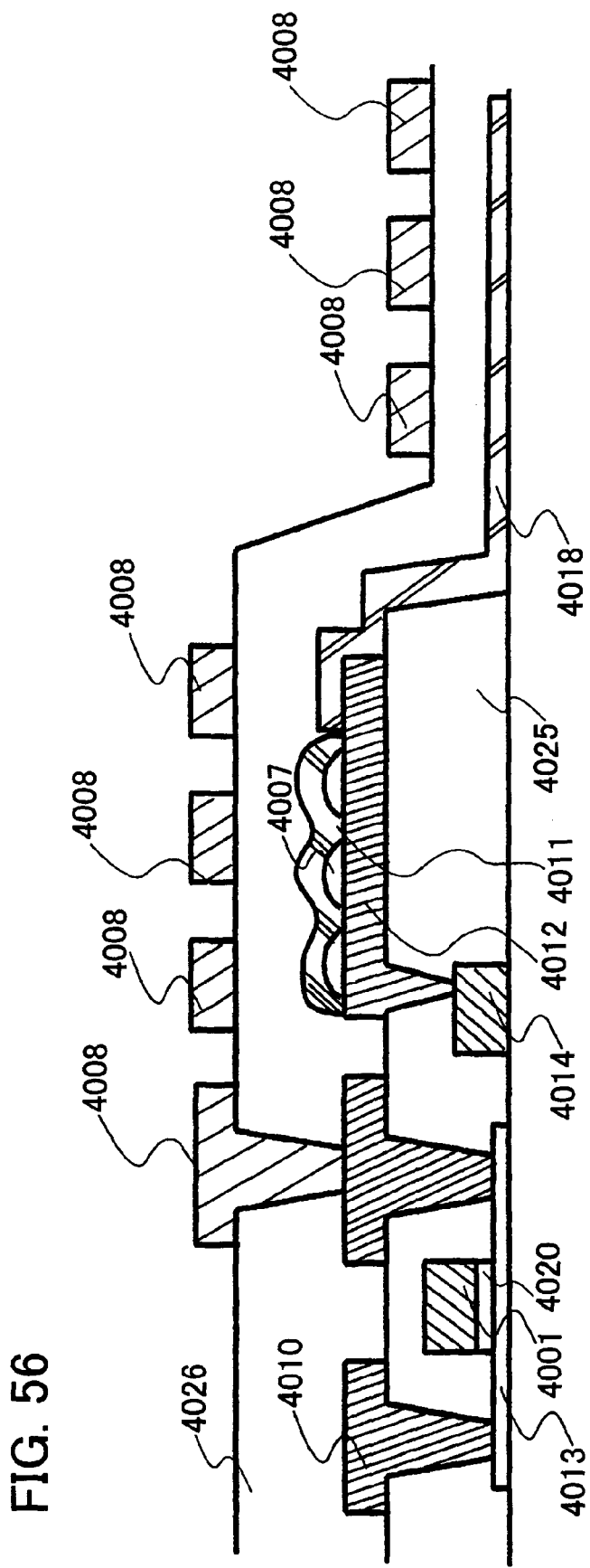
FIG. 56 is a view explaining one mode of a liquid crystal display device according to the present invention.

FIG. 56 shows a structure in which a projection 4007 for unevenness is provided over a second wiring 4012, and a reflecting electrode 4011 is formed along the projection 4007 for unevenness. Other structure is similar to that of FIG. 54 or the like, and the description is thus omitted.

Figure 57:
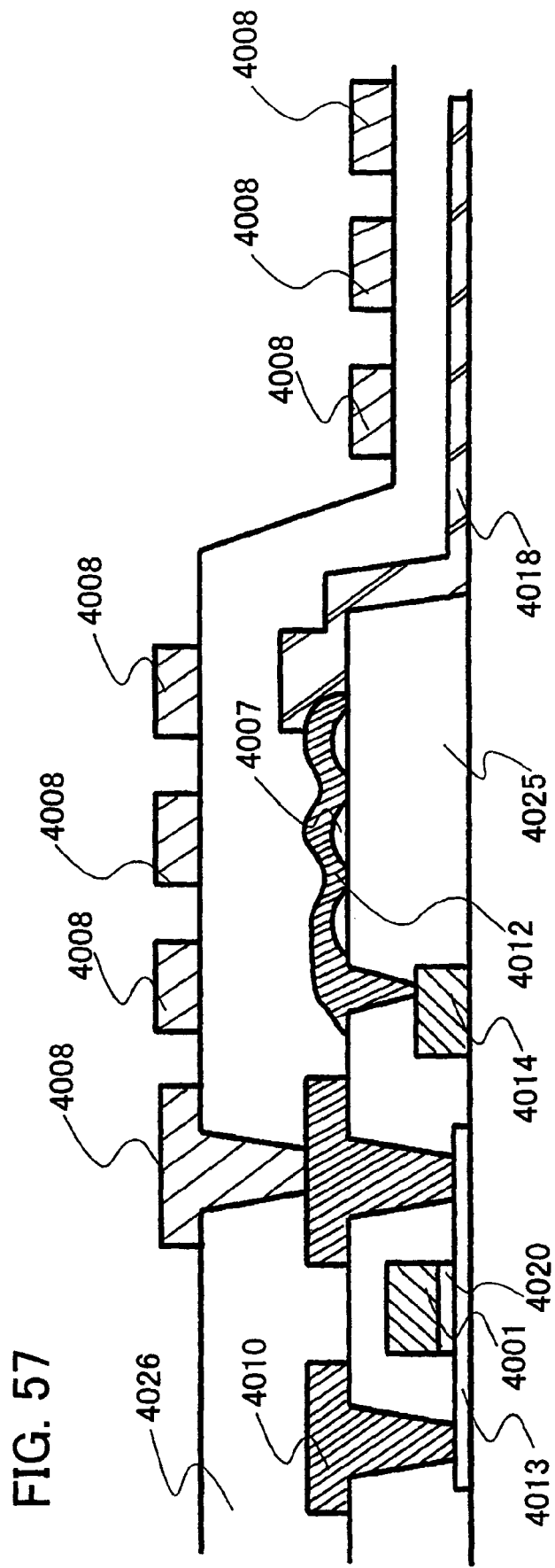
FIG. 57 is a view explaining one mode of a liquid crystal display device according to the present invention.

As shown in FIG. 57, a projection 4007 for unevenness is provided over a first insulating layer 4025, and a second wiring 4012 is formed along the projection 4007 for unevenness. Other structure is similar to that of FIG. 54 or the like, and the description is thus omitted.

Figure 58:
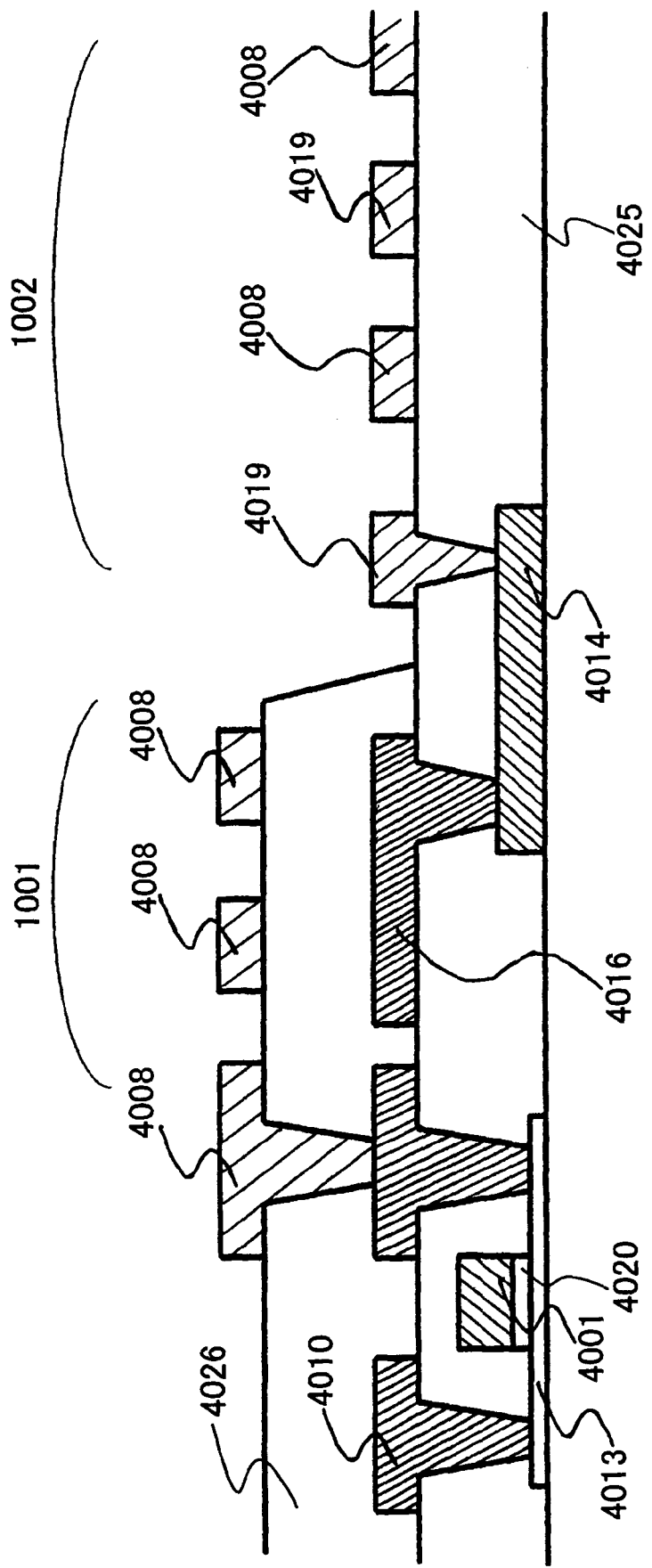
FIG. 58 is a view explaining one mode of a liquid crystal display device according to the present invention.

FIG. 58 shows a structure in which an opening is provided in a second insulating layer 4026. A wiring 4014 is formed in the same plane as that of a transistor. Over the transistor and the wiring 4014, a first insulating layer 4025 is formed. Over the first insulating layer 4025 in a transmission portion 1002, a common electrode 4019 and a pixel electrode 4008 which are formed using ITO or the like are formed. In the transmission portion 1002, the common electrode 4019 and the pixel electrode 4008 are alternately arranged. Further, in the transmission portion 1002, the common electrode 4019 is not arranged below the pixel electrode 4008. On the other hand, in a reflection portion 1001, the pixel electrode 4008 is formed over a second insulating layer 4026. In the reflection portion 1001, a reflecting common electrode 4016 is arranged below the pixel electrode 4008 with the second insulating layer 4026 interposed therebetween. In the reflection portion 1001 and the transmission portion 1002, a contact hole is formed in the first insulating layer 4025 so as to expose the wiring 4014. In the reflection portion 1001, the reflecting common electrode 4016 is formed in the contact hole whereas, in the transmission portion 1002, the common electrode 4019 is formed in the contact hole. The pixel electrode 4008 is connected to the transistor (a polycrystalline semiconductor layer 4013) through the contact hole formed in the second insulating layer 4026 and the first insulating layer 4025.

Figure 59:
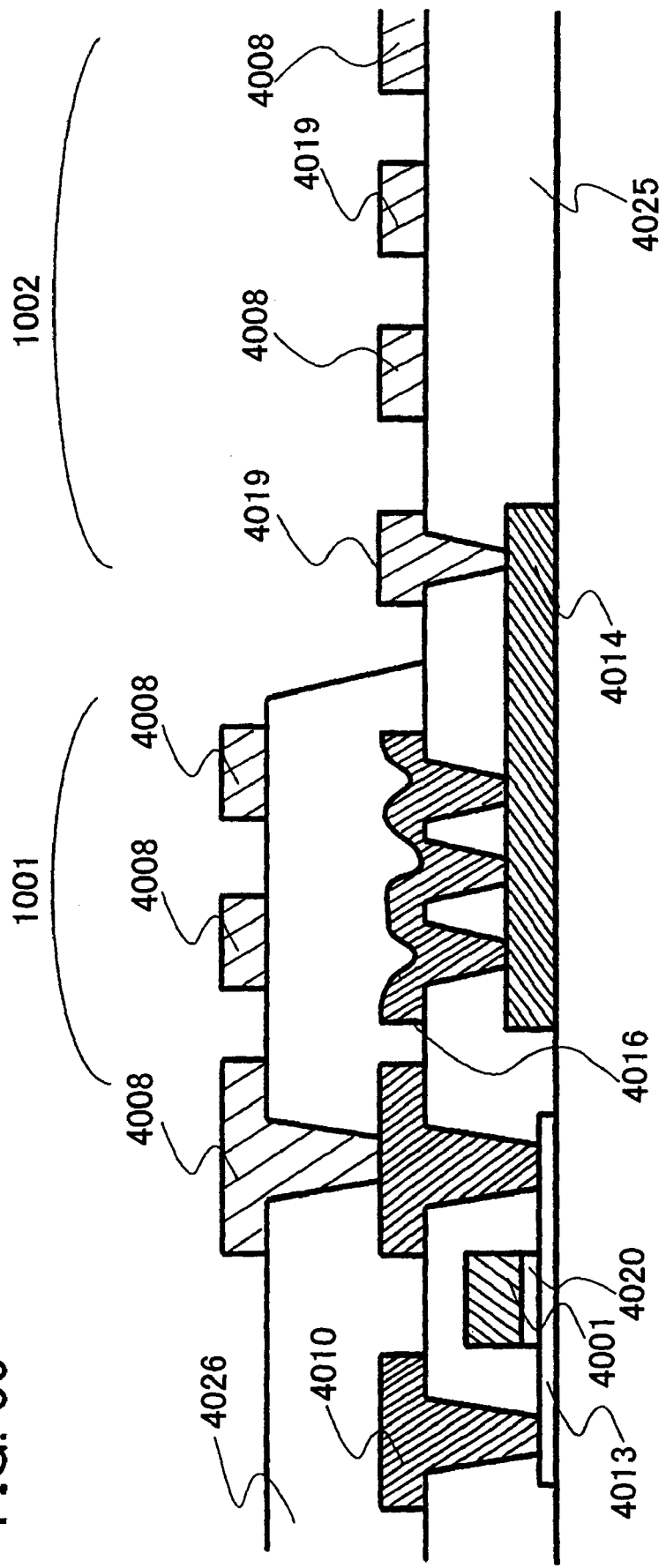
FIG. 59 is a view explaining one mode of a liquid crystal display device according to the present invention.

FIG. 59 shows a structure in which a plurality of contact holes are formed in a first insulating layer 4025 so as to expose a wiring 4014 on a reflection portion 1001 side. A reflecting common electrode 4016 is formed using the same material as that of a second wiring in the contact hole, thereby connecting the reflecting common electrode 4016 and the wiring 4014. The surface of the reflecting common electrode 4016 is uneven. Other structure is similar to that of FIG. 58 or the like, and the description is thus omitted.

Figure 60:
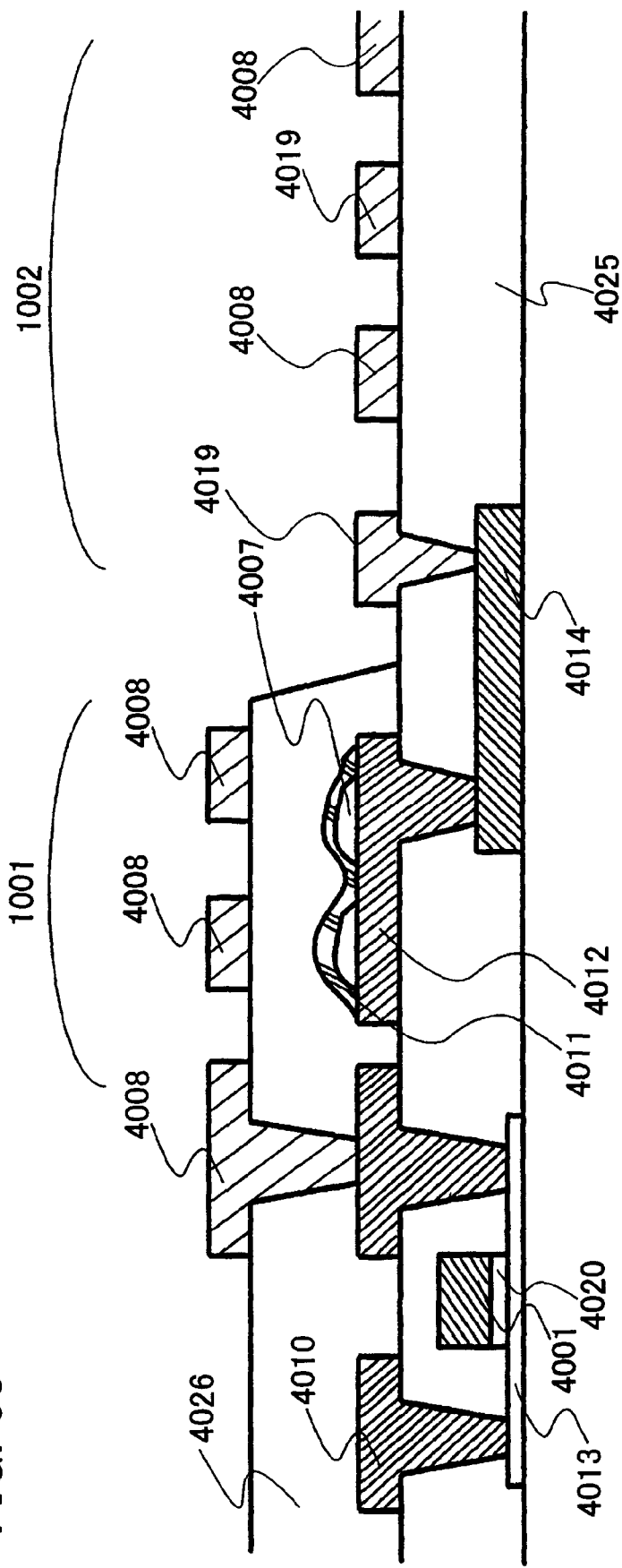
FIG. 60 is a view explaining one mode of a liquid crystal display device according to the present invention.

FIG. 60 shows a structure in which a projection 4007 for unevenness is provided over a second wiring 4012, and a reflecting electrode 4011 is formed along the projection 4007 for unevenness. Other structure is similar to that of FIG. 58 or the like, and the description is thus omitted.

Figure 61:
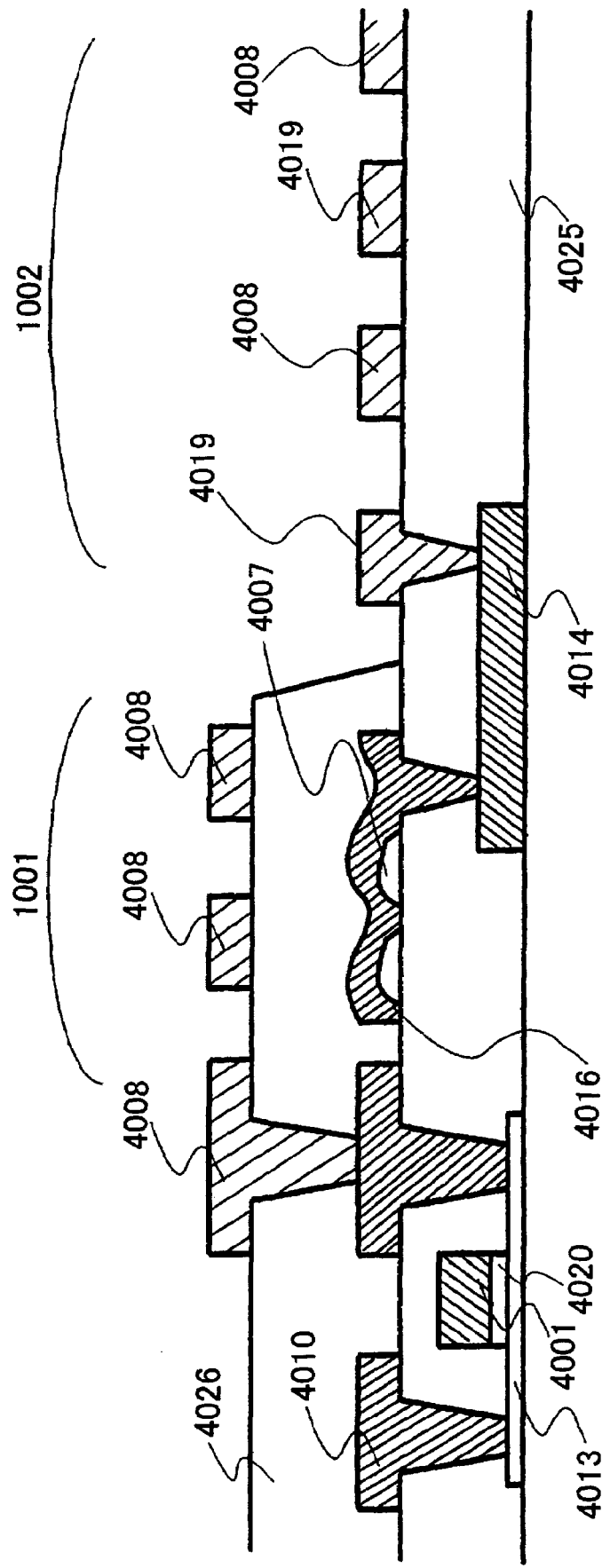
FIG. 61 is a view explaining one mode of a liquid crystal display device according to the present invention.

As shown in FIG. 61, a projection 4007 for unevenness is provided over a first insulating layer 4025, and a reflecting common electrode 4016 is formed using a second wiring along the projection 4007 for unevenness. Other structure is similar to that of FIG. 58 or the like, and the description is thus omitted.

Figure 62:
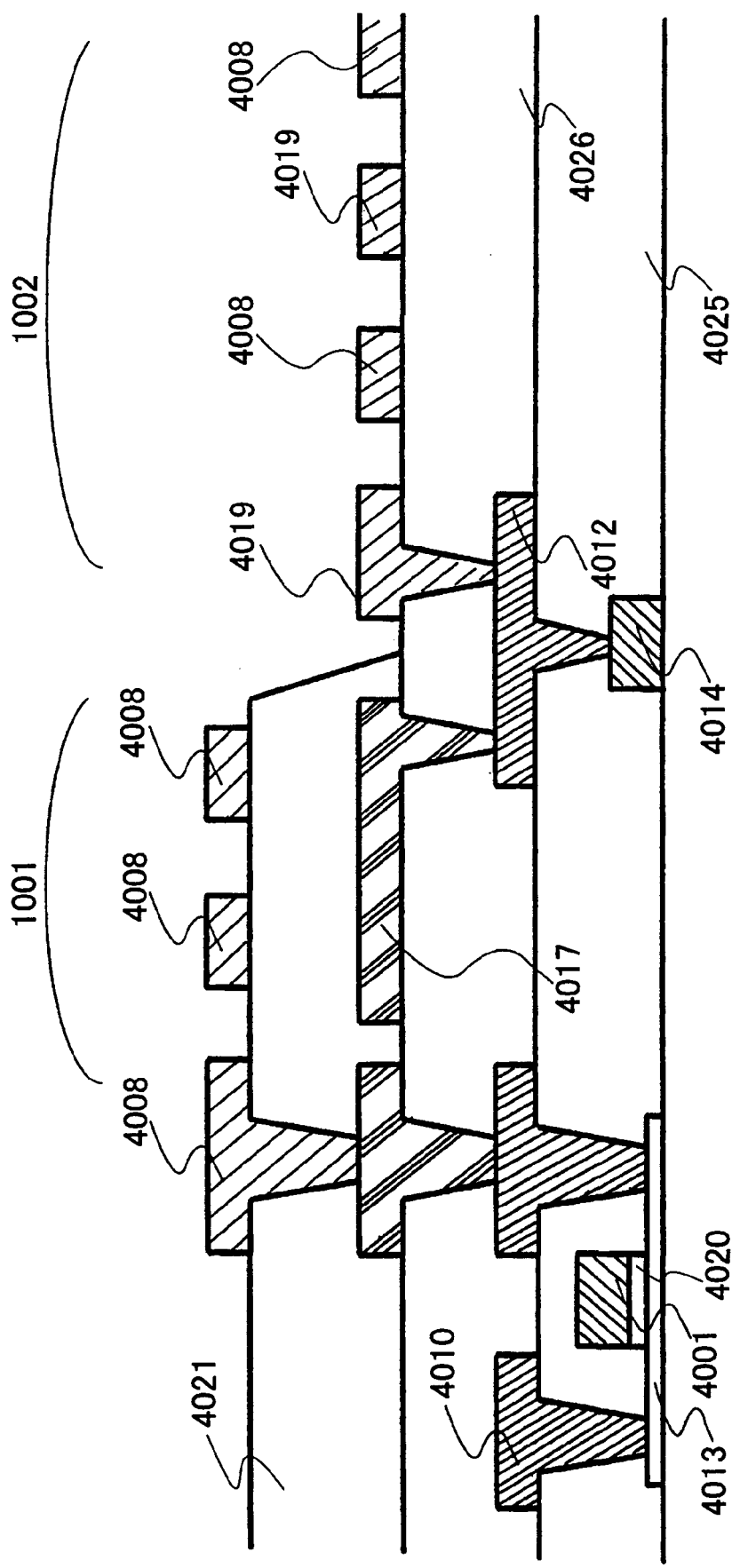
FIG. 62 is a view explaining one mode of a liquid crystal display device according to the present invention.

FIG. 62 shows a structure in which a third insulating layer 4021 is provided. In the same plane as that of a polycrystalline semiconductor layer 4013, a wiring 4014 is formed using the same material as that of a gate electrode. Over a transistor and the wiring 4014, a first insulating layer 4025 is formed and a contact hole is formed so as to expose the wiring 4014. A second wiring 4012 is formed in the contact hole so as to be connected to the wiring 4014. Over the transistor and the second wiring 4012, a second insulating layer 4026 is formed. In the second insulating layer 4026, a contact hole is formed in each of a reflection portion 1001 and a transmission portion 1002. A reflecting common electrode 4017 is formed in the contact hole in the reflection portion 1001, and a common electrode 4019 is formed in the contact hole in the transmission portion 1002. The third insulating layer 4021 is formed over the reflecting common electrode 4017. The third insulating layer 4021 has an opening, and part of a pixel electrode 4008 and part of the common electrode 4019 are formed over the second insulating layer 4026. In the transmission portion 1002, the common electrode 4019 and the pixel electrode 4008 are alternately arranged. Further, in the transmission portion 1002, the common electrode 4019 is not arranged below the pixel electrode 4008. On the other hand, in the reflection portion 1001, the pixel electrode 4008 is formed over the third insulating layer 4021. In the reflection portion 1001, the reflecting common electrode 4017 is arranged below the pixel electrode 4008 with the third insulating layer 4021 interposed therebetween. The pixel electrode 4008 is connected to the transistor (the polycrystalline semiconductor layer 4013) through the contact hole formed in the third insulating layer 4021, the second insulating layer 4026, and the first insulating layer 4025.

Figure 63:
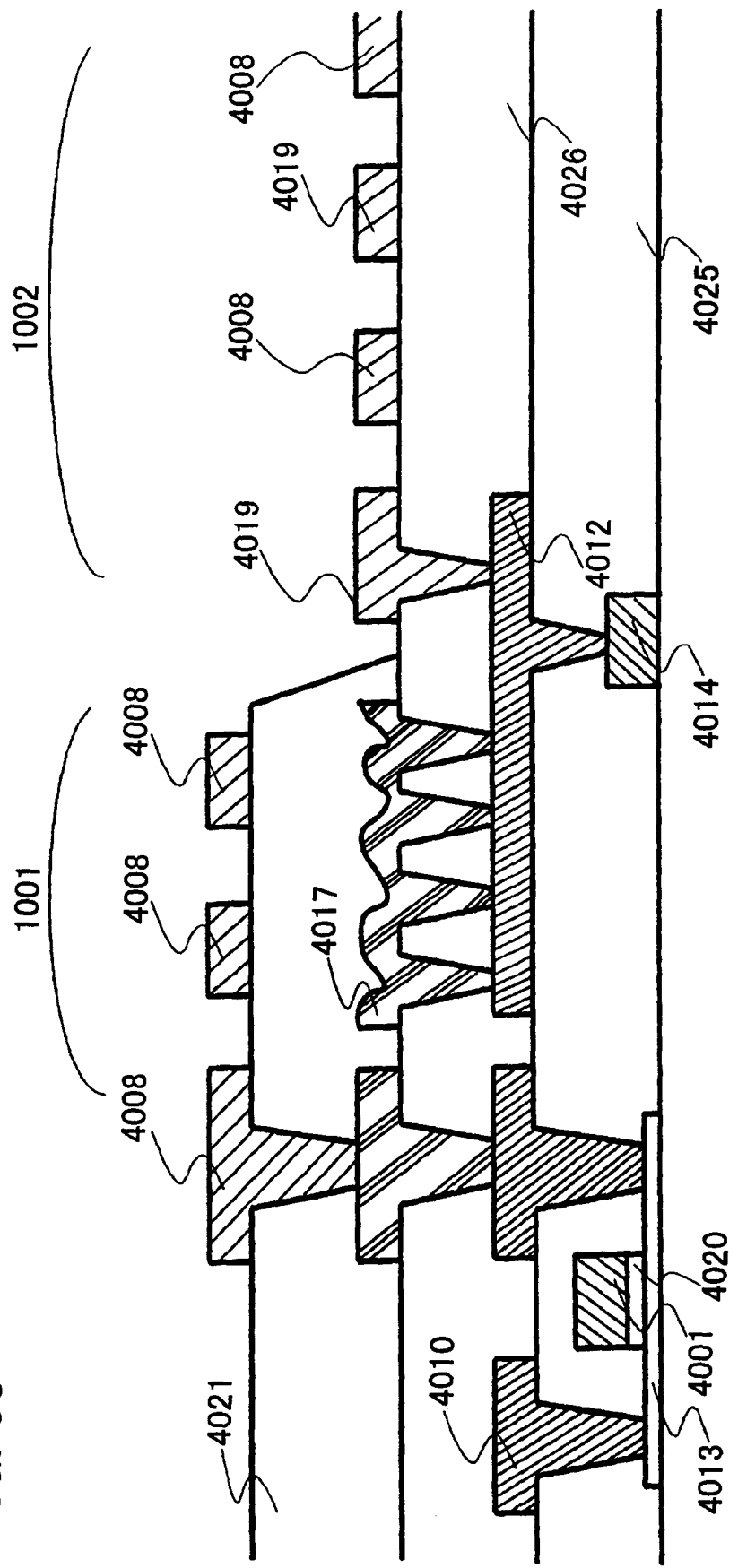
FIG. 63 is a view explaining one mode of a liquid crystal display device according to the present invention.

FIG. 63 shows a structure in which a plurality of contact holes are formed in a second insulating layer 4026 so as to expose a second wiring 4012. A reflecting common electrode 4017 is formed in the contact hole, thereby connecting the reflecting common electrode 4017 and the second wiring 4012. The surface of the reflecting common electrode 4017 is uneven. Other structure is similar to that of FIG. 62 or the like, and the description is thus omitted.

Figure 64:
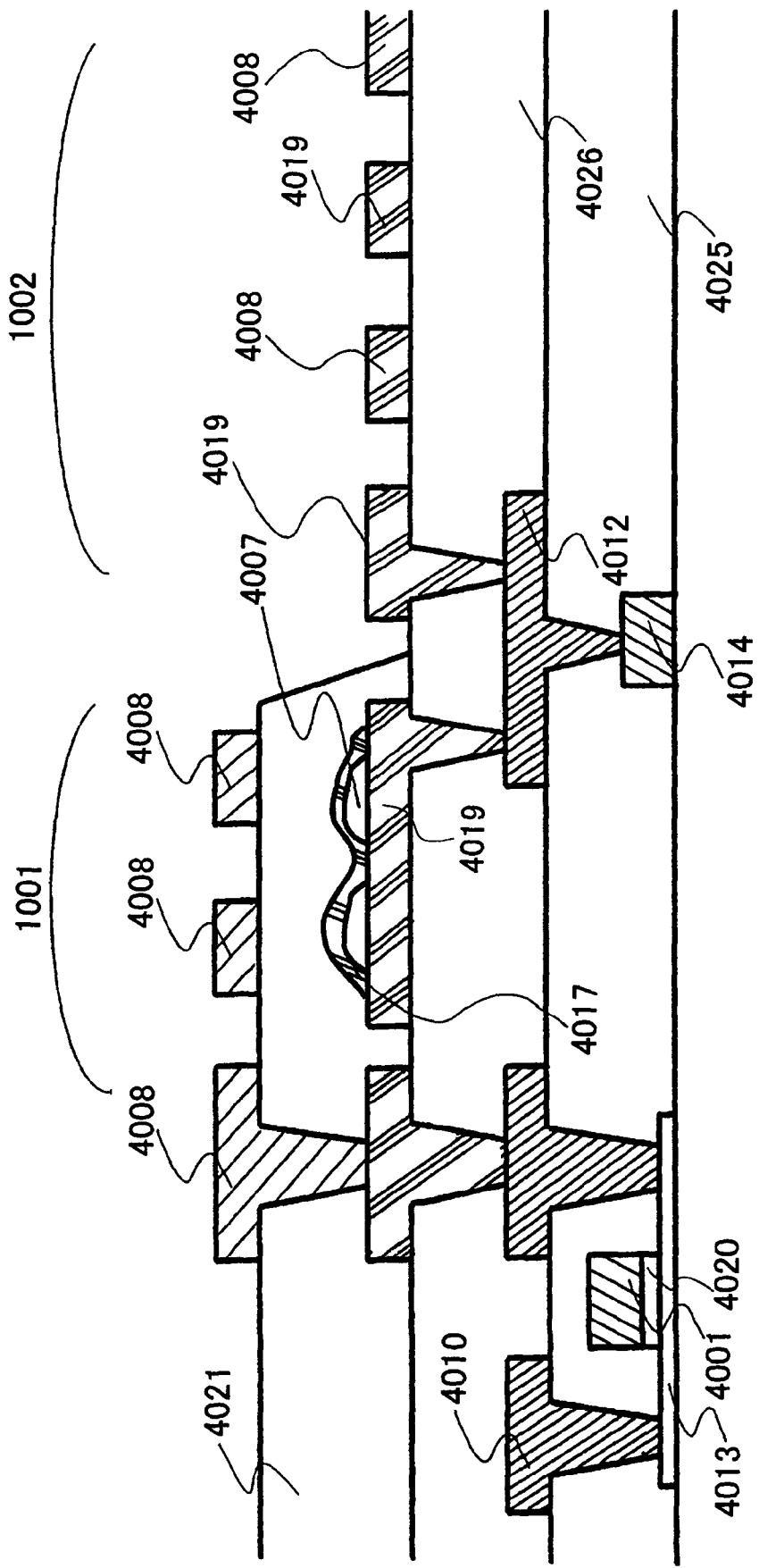
FIG. 64 is a view explaining one mode of a liquid crystal display device according to the present invention.

FIG. 64 shows a structure in which a projection 4007 for unevenness is provided over a common electrode 4019, and a reflecting common electrode 4017 is formed along the projection 4007 for unevenness. Other structure is similar to that of FIG. 62 or the like, and the description is thus omitted.

Figure 65:
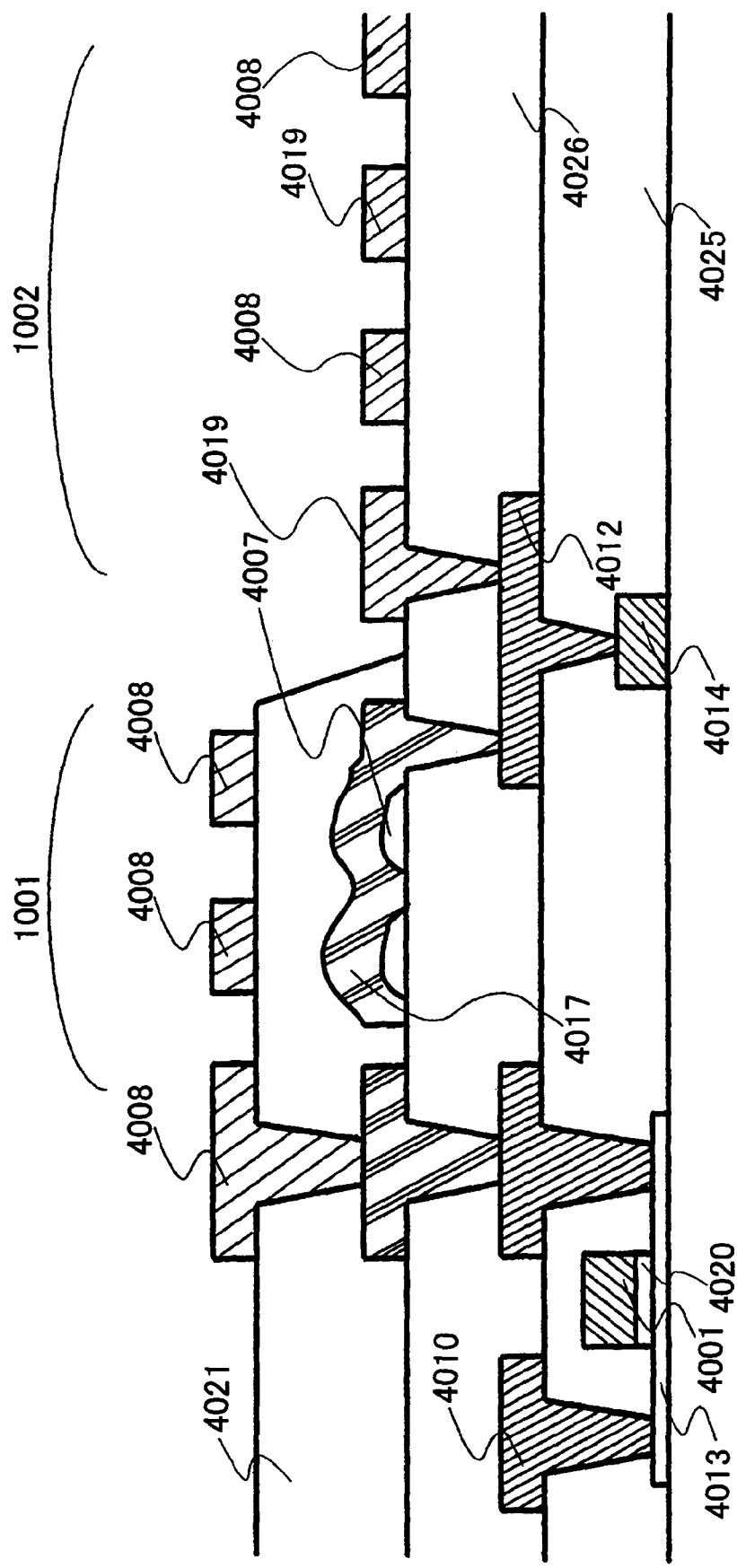
FIG. 65 is a view explaining one mode of a liquid crystal display device according to the present invention.

As shown in FIG. 65, a projection 4007 for unevenness is provided over a second insulating layer 4026, and a reflecting common electrode 4017 is formed using a second wiring along the projection 4007 for unevenness. Other structure is similar to that of FIG. 62 or the like, and the description is thus omitted.

Figure 66:
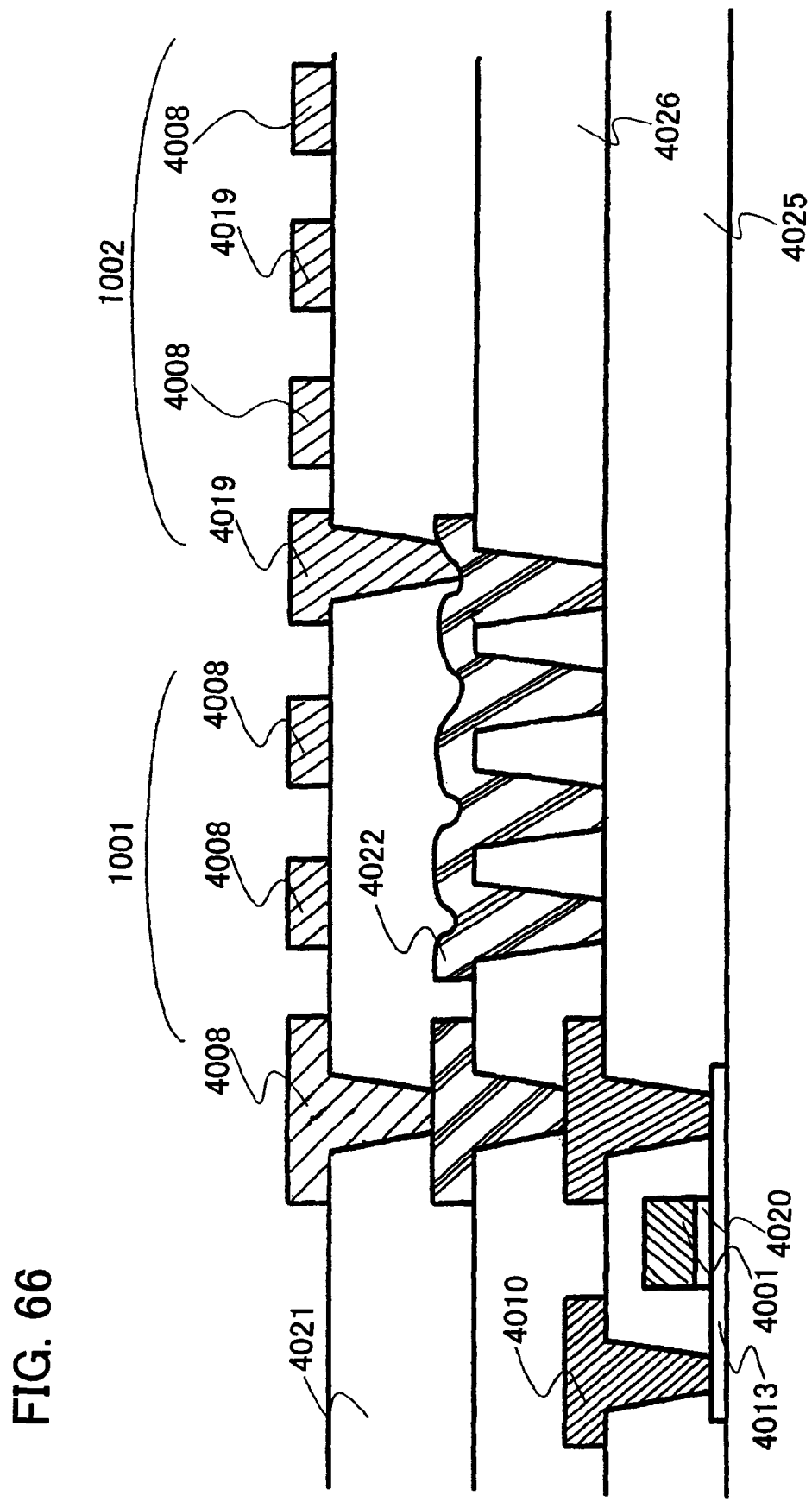
FIG. 66 is a view explaining one mode of a liquid crystal display device according to the present invention.

FIG. 66 shows a structure in which, in a reflection portion 1001, a plurality of contact holes are provided in a second insulating layer 4026 and a reflecting common electrode 4022 for FFS is formed. It is to be noted that the surface of the reflecting common electrode 4022 is uneven. A third insulating layer 4021 is formed over the reflecting common electrode 4022, and a contact hole is provided in each of the reflection portion 1001 and a transmission portion 1002. In addition, in the transmission portion 1002, a pixel electrode 4008 and a common electrode 4019 are formed over the third insulating layer 4021, thereby connecting the common electrode 4019 and the reflecting common electrode 4022 through the contact hole. In the transmission portion 1002, the common electrode 4019 and the pixel electrode 4008 are alternately arranged. Further, in the transmission portion 1002, the common electrode 4019 is not arranged below the pixel electrode 4008. On the other hand, in the reflection portion 1001, the pixel electrode 4008 is formed over the third insulating layer 4021. In the reflection portion 1001, the reflecting common electrode 4022 is arranged below the pixel electrode 4008 with the third insulating layer 4021 interposed therebetween. The pixel electrode 4008 is connected to the transistor (the polycrystalline semiconductor layer 4013) through the contact hole formed in the third insulating layer 4021, the second insulating layer 4026, and the first insulating layer 4025. Other structure is similar to that of FIG. 62 or the like, and the description is thus omitted.

Figure 67:
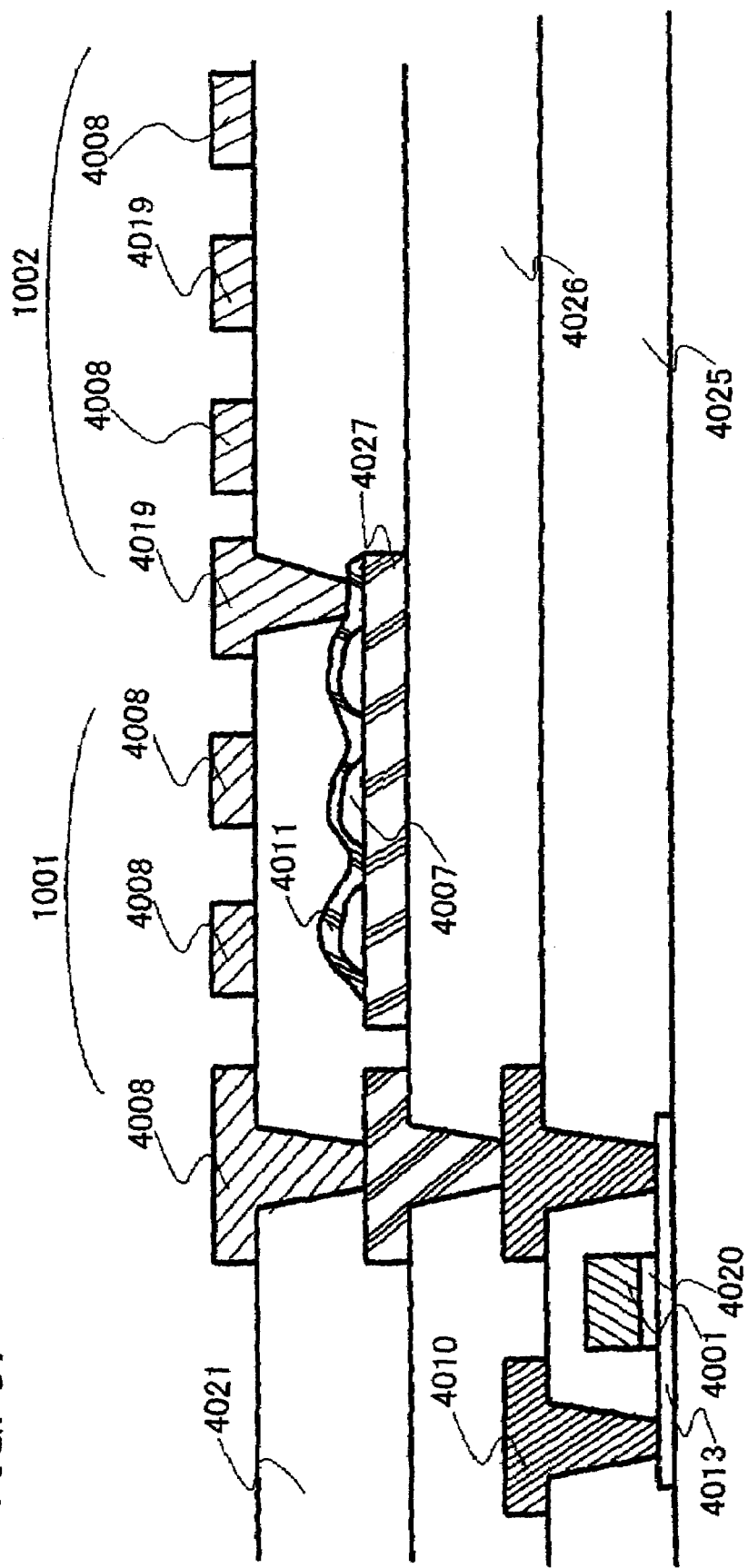
FIG. 67 is a view explaining one mode of a liquid crystal display device according to the present invention.

FIG. 67 shows a structure in which a conductive layer 4027 is formed over a second insulating layer 4026 in a reflection portion 1001. A projection 4007 for unevenness is provided over the conductive layer 4027, and a reflecting electrode 4011 is formed along the projection 4007 for unevenness. In addition, in a transmission portion 1002, a pixel electrode 4008 and a common electrode 4019 are formed over a third insulating layer 4021, thereby connecting the common electrode 4019 and the reflecting electrode 4011 through the contact hole. Other structure is similar to that of FIG. 62, FIG. 66, or the like, and the description is thus omitted.

Figure 68:
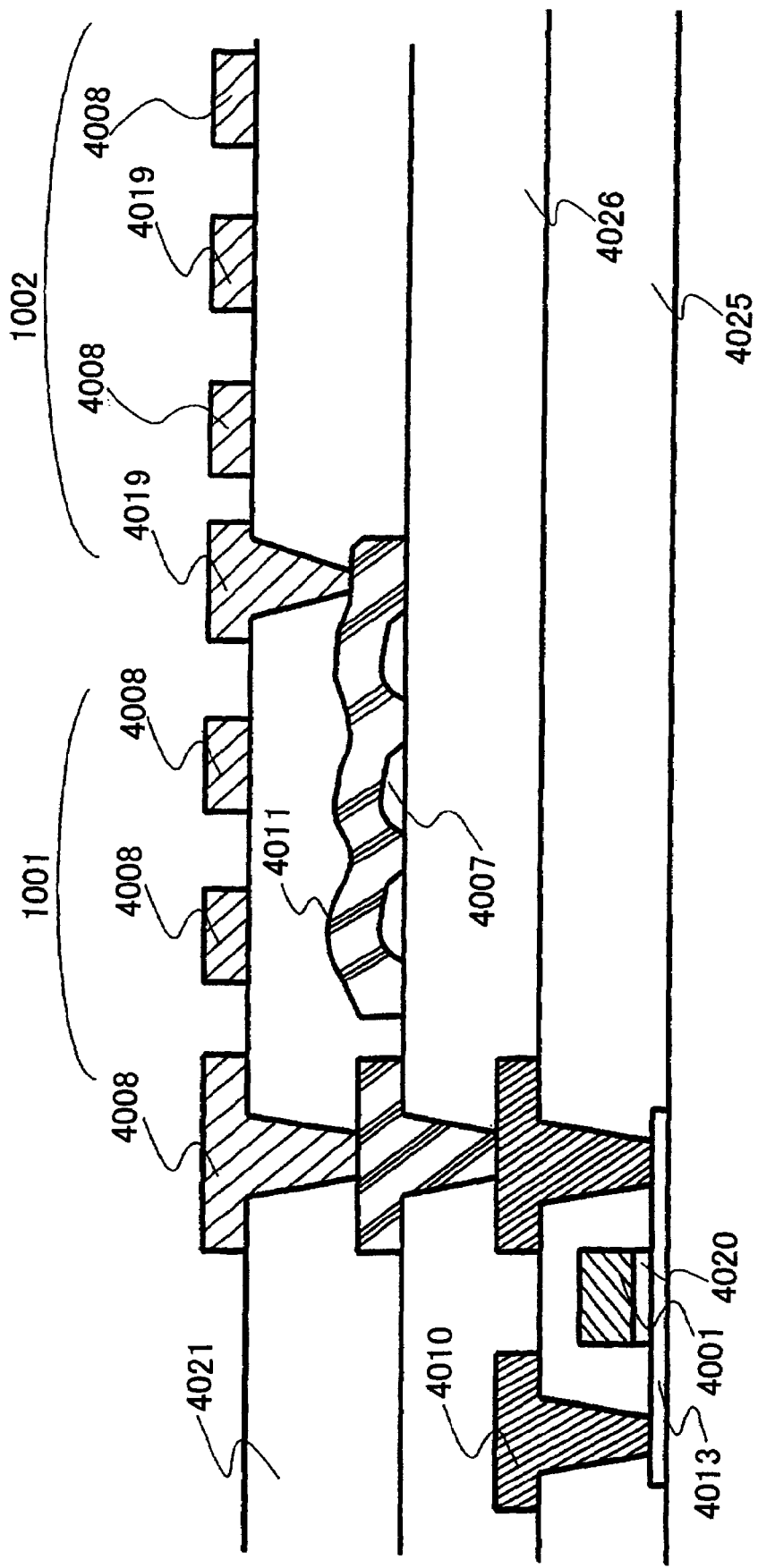
FIG. 68 is a view explaining one mode of a liquid crystal display device according to the present invention.

FIG. 68 shows a structure in which a projection 4007 for unevenness is provided over a second insulating layer 4026 in a reflection portion 1001. A reflecting electrode 4011 is formed along the projection 4007 for unevenness. In addition, in a transmission portion 1002, a pixel electrode 4008 and a common electrode 4019 are formed over a third insulating layer 4021, thereby connecting the common electrode 4019 and the reflecting electrode 4011 through the contact hole. Other structure is similar to that of FIG. 62, FIG. 66, or the like, and the description is thus omitted.

Figure 69:
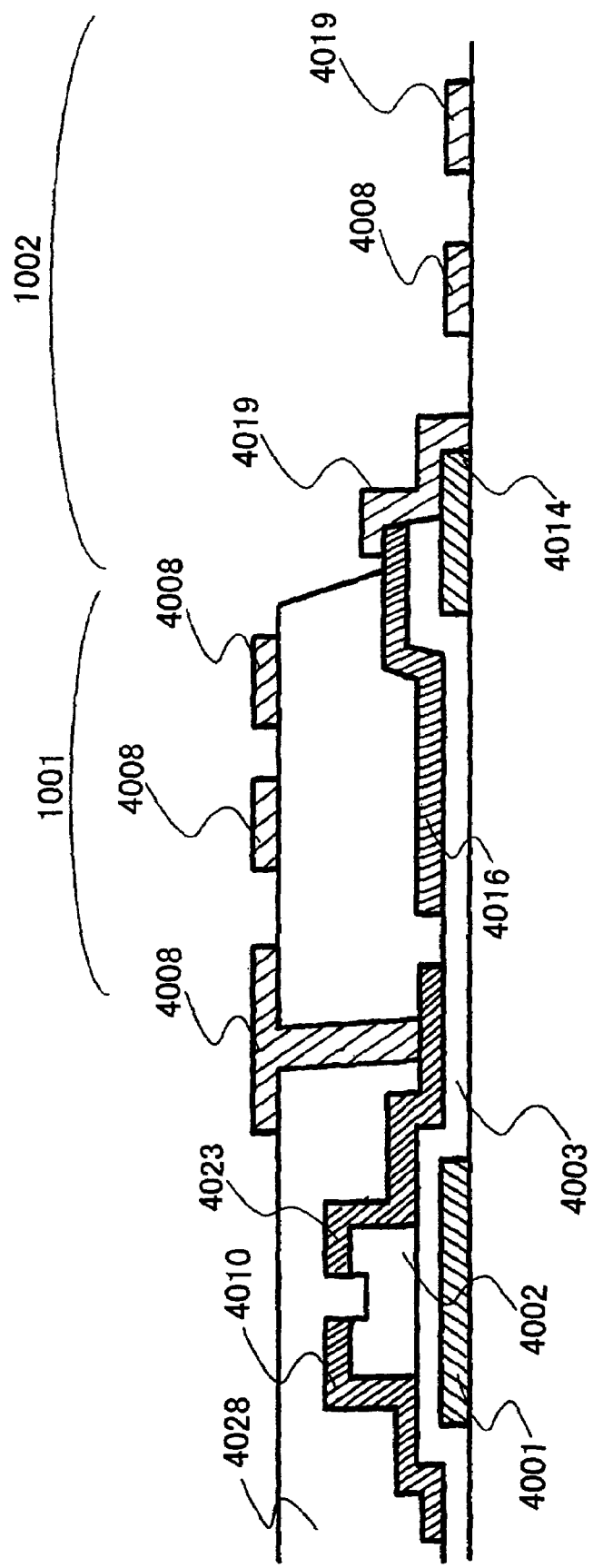
FIG. 69 is a view explaining one mode of a liquid crystal display device according to the present invention.

FIG. 69 shows a structure in which, in a transmission portion 1002, an opening is formed in an insulating layer 4028 and a gate insulating layer 4003. In the transmission portion 1002, over a wiring 4014 formed using the same material as that of a gate electrode and the gate insulating layer 4003, an opening is provided so as to expose part of a reflecting common electrode 4016 formed using the same material as that of a second wiring. A common electrode 4019 is formed so as to be in contact with the wiring 4014 and the reflecting common electrode 4016 which are partially exposed. In addition, in the same plane as that of the gate electrode 4001, a pixel electrode 4008 and a common electrode 4019 are formed. The insulating layer 4028 is formed over and to cover the second wiring 4010 and the reflecting common electrode 4016. A contact hole is formed in the insulating layer 4028 so as to expose the second wiring 4023, thereby connecting the pixel electrode 4008 formed over the insulating layer 4028 and the second wiring 4023. In the transmission portion 1002, the common electrode 4019 and the pixel electrode 4018 are alternately arranged. Further, in the transmission portion 1002, the common electrode is not arranged below the pixel electrode 4008. On the other hand, in a reflection portion 1001, the pixel electrode 4008 is formed over the insulating layer 4028. In the reflection portion 1001, the reflecting common electrode 4016 is arranged below the pixel electrode 4008 with the insulating layer 4028 interposed therebetween. Other structure is similar to that of FIG. 43 or the like, and the description is thus omitted.

Figure 70:
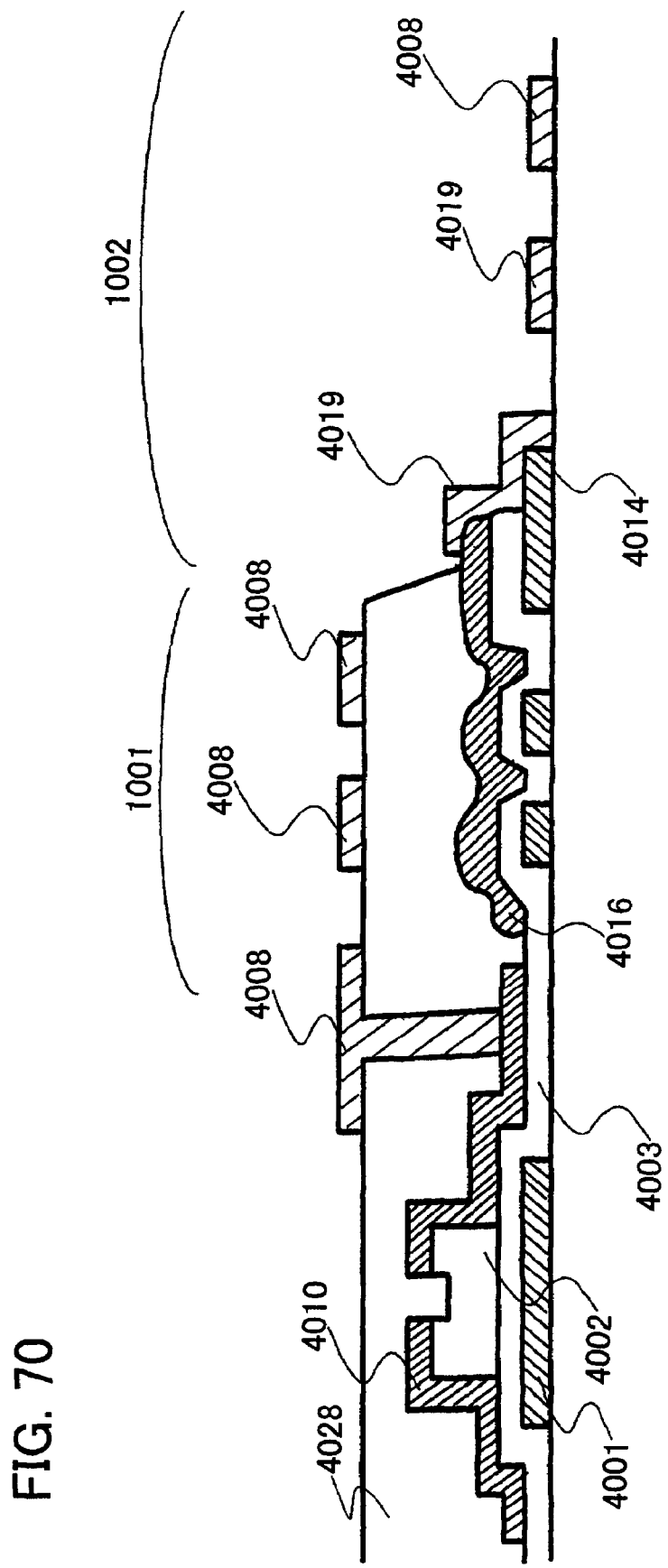
FIG. 70 is a view explaining one mode of a liquid crystal display device according to the present invention.

FIG. 70 shows a structure in which a plurality of wirings 4014 are formed in a reflection portion 1001. In a transmission portion 1002, over a wiring 4014 formed using the same material as that of a gate electrode and a gate insulating layer 4003, an opening is provided so as to expose part of a reflecting common electrode 4016 formed using the same material as that of a second wiring. It is to be noted that the surface of the reflecting common electrode 4016 is uneven. A common electrode 4019 is formed so as to be in contact with the wiring 4014 and the reflecting common electrode 4016 which are partially exposed. In addition, in the same plane as that of the gate electrode 4001, a pixel electrode 4008 and the common electrode 4019 are formed. Other structure is similar to that of FIG. 43, FIG. 69, or the like, and the description is thus omitted.

Figure 71:
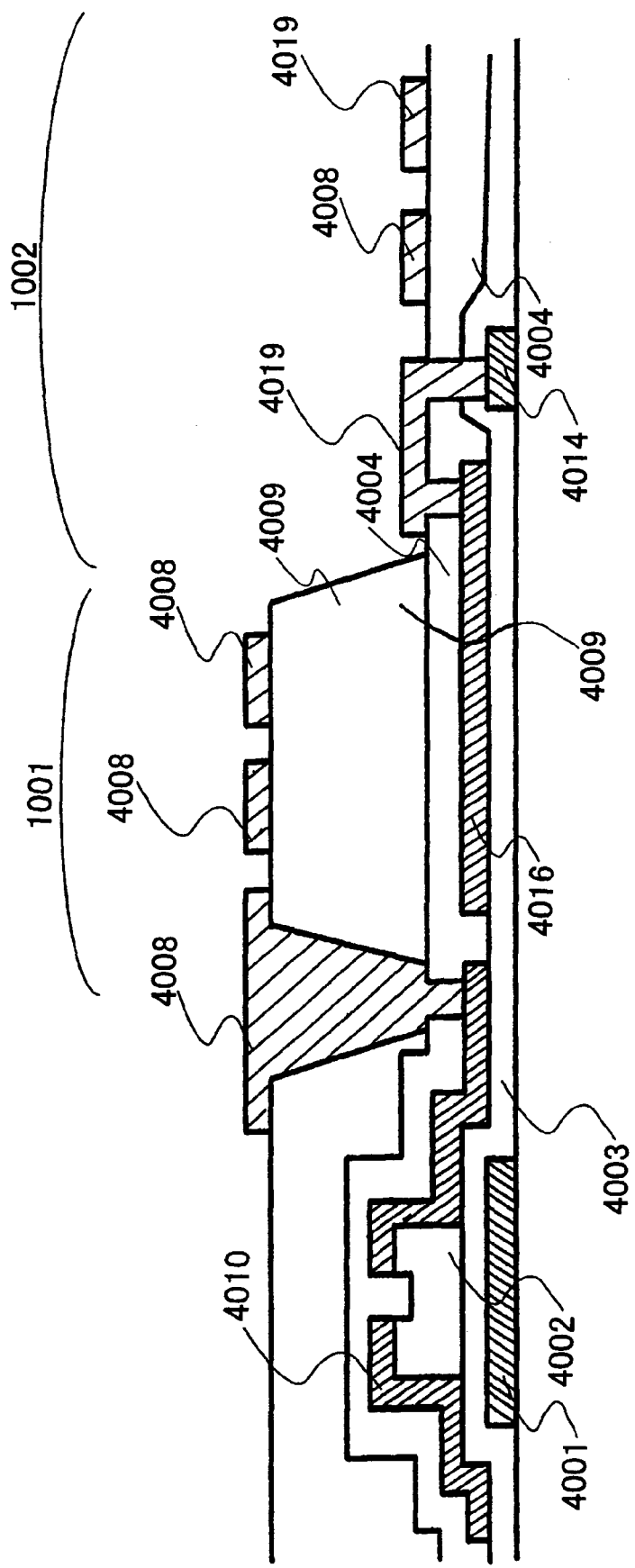
FIG. 71 is a view explaining one mode of a liquid crystal display device according to the present invention.

FIG. 71 shows a structure in which a wiring 4014 is formed in the same plane as that of a gate electrode 4001 in a transmission portion 1002. In a reflection portion 1001, a reflecting common electrode 4016 is formed using the same material as that of a second wiring over a gate insulating layer 4013 which is formed so as to cover the gate electrode 4001 and the wiring 4014. Over the reflecting common electrode 4016, a first insulating layer 4004 is formed and a plurality of contact holes are provided. Over the first insulating layer 4004, a common electrode 4019 is formed so as to connect the reflecting common electrode 4016 and the wiring 4014 through the contact hole. In the transmission portion 1002, the common electrode 4019 and the pixel electrode 4008 are alternately arranged over the first insulating layer 4004. Further, in the transmission portion 1002, the common electrode is not arranged below the pixel electrode 4008. On the other hand, in a reflection portion 1001, the reflecting common electrode 4016 is arranged below the pixel electrode 4008 with a second insulating layer 4009, the first insulating layer 4004, and the like interposed therebetween. Other structure is similar to that of FIG. 43, FIG. 69, or the like, and the description is thus omitted.

Figure 72:
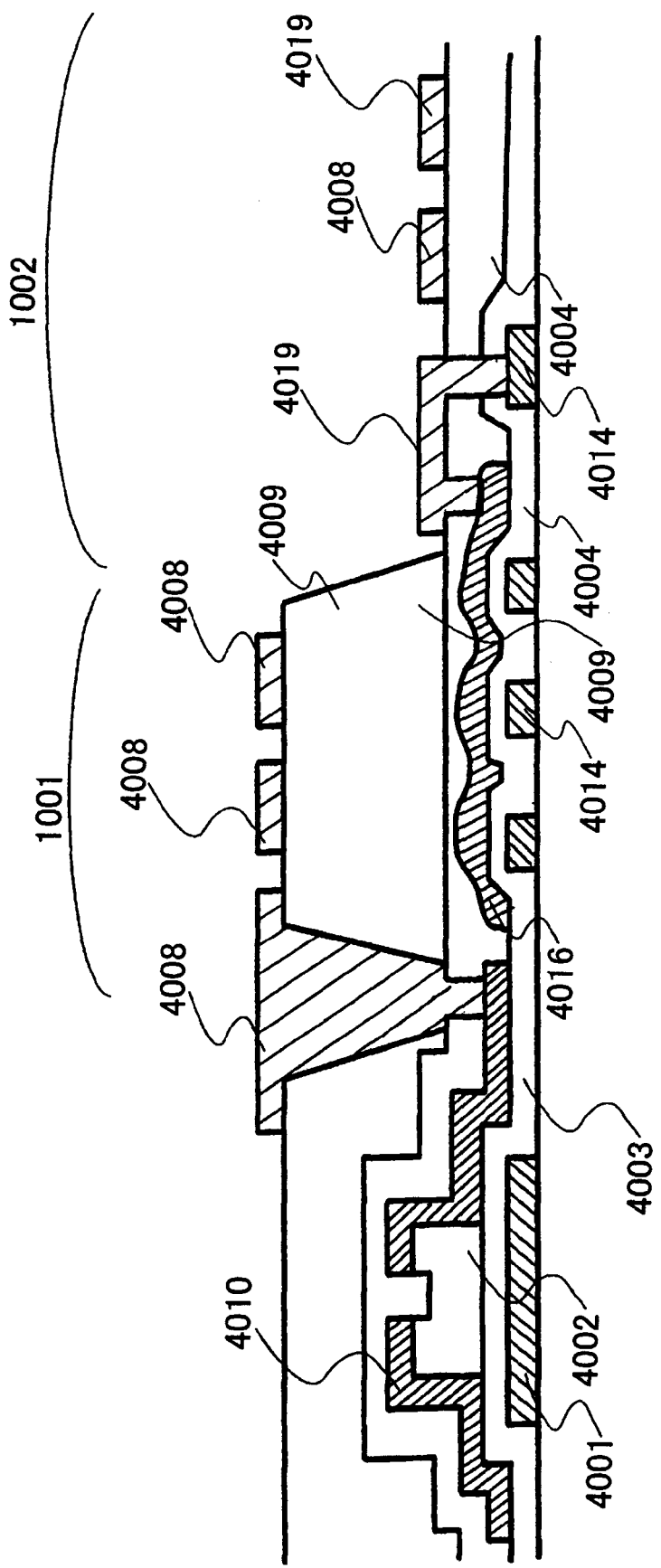
FIG. 72 is a view explaining one mode of a liquid crystal display device according to the present invention.

FIG. 72 shows a structure in which a plurality of wirings 4014 are formed in the same plane as that of a gate electrode 4001. Over a gate insulating layer 4003 which is formed so as to cover the gate electrode 4001 and the wiring 4014, a reflecting common electrode 4016 is formed using the same material as that of a second wiring in a reflection portion 1001. It is to be noted that the surface of the reflecting common electrode 4016 is uneven. Over the reflecting common electrode 4016, a first insulating layer 4004 is formed, and a plurality of contact holes are provided. Over the first insulating layer 4004, a common electrode 4019 is formed so as to connect the reflecting common electrode 4016 and the wiring 4014 through the contact hole. Other structure is similar to that of FIG. 43, FIG. 71, or the like, and the description is thus omitted.

Figure 73:
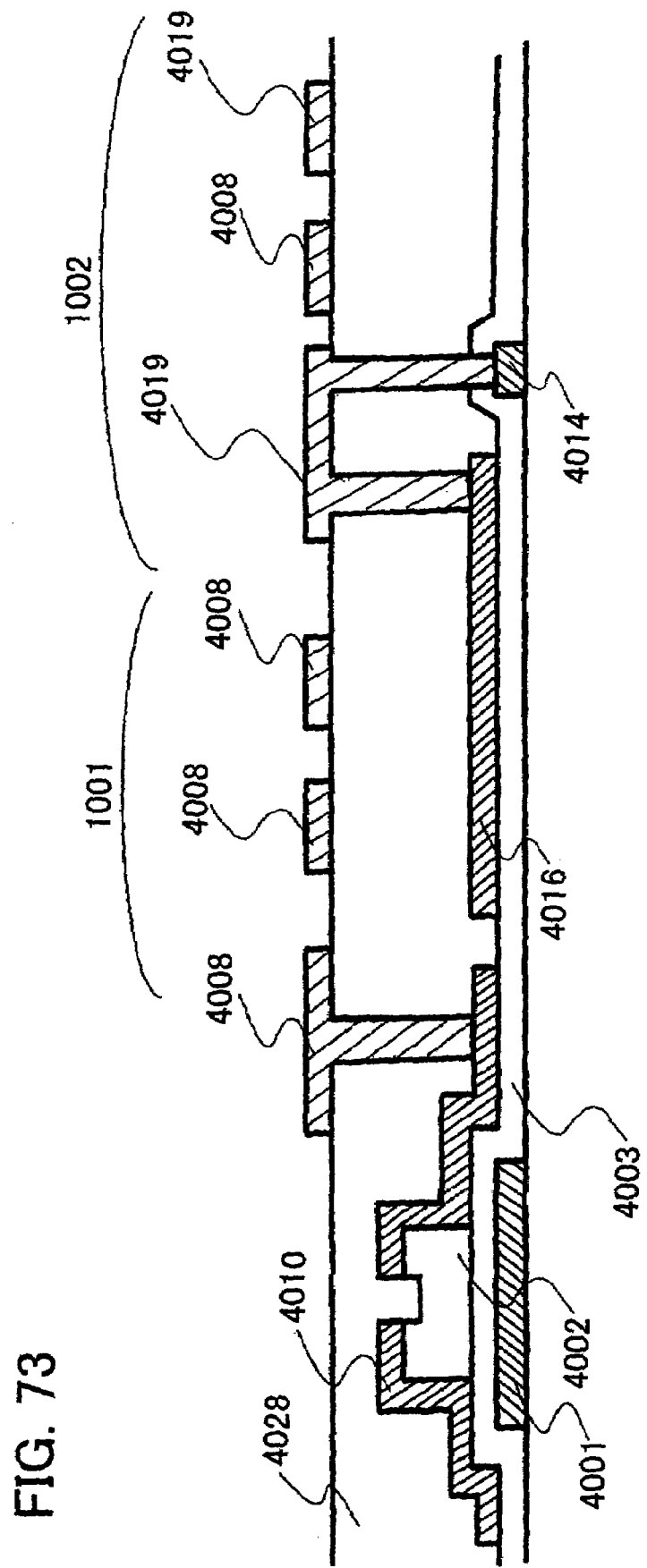
FIG. 73 is a view explaining one mode of a liquid crystal display device according to the present invention.

FIG. 73 shows a structure in which a wiring 4014 is provided in the same plane as that of a gate electrode 4001. Over a gate insulating layer 4003 which is formed so as to cover the gate electrode 4001 and the wiring 4014, a reflecting common electrode 4016 is formed using the same material as that of a second wiring in a reflection portion 1001. Over the reflecting common electrode 4016, an insulating layer 4028 is formed, and a plurality of contact holes are provided. Over the insulating layer 4028, a common electrode 4019 is formed so as to connect the reflecting common electrode 4016 and the wiring 4014 through the contact hole. In a transmission portion 1002, the common electrode 4019 and the pixel electrode 4008 are alternately arranged over the insulating layer 4028. Further, in the transmission portion 1002, the common electrode is not arranged below the pixel electrode 4008. On the other hand, in the reflection portion 1001, the pixel electrode 4008 is formed over the insulating layer 4028. In the reflection portion 1001, the reflecting common electrode 4016 is arranged below the pixel electrode 4008 with the insulating layer 4028 interposed therebetween. Other structure is similar to that of FIG. 43, FIG. 69, or the like, and the description is thus omitted.

Figure 74:
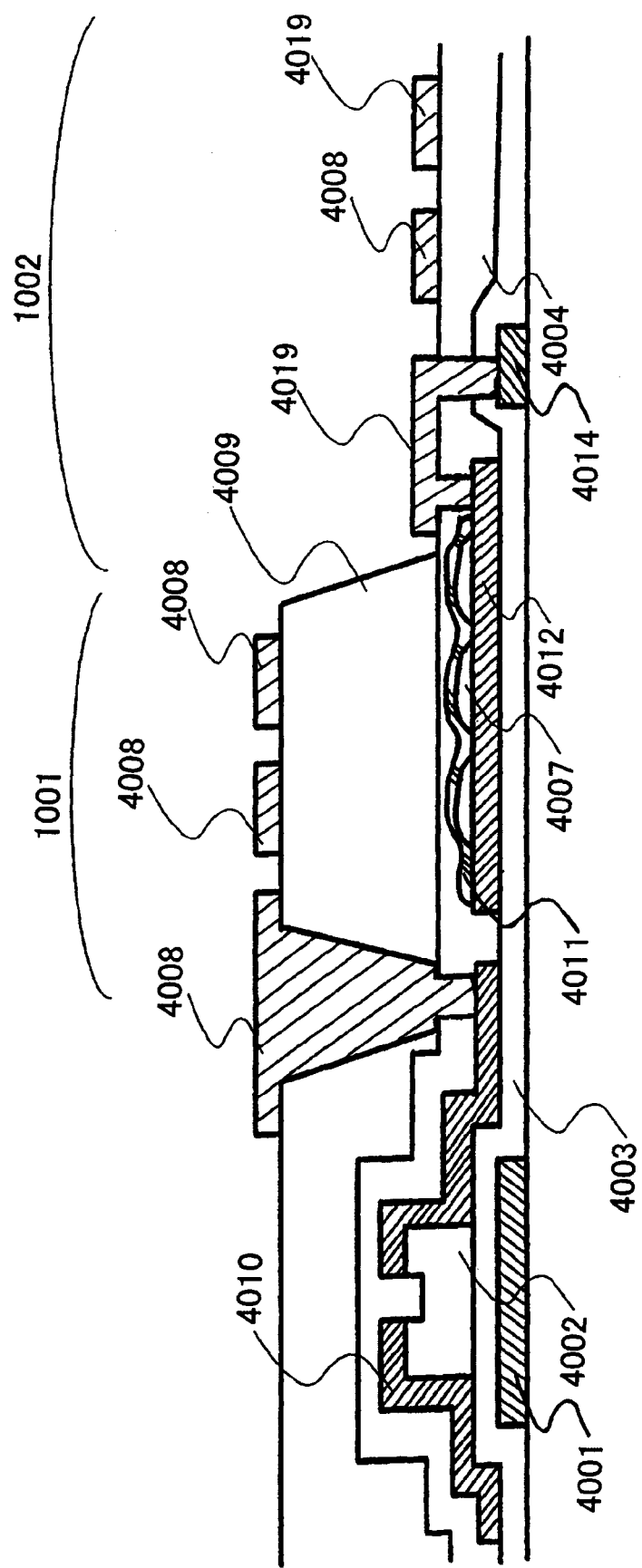
FIG. 74 is a view explaining one mode of a liquid crystal display device according to the present invention.

FIG. 74 shows a structure in which a projection 4007 for unevenness is formed over a second wiring 4012. Over a gate insulating layer 4003 which is formed so as to cover a gate electrode 4001 and a wiring 4014, the second wiring 4012 is formed in a reflection portion 1001. The projection 4007 for unevenness is formed over the second wiring 4012, and a reflecting electrode 4011 is formed along the projection 4007 for unevenness. In addition, over the second wiring 4012, a first insulating layer 4004 is formed, and a plurality of contact holes are provided. Over the first insulating layer 4004, a common electrode 4019 is formed so as to connect the second wiring 4012 and the wiring 4014 through the contact hole. Other structure is similar to that of FIG. 43, FIG. 71, or the like, and the description is thus omitted.

Figure 75:
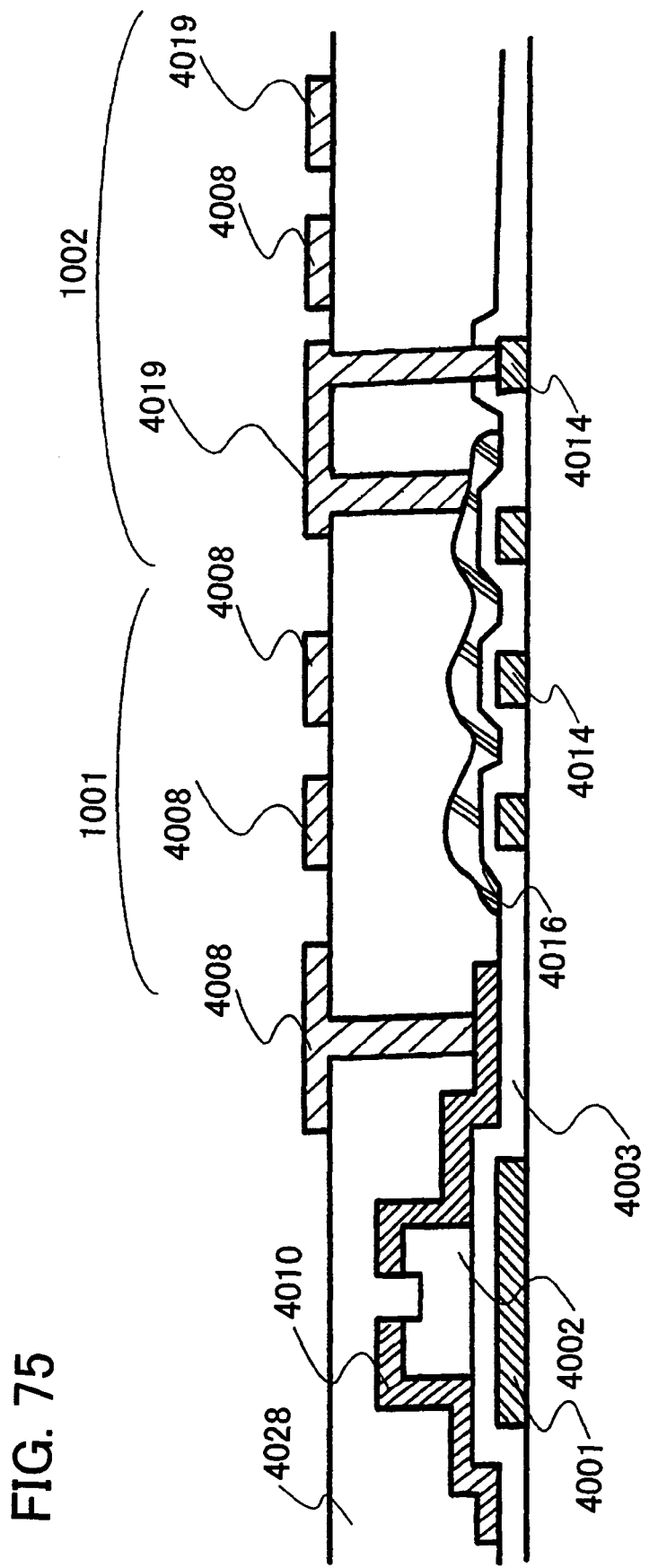
FIG. 75 is a view explaining one mode of a liquid crystal display device according to the present invention.

FIG. 75 shows a structure in which a plurality of wirings 4014 are formed in a reflection portion 1001. Over a gate insulating layer 4003 which is formed so as to cover a gate electrode 4001 and the wiring 4014, a reflecting common electrode 4016 is formed using the same material as that of a second wiring in the reflection portion 1001. It is to be noted that, since the plurality of wirings 4014 are formed below the reflecting common electrode 4016, the reflecting common electrode 4016 has an uneven shape. Over the reflecting common electrode 4016, an insulating layer 4028 is formed, and a plurality of contact holes are provided. Over the insulating layer 4028, a common electrode 4019 is formed so as to connect the reflecting common electrode 4016 and the wiring 4014 through the contact hole. Other structure is similar to that of FIG. 43, FIG. 73, or the like, and the description is thus omitted.

Figure 76:
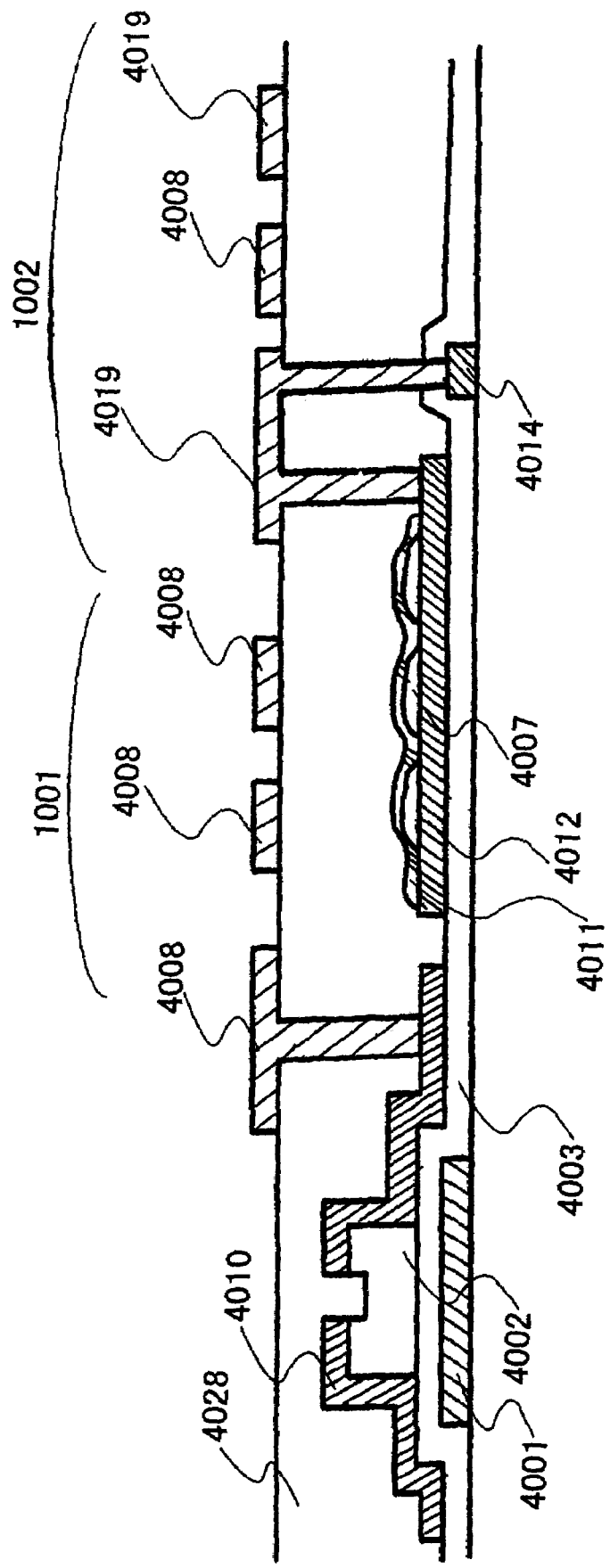
FIG. 76 is a view explaining one mode of a liquid crystal display device according to the present invention.

FIG. 76 shows a structure in which a projection 4007 for unevenness is formed over a second wiring 4012, and a reflecting electrode 4011 is formed along the projection 4007 for unevenness. In addition, in a reflection portion 1001, over a gate insulating layer 4003 which is formed so as to cover a gate electrode 4001 and a wiring 4014, a reflecting electrode 4011 is formed using a second wiring. Over the reflecting electrode 4011, an insulating layer 4028 is formed, and a plurality of contact holes are provided. Over the insulating layer 4028, a common electrode 4019 is formed so as to connect the reflecting electrode 4011 and the wiring 4014 through the contact hole. Other structure is similar to that of FIG. 43, FIG. 73, or the like, and the description is thus omitted.

Figure 77:
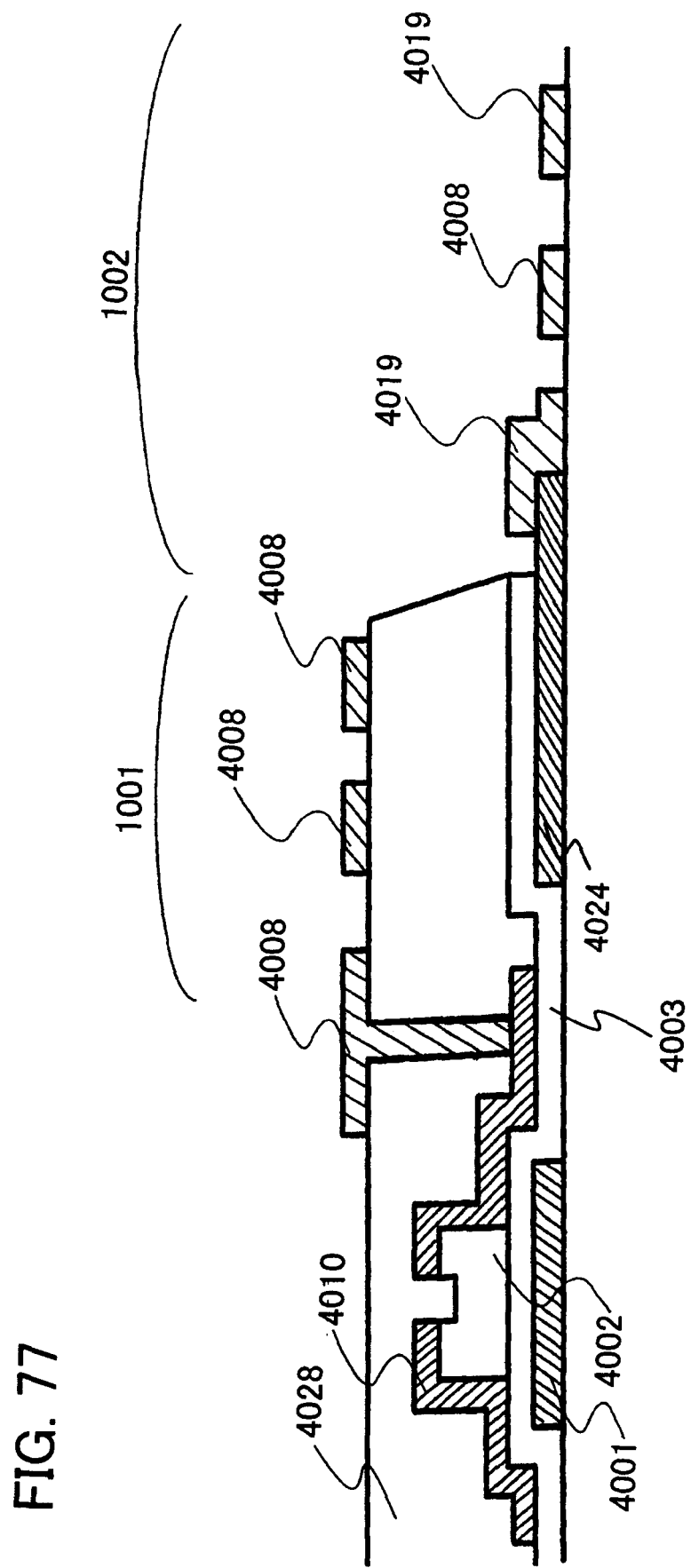
FIG. 77 is a view explaining one mode of a liquid crystal display device according to the present invention.

FIG. 77 shows a structure in which a reflecting common electrode 4024 is formed in the same plane as that of a gate electrode 4001 in a transmission portion 1002. An opening is formed in an insulating layer 4028 and a gate insulating layer 4003 so as to expose part of the reflecting common electrode 4024. A pixel electrode 4008 and a common electrode 4019 are formed in the same plane as that of the gate electrode 4001, and part of the common electrode 4019 is formed so as to overlap with part of the reflecting common electrode 4024. In the transmission portion 1002, the common electrode 4019 and the pixel electrode 4008 are alternately arranged. Further, in the transmission portion 1002, the common electrode is not arranged below the pixel electrode 4008. On the other hand, in a reflection portion 1001, the pixel electrode 4008 is formed over the insulating layer 4028. In the reflection portion 1001, the reflecting common electrode 4024 is arranged below the pixel electrode 4008 with the insulating layer 4028 and the gate insulating layer 4003 interposed therebetween. Other structure is similar to that of FIG. 43, FIG. 69, or the like, and the description is thus omitted.

Figure 78:
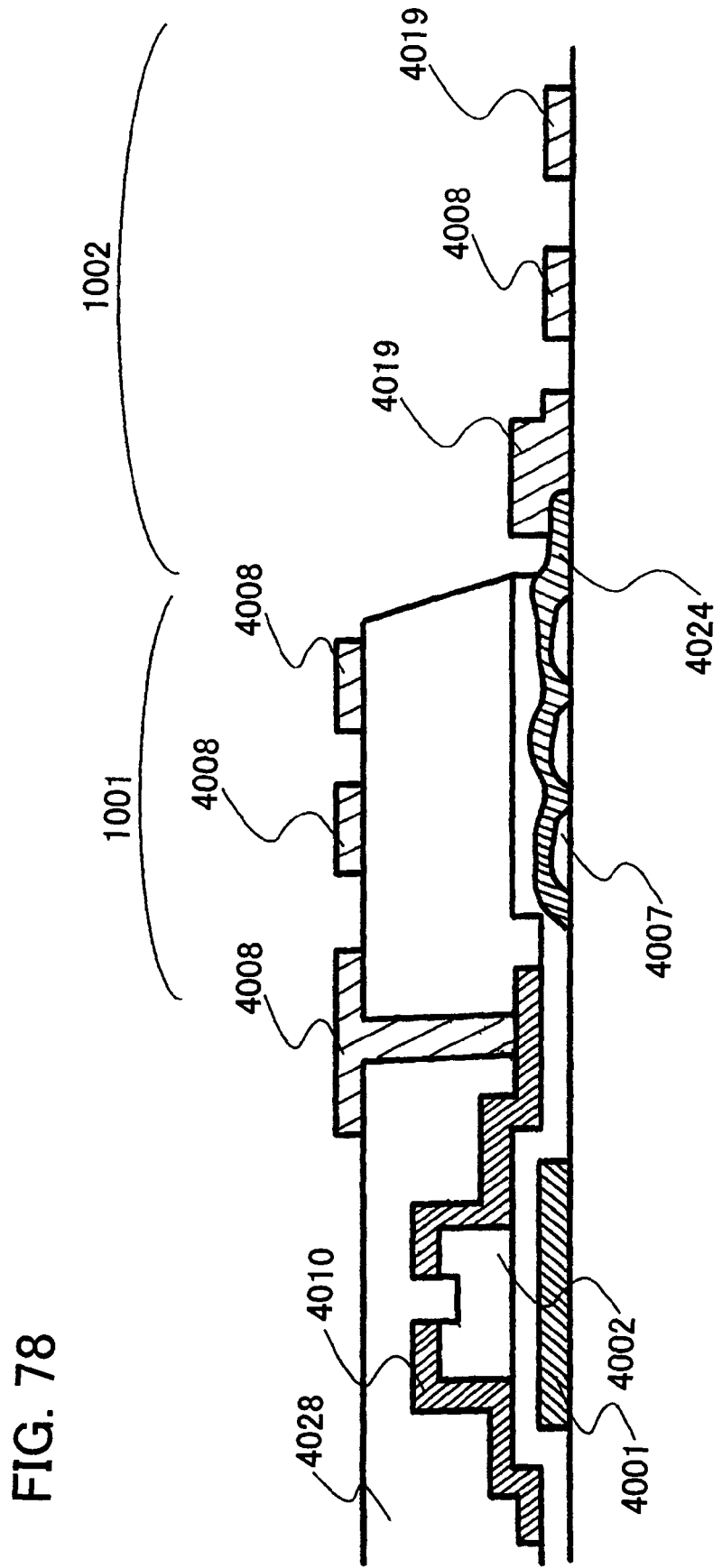
FIG. 78 is a view explaining one mode of a liquid crystal display device according to the present invention.

FIG. 78 shows a structure in which a projection 4007 for unevenness is provided in the same plane as that of a gate electrode 4001. Over the projection 4007 for unevenness, a reflecting common electrode 4024 is formed along the projection 4007 for unevenness. Then, an opening is provided in an insulating layer 4028 so as to expose part of the reflecting common electrode 4024. A pixel electrode 4008 and a common electrode 4019 are formed in the same plane as that of the gate electrode 4001, and part of the common electrode 4019 is formed so as to overlap with part of the reflecting common electrode 4024. Other structure is similar to that of FIG. 43, FIG. 77, or the like, and the description is thus omitted.

Figure 79:
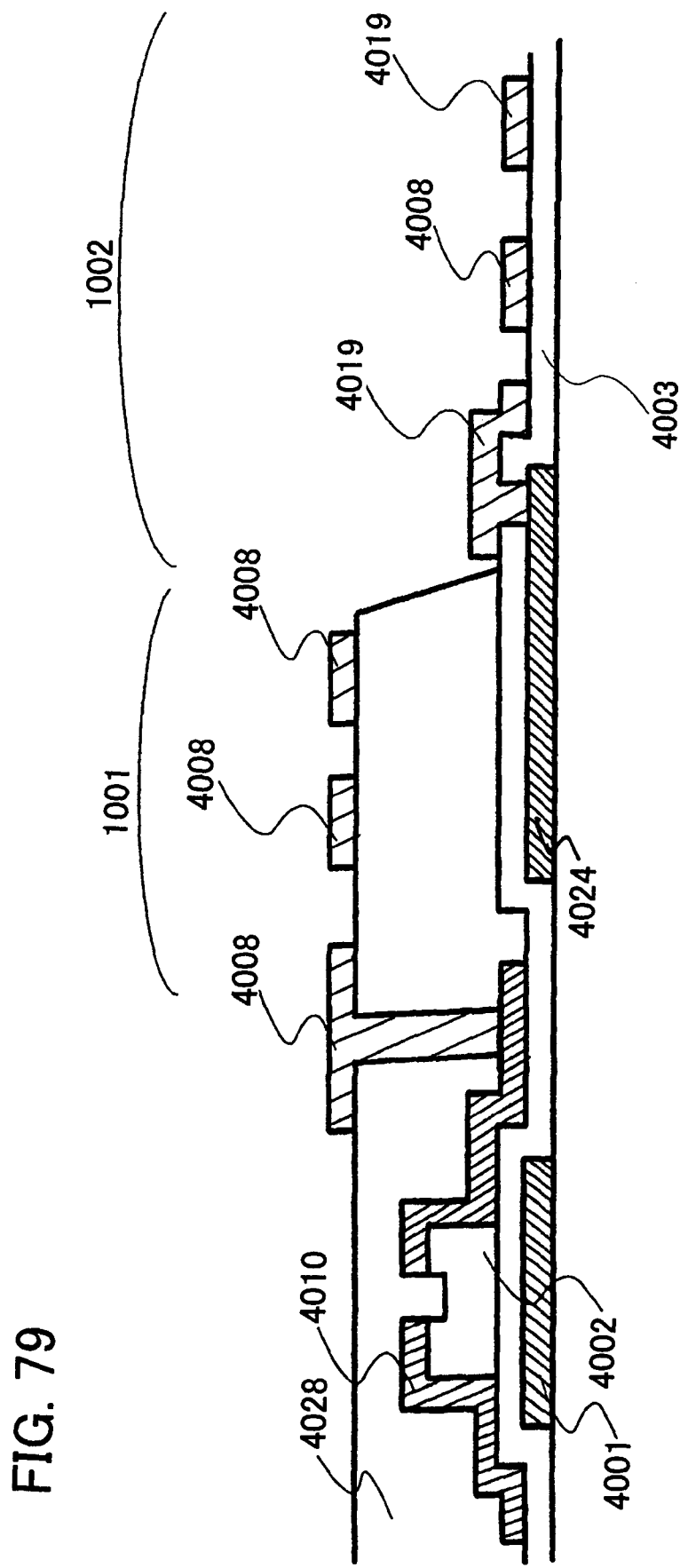
FIG. 79 is a view explaining one mode of a liquid crystal display device according to the present invention.

FIG. 79 shows a structure in which a pixel electrode 4008 and a common electrode 4019 are formed over a gate insulating layer 4003 in a transmission portion 1002. A reflecting common electrode 4024 is formed in the same plane as that of a gate electrode 4001, and the gate insulating layer 4003 is formed over the reflecting common electrode 4024. In the transmission portion 1002, a contact hole is provided in the gate insulating layer 4003 so as to expose the reflecting common electrode 4024, thereby connecting the common electrode 4019 and the reflecting common electrode 4024. In the transmission portion 1002, the common electrode 4019 and the pixel electrode 4008 are alternately arranged over the gate insulating layer 4003. Further, in the transmission portion 1002, the common electrode is not arranged below the pixel electrode 4008. On the other hand, in a reflection portion 1001, the pixel electrode 4008 is formed over the insulating layer 4028. In the reflection portion 1001, a reflecting common electrode 4024 is arranged below the pixel electrode 4008 with the insulating layer 4028 and the gate insulating layer 4003 interposed therebetween. Other structure is similar to that of FIG. 43, FIG. 77, or the like, and the description is thus omitted.

Figure 80:
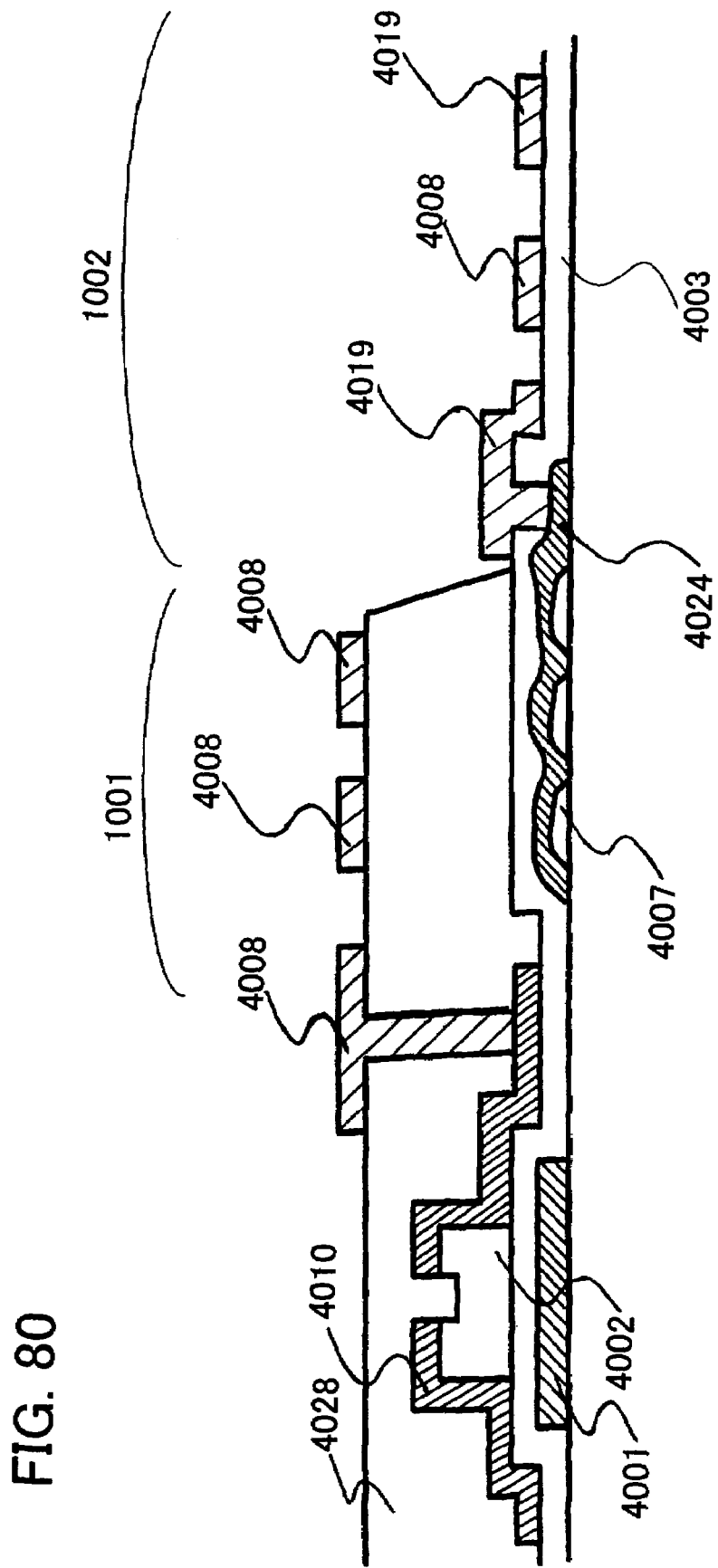
FIG. 80 is a view explaining one mode of a liquid crystal display device according to the present invention.

FIG. 80 shows a structure in which a projection 4007 for unevenness is formed in the same plane as that of a gate electrode 4001. A reflecting common electrode 4024 is formed along the projection 4007 for unevenness. Over the reflecting common electrode 4024, a gate insulating layer 4003 is formed. Then, in a transmission portion, a contact hole is provided in the gate insulating layer 4003 so as to expose the reflecting common electrode 4024, thereby connecting the common electrode 4019 and the reflecting common electrode 4024. Other structure is similar to that of FIG. 79 or the like, and the description is thus omitted.

Figure 81:
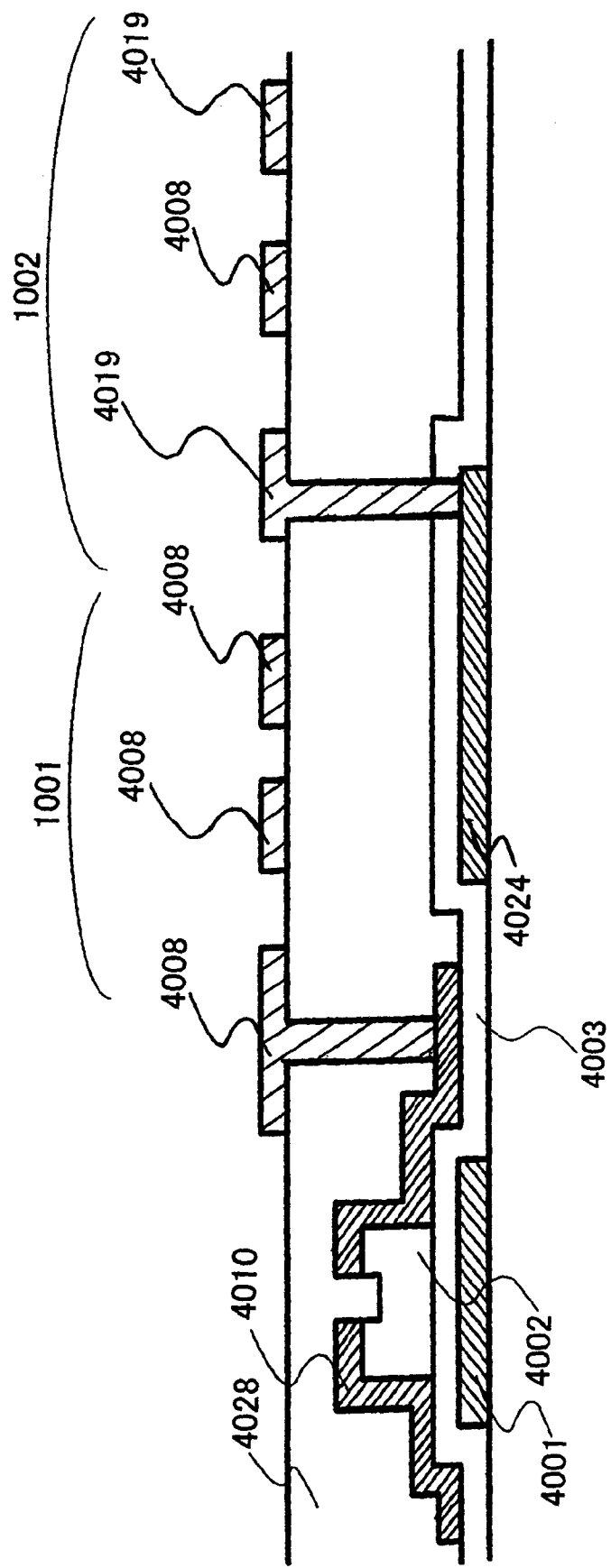
FIG. 81 is a view explaining one mode of a liquid crystal display device according to the present invention.

FIG. 81 shows a structure in which a pixel electrode 4008 and a common electrode 4019 are formed over an insulating layer 4028 in a transmission portion 1002. A contact hole is provided in the insulating layer 4028 and a gate insulating layer 4003, thereby exposing a reflecting common electrode 4024 that is formed in the same plane as that of a gate electrode. In the contact hole, the common electrode 4019 and the reflecting common electrode 4024 are connected to each other. In the transmission portion 1002, the common electrode 4019 and the pixel electrode 4008 are alternately arranged over the insulating layer 4028. Further, in the transmission portion 1002, the common electrode is not arranged below the pixel electrode 4008. On the other hand, in a reflection portion 1001, the pixel electrode 4008 is formed over the insulating layer 4028. In the reflection portion 1001, the reflecting common electrode 4024 is arranged below the pixel electrode 4008 with the insulating layer 4028 and the gate insulating layer 4003 interposed therebetween. Other structure is similar to that of FIG. 43, FIG. 73, or the like, and the description is thus omitted.

Figure 82:
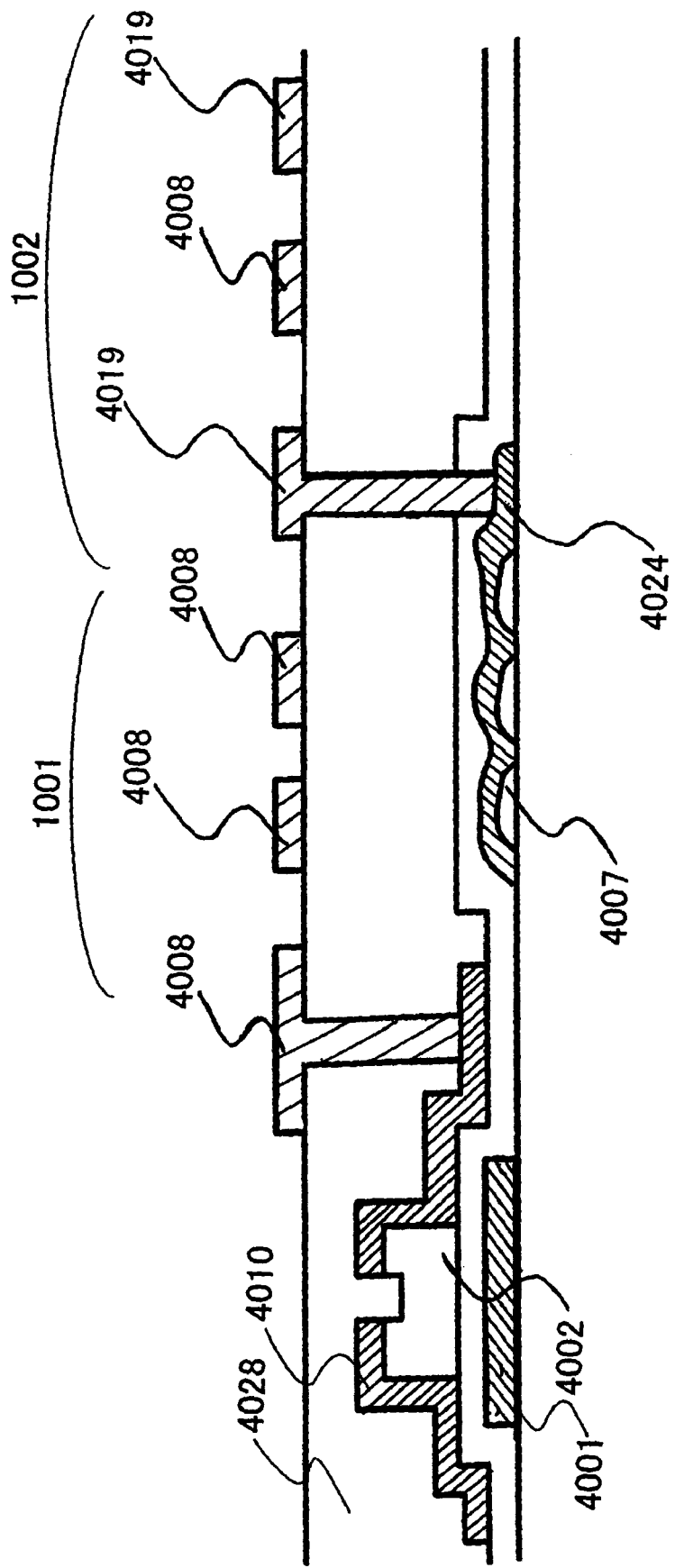
FIG. 82 is a view explaining one mode of a liquid crystal display device according to the present invention.

FIG. 82 shows a structure in which, in a reflection portion 1001, a projection 4007 for unevenness is provided in the same plane as that of a gate electrode 4001, and a reflecting common electrode 4024 is formed along the projection 4007 for unevenness. A contact hole is provided in an insulating layer 4028, thereby exposing the reflecting common electrode 4024 that is formed in the same plane as that of the gate electrode 4001. In the contact hole, the common electrode 4019 and the reflecting common electrode 4024 are connected to each other. Other structure is similar to that of FIG. 43, FIG. 81, or the like, and the description is thus omitted.

FIGS. 43 to 82 each have a feature that a contact hole or a hole that is similar to the contact hole is provided in an insulating film below a reflecting electrode, thereby making the surface of the reflecting electrode uneven. In such a case, an additional process is not necessary to make the surface of the reflecting electrode uneven.

It is to be noted that, in FIGS. 43 to 82, the gate insulating layer 4020 is illustrated only below a gate electrode in some cases; however, the present invention is not limited thereto. The gate insulating layer may be arranged over the entire surface, may be arranged only below the gate electrode, or may be thick below or around the gate electrode and thin in other regions.

FIGS. 43 to 82 each show the case where the transistor is a top gate type, but the top gate transistor may also be changed into a bottom gate transistor.

It is to be noted that the description of Embodiment Mode 1 to Embodiment Mode 10 can also be applied to and combined with this embodiment mode.

Embodiment Mode 12

A pixel structure included in a liquid crystal display device according to the present invention is described with reference to the top views of FIGS. 2, 4, 6, 8, 14, and 15. A wiring is led in a pixel portion as shown in a circuit of FIG. 16. A mode that is different from those of FIGS. 2, 4, 6, 8, 14, and 15 can also be allowed unless it departs from the purpose and scope of the present invention. A pixel circuit of a liquid crystal display device according to the present invention will be described with reference to FIG. 16.

Figure 16:
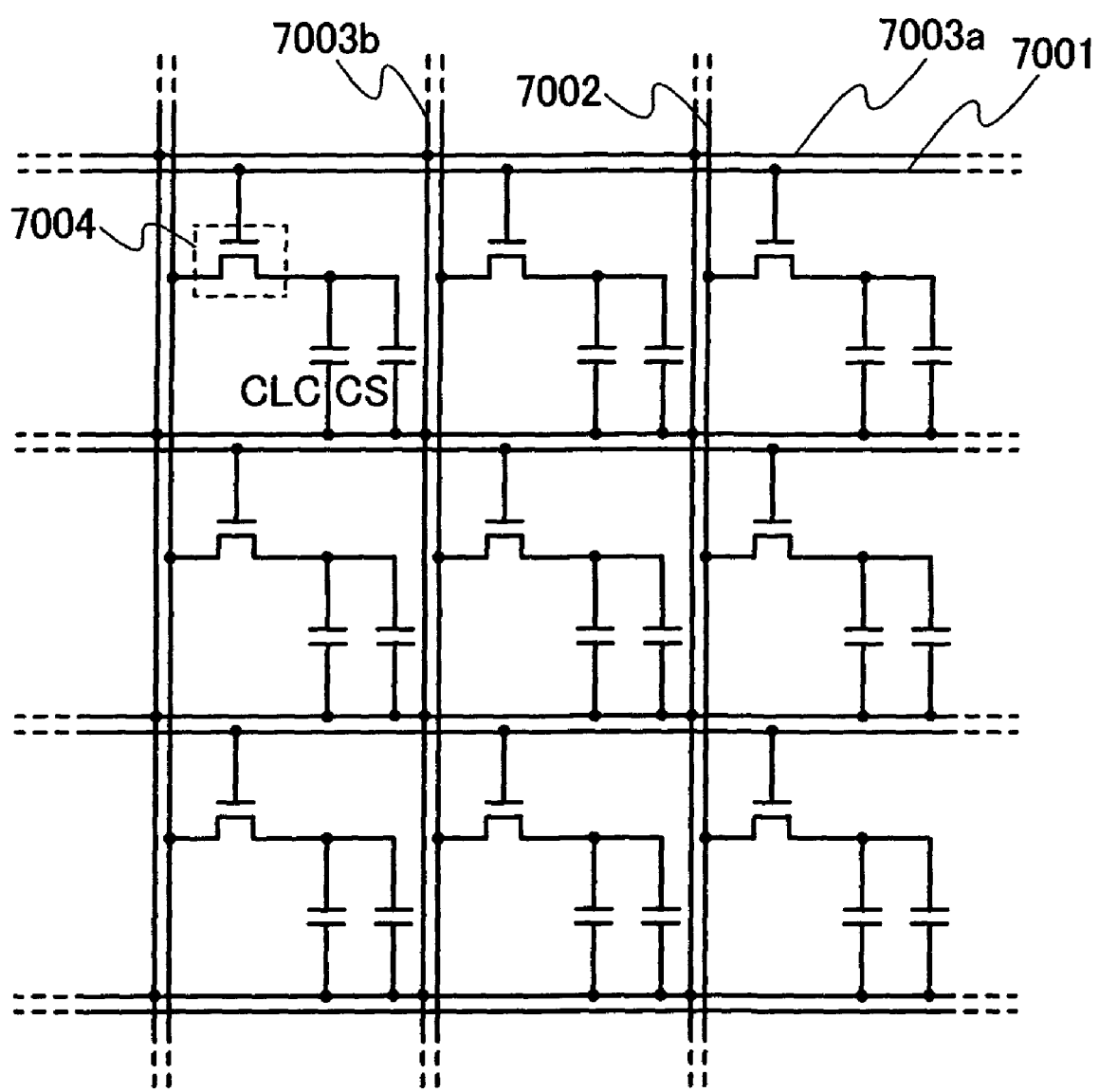
FIG. 16 is a diagram explaining a circuit of a pixel portion of a liquid crystal display device according to the present invention.

In FIG. 16, a gate line 7001 intersects with a source line 7002. In addition, a common wiring 7003a and a common wiring 7003b are led vertically and horizontally. The gate line 7001 is connected to a gate electrode of a transistor 7004. In addition, the source line 7002 is connected to a source (or drain) electrode of the transistor 7004. It is to be noted that, when the liquid crystal display device is an AC driving liquid crystal display device, the source electrode and the drain electrode of the transistor 7004 are switched in accordance with potential transmitted from the source line 7002; therefore, the electrode is referred to as the source (or drain) electrode in this embodiment mode. A liquid crystal element $C_{LC}$ is provided between the source (or drain) electrode of the transistor 7004 and the common wiring 7003a. When the transistor 7004 is turned on, the potential from the source line 7002 is transmitted to the liquid crystal element $C_{LC}$, whereas, when the transistor 7004 is turned off, the potential from the source line 7002 is not transmitted to the liquid crystal element $C_{LC}$. In the case where it is desired that light pass through the liquid crystal layer even when the transistor 7004 is turned off and the potential from the source line 7002 is not transmitted to the liquid crystal element $C_{LC}$, a capacitor $C_S$ is preferably provided in parallel to the liquid crystal element $C_{LC}$. When the capacitor stores voltage, light can pass through the liquid crystal layer even when the transistor 7004 is turned off.

FIG. 92A shows a top view of the display device described in this embodiment mode. FIG. 92B shows a cross-sectional view corresponding to a line K-L of FIG. 92A. The display device shown in FIGS. 92A and 92B includes an external terminal connecting region 852, a sealing region 853, and a scanning line driver circuit 854 including a signal line driver circuit.

The display device shown in FIGS. 92A and 92B in this embodiment mode includes a substrate 801, a thin film transistor 827, a thin film transistor 829, a thin film transistor 825, a sealant 834, a counter substrate 830, an alignment film 831, a counter electrode 832, a spacer 833, a polarizing plate 835a, a polarizing plate 835b, a first terminal electrode layer 838a, a second terminal electrode layer 838b, an anisotropy conductive layer 836, and an FPC 837. The display device also includes the external terminal connecting region 852, the sealing region 853, the scanning line driver circuit 854, a pixel region 856, and a signal line driver circuit 857.

The sealant 834 is provided to surround the pixel region 856 and the scanning line driver circuit 854 formed over the substrate 801. The counter substrate 830 is provided over the pixel region 856 and the scanning line driver circuit 854. Therefore, the pixel region 856 and the scanning line driver circuit 854 are sealed, as well as the liquid crystal material, by the substrate 801, the sealant 834, and the counter substrate 830.

The pixel region 856 and the scanning line driver circuit 854 formed over the substrate 801 include a plurality of thin film transistors. In FIG. 92B, the thin film transistor 825 included in the pixel region 856 is shown as an example.

It is to be noted that the description of Embodiment Modes 1 to 11 can also be applied to and combined with this embodiment mode.

Embodiment Mode 13

FIGS. 17A and 17B each show a mode of a module including a liquid crystal display device according to the present invention described in Embodiment Modes 1 to 12. A pixel portion 930, a gate driver 920, and a source driver 940 are provided over a substrate 900. A signal is inputted to the gate driver 920 and the source driver 940 from an integrated circuit 950 through a flexible printed circuit 960. An image is displayed in the pixel portion 930 in accordance with the inputted signal.

It is to be noted that the description of Embodiment Mode 1 to Embodiment Mode 12 can also be applied to and combined with this embodiment mode.

Embodiment Mode 14

Figure 94:
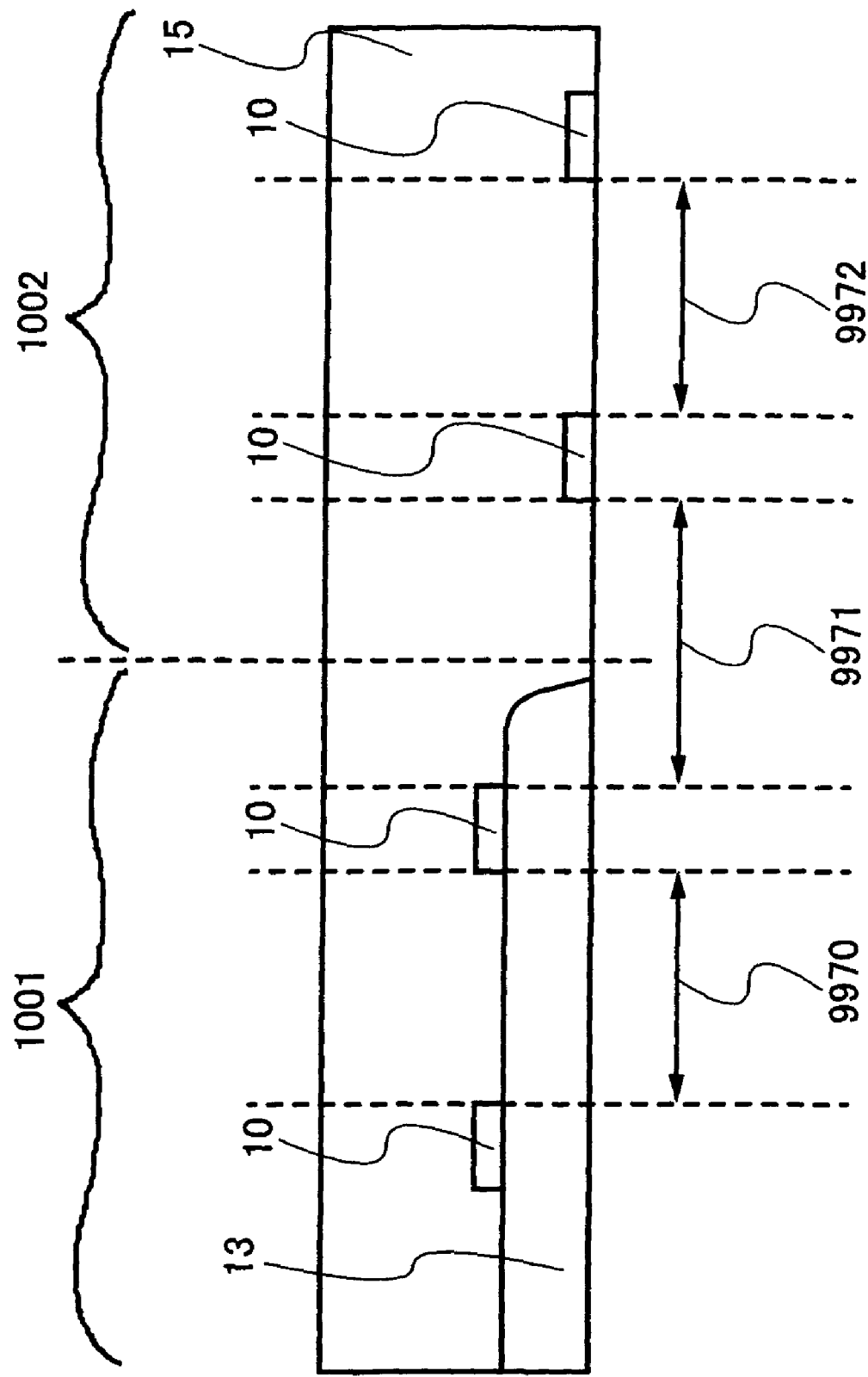
FIG. 94 is a view explaining one mode of a liquid crystal display device according to the present invention.

This embodiment mode will describe details of an electrode 10 of a liquid crystal element. FIG. 94 shows one example of a cross-sectional view. It is to be noted that an electrode of the liquid crystal element other than the electrode 10 of the liquid crystal element can have various modes and not shown in FIG. 94 but may be arranged in any manner.

In addition, an insulating layer 13 which is a film for adjusting a thickness of a liquid crystal layer 15 is formed on a substrate side provided with the electrode 10 of the liquid crystal element; however, the present invention is not limited thereto. The insulating layer 13 which is a film for adjusting a thickness of a liquid crystal layer 15 may also be arranged on a counter substrate side. Further, the insulating layer 13 which is a film for adjusting a thickness of the liquid crystal layer 15 is formed below the electrode 10 of the liquid crystal element; however, the present invention is not limited thereto. The insulating layer 13 which is a film for adjusting a thickness may also be arranged over the electrode 10 of the liquid crystal element.

It is to be noted that, instead of the electrode 10 of the liquid crystal element, an electrode 12 of the liquid crystal element may be arranged in part.

Here, an interval between electrodes will be described. As shown in FIG. 94, an interval 9972 between the electrodes 10 of the liquid crystal element in a transmission portion 1002 is compared to an interval 9971 between the electrodes 10 of the liquid crystal element, which is arranged at a boundary of the transmission portion 1002 and a reflection portion 1001, i.e., at a boundary of the insulating layer 13. The interval 9971 may be almost equal to or longer than the interval 9972. It is preferable that, in the pixel, there are more such regions where the interval 9971 is almost equal to or longer than the interval 9972 than regions where the interval 9971 is shorter than the interval 9972. It is also preferable that, in the pixel, there are two times or three times more regions where the interval 9971 is longer than the interval 9972 than regions where the interval 9971 is shorter than the interval 9972.

Alignment of a liquid crystal molecule is disordered at the boundary of the insulating layer 13. Therefore, when the interval 9971 is made long so as not to easily receive en electric field, an alignment defect such as disclination can be reduced.

Similarly, it is preferable that the interval 9971 be almost equal to or longer than an interval 9970 between the electrodes 10 of the liquid crystal element in the reflection portion 1001.

Subsequently, the interval 9972 between the electrodes 10 of the liquid crystal element in the transmission portion 1002 is compared to the interval 9970 between the electrodes 10 of the liquid crystal element in the reflection portion 1001. The interval 9970 may be almost equal to or longer than the interval 9972. It is preferable that, in the pixel, there are more such regions where the interval 9970 is almost equal to or longer than the interval 9972 than regions where the interval 9970 is shorter than the interval 9972. It is more preferable that, in the pixel, there are two times or three times more regions where the interval 9970 is longer than the interval 9972 than regions where the interval 9970 is shorter than the interval 9972.

In the reflection portion 1001, a thickness of the liquid crystal layer, i.e. a cell gap, is thin. Therefore, an electric field applied to the liquid crystal molecule may be lower than that in the transmission portion 1002.

Next, the arrangement of the boundary of the insulating layer 13 which is a film for adjusting a thickness of the liquid crystal layer 15 and the electrode 10 of the liquid crystal element will be described. At the boundary of the insulating layer 13, alignment of the liquid crystal molecule is possibly disordered. Therefore, in order to reduce disordered alignment as much as possible, the boundary of the insulating layer 13 and the electrode 10 of the liquid crystal element are preferably arranged almost in parallel or to be almost orthogonal.

Figures 96A, 96B:
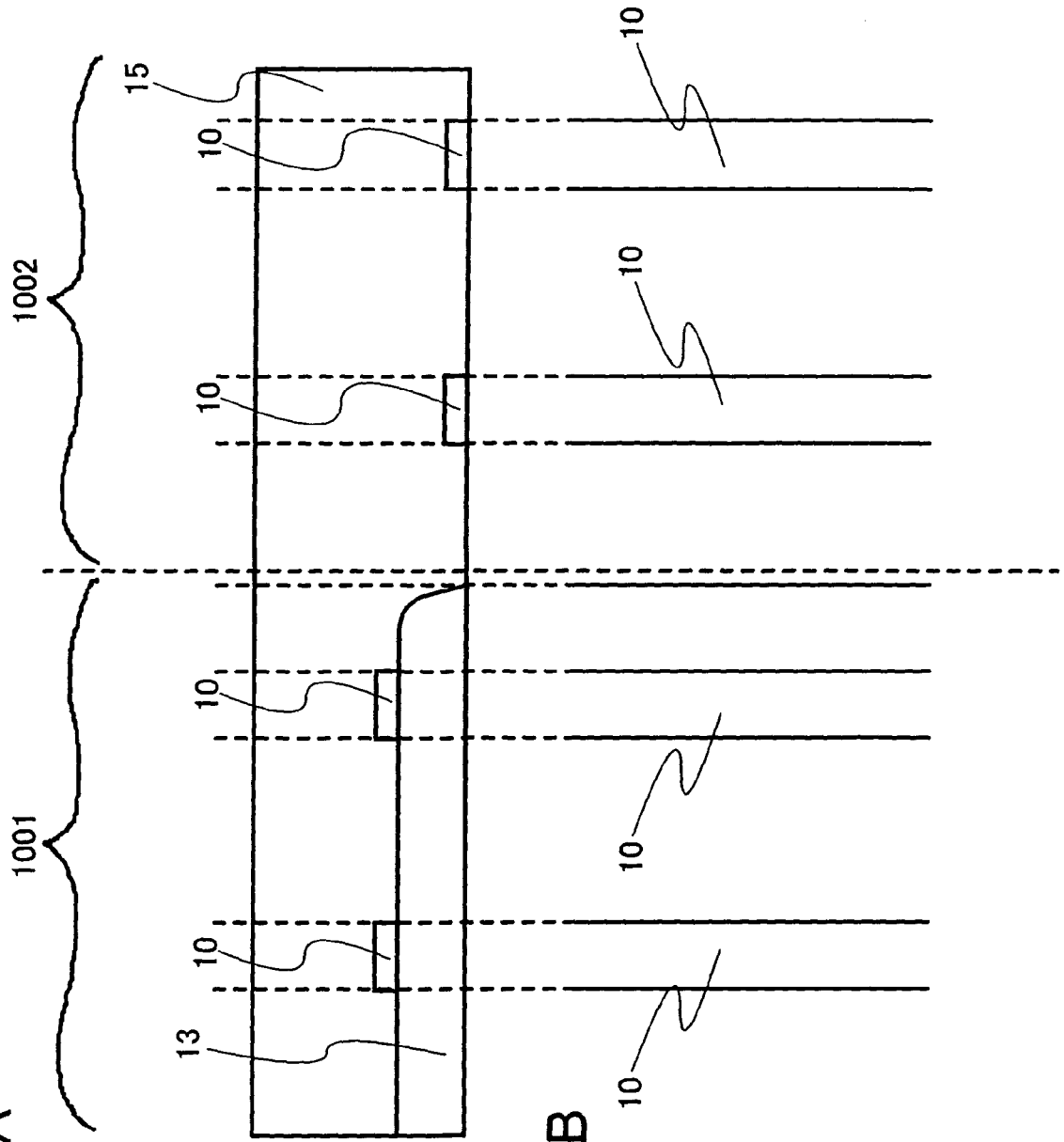
FIGS. 96A and 96B are views each explaining one mode of a liquid crystal display device according to the present invention.

FIGS. 96A and 96B each show a view in the case where the boundary of the insulating layer 13 and the electrode 10 of the liquid crystal element are arranged almost in parallel. FIG. 96A shows a cross-sectional view and FIG. 96B shows a plan view. In such a manner, by the almost parallel arrangement, disordered alignment of the liquid crystal molecule can be reduced.

It is to be noted that, "be almost parallel" here also includes discrepancy in such a degree that disordered alignment of the liquid crystal molecule does not have a great influence. Therefore, for example, an angle between a tangent line of the boundary of the insulating layer 13 and that of the electrode 10 of the liquid crystal element is preferably −10 to +10 degrees, more preferably −5 to +5 degrees.

Figure 95:
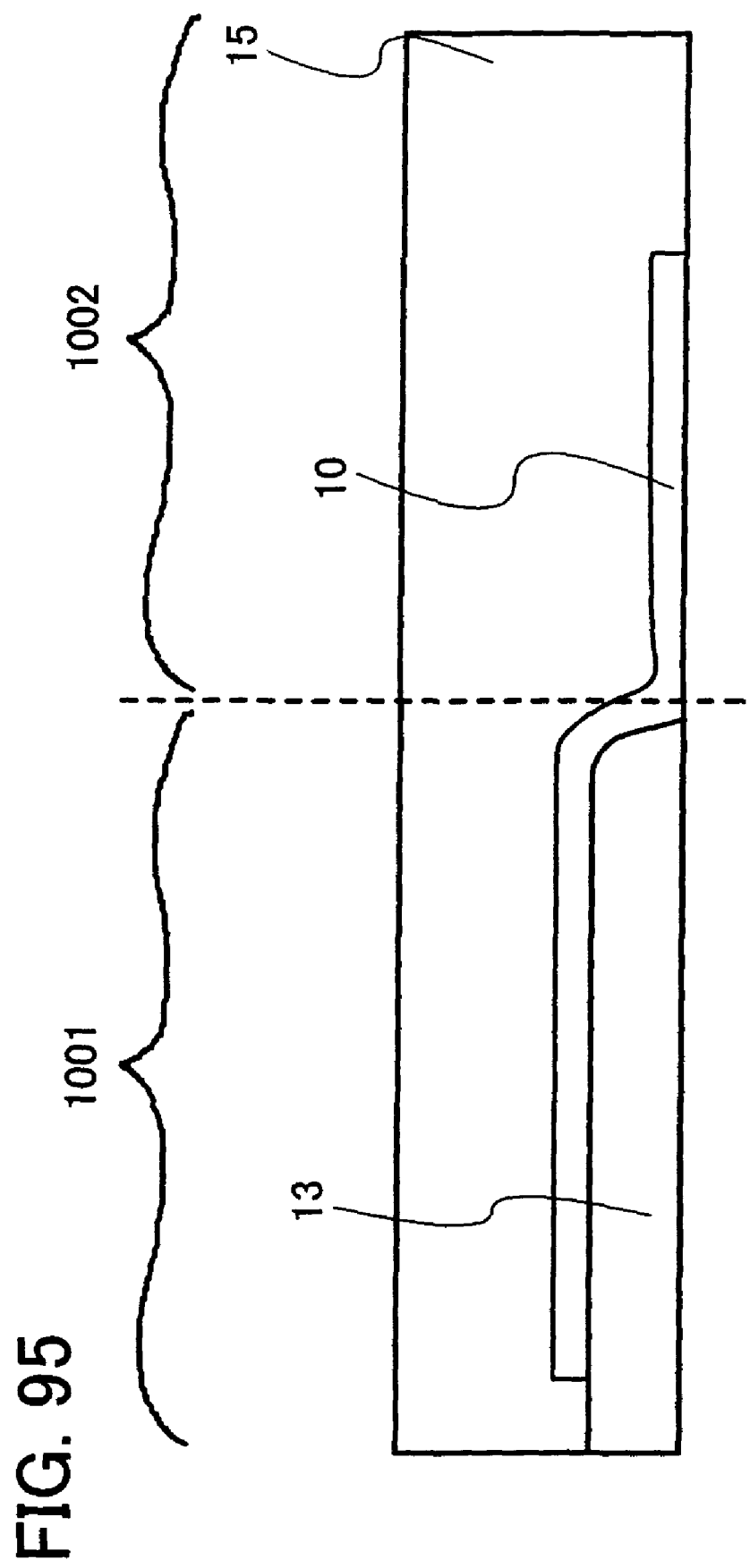
FIG. 95 is a view explaining one mode of a liquid crystal display device according to the present invention.

Even when the boundary of the insulating layer 13 and the electrode 10 of the liquid crystal element are arranged almost in parallel as shown in FIGS. 96A and 96B, there can be a region, as shown in FIG. 95, where the electrode 10 of the liquid crystal element is arranged over the boundary of the insulating layer 13 due to connection of the electrodes.

Figures 97A, 97B:
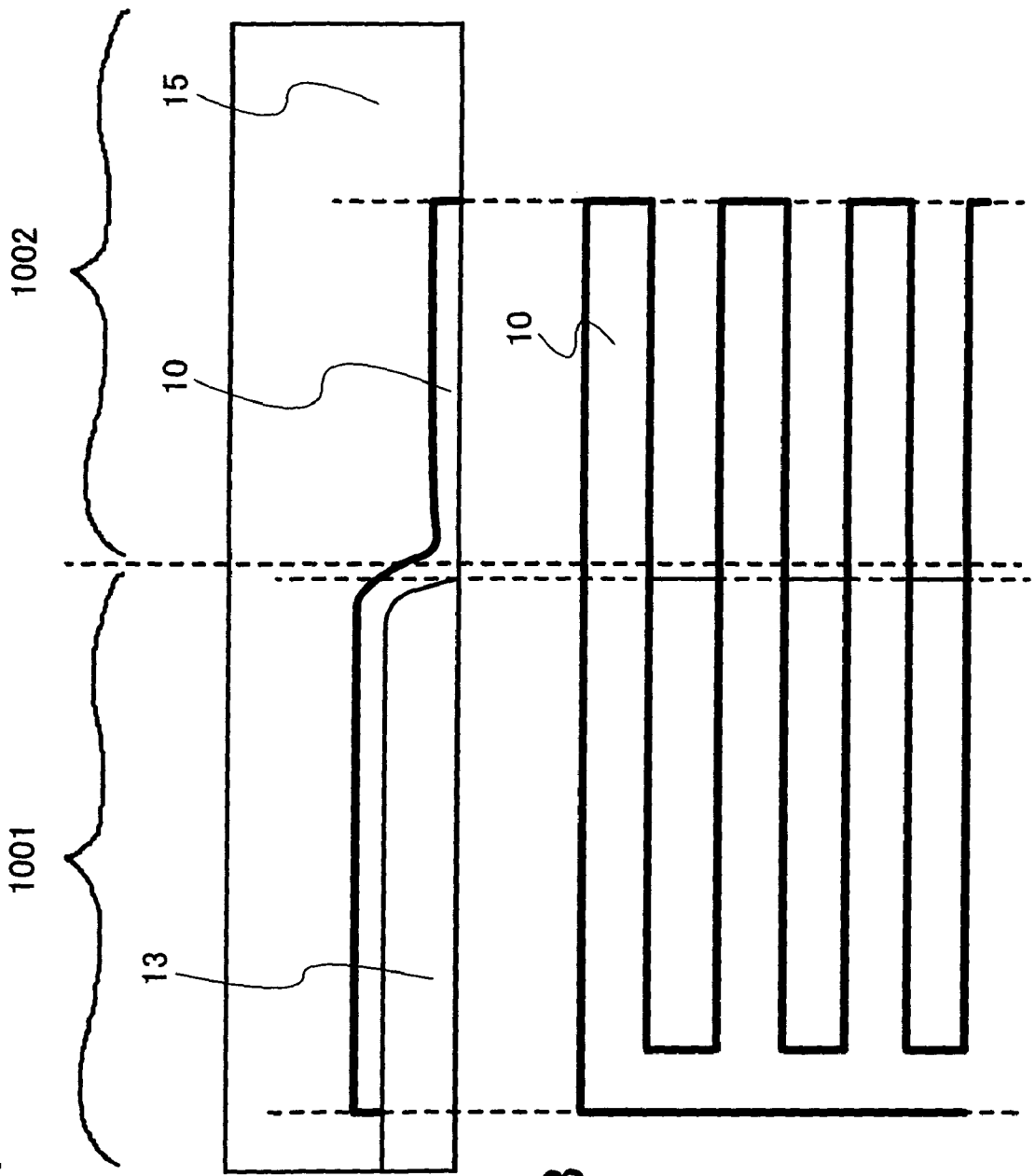
FIGS. 97A and 97B are views each explaining one mode of a liquid crystal display device according to the present invention.

Then, FIGS. 97A and 97B show a view in the case where the boundary of the insulating layer 13 and the electrode 10 of the liquid crystal element are arranged to be almost orthogonal. FIG. 97A shows a cross-sectional view and FIG. 97B shows a plan view. In such a manner, by the almost orthogonal arrangement, disordered alignment of the liquid crystal molecule can be reduced.

It is to be noted that, "be almost orthogonal" here also includes discrepancy in such a degree that disordered alignment of the liquid crystal molecule does not have a great influence. Therefore, for example, an angle between a tangent line of the boundary of the insulating layer 13 and that of the electrode 10 of the liquid crystal element is preferably 80 to 110 degrees, more preferably 85 to 105 degrees.

It is to be noted that the description of Embodiment Mode 1 to Embodiment mode 13 can also be applied to and combined with this embodiment mode.

Embodiment Mode 15

Figure 19A:
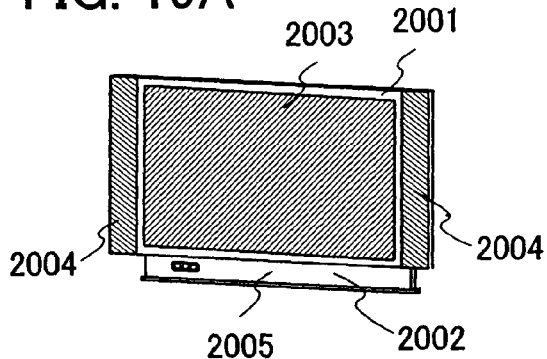
FIGS. 19A to 19H are views each explaining one mode of an electronic appliance to which the present invention is applied.
Figure 19B:
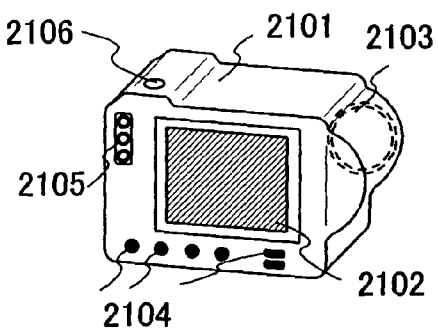
Figure 19C:
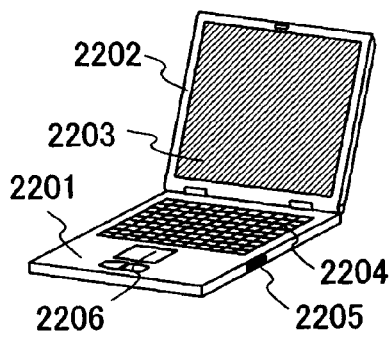
Figure 19D:
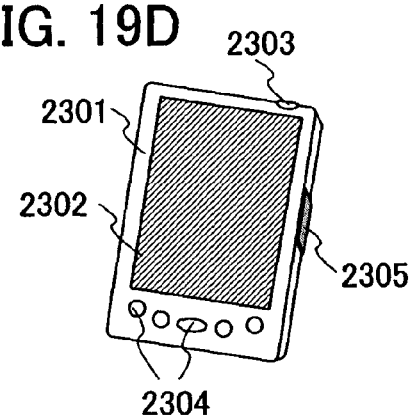
Figure 19E:
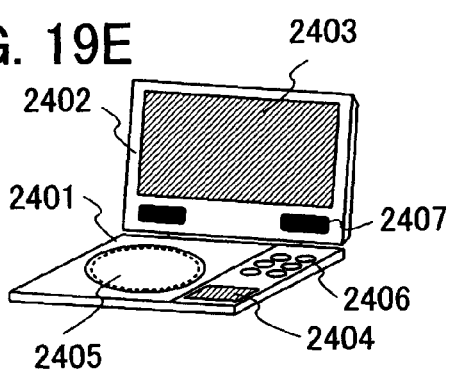
Figure 19F:
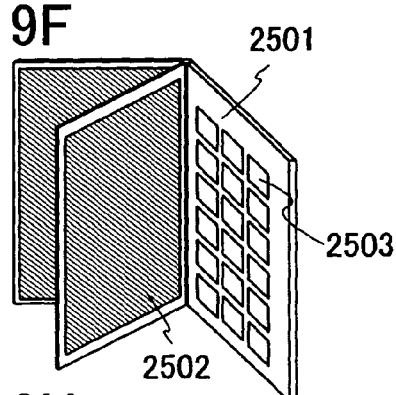
Figure 19G:
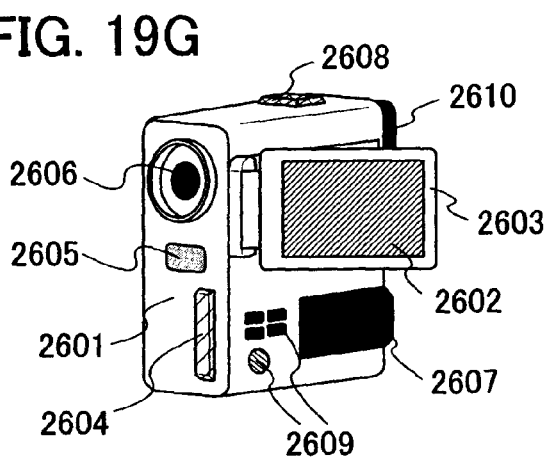
Figure 19H:
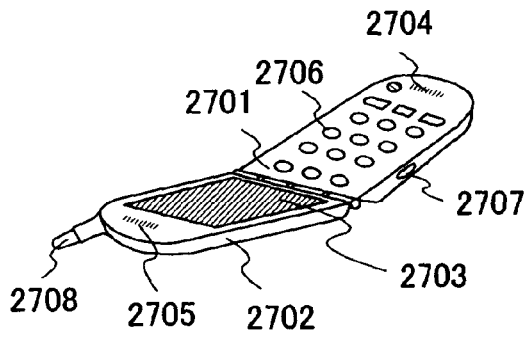

An electronic appliance including a liquid crystal display device according to the present invention in a display portion will be described with reference to FIGS. 19A to 19H. FIG. 19A shows a TV set which includes a housing 2001, a support base 2002, a display portion 2003, speaker portions 2004, a video input terminal 2005, and the like. The display portion 2003 includes the liquid crystal display device according to the present invention described in Embodiment Modes 1 to 14. FIG. 19B shows a camera which includes a main body 2101, a display portion 2102, an image receiving portion 2103, operation keys 2104, an external connecting port 2105, a shutter 2106, and the like. The display portion 2102 includes the liquid crystal display device according to the present invention described in Embodiment Modes 1 to 14. FIG. 19C shows a computer which includes a main body 2201, a housing 2202, a display portion 2203, a keyboard 2204, an external connecting port 2205, a pointing mouse 2206, and the like. The display portion 2203 includes the liquid crystal display device according to the present invention described in Embodiment Modes 1 to 14. FIG. 19D shows an information terminal which includes a main body 2301, a display portion 2302, a switch 2303, operation keys 2304, an infrared port 2305, and the like. The display portion 2302 includes the liquid crystal display device according to the present invention described in Embodiment Modes 1 to 14. FIG. 19E shows a DVD reproducing device which includes a main body 2401, a housing 2402, a display portion A 2403, a display portion B 2404, a recording medium reading portion 2405, operation keys 2406, speaker portions 2407, and the like. The display portion A 2403 and the display portion B 2404 each include the liquid crystal display device according to the present invention described in Embodiment Modes 1 to 14. FIG. 19F shows an electronic book which includes a main body 2501, a display portions 2502, operation keys 2503, and the like. The display portion 2502 includes the liquid crystal display device according to the present invention described in Embodiment Modes 1 to 14. FIG. 19G shows an image pickup device which includes a main body 2601, a display portion 2602, a housing 2603, an external connecting port 2604, a remote control receiving portion 2605, an image receiving portion 2606, a battery 2607, an audio input portion 2608, operation keys 2609, and the like. The display portion 2602 includes the liquid crystal display device according to the present invention described in Embodiment Modes 1 to 14. FIG. 19H shows a phone which includes a main body 2701, a housing 2702, a display portion 2703, an audio input portion 2704, an audio output portion 2705, operation keys 2706, an external connecting port 2707, an antenna 2708, and the like. The display portion 2703 includes the liquid crystal display device according to the present invention described in Embodiment Modes 1 to 14.

As described above, an electronic appliance according to the present invention is completed by incorporating a liquid crystal display device according to the present invention into a display portion. Such an electronic appliance according to the present invention can display an image that is favorable both indoors and outdoors. In particular, an electronic appliance such as a camera or an image pickup device which is often used outdoors and indoors has advantages, such as a wide viewing angle and less color-shift depending on an angle at which a display screen is seen, both indoors and outdoors.

It is to be noted that the description of Embodiment Mode 1 to Embodiment mode 14 can also be applied to and combined with this embodiment mode. This application is based on Japanese Patent Application serial no. 2005-350198 filed in Japan Patent Office on Dec. 5, 2005, the entire contents of which are hereby incorporated by reference.

The invention claimed is:

1. A liquid crystal display device including a transmission portion and a reflection portion, the device comprising:
    a liquid crystal element including a pixel electrode in both of said portions and a first common electrode at least in the transmission portion, each having a light-transmitting property, a second common electrode having reflectiveness in the reflection portion, and a liquid crystal layer provided over the pixel electrode,
    wherein the pixel electrode is provided over the second common electrode with an insulating layer interposed therebetween in the reflection portion; and
    wherein the pixel electrode is provided over the first common electrode with the insulating layer interposed therebetween in the transmission portion; and
    wherein a second insulating layer scarcely having refractive index anisotropy is provided in the reflection portion.

2. A liquid crystal display device according to claim 1, wherein the second common electrode is electrically connected to the first common electrode.

3. A liquid crystal display device according to claim 1, wherein the liquid crystal layer includes a liquid crystal molecule rotating parallel to a substrate plane.

4. A liquid crystal display device according to claim 1, wherein the pixel electrode is comb-shaped.

5. A liquid crystal display device according to claim 1, wherein the second insulating layer has a thickness such that a thickness of the liquid crystal layer in the reflective portion is greater than or equal to one-third and less than or equal to two-thirds of a thickness of the liquid crystal layer in the transmission portion.

6. A liquid crystal display device comprising:
    a liquid crystal element between a first substrate and a second substrate, which includes
        a pixel electrode having a light-transmitting property,
        a first common electrode having a light-transmitting property,
        a second common electrode having reflectiveness in a reflective portion of the liquid crystal element, and
        a liquid crystal layer provided between the pixel electrode and the second substrate;
    wherein the first common electrode and the second common electrode are provided over the first substrate;
    wherein the pixel electrode is provided over the first common electrode and the second common electrode with an insulating layer interposed therebetween, and
    wherein a second insulating layer scarcely having refractive index anisotropy is provided between the first substrate and the second substrate in the reflective portion.

7. A liquid crystal display device according to claim 6, wherein the liquid crystal layer includes a liquid crystal molecule rotating parallel to a substrate plane.

8. A liquid crystal display device according to claim 6, wherein the pixel electrode is comb-shaped.

9. A liquid crystal display device according to claim 6, wherein the second common electrode is electrically connected to the first common electrode.

10. A liquid crystal display device according to claim 6, wherein the second insulating layer has a thickness such that a thickness of the liquid crystal layer in the reflective portion is greater than or equal to one-third and less than or equal to two-thirds of a thickness of the liquid crystal layer in a portion other than the reflective portion.

* * * * *